(12) United States Patent
Kawata et al.

(10) Patent No.: US 9,831,353 B2
(45) Date of Patent: Nov. 28, 2017

(54) SEMICONDUCTOR DEVICE, DISPLAY DEVICE, DISPLAY MODULE, ELECTRONIC DEVICE, OXIDE, AND MANUFACTURING METHOD OF OXIDE

(71) Applicant: Semiconductor Energy Laboratory Co., Ltd., Kanagawa-ken (JP)

(72) Inventors: Takuya Kawata, Kanagawa (JP); Masashi Oota, Kanagawa (JP); Yusuke Nonaka, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/974,977

(22) Filed: Dec. 18, 2015

(65) Prior Publication Data

US 2016/0190346 A1   Jun. 30, 2016

(30) Foreign Application Priority Data

Dec. 26, 2014 (JP) ................... 2014-265862
Dec. 26, 2014 (JP) ................... 2014-266094
(Continued)

(51) Int. Cl.
*H01L 21/02* (2006.01)
*H01L 29/786* (2006.01)
(Continued)

(52) U.S. Cl.
CPC ........ *H01L 29/78693* (2013.01); *C23C 14/08* (2013.01); *C23C 14/3414* (2013.01);
(Continued)

(58) Field of Classification Search
None
See application file for complete search history.

(56) References Cited

U.S. PATENT DOCUMENTS 4,963,524 A   10/1990   Yamazaki
5,528,032 A    6/1996   Uchiyama
(Continued)

FOREIGN PATENT DOCUMENTS

CN   001032885 A    5/1989
CN   105190902 A   12/2015
(Continued)

OTHER PUBLICATIONS

Yamazaki, S., "Crystalline Oxide Semiconductor Using CAAC-IGZO and its Application," ECS Transactions, Oct. 1, 2014, vol. 64, No. 10, pp. 155-164, The Electrochemical Society.
(Continued)

*Primary Examiner* — Hoang-Quan Ho
(74) *Attorney, Agent, or Firm* — Husch Blackwell LLP

(57) ABSTRACT

The semiconductor device includes a first insulator over a substrate, a first oxide semiconductor over the first insulator, a second oxide semiconductor over the first oxide semiconductor, a first conductor and a second conductor in contact with the second oxide semiconductor, a third oxide semiconductor on the second oxide semiconductor and the first and second conductors, a second insulator over the third oxide semiconductor, and a third conductor over the second insulator. At least one of the first oxide semiconductor, the second oxide semiconductor, and the third oxide semiconductor has a crystallinity peak that corresponds to a (hkl) plane (h=0, k=0, l is a natural number) observed by X-ray diffraction using a Cu K-alpha radiation as a radiation source. The peak appears at a diffraction angle 2 theta greater than or equal to 31.3 degrees and less than 33.5 degrees.

14 Claims, 88 Drawing Sheets

(30) Foreign Application Priority Data

| Jan. 14, 2015 | (JP) | 2015-004895 |
|---|---|---|
| Jan. 14, 2015 | (JP) | 2015-004898 |
| Oct. 20, 2015 | (JP) | 2015-206123 |

(51) Int. Cl.

| H01L 29/04 | (2006.01) |
|---|---|
| C23C 14/08 | (2006.01) |
| C23C 14/34 | (2006.01) |
| C23C 14/35 | (2006.01) |
| C23C 14/56 | (2006.01) |
| H01J 37/32 | (2006.01) |
| H01J 37/34 | (2006.01) |
| H01L 21/67 | (2006.01) |
| H01L 21/8258 | (2006.01) |
| H01L 27/092 | (2006.01) |
| H01L 27/06 | (2006.01) |

(52) U.S. Cl.
CPC .......... *C23C 14/352* (2013.01); *C23C 14/564* (2013.01); *C23C 14/566* (2013.01); *H01J 37/32899* (2013.01); *H01J 37/3408* (2013.01); *H01J 37/3417* (2013.01); *H01J 37/3447* (2013.01); *H01L 21/0243* (2013.01); *H01L 21/0262* (2013.01); *H01L 21/02554* (2013.01); *H01L 21/02565* (2013.01); *H01L 21/02631* (2013.01); *H01L 21/02639* (2013.01); *H01L 21/02647* (2013.01); *H01L 21/67207* (2013.01); *H01L 21/8258* (2013.01); *H01L 27/0688* (2013.01); *H01L 27/092* (2013.01); *H01L 29/04* (2013.01); *H01L 29/78696* (2013.01); *H01L 27/0629* (2013.01)

(56) References Cited

U.S. PATENT DOCUMENTS

| 5,731,856 | A | 3/1998 | Kim et al. |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,021,916 | B2 | 9/2011 | Akimoto et al. |
| 8,703,531 | B2 | 4/2014 | Honda et al. |
| 8,809,115 | B2 | 8/2014 | Akimoto et al. |
| 2001/0009221 | A1* | 7/2001 | Anzaki .......... C23C 14/352 204/192.12 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0198213 | A1* | 8/2011 | Kurata .......... C23C 14/086 204/192.25 |
| 2011/0217815 | A1 | 9/2011 | Honda et al. |
| 2013/0043465 | A1 | 2/2013 | Okazaki et al. |
| 2013/0270555 | A1 | 10/2013 | Okazaki et al. |
| 2014/0001032 | A1* | 1/2014 | Yamazaki .......... C23C 14/34 204/192.15 |
| 2014/0151687 | A1 | 6/2014 | Yamazaki |
| 2014/0252345 | A1 | 9/2014 | Tsubuku et al. |
| 2014/0284597 | A1 | 9/2014 | Shimomura et al. |
| 2014/0332800 | A1 | 11/2014 | Hanaoka |
| 2014/0357018 | A1 | 12/2014 | Akimoto et al. |

(56) References Cited

U.S. PATENT DOCUMENTS

| | | | |
|---|---|---|---|
| 2015/0027876 A1* | 1/2015 | Choi | C23C 14/352 |
| | | | 204/192.12 |
| 2015/0129416 A1 | 5/2015 | Yamazaki | |
| 2015/0329371 A1 | 11/2015 | Kurosawa et al. | |

FOREIGN PATENT DOCUMENTS

| | | |
|---|---|---|
| EP | 0 309 294 A2 | 3/1989 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 | 10/1988 |
| JP | 63-265818 A | 11/1988 |
| JP | 64-083659 A | 3/1989 |
| JP | 05-251705 A | 9/1993 |
| JP | 6-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-037594 * | 2/2010 |
| JP | 2010-037594 A | 2/2010 |
| JP | 2014-053628 A | 3/2014 |
| JP | 2014-135478 A | 7/2014 |
| JP | 2014-209574 A | 11/2014 |
| JP | 2014-239213 A | 12/2014 |
| KR | 2013-0045252 A | 5/2013 |
| KR | 2014-0071259 A | 6/2014 |
| KR | 2014-0109817 A | 9/2014 |
| KR | 2016-0006718 A | 1/2016 |
| TW | 201232613 | 8/2012 |
| TW | 201501313 | 1/2015 |
| WO | WO 2004/114391 A1 | 12/2004 |
| WO | WO 2011/108346 A1 | 9/2011 |
| WO | WO 2014/181785 A1 | 11/2014 |

OTHER PUBLICATIONS

Asakuma, N. et al., "Crystallization and Reduction of SOL-GEL-Derived Zinc Oxide Films by Irradiation with Ultraviolet Lamp," Journal of SOL-GEL Science and Technology, 2003, vol. 26, pp. 181-184.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology, " IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application ," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn]at Temperatures over 1000° C.," Journal of Solid State Chemistry, 1985, vol. 60, pp. 382-384.

(56) References Cited

OTHER PUBLICATIONS

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transitors by DC Sputtering,"SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4-ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transitors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 in. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT,"IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

(56) References Cited

OTHER PUBLICATIONS

Van de Walle, C.G., "Hydrogen as a Cause of Doping in Zinc Oxide," Physical Review Letters, Jul. 31, 2000, vol. 85, No. 5, pp. 1012-1015.
International Search Report re Application No. PCT/IB2015/059755, dated Apr. 19, 2016.
Written Opinion re Application No. PCT/IB2015/059755, dated Apr. 19, 2016.

* cited by examiner

FIG. 18A
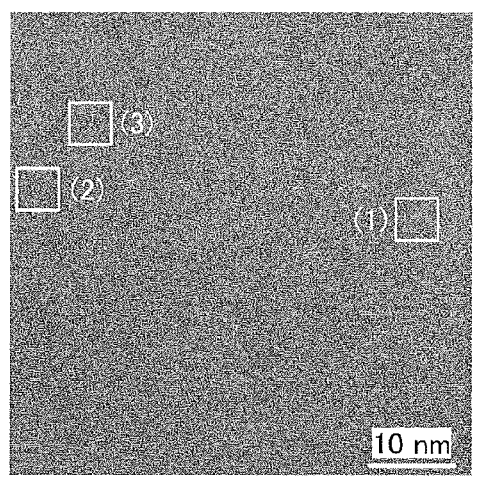
FIG. 18B  FIG. 18C  FIG. 18D
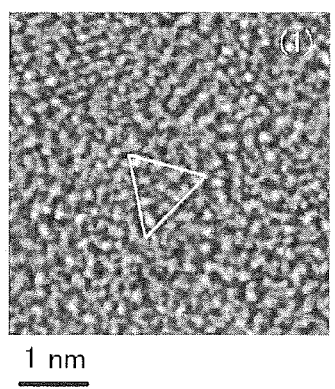 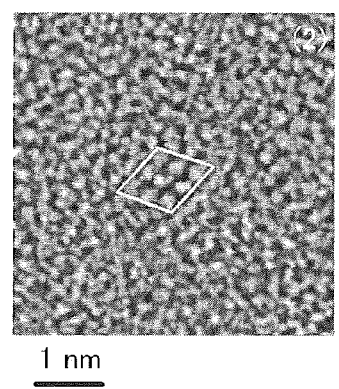 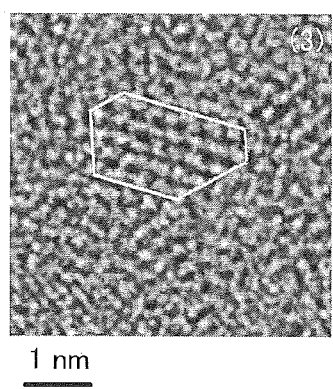

irradiated with electron beam from a direction parallel to sapmle surface irradiated with electron beam from a direction perpendicular to sapmle surface Crystal Structure of InMZnO$_4$ FIG. 28A
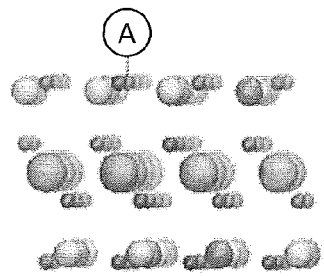
FIG. 28B
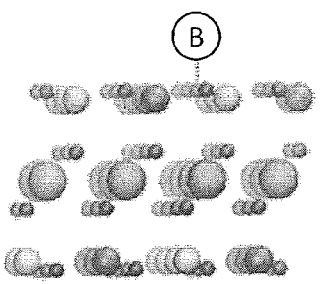
FIG. 28C
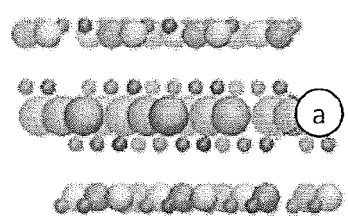
FIG. 28D
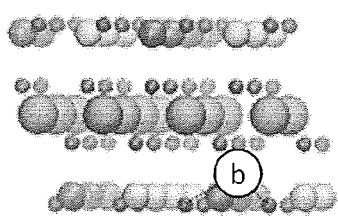
FIG. 28E
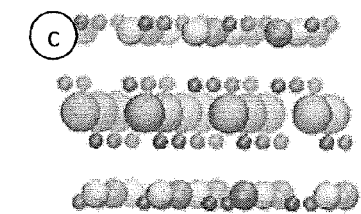
FIG. 28F
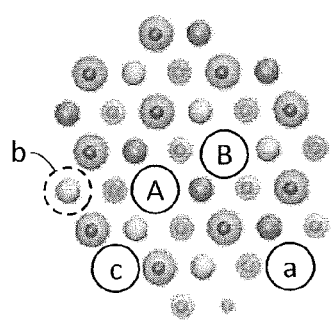
FIG. 28G
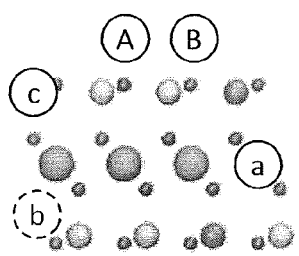
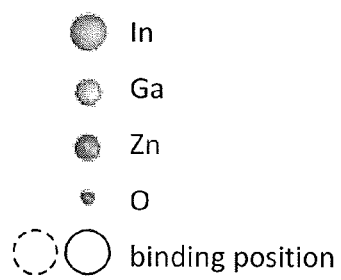

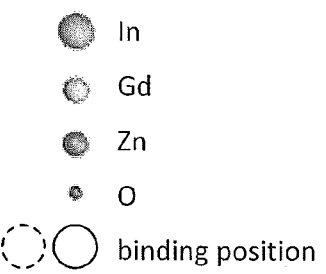

X1　　　　　　　　X2

Y1　　　　　　　　Y2

X1　　　　　　　　X2

Y1　　　　　　　　Y2

2200    2100

2200    2100

FIG. 65A1
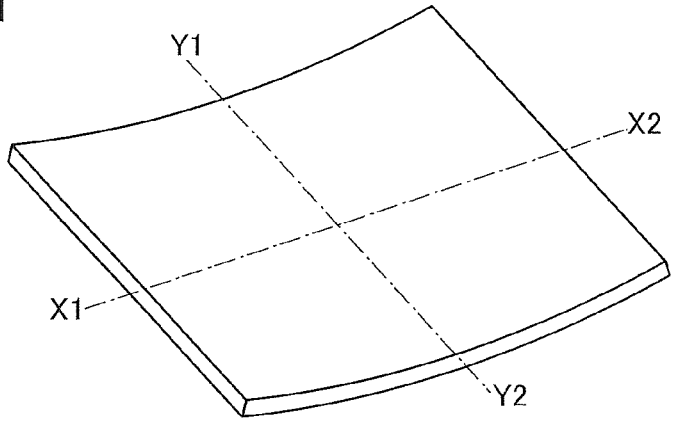
FIG. 65A2
FIG. 65A3
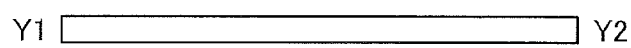
FIG. 65B1
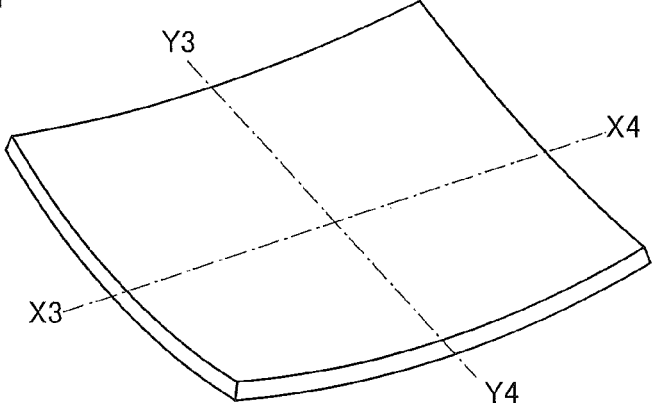
FIG. 65B2
FIG. 65B3

SEMICONDUCTOR DEVICE, DISPLAY DEVICE, DISPLAY MODULE, ELECTRONIC DEVICE, OXIDE, AND MANUFACTURING METHOD OF OXIDE

TECHNICAL FIELD

The present invention relates to, for example, an oxide, a transistor, a semiconductor device, and manufacturing methods thereof. The present invention relates to, for example, a display device, a light-emitting device, a lighting device, a power storage device, a memory device, an imaging device, a processor, or an electronic device. The present invention relates to a manufacturing method of a display device, a liquid crystal display device, a light-emitting device, a memory device, an imaging device, or an electronic device. The present invention relates to a driving method of a display device, a liquid crystal display device, a light-emitting device, a memory device, an imaging device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where driver circuits are formed over the same substrate, it is preferred to use polycrystalline silicon, which can form a transistor having high field-effect mobility. It is known that polycrystalline silicon can be formed as a result of heat treatment at high temperatures or laser light treatment on amorphous silicon.

In recent years, transistors including oxide semiconductors (typified by an In—Ga—Zn oxide) have been actively developed.

Oxide semiconductors have been researched since early times. In 1988, it was disclosed to use an In—Ga—Zn oxide crystal for a semiconductor element (see Patent Document 1). In 1995, a transistor including an oxide semiconductor was invented, and its electrical characteristics were disclosed (see Patent Document 2).

In 2014, it was reported that a transistor including a crystalline In—Ga—Zn oxide has more excellent electrical characteristics and higher reliability than a transistor including an amorphous In—Ga—Zn oxide (see Non-Patent Document 1). Non-Patent Document 1 reports that a crystal boundary is not clearly observed in an In—Ga—Zn oxide including a c-axis aligned crystalline oxide semiconductor (CAAC-OS).

REFERENCE

Patent Document

[Patent Document 1] Japanese Published Patent Application No. S63-239117
[Patent Document 2] Japanese translation of PCT international application No. H11-505377

Non-Patent Document

[Non-Patent Document 1] S. Yamazaki, *The Electrochemical Society Transactions*, 2014, vol. 64(10), pp. 155-164

DISCLOSURE OF INVENTION

One embodiment of the present invention is to provide a transistor with stable electrical characteristics. Another object is to provide a transistor with normally-off electrical characteristics. Another object is to provide a transistor having a small subthreshold swing value. Another object is to provide a transistor having a small short-channel effect. Another object is to provide a transistor having a low leakage current in an off state. Another object is to provide a transistor with excellent electrical characteristics. Another object is to provide a highly reliable transistor. Another object is to provide a transistor with high frequency characteristics.

Another object is to provide a semiconductor device including any of the above transistors. Another object is to provide a display device including the semiconductor device. Another object is to provide a display module including the display device. Another object is to provide an electronic device including the semiconductor device, the display device, or the display module. Another object is to provide a novel semiconductor device. Another object is to provide a novel display device. Another object is to provide a novel display module. Another object is to provide a novel electronic device.

Another object is to provide an oxide that can be used for a semiconductor or the like of a transistor. Another object is to provide an oxide with high crystallinity. Another object is to provide a crystalline oxide with high orientation. Another object is to provide an oxide with few defects. Another object is to provide an oxide with low impurity concentration. Another object is to provide a manufacturing method of an oxide which causes small damage to a formation surface. Another object is to provide a manufacturing method of an oxide with a high deposition rate. Another object is to provide a manufacturing method of an oxide in which a sputtering method with a high utilization efficiency of a target is used. Another object is to provide a novel oxide, a novel semiconductor, a manufacturing method of the novel oxide, or a manufacturing method of the novel semiconductor.

Note that the descriptions of these objects do not preclude the existence of other objects. In one embodiment of the present invention, there is no need to achieve all the objects. Other objects will be apparent from and can be derived from the descriptions of the specification, the drawings, the claims, and the like.

One embodiment of the present invention is a semiconductor device including a first insulator over a substrate, a first oxide semiconductor over the first insulator, a second oxide semiconductor over the first oxide semiconductor, a first conductor and a second conductor in contact with the second oxide semiconductor, a third oxide semiconductor on the second oxide semiconductor and the first and second conductors, a second insulator over the third oxide semiconductor, and a third conductor over the second insulator. At least one of the first oxide semiconductor, the second oxide semiconductor, and the third oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.3° and less than 33.5°.

One embodiment of the present invention is a semiconductor device including a first insulator over a substrate, a first oxide semiconductor over the first insulator, a second oxide semiconductor over the first oxide semiconductor, a first conductor and a second conductor in contact with the second oxide semiconductor, a third oxide semiconductor on the second oxide semiconductor and the first and second conductors, a second insulator over the third oxide semiconductor, and a third conductor over the second insulator. At least one of the first oxide semiconductor, the second oxide semiconductor, and the third oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.8° and less than 32.8°.

In the semiconductor device of one embodiment of the present invention, lattice spacing in at least one of the first oxide semiconductor, the second oxide semiconductor, and the third oxide semiconductor may be longer than or equal to 0.27 nm and shorter than or equal to 0.28 nm in a normal direction of the substrate.

One embodiment of the present invention is a semiconductor device including a first conductor over a substrate, a first insulator over the first conductor, a first oxide semiconductor over the first insulator, a second oxide semiconductor over the first oxide semiconductor, and a second conductor and a third conductor in contact with the second oxide semiconductor. At least one of the first oxide semiconductor and the second oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.3° and less than 33.5°.

One embodiment of the present invention is a semiconductor device including a first conductor over a substrate, a first insulator over the first conductor, a first oxide semiconductor over the first insulator, a second oxide semiconductor over the first oxide semiconductor, and a second conductor and a third conductor in contact with the second oxide semiconductor. At least one of the first oxide semiconductor and the second oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.8° and less than 32.8°.

In the semiconductor device of one embodiment of the present invention, lattice spacing in at least one of the first oxide semiconductor and the second oxide semiconductor may be longer than or equal to 0.27 nm and shorter than or equal to 0.28 nm in a normal direction of the substrate.

One embodiment of the present invention is a semiconductor device including a first conductor over a substrate, a first insulator over the first conductor, a first oxide semiconductor over the first insulator, a second oxide semiconductor over the first oxide semiconductor, a third oxide semiconductor over the second oxide semiconductor, and a second conductor and a third conductor in contact with the third oxide semiconductor. At least one of the first oxide semiconductor and the second oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.3° and less than 33.5°.

One embodiment of the present invention is a semiconductor device including a first conductor over a substrate, a first insulator over the first conductor, a first oxide semiconductor over the first insulator, a second oxide semiconductor over the first oxide semiconductor, a third oxide semiconductor over the second oxide semiconductor, and a second conductor and a third conductor in contact with the third oxide semiconductor. At least one of the first oxide semiconductor and the second oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.8° and less than 32.8°.

In the semiconductor device of one embodiment of the present invention, lattice spacing in at least one of the first oxide semiconductor, the second oxide semiconductor, and the third oxide semiconductor may be longer than or equal to 0.27 nm and shorter than or equal to 0.28 nm in a normal direction of the substrate.

One embodiment of the present invention is a display device including any of the semiconductor devices and a display element.

One embodiment of the present invention is a display module including the display device and a touch sensor.

One embodiment of the present invention is an electronic device including any of the semiconductor devices, the display device, or the display module; and an operation key or a battery.

One embodiment of the present invention is a manufacturing method of an oxide, which is a sputtering method using a deposition chamber, a pair of targets positioned in the deposition chamber, a substrate, and magnets for making a space between the pair of targets a magnetic field space. The target contains indium, zinc, an element M (aluminum, gallium, yttrium, or tin), and oxygen. In the manufacturing method, the substrate is placed between the pair of targets, a sputtering gas containing oxygen and/or a rare gas is supplied to the deposition chamber to adjust pressure in the deposition chamber to higher than or equal to 0.005 Pa and lower than or equal to 0.09 Pa, a sputtering power is supplied to the pair of targets to generate plasma, the pair of targets is sputtered using ions in the plasma, and particles sputtered from the pair of targets are deposited on the substrate.

One embodiment of the present invention is a manufacturing method of an oxide, which is a sputtering method using a deposition chamber, a pair of targets positioned in the deposition chamber, a substrate, and magnets for making a space between the pair of targets a magnetic field space. The target contains indium, zinc, an element M (aluminum, gallium, yttrium, or tin), and oxygen. In the manufacturing method, the substrate is placed beside the space between the pair of targets, a sputtering gas containing oxygen and/or a rare gas is supplied to the deposition chamber to adjust pressure in the deposition chamber to higher than or equal to 0.005 Pa and lower than or equal to 0.09 Pa, a sputtering power is supplied to the pair of targets to generate plasma, the pair of targets is sputtered using ions in the plasma, and particles sputtered from the pair of targets are deposited on the substrate.

In the manufacturing method of an oxide of one embodiment of the present invention, the substrate may be placed in a positive column of the plasma.

In the manufacturing method of an oxide of one embodiment of the present invention, L1 and L2 may be each longer than or equal to 10 mm and shorter than or equal to 200 mm, where L1 is a horizontal distance from one of the pair of targets to the substrate and L2 is a horizontal distance from the other of the pair of targets to the substrate.

In the manufacturing method of an oxide of one embodiment of the present invention, temperature of the substrate during deposition may be higher than or equal to 10° C. and lower than 100° C.

In the manufacturing method of an oxide of one embodiment of the present invention, temperature of the substrate during deposition may be higher than or equal to 100° C. and lower than or equal to 500° C.

In the manufacturing method of an oxide of one embodiment of the present invention, the oxide may be formed over a surface of an amorphous structure.

In the manufacturing method of an oxide of one embodiment of the present invention, lattice spacing in the oxide may be longer than or equal to 0.27 nm and shorter than or equal to 0.28 nm in a normal direction of the substrate.

One embodiment of the present invention is an oxide containing indium, zinc, an element M (aluminum, gallium, yttrium, or tin), and oxygen. The oxide has a layered crystal structure including a layer containing indium and oxygen and a layer containing zinc, the element M, and oxygen. The oxide has a crystallinity peak that corresponds to a (hkl) plane (h =0, k=0, l is a natural number) observed by X-ray diffraction using a Cu Kα radiation as a radiation source. The peak appears at a diffraction angle 2θ greater than or equal to 31.3° and less than 33.5°.

One embodiment of the present invention is an oxide containing indium, zinc, an element M (aluminum, gallium, yttrium, or tin), and oxygen. The oxide has a layered crystal structure including a layer containing indium and oxygen and a layer containing zinc, the element M, and oxygen. The oxide has a crystallinity peak that corresponds to a (hkl) plane (h =0, k=0, l is a natural number) observed by X-ray diffraction using a Cu Kα radiation as a radiation source. The peak appears at a diffraction angle 2θ greater than or equal to 31.8° and less than 32.8°.

In the oxide of one embodiment of the present invention, lattice spacing may be longer than or equal to 0.27 nm and shorter than or equal to 0.28 nm in a normal direction of a top surface of the layer containing indium and oxygen.

According to one embodiment of the present invention, a transistor with stable electrical characteristics, a transistor with normally-off electrical characteristics, a transistor having a small subthreshold swing value, a transistor having a small short-channel effect, a transistor having a low leakage current in an off state, a transistor with excellent electrical characteristics, a highly reliable transistor, or a transistor with high frequency characteristics can be provided.

Alternatively, a semiconductor device including any of the above transistors; a display device including the semiconductor device; a display module including the display device; an electronic device including the semiconductor device, the display device, or the display module; a novel semiconductor device; a novel display device; a novel display module; or a novel electronic device can be provided.

According to one embodiment of the present invention, an oxide that can be used for a semiconductor or the like of a transistor, an oxide with high crystallinity, a crystalline oxide with high orientation, an oxide with few defects, an oxide with low impurity concentration, a manufacturing method of an oxide which causes small damage to a formation surface, a manufacturing method of an oxide with a high deposition rate, a manufacturing method of an oxide in which a sputtering method with a high utilization efficiency of a target is used, a novel oxide, a novel semiconductor, a manufacturing method of the novel oxide, or a manufacturing method of the novel semiconductor can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 18A to 18D are Cs-corrected high-resolution TEM images of a plane of a CAAC-OS.

FIGS. 28A to 28G illustrate positions to which particles can be attached in a pellet.

FIGS. 65A1 to 65A3 and FIGS. 65B1 to 65B3 are perspective views and cross-sectional views illustrating semiconductor devices of one embodiment of the present invention.

BEST MODE FOR CARRYING OUT THE INVENTION

Figure 1A:
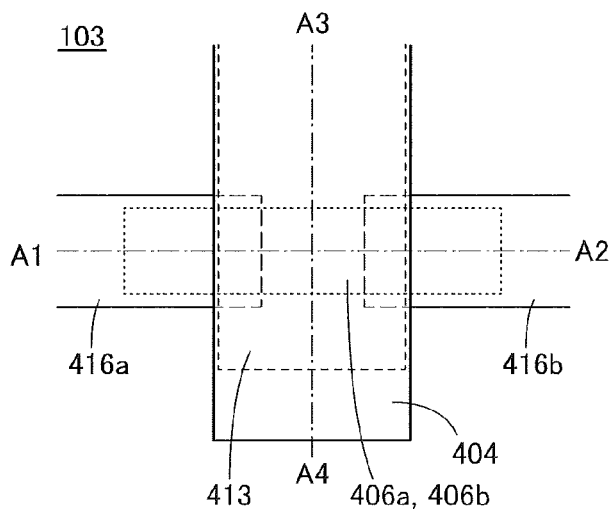
FIGS. 1A and 1B are a top view and a cross-sectional view illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

The ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when, for example, the conductivity is sufficiently high. Furthermore, a "semiconductor" and a "conductor" cannot be strictly distinguished from each other in some cases because the border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is regarded as an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B," "the average concentration in a region of A in the depth direction is B," "the median value of a concentration in a region of A in the depth direction is B," "the maximum value of a concentration in a region of A in the depth direction is B," "the minimum value of a concentration in a region of A in the depth direction is B," "a convergence value of a concentration in a region of A in the depth direction is B," and "a concentration in a region of A in which a probable value is obtained in measurement is B."

In this specification, the phrase "A has a region with a size B, a length B, a thickness B, a width B, or a distance B" includes, for example, "the size, the length, the thickness, the width, or the distance of the entire region in a region of A is B," "the average value of the size, the length, the thickness, the width, or the distance of a region of A is B," "the median value of the size, the length, the thickness, the width, or the distance of a region of A is B," "the maximum value of the size, the length, the thickness, the width, or the distance of a region of A is B," "the minimum value of the size, the length, the thickness, the width, or the distance of a region of A is B," "a convergence value of the size, the length, the thickness, the width, or the distance of a region of A is B," and "the size, the length, the thickness, the width, or the distance of a region of A in which a probable value is obtained in measurement is B."

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed, in a top view. In one transistor, channel widths in all regions are not necessarily the same. In other words, the channel width of one transistor is not limited to one value in some cases. Therefore, in this specification, the channel with is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 50. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, a term "semiconductor" can be referred to as an "oxide semiconductor." As the semiconductor, a Group 14 semiconductor such as silicon or germanium; a compound semiconductor such as silicon carbide, germanium silicide, gallium arsenide, indium phosphide, zinc selenide, cadmium sulfide, or an oxide semiconductor, a carbon nanotube; graphene; or an organic semiconductor can be used.

Note that in this specification and the like, a "silicon oxynitride film" refers to a film that contains oxygen at a higher proportion than nitrogen, and a "silicon nitride oxide film" refers to a film that contains nitrogen at a higher proportion than oxygen.

In the case where at least one specific example is described in a diagram or text in one embodiment in this specification and the like, it will be readily appreciated by those skilled in the art that a broader concept of the specific example can be derived. Therefore, in the case where at least one specific example is described in the diagram or the text in one embodiment, a broader concept of the specific example is disclosed as one embodiment of the invention, and one embodiment of the invention can be constituted. The embodiment of the invention is clear.

In this specification and the like, a content described in at least a diagram (or part of the diagram) is disclosed as one embodiment of the invention, and one embodiment of the invention can be constituted. Therefore, when a certain content is described in a diagram, the content is disclosed as one embodiment of the invention even when the content is not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

In addition, contents that are not specified in any text or drawing in the specification can be excluded from one embodiment of the invention. Alternatively, when the range of a value that is defined by the maximum and minimum values is described, the range is appropriately narrowed or part of the range is removed, whereby one embodiment of the invention excluding part of the range can be constructed. In this manner, it can be specified that a conventional technology is excluded from the technical scope of one embodiment of the present invention, for example.

(Embodiment 1)

In this embodiment, an example of a transistor of one embodiment of the present invention will be described.

<Transistor 1>

Figure 1B:
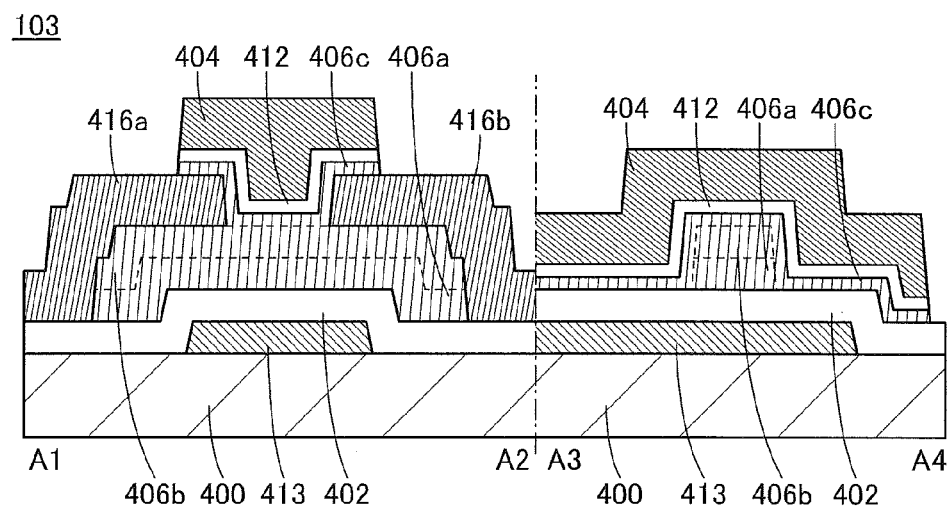

FIGS. 1A and 1B illustrate a transistor of one embodiment of the present invention. FIG. 1A is a top view of a transistor 103, and FIG. 1B is a cross-sectional view taken along dashed-dotted lines A1-A2 and A3-A4 in FIG. 1A. The transistor 103 includes a substrate 400, a conductor 413, an insulator 402, a semiconductor 406a, a semiconductor 406b, a semiconductor 406c, a conductor 416a, a conductor 416b, an insulator 412, and a conductor 404.

In the transistor 103 of this embodiment, at least one of the semiconductor 406a, the semiconductor 406b, and the semiconductor 406c preferably has a crystallinity peak that corresponds to a (hkl) plane (h=0, k=0, l is a natural number) observed by X-ray diffraction using a Cu Kα radiation as a radiation source. The peak preferably appears at a diffraction angle 2θ greater than or equal to 31.3° and less than 33.5°. The peak may appear at a diffraction angle 2θ greater than or equal to 31.8° and less than 32.8°.

Furthermore, in the transistor 103 of this embodiment, lattice spacing in at least one of the semiconductor 406a, the semiconductor 406b, and the semiconductor 406c is preferably longer than or equal to 0.27 nm and shorter than or equal to 0.28 nm in the normal direction of the substrate.

Note that the conductor 404 functions as a first gate electrode (also referred to as a front gate electrode) of the transistor 103. The conductor 413 functions as a second gate electrode (also referred to as a back gate electrode) of the transistor 103. The conductor 416a and the conductor 416b function as a source electrode and a drain electrode of the transistor 103. The insulator 412 functions as a gate insulator.

The transistor 103 in this embodiment is, although not limited to, a top-gate transistor including a back gate electrode. The transistor 103 may have a structure without a back gate electrode, for example. Alternatively, a bottom-gate structure may be used, in which case the conductor 413 serves as a front gate electrode and the conductor 404 serves as a back gate electrode. Further alternatively, a structure without the conductor 404 may be used.

A method for manufacturing the transistor 103 illustrated in FIGS. 1A and 1B will be described with reference to FIGS. 2A and 2B, FIGS. 3A and 3B, FIGS. 4A and 4B, FIGS. 5A and 5B, and FIGS. 6A to 6B.

FIG. 2A, FIG. 3A, FIG. 4A, FIG. 5A, and FIG. 6A are top views illustrating a method for manufacturing the transistor 103 of one embodiment of the present invention. FIG. 2B, FIG. 3B, FIG. 4B, FIG. 5B, and FIG. 6B are each a cross-sectional view taken along dashed-dotted lines A1-A2 and A3-A4 shown in the corresponding top view.

First, the substrate 400 is prepared.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 1000 μm, preferably greater than or equal to 10 μm and less than or equal to 700 μm, and further preferably greater than or equal to 15 μm and less than or equal to 500 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Next, a conductor is formed. The conductor may be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes no plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method provides excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a certain composition can be formed by adjusting the flow rate ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, a resist or the like is formed over the conductor and processing is performed using the resist, whereby the conductor 413 is formed. Note that the case where the resist is simply formed also includes the case where an anti-reflective layer is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

The conductor to be the conductor 413 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 2A:
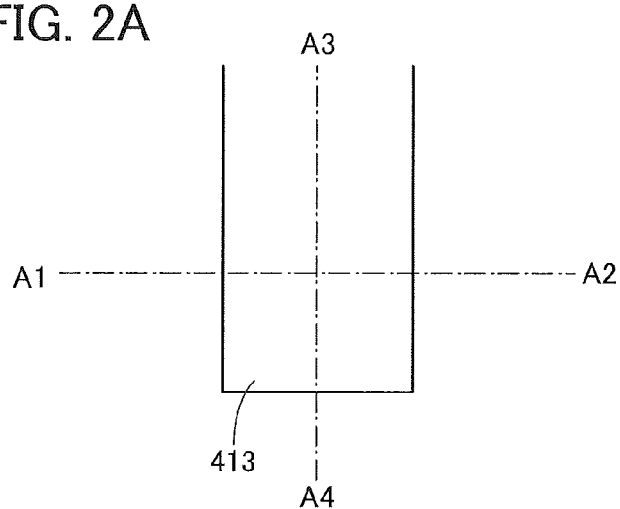
FIGS. 2A and 2B are a top view and a cross-sectional view illustrating a method for manufacturing a transistor of one embodiment of the present invention.
Figure 2B:
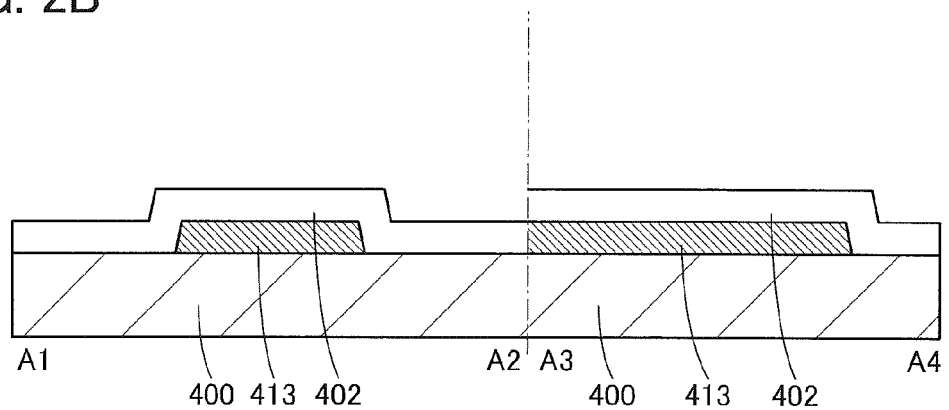

Then, the insulator 402 is formed (see FIGS. 2A and 2B). The insulator 402 can be formed by a sputtering method, a CVD method, an MBE method, a PLD method, an ALD method, or the like.

The insulator 402 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 preferably includes excess oxygen and/or a hydrogen trap.

Here, an insulator including excess oxygen may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a film surface temperature of 100° C. to 700° C. or 100° C. to 500° C.

The method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density of a signal attributed to the peroxide radical is greater than or equal to $5 \times 10^{17}$ spins/cm³. Note that the insulator containing a peroxide radical may have an asymmetric signal with a g factor of approximately 2.01 in electron spin resonance (ESR).

The insulator 402 may have a function of preventing diffusion of impurities from the substrate 400.

Next, a semiconductor to be the semiconductor 406a is deposited. The semiconductor to be the semiconductor 406a can be deposited by a sputtering method, a CVD method, an MBE method, a PLD method, an ALD method, or the like. It is particularly preferable to use a facing-target sputtering apparatus. Note that in this specification and the like, deposition using a facing-target sputtering apparatus can also be referred to as vapor deposition sputtering (VDSP).

The use of the facing-target sputtering apparatus can reduce plasma damage induced during deposition of the semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

Next, oxygen may be added so that a semiconductor to be the semiconductor 406a includes excess oxygen. The addition of oxygen may be performed by an ion implantation method at an acceleration voltage of greater than or equal to 2 kV and less than or equal to 10 kV at a dose of greater than or equal to $5 \times 10^{14}$ ions/cm² and less than or equal to $1 \times 10^{17}$ ions/cm², for example.

Next, a semiconductor to be the semiconductor 406b is deposited. The semiconductor to be the semiconductor 406b can be deposited by a sputtering method, a CVD method, an MBE method, a PLD method, an ALD method, or the like. It is particularly preferable to use a facing-target sputtering apparatus. Note that the semiconductor to be the semiconductor 406a and the semiconductor to be the semiconductor 406b are successively formed without being exposed to the air, in which case impurities can be prevented from entering the films and the interface therebetween.

The use of the facing-target sputtering apparatus can reduce plasma damage induced during deposition of the semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

Next, heat treatment is preferably performed. The heat treatment can reduce hydrogen concentration in the semiconductor to be the semiconductor 406a and in the semiconductor to be the semiconductor 406b in some cases. In addition, the heat treatment can reduce oxygen vacancies in the semiconductor to be the semiconductor 406a and in the semiconductor to be the semiconductor 406b in some cases. The heat treatment may be performed at higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the heat treatment, crystallinity of the semiconductor to be the semiconductor 406a and crystallinity of the semiconductor to be the semiconductor 406b can be increased and impurities such as hydrogen and water can be removed.

Figure 3A:
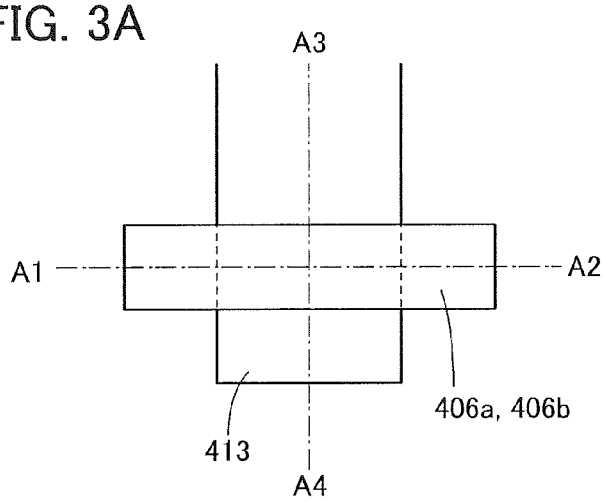
FIGS. 3A and 3B are a top view and a cross-sectional view illustrating a method for manufacturing a transistor of one embodiment of the present invention.
Figure 3B:
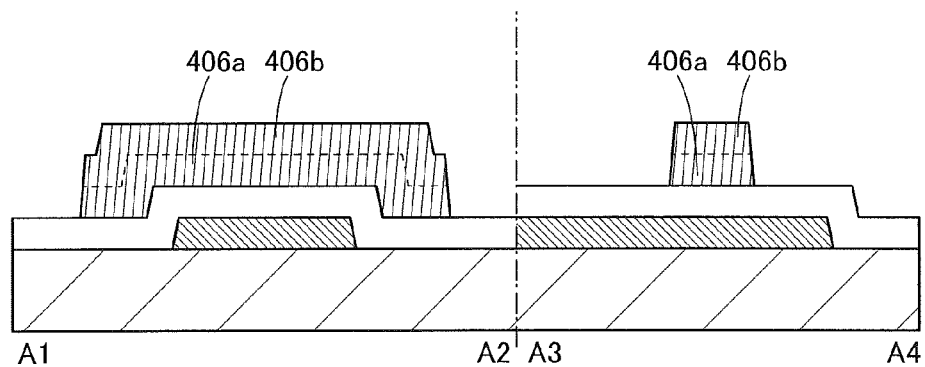

Then, a resist or the like is formed over the semiconductor to be the semiconductor 406b and processing is performed using the resist, whereby the semiconductor 406a and the semiconductor 406b are formed (see FIGS. 3A and 3B).

Next, a conductor is formed. The conductor can be deposited by a sputtering method, a CVD method, an MBE method, a PLD method, an ALD method, or the like.

The conductor may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 4A:
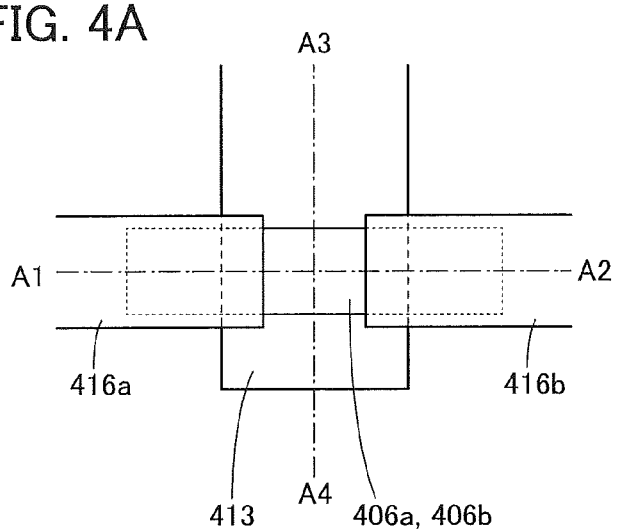
FIGS. 4A and 4B are a top view and a cross-sectional view illustrating a method for manufacturing a transistor of one embodiment of the present invention.
Figure 4B:
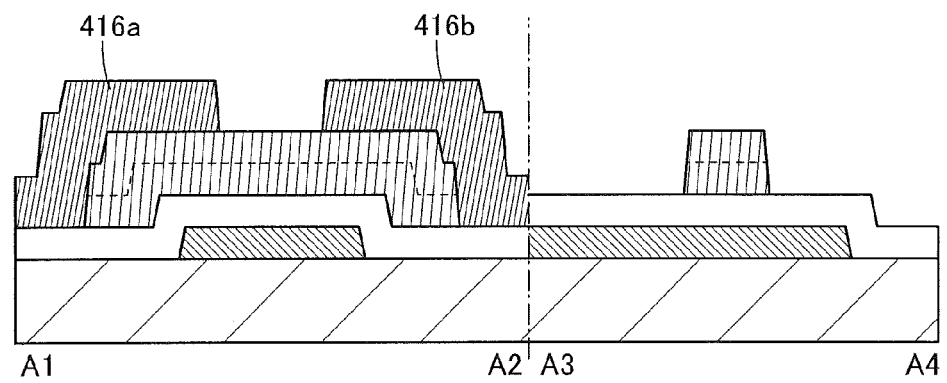
Figure 5A:
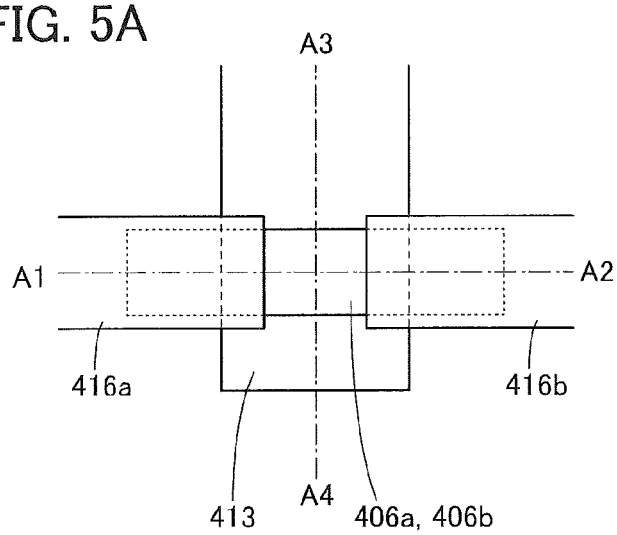
FIGS. 5A and 5B are a top view and a cross-sectional view illustrating a method for manufacturing a transistor of one embodiment of the present invention.
Figure 5B:
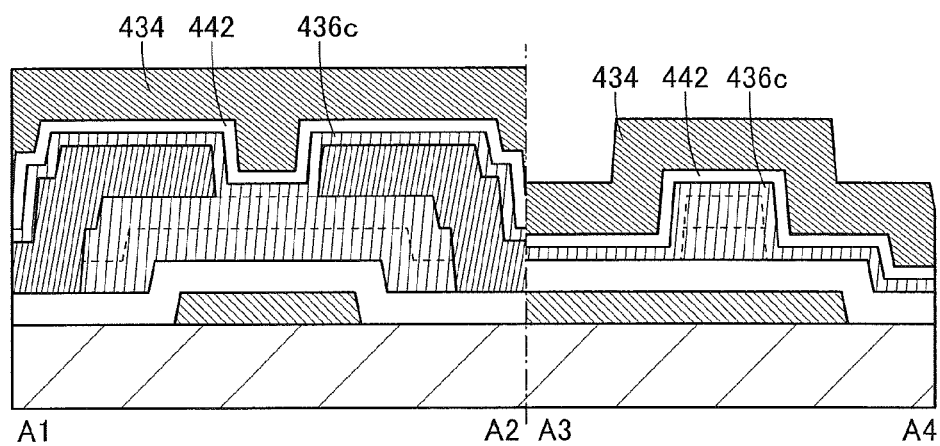

Next, a resist or the like is formed over the conductor, and the conductor is processed into a conductor 416a and a conductor 416b using the resist (see FIGS. 4A and 4B).

Oxygen may be added by an ion implantation method, an ion doping method, plasma treatment, or the like after the conductor 416a and the conductor 416b are formed.

When the conductor 413, the insulator 402, the conductor 416a, and the conductor 416b serve as a gate electrode, a gate insulator, a source electrode, and a drain electrode, respectively, for example, a bottom-gate transistor may be obtained by completing the steps up to FIGS. 4A and 4B.

Next, a semiconductor 436c is formed. The semiconductor 436c can be formed by a sputtering method, a CVD method, an MBE method, a PLD method, an ALD method, or the like. It is particularly preferable to use a facing-target sputtering apparatus. Before the formation of the semiconductor 436c, surfaces of the semiconductor 406a, the semiconductor 406b, the conductor 416a, and the conductor 416b may be etched. For example, plasma containing a rare gas can be used for the etching. After that, the semiconductor 436c is successively formed without being exposed to the air, whereby impurities can be prevented from entering interfaces between the semiconductor 436c and the semiconductor 406a, the semiconductor 406b, the conductor 416a, or the conductor 416b. In some cases, impurities at an interface between films are diffused more easily than impurities in a film. For this reason, a reduction in impurity at the interfaces leads to stable electrical characteristics of a transistor.

The use of the facing-target sputtering apparatus can reduce plasma damage induced during deposition of the semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

Next, an insulator 442 is formed. The insulator 442 can be formed by a sputtering method, a CVD method, an MBE method, a PLD method, an ALD method, or the like. Note that the semiconductor 436c and the insulator 442 are successively formed without being exposed to the air, in which case impurities can be prevented from entering the films and the interface therebetween.

The insulator 442 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 442 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Next, a conductor 434 is formed. The conductor 434 can be formed by a sputtering method, a CVD method, an MBE method, a PLD method, an ALD method, or the like. Note that the insulator 442 and the conductor 434 are successively formed without being exposed to the air, in which case impurities can be prevented from entering the films and the interface therebetween (see FIGS. 5A and 5B).

The conductor 434 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Then, a resist or the like is formed over the conductor 434 and the conductor 434 is processed into a conductor 404 using the resist. The insulator 442 is processed into an insulator 412 using the resist or the conductor 404. The semiconductor 436c is processed into a semiconductor 406c using the resist, the conductor 404, or the insulator 412. The semiconductor 406c, the insulator 412, and the conductor 404 have the same shape when seen from the above, but a transistor of one embodiment of the present invention is not limited to this shape. For example, the semiconductor 406c, the insulator 412, and the conductor 404 may be processed using different resists. For example, after the insulator 412 is formed, the conductor to be the conductor 404 may be formed; or after the conductor 404 is formed, a resist or the like may be formed over the insulator to be the insulator 412. For example, the semiconductor 406c may be shared between adjacent transistors or the like (see FIGS. 6A and 6B).

Oxygen may be added by an ion implantation method, an ion doping method, plasma treatment, or the like after the conductor 404 is formed.

Next, an insulator may be formed. The insulator can be formed by a sputtering method, a CVD method, an MBE method, a PLD method, an ALD method, or the like.

The insulator may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator may be formed to have a single-layer structure or a stacked-layer structure including an insulator containing, for example, aluminum oxide, silicon nitride oxide, silicon nitride, gallium oxide, yttrium oxide, zirconium oxide, lanthanum oxide, neodymium oxide, hafnium oxide, or tantalum oxide.

The insulator preferably has a function of a barrier layer. The insulator has, for example, a function of blocking oxygen and/or hydrogen. Alternatively, the insulator preferably has a higher capability of blocking oxygen and/or hydrogen than the insulator 402 and the insulator 412, for example.

Through the above process, the transistor 103 of one embodiment of the present invention can be manufactured.

Figure 6A:
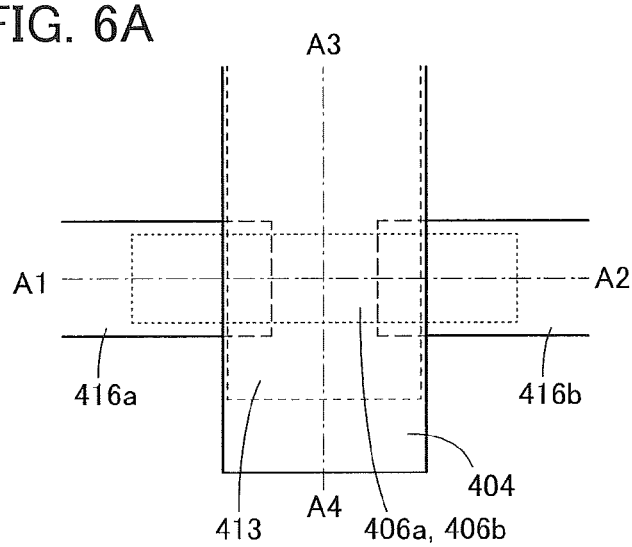
FIGS. 6A and 6B are a top view and a cross-sectional view illustrating a method for manufacturing a transistor of one embodiment of the present invention.
Figure 6B:
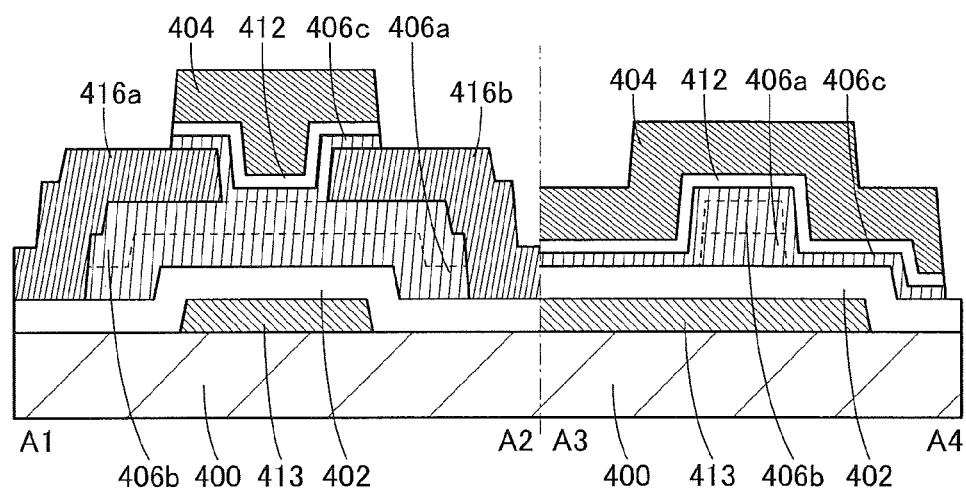

As illustrated in FIG. 6B, the semiconductor 406b can be electrically surrounded by an electric field of the conductor 404 and the conductor 413 (a structure in which a semiconductor is electrically surrounded by an electric field of a conductor is referred to as a surrounded channel (s-channel) structure). Therefore, a channel is formed in the entire semiconductor 406b (the top, bottom, and side surfaces). In the s-channel structure, a large amount of current can flow between a source and a drain of the transistor, so that a high on-state current can be achieved.

In the case where the transistor has the s-channel structure, a channel is formed also in the side surface of the semiconductor 406b. Therefore, as the semiconductor 406b has a larger thickness, the channel formation region becomes larger. In other words, the thicker the semiconductor 406b is, the larger the on-state current of the transistor is. In addition, when the semiconductor 406b is thicker, the proportion of the region with a high carrier controllability increases, leading to a smaller subthreshold swing value. For example, the semiconductor 406b has a region with a thickness of greater than or equal to 10 nm, preferably greater than or equal to 20 nm, further preferably greater than or equal to 40 nm, and still further preferably greater than or equal to 100 nm. In addition, to prevent a decrease in the productivity of the semiconductor device, the semiconductor 406b has a region with a thickness of, for example, less than or equal to 300 nm, preferably less than or equal to 200 nm, and further preferably less than or equal to 150 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, and still further preferably less than or equal to 20 nm and a region having a channel width of preferably less than or equal to 40 nm, further preferably less than or equal to 30 nm, and still further preferably less than or equal to 20 nm.

Figure 7A:
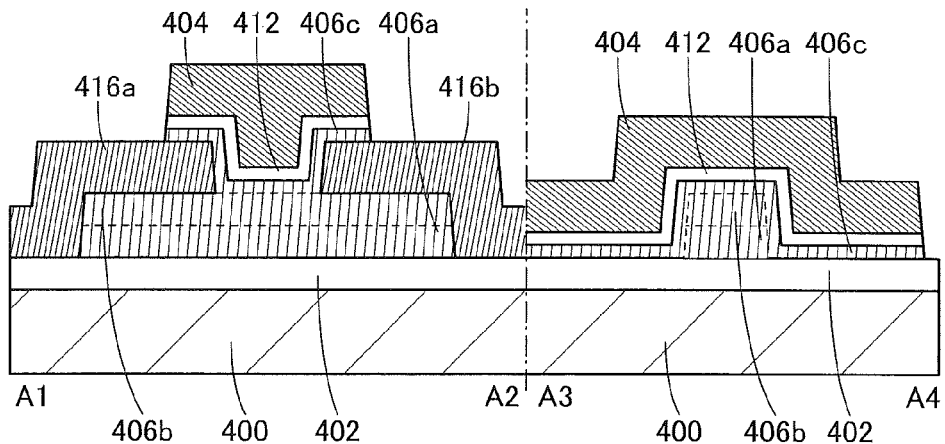
FIGS. 7A to 7C are cross-sectional views each illustrating a transistor of one embodiment of the present invention.
Figure 7B:
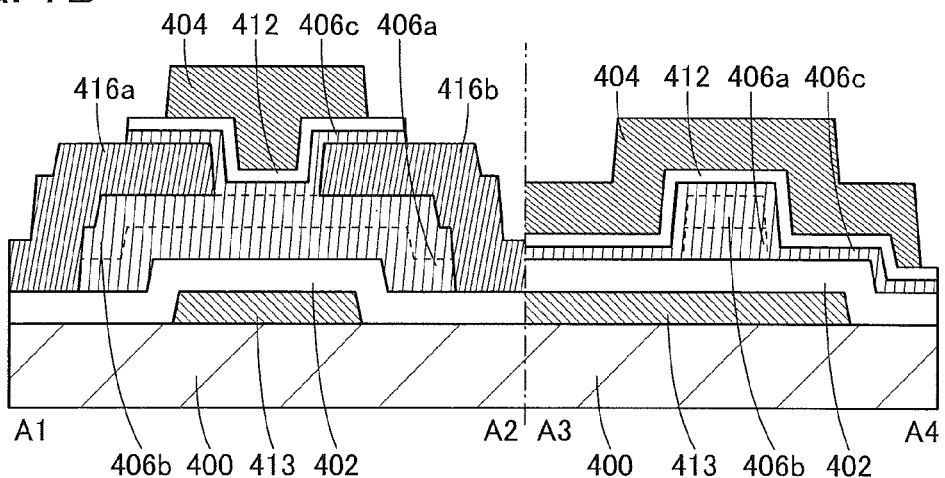
Figure 7C:
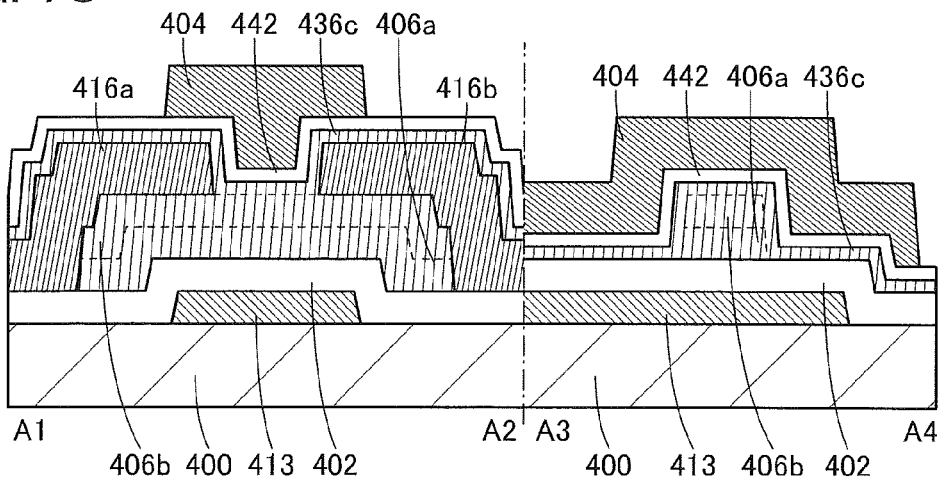
Figure 8A:
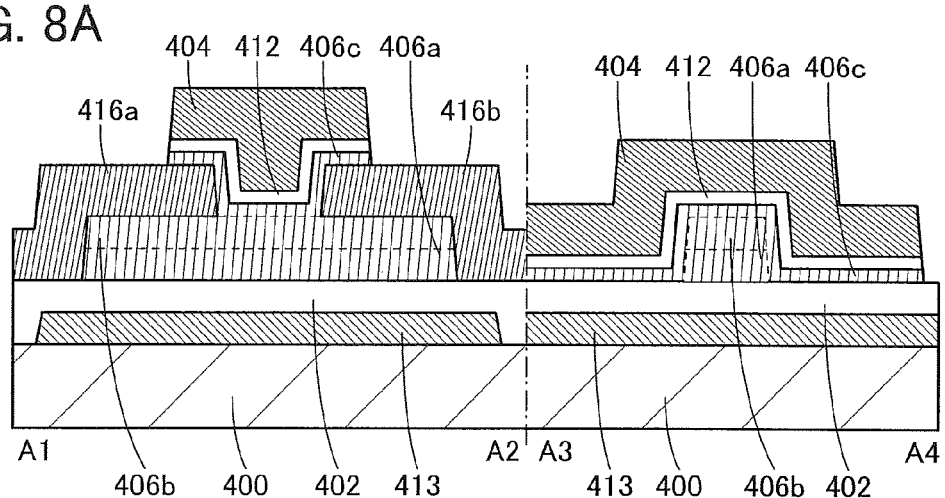
FIGS. 8A to 8C are cross-sectional views each illustrating a transistor of one embodiment of the present invention.
Figure 8B:
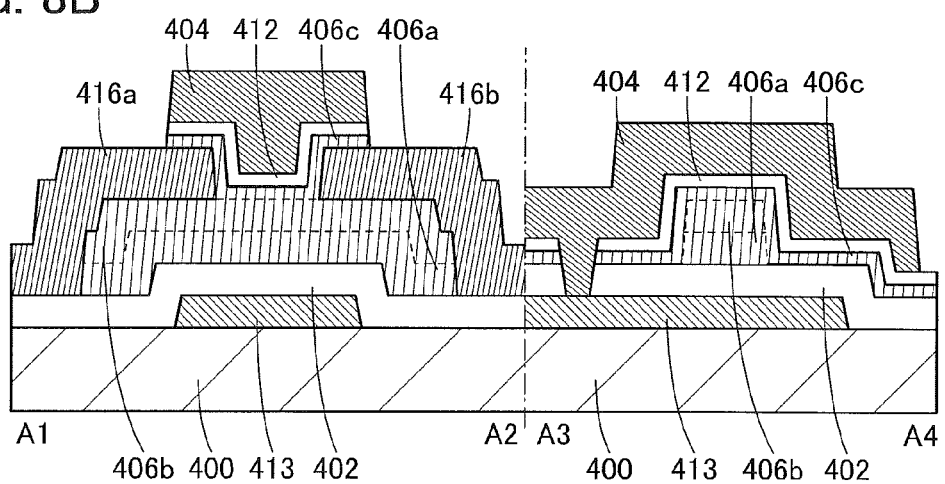
Figure 8C:
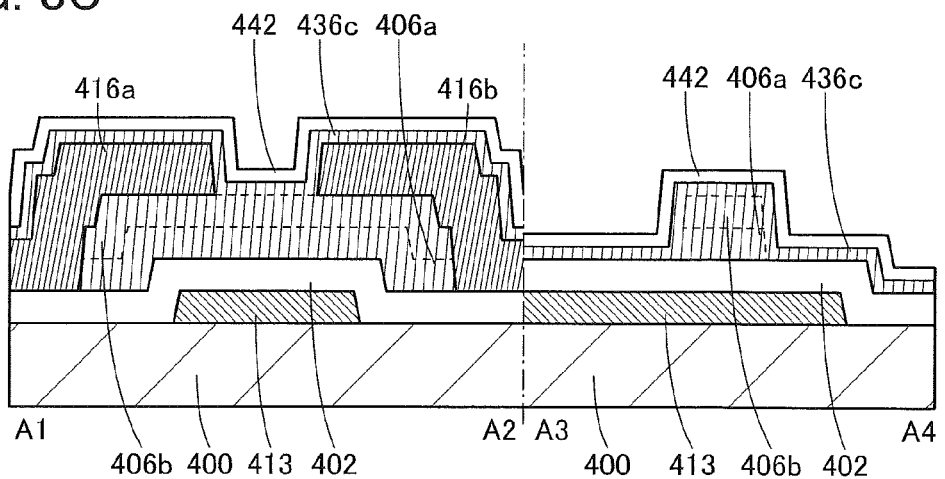

Note that the conductor 413 is not necessarily formed (see FIG. 7A). A shape in which the insulator 412 and the semiconductor 406c protrude from the conductor 404 may be employed (see FIG. 7B). The insulator 442 and the semiconductor 436c are not necessarily processed (see FIG. 7C). In the A1-A2 cross section, the width of the conductor 413 may be larger than that of the semiconductor 406b (see FIG. 8A). The conductor 413 may be in contact with the conductor 404 through an opening (see FIG. 8B). The conductor 404 is not necessarily formed (see FIG. 8C).

Note that the transistor in this embodiment has, although not limited to, a structure (top-contact structure) in which the top surface of a semiconductor is in contact with a source electrode and a drain electrode. The transistor may have, for example, a structure (bottom-contact structure) in which the bottom surface of a semiconductor is in contact with a source electrode and a drain electrode.

Furthermore, the transistor in this embodiment has, although not limited to, a structure in which a gate electrode partly overlaps with a source electrode and a drain electrode. Alternatively, the transistor may have, for example, a structure in which a gate electrode does not overlap with a source electrode and a drain electrode.

<Semiconductor>

As described in this embodiment, placing the semiconductor 406a under the semiconductor 406b and placing the semiconductor 406c over the semiconductor 406b can increase electrical characteristics of the transistor in some cases.

The semiconductor 406b is an oxide semiconductor containing indium, for example. The oxide semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, magnesium, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily crystallized, in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used, for example. For example, the energy gap of the semiconductor 406b is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406b. Since the semiconductor 406a and the semiconductor 406c each include one or more elements, or two or more elements other than oxygen included in the semiconductor 406b, a defect state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, and further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, and further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406b, and the semiconductor 406c are not necessarily simple ratios of integers.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The fraction of gallium atoms [Ga/(In+Ga)] is, for example, higher than or equal to 70%, preferably higher than or equal to 80%, further preferably higher than or equal to 90%.

When gate voltage is applied to such a transistor in which the semiconductor 406a is placed under the semiconductor 406b and the semiconductor 406c is placed over the semiconductor 406b, a channel is formed in the semiconductor 406b whose electron affinity is the highest among the semiconductor 406a, the semiconductor 406b, and the semiconductor 406c.

Figure 9:
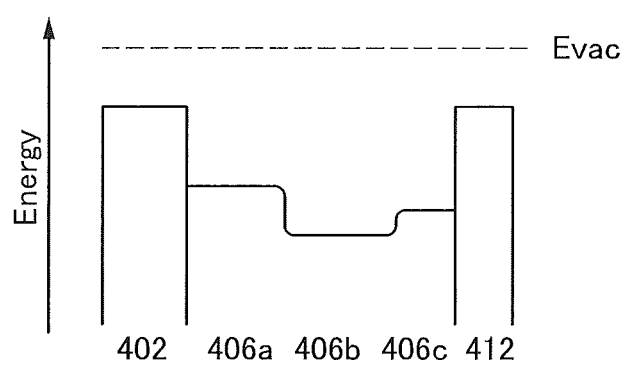
FIG. 9 is a band diagram of one embodiment of the present invention.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of defect states. For that reason, the stack including the semiconductor 406a, the semiconductor 406b, and the semiconductor 406c has a band structure where energy is changed continuously at each interface and in the vicinity of the interface (continuous junction) (see FIG. 9). Note that boundaries of the semiconductor 406a, the semiconductor 406b, and the semiconductor 406c are not clear in some cases.

At this time, electrons move mainly in the semiconductor 406b, not in the semiconductor 406a and the semiconductor 406c. As described above, when the density of defect states at the interface between the semiconductor 406a and the semiconductor 406b and the density of defect states at the interface between the semiconductor 406b and the semiconductor 406c are decreased, electron movement in the semiconductor 406b is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top surface or the bottom surface of the semiconductor 406b (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, and further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, and still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, and further preferably less than or equal to 80 nm.

A region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406a, for example. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406b and the semiconductor 406c.

It is preferable to reduce the hydrogen concentration in the semiconductor 406a and the semiconductor 406c in order to reduce the hydrogen concentration in the semiconductor 406b. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is also preferable to reduce the nitrogen concentration in the semiconductor 406a and the semiconductor 406c in order to reduce the nitrogen concentration in the semiconductor 406b. The semiconductor 406a and the semiconductor 406c includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) in which one of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

(Embodiment 2)

In this embodiment, a deposition method of an oxide of one embodiment of the present invention, in particular, a deposition method of an oxide semiconductor, will be described.

<Sputtering Apparatus>

A sputtering apparatus that is used for forming the oxide semiconductor of one embodiment of the present invention is described with reference to FIGS. 10A to 10C. The sputtering apparatus described with reference to FIGS. 10A to 10C is a facing-target sputtering apparatus.

Figure 10A:
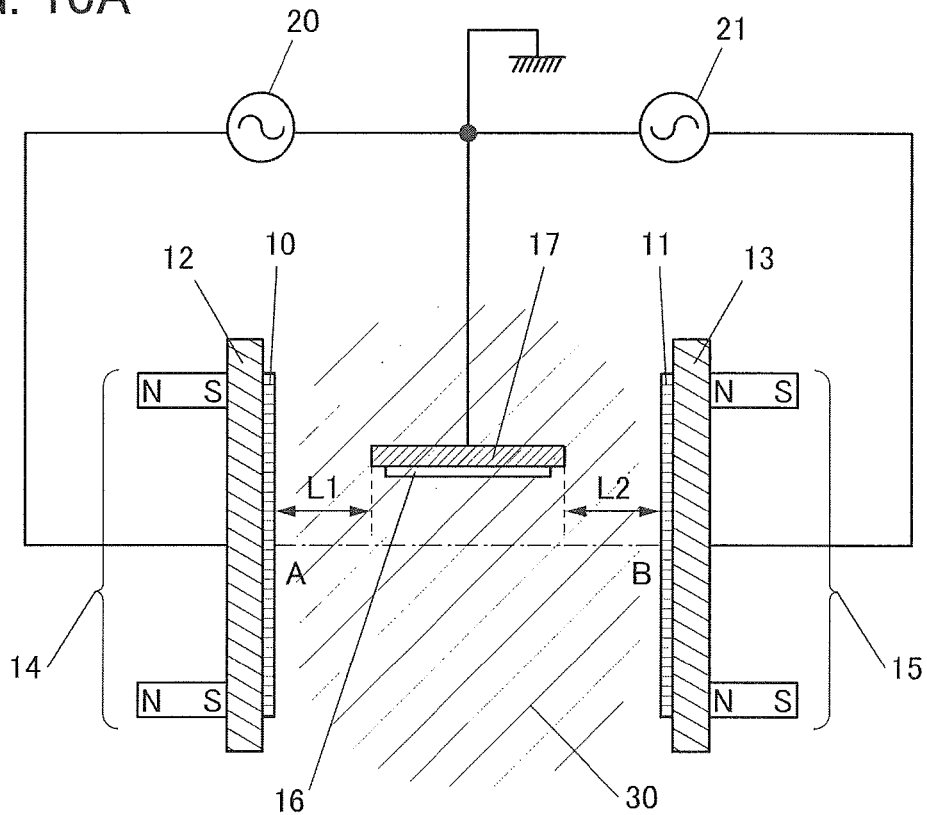
FIG. 10A illustrates a sputtering apparatus and FIGS. 10B and 10C each show potential distribution.
Figure 10B:
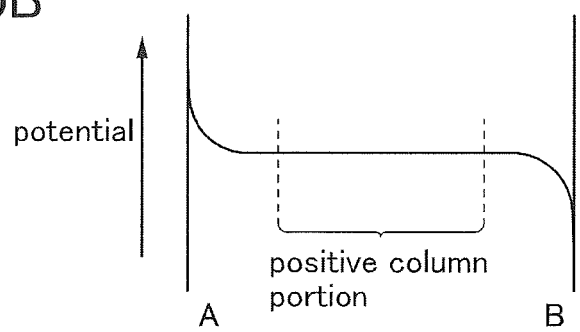
Figure 10C:
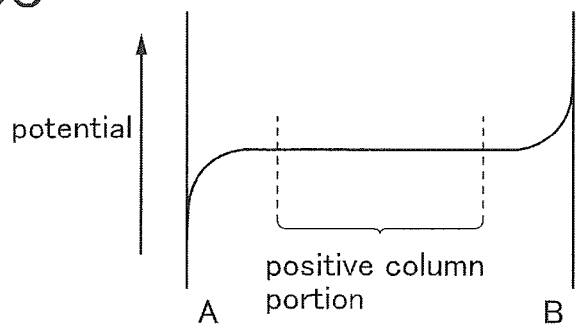

FIG. 10A is a schematic cross-sectional view of a deposition chamber of the sputtering apparatus. In the deposition chamber illustrated in FIG. 10A, a target 10, a target 11, a backing plate 12 for holding the target 10, a backing plate 13 for holding the target 11, a magnet 14 placed under the target 10 with the backing plate 12 positioned therebetween, and a magnet 15 placed under the target 11 with the backing plate 13 positioned therebetween are provided. A substrate holder 17 is placed between the target 10 and the target 11. Note that the magnet in this specification can also be called a cathode, a cathode magnet, a magnetic member, a magnetic part, or the like. When a substrate 16 is transferred into the deposition chamber, the substrate 16 is placed on the substrate holder 17.

The target 10 and the target 11 may face each other. In that case, the target 10 and the target 11 can be called a pair of targets or facing targets.

As the target 10 and the target 11, In-M-Zn oxide targets can be used, for example. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like.

Figure 11:
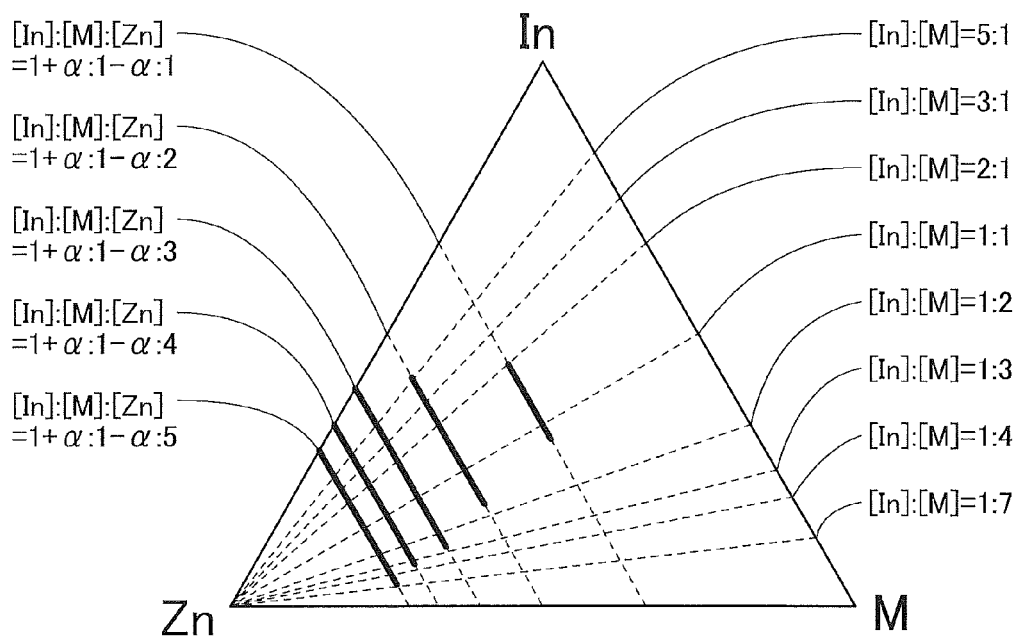
FIG. 11 is a triangular diagram for explaining composition of an In-M-Zn oxide.

FIG. 11 is a ternary diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide might have a homologous structure, in which case the crystal is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as $[In]:[M]:[Zn]=1+\alpha:1-\alpha:1$, $[In]:[M]:[Zn]=1+\alpha:1-\alpha:2$, $[In]:[M]:[Zn]=1+\alpha:1-\alpha:3$, $[In]:[M]:[Zn]=1+\alpha:1-\alpha:4$, and $[In]:[M]:[Zn]=1+\alpha:1-\alpha:5$. Note that the bold line on the dashed line represents, for example, the composition that allows an oxide as a raw material mixed and subjected to baking at 1350° C. to be a solid solution.

Thus, when an oxide has a composition close to the above composition that allows the oxide to be a solid solution, the crystallinity can be increased. When an In-M-Zn oxide is deposited by a sputtering method, the composition of a target might be different from the composition of a deposited film. For example, using an In-M-Zn oxide in which an atomic ratio is 1:1:1, 1:1:1.2, 3:1:2, 4:2:4.1, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 1:3:1.5 (approximately 1:3:1 to 1:3:1.8), 1:3:3 (approximately 1:3:2.5 to 1:3:3.5), or 1:4:4 (approximately 1:4:3.4 to 1:4:4.4).

Thus, in order to obtain a film with a desired composition, a composition of a target may be selected in consideration of a change in the composition. The sputtering apparatus described in this embodiment can reduce a difference between the composition of the target and the composition of the film to be deposited.

When a raw material with high purity is used, a sputtering target containing a polycrystalline oxide with low impurity concentration can be easily obtained. Specifically, the concentration of an alkali metal can be lower than 10 ppm by weight, preferably lower than 5 ppm by weight, and further preferably lower than 2 ppm by weight. The concentration of an alkaline earth metal can be lower than 5 ppm by weight, preferably lower than 2 ppm by weight, and further preferably lower than 1 ppm by weight. The concentration of halogen can be lower than 10 ppm by weight, preferably lower than 5 ppm by weight, and further preferably lower than 2 ppm by weight. The concentration of each of boron, magnesium, phosphorus, copper, and germanium can be lower than 5 ppm by weight, preferably lower than 2 ppm by weight, and further preferably lower than 1 ppm by weight. The concentration of nitrogen can be lower than 20 ppm by weight, preferably lower than 10 ppm by weight, further preferably lower than 5 ppm by weight, and still further preferably lower than 2 ppm by weight. The concentration of silicon can be lower than 50 ppm by weight, preferably lower than 20 ppm by weight, further preferably lower than 10 ppm by weight, and still further preferably lower than 5 ppm by weight. Note that the impurity concentration may be measured by secondary ion mass spectrometry (SIMS), glow discharge mass spectrometry (GDMS), inductively coupled plasma mass spectrometry (ICP-MS), or the like.

The target 10 and the target 11 do not necessarily contain indium. For example, an oxide target not containing indium but zinc, an oxide target not containing indium but gallium, or an oxide target not containing indium but tin, such as a zinc tin oxide or a gallium tin oxide, can be used.

The backing plates 12 and 13 have functions of fixing the targets 10 and 11.

As illustrated in FIG. 10A, a power source 20 and a power source 21 for applying potentials are connected to the backing plates 12 and 13. It is preferable to use AC power sources, which inversely apply alternate high and low potentials, as the power source 20 connected to the backing plate 12 and the power source 21 connected to the backing plate 13. Although AC power sources are used as the power sources 20 and 21 illustrated in FIG. 10A, one embodiment of the present invention is not limited thereto. For example, RF power sources, DC power sources, or the like can be used as the power sources 20 and 21. Alternatively, different kinds of power sources may be used as the power sources 20 and 21.

The substrate holder 17 is preferably connected to GND. The substrate holder 17 may be in a floating state.

FIGS. 10B and 10C each show potential distribution of plasma 30 along dashed-dotted line A-B in FIG. 10A. FIG. 10B shows the potential distribution in the case where a high potential is applied to the backing plate 12 and a low potential is applied to the backing plate 13. In that case, a cation is accelerated toward the target 11. FIG. 10C shows the potential distribution in the case where a low potential is applied to the backing plate 12 and a high potential is applied to the backing plate 13. In that case, a cation is accelerated toward the target 10. To deposit the oxide semiconductor of one embodiment of the present invention, the state in FIG. 10B and the state in FIG. 10C are alternated.

The oxide semiconductor of one embodiment of the present invention is preferably deposited while the plasma 30 completely reaches the substrate 16. For example, the substrate holder 17 and the substrate 16 are preferably placed in the plasma 30 as illustrated in FIG. 10A. It is particularly preferable that the substrate holder 17 and the substrate 16 be placed in a positive column of the plasma 30. The positive column of the plasma 30 is, in each of FIGS. 10B and 10C, a region around the midpoint of A and B where the gradient of the potential distribution is small. When the substrate 16 is placed in the positive column of the plasma 30 as illustrated in FIG. 10A, the substrate 16 is not exposed to a high electric field portion in the plasma 30; thus, damage to the substrate 16 due to the plasma 30 can be reduced and an oxide semiconductor with a favorable film quality can be obtained.

The oxide semiconductor of one embodiment of the present invention can be deposited in high vacuum (e.g., higher than or equal to 0.005 Pa and lower than or equal to 0.09 Pa). In that case, the concentration of impurities contained in the deposited oxide semiconductor can be reduced. Examples of the impurities include hydrogen, water, and a rare gas (e.g., argon). Deposition in high vacuum enables the plasma 30 to expand, in which case the plasma 30 can reach the substrate 16 even when the substrate holder 17 and the substrate 16 are placed above the position in FIG. 10A.

It is preferable to place the substrate holder 17 and the substrate 16 in the plasma 30 during deposition as illustrated in FIG. 10A also because utilization efficiencies of the targets 10 and 11 are increased.

As illustrated in FIG. 10A, the horizontal distance between the substrate holder 17 and the target 10 is referred to as L1 and the horizontal distance between the substrate holder 17 and the target 11 is referred to as L2. The distance L1 and the distance L2 are each preferably as long as the length of the substrate 16 in the horizontal direction in FIG. 10A. In addition, it is preferable that the distances L1 and L2 be adjusted as appropriate so that the substrate 16 is placed in the positive column of the plasma 30 as described above. The distances L1 and L2 can each be, for example, greater than or equal to 10 mm and less than or equal to 200 mm.

Figure 12A:
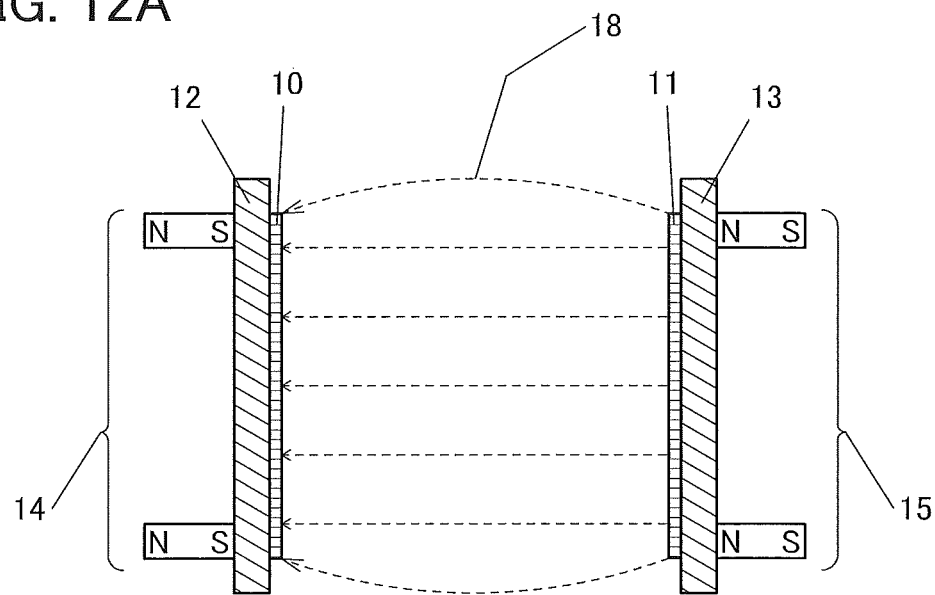
FIGS. 12A and 12B illustrate a sputtering apparatus.

FIG. 12A illustrates magnetic force lines 18 in a magnetic field space formed by the magnets 14 and 15 in the deposition chamber illustrated in FIG. 10A.

In FIG. 12A, the target 10 and the target 11 are parallel to each other. Moreover, the magnet 14 and the magnet 15 are placed so that opposite poles face each other. The magnetic force lines 18 are from the magnet 15 toward the magnet 14. Note that although the substrate holder 17 is placed parallel to the direction in which the target 10 and the target 11 face each other in FIG. 10A, the substrate holder 17 may be inclined to the direction. By inclination of the substrate holder 17 at 30° or more and 60° or less (typified by 45°), for example, the proportion of sputtered particles that perpendicularly reach the substrate 16 during deposition can be changed.

Figure 12B:
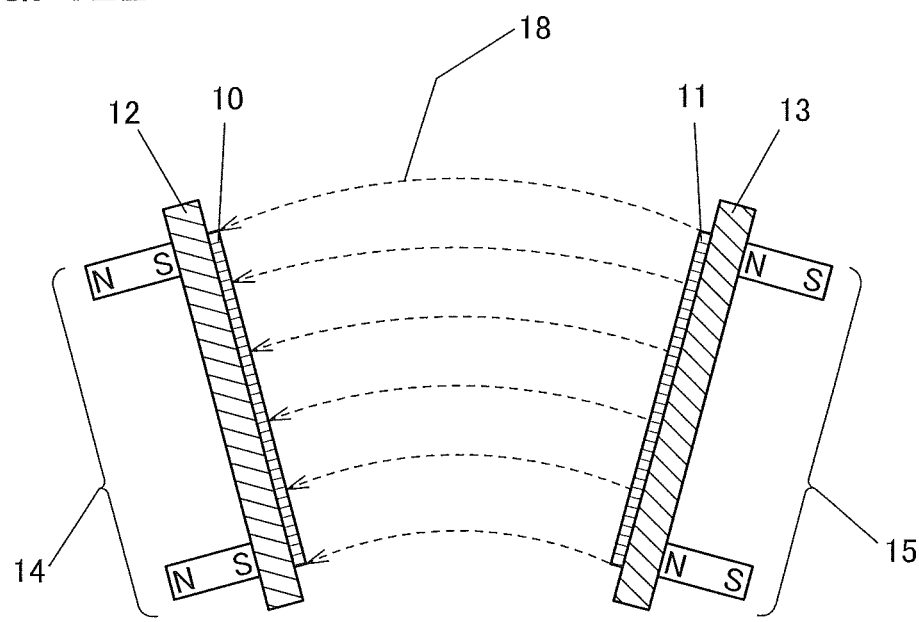

The structure illustrated in FIG. 12B is different from that illustrated in FIG. 12A in that the target 10 and the target 11 that face each other are not parallel but inclined to each other. Thus, the description for FIG. 12A is referred to for the description except for the positions of the targets. The magnet 14 and the magnet 15 are placed so that opposite poles face each other. With the targets 10 and 11 placed as illustrated in FIG. 12B, the proportion of sputtered particles that reach the substrate 16 can be increased; accordingly, the deposition rate can be increased.

The use of strong magnets as the magnet 14 and the magnet 15 can produce a strong magnetic field also around the top surface of the substrate 16. Specifically, the magnetic flux density in the horizontal direction on the top surface of the substrate 16 can be greater than or equal to 10 G and less than or equal to 100 G, preferably greater than or equal to 15 G and less than or equal to 60 G, and further preferably greater than or equal to 20 G and less than or equal to 40 G.

Note that the magnetic flux density in the horizontal direction may be measured when the magnetic flux density in the vertical direction is 0 G.

The magnetic flux density of the magnetic field in the above range can provide an oxide semiconductor with high density and high crystallinity. The deposited oxide semiconductor hardly includes plural kinds of crystal phases and is a substantially-single crystalline phase.

The magnets 14 and 15 may each have any shape such as a circle or an approximate circle. Note that the directions of the magnetic force lines between the magnets 14 and 15 can be changed if the magnets 14 and 15 rotate.

Figure 13:
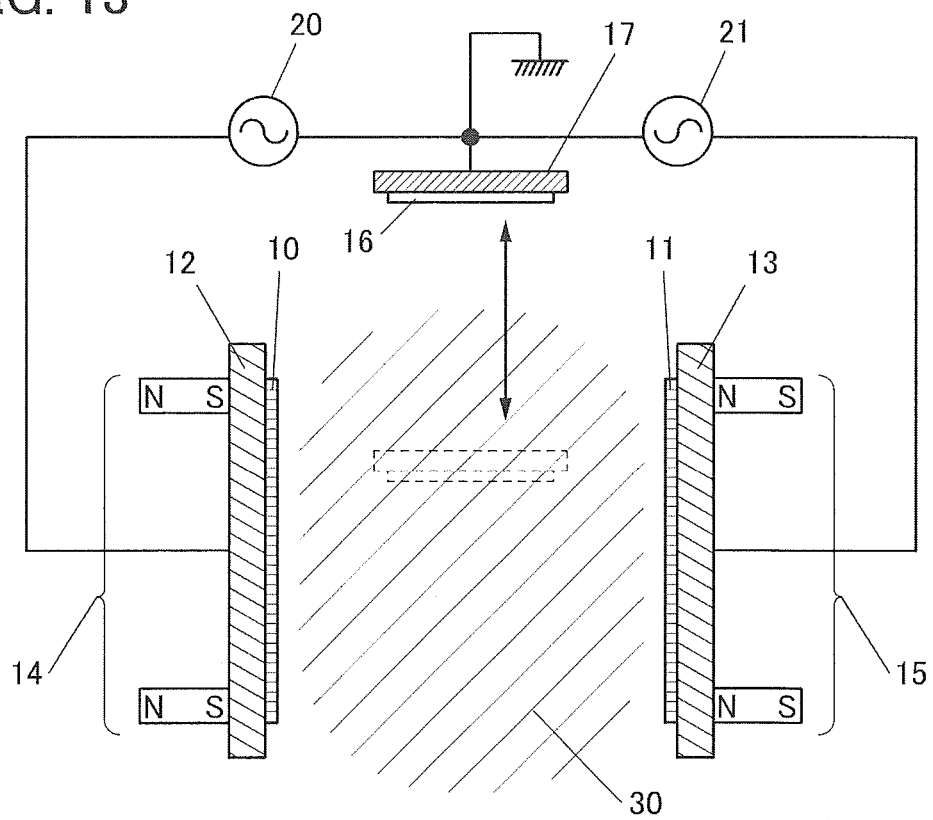
FIG. 13 illustrates a sputtering apparatus.

The positions of the substrate holder 17 and the substrate 16 are not limited to in the plasma 30 as illustrated in FIG. 10A. The substrate holder 17 and the substrate 16 may be placed outside the plasma 30 as illustrated in FIG. 13, for example. In that case, the surface of the substrate 16 is not exposed to a high electric field region of the plasma 30, leading to a reduction in damage due to the plasma 30. Note that the utilization efficiencies of the targets 10 and 11 are decreased as the distance between the plasma 30 and the substrate 16 are increased. It is preferable that the position of the substrate holder 17 be adjustable in the perpendicular direction as illustrated in FIG. 13.

The substrate holder 17 may be placed above a region where the target 10 and the target 11 face each other as illustrated in FIG. 13, or may be placed below the region. Alternatively, the substrate holders 17 may be placed above and below the region. When the substrate holders 17 are provided above and below the region, deposition on two or more substrates can be performed at once, leading to an increase in productivity. Further alternatively, the substrate holder 17 may be placed on the side of the region where the target 10 and the target 11 face each other.

A water channel may be provided inside or under the backing plates 12 and 13, for example. Making fluid (air, nitrogen, a rare gas, water, oil, or the like) flow through the water channel can prevent discharge anomaly due to an increase in the temperature of the targets 10 and 11, damage to the deposition chamber due to deformation of a component, and the like in the sputtering. In that case, the backing plate 12 and the backing plate 13 are preferably adhered to the target 10 and the target 11, respectively, with a bonding member because the cooling capability is increased.

To increase the crystallinity of the deposited oxide semiconductor, the temperature of the substrate 16 may be set high. The substrate 16 at high temperature can promote migration of sputtered particles at the top surface of the substrate 16. In addition, the amount of impurities contained during deposition can be reduced. Thus, an oxide semiconductor with higher density and higher crystallinity can be deposited. Note that the temperature of the substrate 16 is, for example, higher than or equal to 100° C. and lower than or equal to 500° C., preferably higher than or equal to 150° C. and lower than or equal to 400° C., and further preferably higher than or equal to 170° C. and lower than or equal to 350° C.

With the use of the facing-target sputtering apparatus as described in this embodiment, excellent crystallinity can be obtained even when the temperature of the substrate 16 is, for example, room temperature. The temperature of the substrate 16 may be higher than or equal to 10° C. and lower than 100° C., for example.

When the partial pressure of oxygen in the deposition gas is too high, an oxide including plural kinds of crystal phases is likely to be deposited; thus, a mixed gas of oxygen and a rare gas such as argon (other examples of the rare gas are helium, neon, krypton, and xenon) may be used as the deposition gas. For example, the proportion of oxygen in the whole deposition gas is less than 50 volume %, preferably less than or equal to 33 volume %, further preferably less than or equal to 20 volume %, and still further preferably less than or equal to 15 volume %.

Figure 14A:
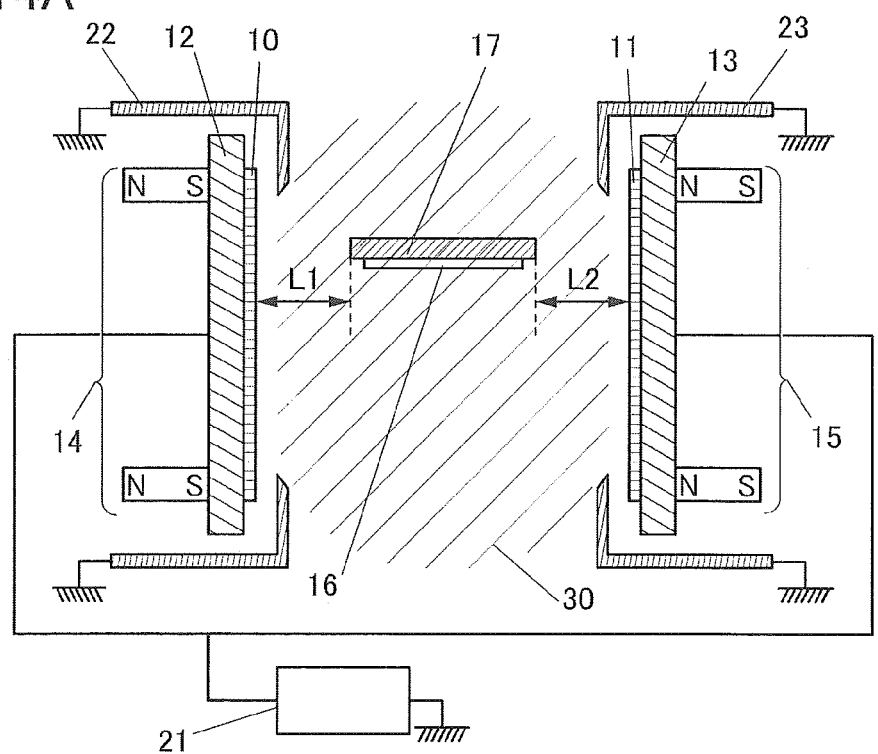
FIGS. 14A and 14B illustrate a sputtering apparatus.

FIG. 14A illustrates an example of a deposition chamber different from that in FIG. 10A.

FIG. 14A is a schematic cross-sectional view of the deposition chamber of a facing-target sputtering apparatus. Unlike in the deposition chamber illustrated in FIG. 10A, target shields 22 and 23 are provided. The power source 21 connected to the backing plates 12 and 13 is also provided.

As the power source 21, an AC power source, an RF power source, or a DC power source may be used. As illustrated in FIG. 14A, the power source 21 supplies the same potential to the backing plates 12 and 13.

The target shields 22 and 23 are connected to GND as illustrated in FIG. 14A. This means that the plasma 30 is generated by a difference between a potential that is applied to the backing plates 12 and 13 connected to the power source 21 and a potential that is applied to the target shields 22 and 23 connected to GND.

The oxide semiconductor of one embodiment of the present invention is preferably deposited while the plasma 30 completely reaches the substrate 16. For example, the substrate holder 17 and the substrate 16 are preferably placed in the plasma 30 as illustrated in FIG. 14A. It is particularly preferable that the substrate holder 17 and the substrate 16 be placed in a positive column of the plasma 30. The positive column of the plasma is a region where the gradient of the potential distribution is small. When the substrate 16 is placed in the positive column of the plasma 30 as illustrated in FIG. 14A, the substrate 16 is not exposed to a high electric field portion in the plasma 30; thus, damage to the substrate 16 due to the plasma 30 can be reduced and an oxide semiconductor with a favorable film quality can be obtained. Deposition in high vacuum (e.g., 0.05 Pa) enables the plasma 30 to expand, in which case the plasma 30 can reach the substrate 16 even when the substrate holder 17 and the substrate 16 are placed above the position in FIG. 14A.

It is preferable to place the substrate holder 17 and the substrate 16 in the plasma 30 during deposition as illustrated in FIG. 14A also because utilization efficiencies of the targets 10 and 11 are increased.

As illustrated in FIG. 14A, the horizontal distance between the substrate holder 17 and the target 10 is referred to as L1 and the horizontal distance between the substrate holder 17 and the target 11 is referred to as L2. The distance L1 and the distance L2 are each preferably as long as the length of the substrate 16 in the horizontal direction in FIG. 14A. In addition, it is preferable that the distances L1 and L2 be adjusted as appropriate so that the substrate 16 is placed in the positive column of the plasma 30 as described above.

Figure 14B:
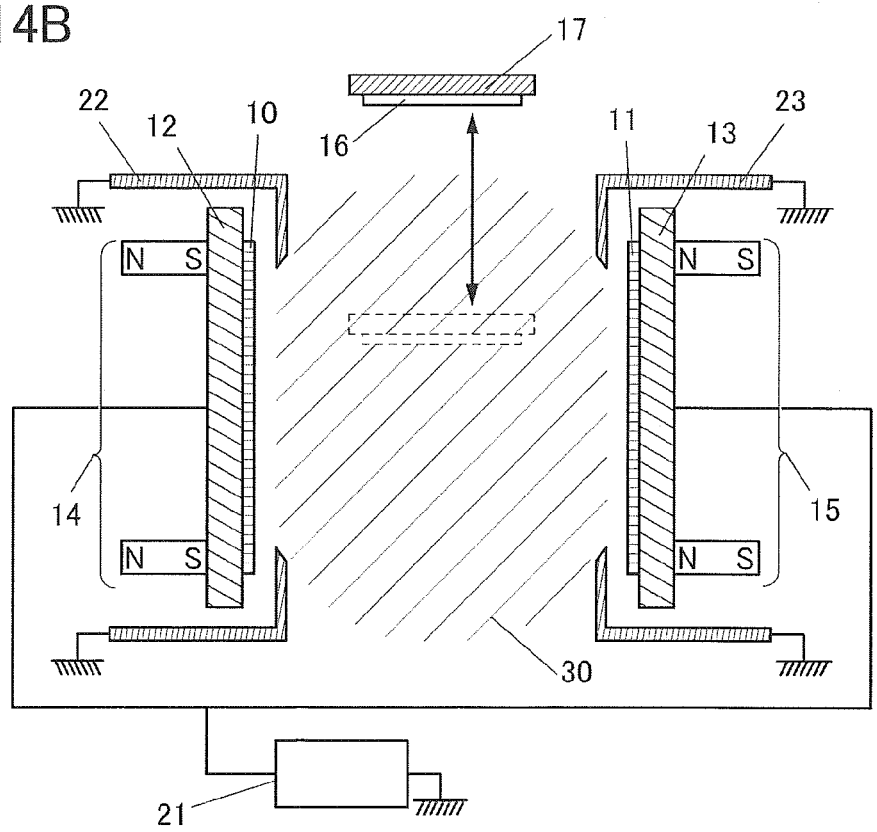

The positions of the substrate holder 17 and the substrate 16 are not limited to in the plasma 30 as illustrated in FIG. 14A. The substrate holder 17 and the substrate 16 may be placed outside the plasma 30 as illustrated in FIG. 14B, for example. In that case, the surface of the substrate 16 is not exposed to a high electric field region of the plasma 30, leading to a reduction in damage due to the plasma 30. Note that the utilization efficiencies of the targets 10 and 11 are decreased as the distance between the plasma 30 and the substrate 16 are increased. It is preferable that the position of the substrate holder 17 be adjustable as in FIG. 14B.

The substrate holder 17 may be placed above a region where the target 10 and the target 11 face each other as illustrated in FIG. 14B, or may be placed below the region. Alternatively, the substrate holders 17 may be placed above and below the region. Providing the substrate holders 17 above and below the region allows deposition on two or more substrates at once, leading to an increase in productivity. Note that the position above or below the region where the target 10 and the target 11 face each other can also be referred to as the side of the region where the target 10 and the target 11 face each other.

Deposition of an oxide semiconductor with the above-described facing-target sputtering apparatus can reduce plasma damage to a substrate, resulting in an oxide semiconductor with high film density and high crystallinity. Furthermore, an oxide semiconductor with few oxygen vacancies can be formed. In the case where the oxide semiconductor of one embodiment of the present invention is used as a semiconductor of a transistor, for example, a high field-effect mobility is achieved. An oxide semiconductor with high crystallinity can be formed even over a surface of an amorphous structure.

The oxide semiconductor of one embodiment of the present invention preferably contains indium, zinc, an element M (aluminum, gallium, yttrium, or tin), and oxygen. The oxide semiconductor has a layered crystal structure including a layer containing indium and oxygen and a layer containing zinc, the element M, and oxygen. Furthermore, the oxide semiconductor has a crystallinity peak that corresponds to a (hkl) plane (h=0, k=0, l is a natural number) observed by X-ray diffraction using a Cu Kα radiation as a radiation source. The peak appears at a diffraction angle 2θ greater than or equal to 31.3° and less than 33.5°.

The peak may appear at a diffraction angle 2θ greater than or equal to 31.8° and less than 32.8°.

In the oxide semiconductor, lattice spacing is longer than or equal to 0.27 nm and shorter than or equal to 0.28 nm in the normal direction of the top surface of the layer containing indium and oxygen (or in the normal direction of a substrate).

Moreover, the oxide semiconductor of one embodiment of the present invention is preferably a CAAC-OS (the details of the CAAC-OS will be described later).

As described in this embodiment, an oxide semiconductor that can be used for a semiconductor or the like of a transistor, an oxide semiconductor with high crystallinity, a crystalline oxide semiconductor with high orientation, an oxide semiconductor with few defects, an oxide semiconductor with low impurity concentration, a manufacturing method of an oxide semiconductor which causes small damage to a formation surface, a manufacturing method of an oxide semiconductor with a high deposition rate, or a manufacturing method of an oxide semiconductor in which a sputtering method with a high utilization efficiency of a target is used can be provided.

<Deposition Apparatus>

A deposition apparatus including a deposition chamber with which the CAAC-OS can be deposited will be described below.

First, a structure of a deposition apparatus which allows the entry of few impurities into a film at the time of the deposition or the like is described with reference to FIG. 15 and FIGS. 16A to 16C.

Figure 15:
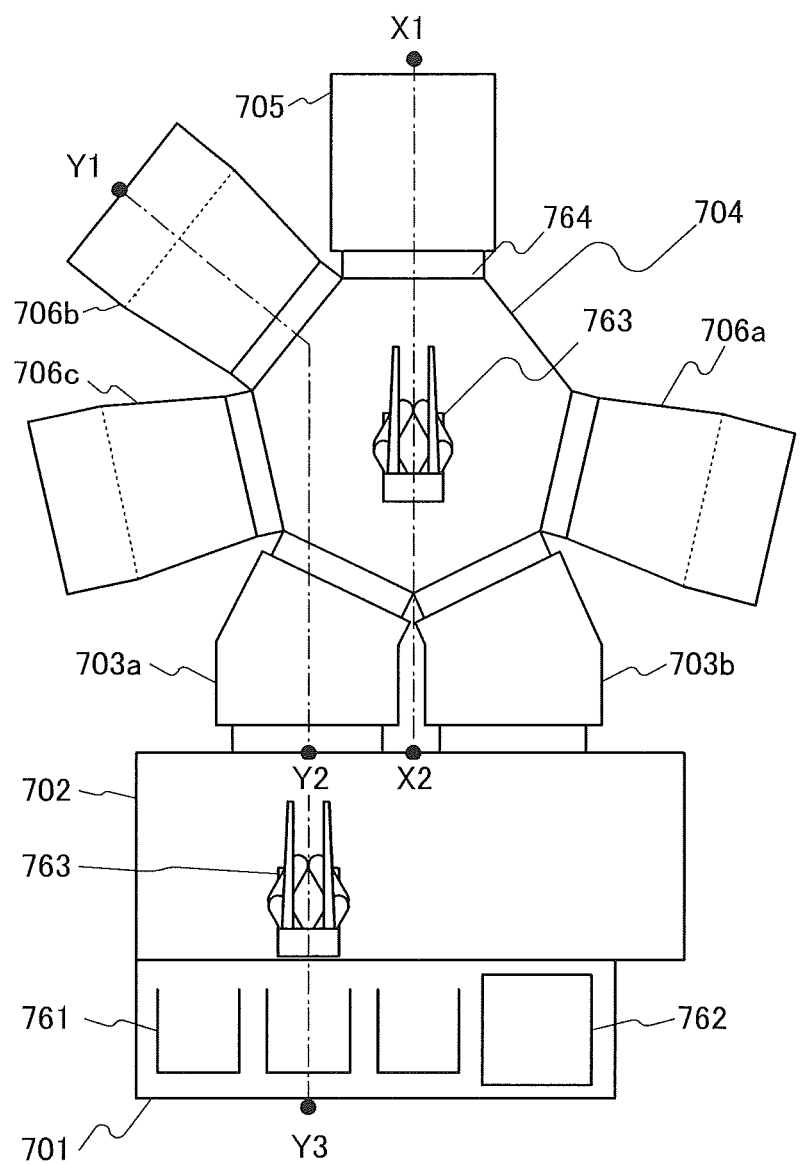
FIG. 15 is a top view illustrating an example of a deposition apparatus.

FIG. 15 is a top view schematically illustrating a single wafer multi-chamber deposition apparatus 700. The deposition apparatus 700 includes an atmosphere-side substrate supply chamber 701 including a cassette port 761 for holding a substrate and an alignment port 762 for performing alignment of a substrate, an atmosphere-side substrate transfer chamber 702 through which a substrate is transferred from the atmosphere-side substrate supply chamber 701, a load lock chamber 703a where a substrate is carried and the pressure inside the chamber is switched from atmospheric pressure to reduced pressure or from reduced pressure to atmospheric pressure, an unload lock chamber 703b where a substrate is carried out and the pressure inside the chamber is switched from reduced pressure to atmospheric pressure or from atmospheric pressure to reduced pressure, a transfer chamber 704 through which a substrate is transferred in a vacuum, a substrate heating chamber 705 where a substrate is heated, and deposition chambers 706a, 706b, and 706c in each of which a target is placed for deposition. Note that for the deposition chambers 706a, 706b, and 706c, the structure of the deposition chamber illustrated in FIG. 10A, FIG. 13, or FIGS. 14A and 14B can be referred to, for example.

The atmosphere-side substrate transfer chamber 702 is connected to the load lock chamber 703a and the unload lock chamber 703b, the load lock chamber 703a and the unload lock chamber 703b are connected to the transfer chamber 704, and the transfer chamber 704 is connected to the substrate heating chamber 705 and the deposition chambers 706a, 706b, and 706c.

Gate valves 764 are provided for connecting portions between chambers so that each chamber except the atmosphere-side substrate supply chamber 701 and the atmosphere-side substrate transfer chamber 702 can be independently kept under vacuum. Moreover, the atmosphere-side substrate transfer chamber 702 and the transfer chamber 704 each include a transfer robot 763, with which a substrate can be transferred.

Furthermore, it is preferable that the substrate heating chamber 705 also serve as a plasma treatment chamber. In the deposition apparatus 700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 16A:
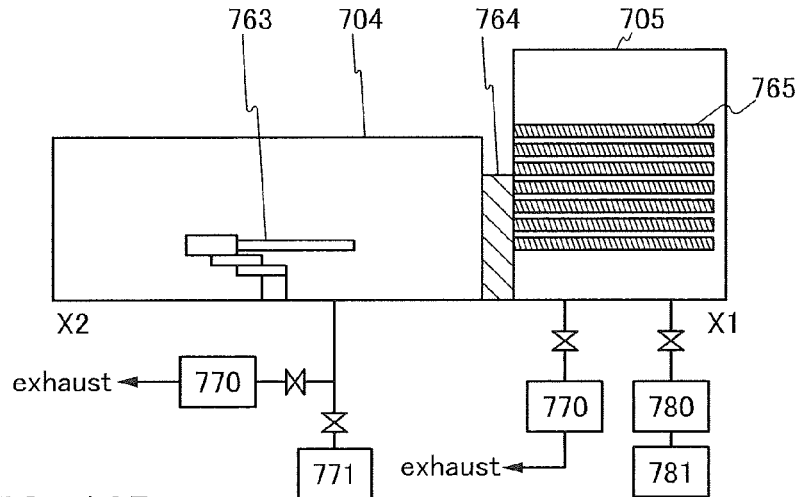
FIGS. 16A to 16C illustrate a structure example of a deposition apparatus.
Figure 16B:
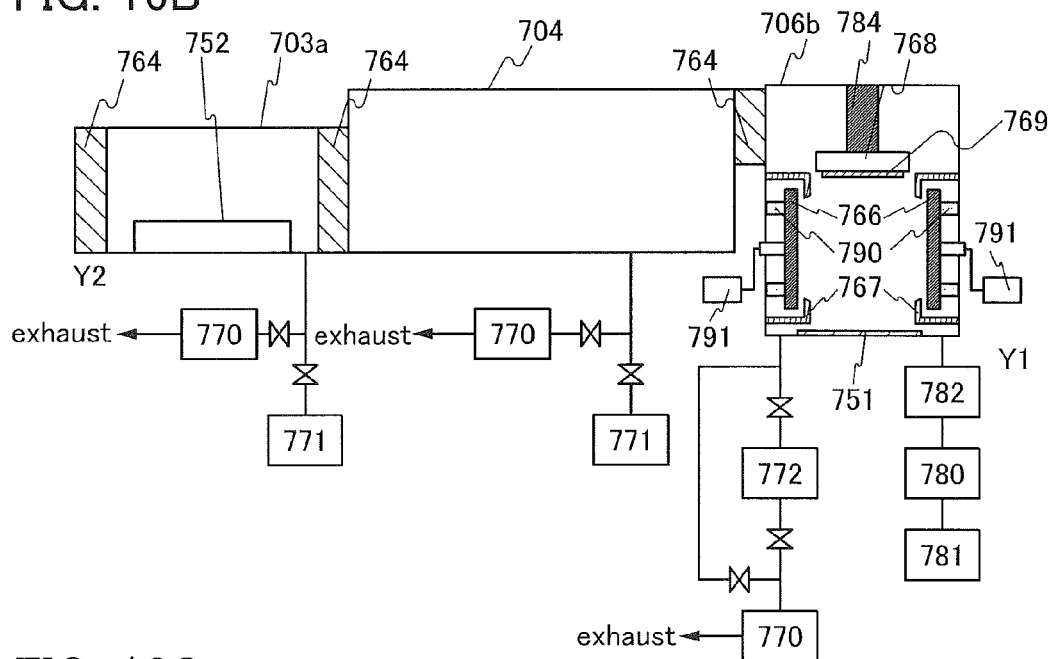
Figure 16C:
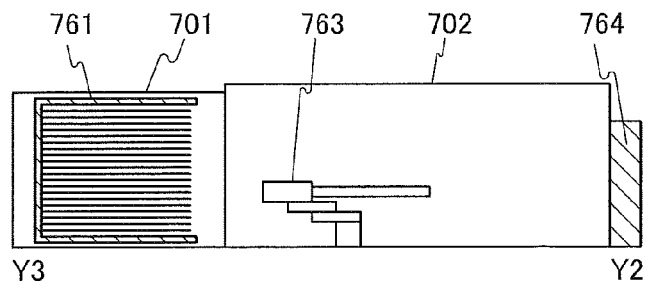

Next, FIG. 16A, FIG. 16B, and FIG. 16C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 700 illustrated in FIG. 15.

FIG. 16A is a cross section of the substrate heating chamber 705 and the transfer chamber 704, and the substrate heating chamber 705 includes a plurality of heating holders 765 which can hold a substrate. Furthermore, the substrate heating chamber 705 is connected to a vacuum pump 770 through a valve. As the vacuum pump 770, a dry pump and a mechanical booster pump can be used, for example.

As heating mechanism which can be used for the substrate heating chamber 705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 705 is connected to a refiner 781 through a mass flow controller 780. Note that although the mass flow controller 780 and the refiner 781 can be provided for each of a plurality of kinds of gases, only one mass flow controller 780 and one refiner 781 are provided for easy understanding. As the gas introduced to the substrate heating chamber 705, a gas whose dew point is −80° C. or lower, preferably −100° C. or lower can be used; for example, an oxygen gas, a nitrogen gas, and a rare gas (e.g., an argon gas) are used.

The transfer chamber 704 includes the transfer robot 763. The transfer robot 763 can transfer a substrate to each chamber. Furthermore, the transfer chamber 704 is connected to the vacuum pump 770 and a cryopump 771 through valves. Owing to such a structure, exhaust is performed using the vacuum pump 770 until the pressure inside the transfer chamber 704 becomes in the range of atmospheric pressure to low or medium vacuum (approximately 0.1 Pa to several hundred pascals) and then the valves are switched so that exhaust is performed using the cryopump 771 until the pressure inside the transfer chamber 704 becomes in the range of middle vacuum to high or ultra-high vacuum ($1 \times 10^{-7}$ Pa to 0.1 Pa).

Alternatively, two or more cryopumps 771 may be connected in parallel to the transfer chamber 704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 16B is a cross section of the deposition chamber 706b, the transfer chamber 704, and the load lock chamber 703a.

Here, the details of the deposition chamber (sputtering chamber) are described with reference to FIG. 16B. The deposition chamber 706b illustrated in FIG. 16B includes a pair of targets 766 that face each other, a pair of magnets 790 that face each other, a pair of target shields 767 that face each other, a substrate holder 768, and power sources 791. Note that here, a substrate 769 is supported by the substrate holder 768. The substrate holder 768 is fixed to the deposition chamber 706b by an adjustment member 784. Owing to the adjustment member 784, the substrate holder 768 can move to a region between the pair of targets 766 (region between targets). Providing the substrate holder 768 supporting the substrate 769 in the region between targets can reduce damage due to plasma in some cases, for example. Although not illustrated, the substrate holder 768 may include a substrate holding mechanism which holds the substrate 769, a rear heater which heats the substrate 769 from the back surface, or the like. The target shields 767 are provided so as to surround end portions of the targets 766.

As the power sources 791, DC power sources, AC power sources, RF power sources, or the like may be used. The power sources 791 are electrically connected to the targets 766.

The target shields 767 can suppress deposition of a particle which is sputtered from the target 766 on a region where deposition is not needed. Moreover, the target shields 767 are preferably processed to prevent accumulated sputtered particles from being separated. For example, blasting treatment which increases surface roughness may be performed, or roughness may be formed on the surfaces of the target shields 767.

The deposition chamber 706b is connected to the mass flow controller 780 through a gas heating system 782, and the gas heating system 782 is connected to the refiner 781 through the mass flow controller 780. With the gas heating system 782, a gas which is introduced to the deposition chamber 706b can be heated to a temperature higher than or equal to 40° C. and lower than or equal to 400° C., preferably higher than or equal to 50° C. and lower than or equal to 200° C. Note that although the gas heating system 782, the mass flow controller 780, and the refiner 781 can be provided for each of a plurality of kinds of gases, only one gas heating system 782, one mass flow controller 780, and one refiner 781 are provided for easy understanding. As the gas introduced to the deposition chamber 706b, a gas whose dew point is −80° C. or lower, preferably −100° C. or lower can be used; for example, an oxygen gas, a nitrogen gas, and a rare gas (e.g., an argon gas) are used.

It is preferable to use a facing-target sputtering apparatus in the deposition chamber 706b as illustrated in FIG. 16B. In a facing-target sputtering apparatus, plasma is confined between targets; thus, plasma damage to a substrate can be reduced. Furthermore, step coverage can be improved because an incident angle of a sputtered particle to the substrate can be made smaller depending on the inclination of the target.

Note that a parallel-plate-type sputtering apparatus or an ion beam sputtering apparatus may be provided in the deposition chamber 706b.

In the case where the refiner is provided near a gas inlet, the length of a pipe between the refiner and the deposition chamber 706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 706b is connected to a turbo molecular pump 772 and the vacuum pump 770 through valves.

In addition, the deposition chamber 706b is provided with a cryotrap 751.

The cryotrap 751 is a mechanism which can adsorb a molecule (or an atom) having a relatively high melting point, such as water. The turbo molecular pump 772 is capable of stably removing a large-sized molecule (or atom), needs low frequency of maintenance, and thus enables high productivity, whereas it has a low capability in removing hydrogen and water. Hence, the cryotrap 751 is connected to the deposition chamber 706b so as to have a high capability in removing water or the like. The temperature of a refrigerator of the cryotrap 751 is set to be lower than or equal to 100 K, preferably lower than or equal to 80 K. In the case where the cryotrap 751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 706b is not limited to the above, and a structure similar to that in the exhaust method described above for the transfer chamber 704 (the exhaust method using the cryopump and the vacuum pump) may be employed. Needless to say, the exhaust method of the transfer chamber 704 may have a structure similar to that of the deposition chamber 706b (the exhaust method using the turbo molecular pump and the vacuum pump).

Note that in each of the transfer chamber 704, the substrate heating chamber 705, and the deposition chamber 706b which are described above, the back pressure (total pressure) and the partial pressure of each gas molecule (atom) are preferably set as follows. In particular, the back pressure and the partial pressure of each gas molecule (atom) in the deposition chamber 706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 704, the substrate heating chamber 705, and the deposition chamber 706b which are described above preferably have a small amount of external leakage or internal leakage.

For example, in each of the transfer chamber 704, the substrate heating chamber 705, and the deposition chamber 706b which are described above, the leakage rate is less than or equal to $3\times10^{-6}$ Pa·m³/s, preferably less than or equal to $1\times10^{-6}$ Pa·m³/s. The leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s. The leakage rate of a gas molecule (atom) having a mass-to-charge ratio (m/z) of 28 is less than or equal to $1\times10^{-5}$ Pa·m³/s, preferably less than or equal to 1×10–6 Pa·m³/s. The leakage rate of a gas molecule (atom) having a mass-to-charge ratio (m/z) of 44 is less than or equal to $3\times10^{-6}$ Pa·m³/s, preferably less than or equal to 1×10–6 Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 700 may be covered with iron fluoride, aluminum oxide, chromium oxide, or the like.

The member of the deposition apparatus 700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is the main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 704 and the load lock chamber 703a illustrated in FIG. 16B and the atmosphere-side substrate transfer chamber 702 and the atmosphere-side substrate supply chamber 701 illustrated in FIG. 16C are described. Note that FIG. 16C is a cross section of the atmosphere-side substrate transfer chamber 702 and the atmosphere-side substrate supply chamber 701.

For the transfer chamber 704 illustrated in FIG. 16B, the description of the transfer chamber 704 illustrated in FIG. 16A can be referred to.

The load lock chamber 703a includes a substrate delivery stage 752. When a pressure in the load lock chamber 703a becomes atmospheric pressure by being increased from reduced pressure, the substrate delivery stage 752 receives a substrate from the transfer robot 763 provided in the atmosphere-side substrate transfer chamber 702. After that, the load lock chamber 703a is evacuated into vacuum so that the pressure therein becomes reduced pressure and then the transfer robot 763 provided in the transfer chamber 704 receives the substrate from the substrate delivery stage 752.

Furthermore, the load lock chamber 703a is connected to the vacuum pump 770 and the cryopump 771 through valves. For a method for connecting exhaust systems such as the vacuum pump 770 and the cryopump 771, the description of the method for connecting the transfer chamber 704 can be referred to, and the description thereof is omitted here. Note that the unload lock chamber 703b illustrated in FIG. 15 can have a structure similar to that in the load lock chamber 703a.

The atmosphere-side substrate transfer chamber 702 includes the transfer robot 763. The transfer robot 763 can deliver a substrate from the cassette port 761 to the load lock chamber 703a or deliver a substrate from the load lock chamber 703a to the cassette port 761. Furthermore, a mechanism for suppressing entry of dust or a particle, such as high efficiency particulate air (HEPA) filter, may be provided above the atmosphere-side substrate transfer chamber 702 and the atmosphere-side substrate supply chamber 701.

The atmosphere-side substrate supply chamber 701 includes a plurality of cassette ports 761. The cassette port 761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used.

However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide semiconductor in which zinc is unlikely to be volatilized can be obtained.

When the above-described deposition apparatus is used, the concentration of hydrogen in the CAAC-OS, which is measured by secondary ion mass spectrometry (SIMS), can be set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$.

The concentration of nitrogen in the CAAC-OS, which is measured by SIMS, can be set to be lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, and still further preferably lower than or equal to $1\times10^{18}$ atoms/cm$^3$.

The concentration of carbon in the CAAC-OS, which is measured by SIMS, can be set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

The amount of each of the following gas molecules (atoms) released from the CAAC-OS can be less than or equal to $1\times10^{19}$/cm$^3$, preferably less than or equal to $1\times10^{18}$/cm$^3$, which is measured by TDS: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the CAAC-OS can be suppressed. Furthermore, when a film in contact with the CAAC-OS is formed with the use of the above deposition apparatus, the entry of impurities into the oxide semiconductor from the film in contact therewith can be suppressed.

The structure described in this embodiment can be used in appropriate combination with any of the structures described in the other embodiments.

(Embodiment 3)

A structure of an oxide semiconductor will be described below.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur. The pellet is preferably larger than or equal to 1 nm and further preferably larger than or equal to 3 nm.

Figure 17A:
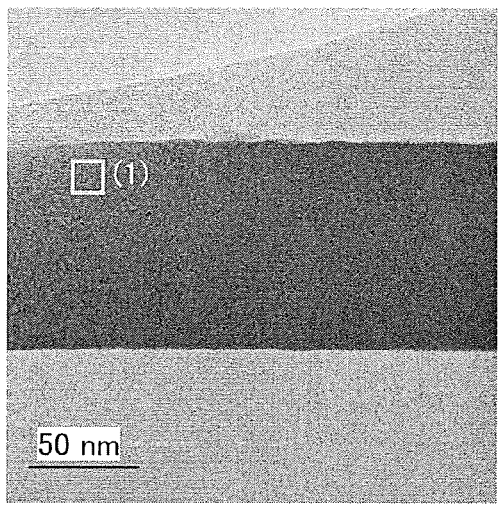
FIGS. 17A to 17D are Cs-corrected high-resolution TEM images of a cross section of a CAAC-OS and a schematic cross-sectional view of the CAAC-OS.

A CAAC-OS observed with TEM is described below. FIG. 17A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 17B:
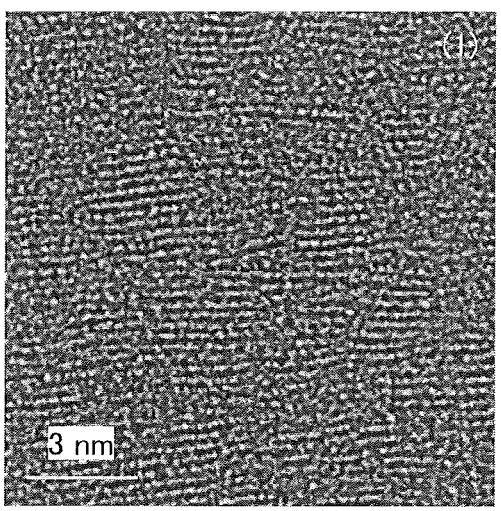

FIG. 17B is an enlarged Cs-corrected high-resolution TEM image of a region (1) in FIG. 17A. FIG. 17B shows that metal atoms are arranged in a layered manner in a pellet. Each metal atom layer has a configuration reflecting unevenness of a surface over which the CAAC-OS is formed (hereinafter, the surface is referred to as a formation surface) or the top surface of the CAAC-OS, and is arranged parallel to the formation surface or the top surface of the CAAC-OS.

Figure 17C:
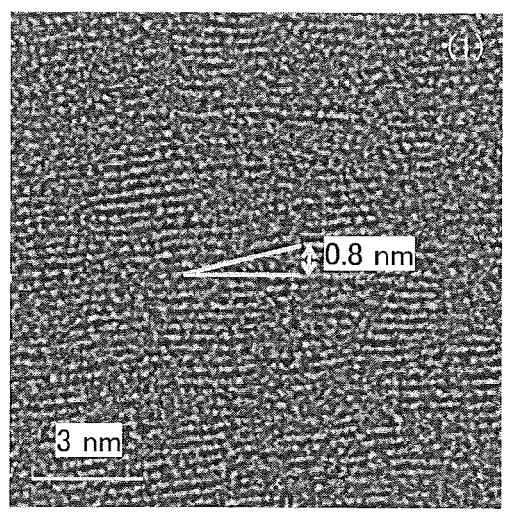

As shown in FIG. 17B, the CAAC-OS has a characteristic atomic arrangement. The characteristic atomic arrangement is denoted by an auxiliary line in FIG. 17C. FIGS. 17B and 17C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 17D:
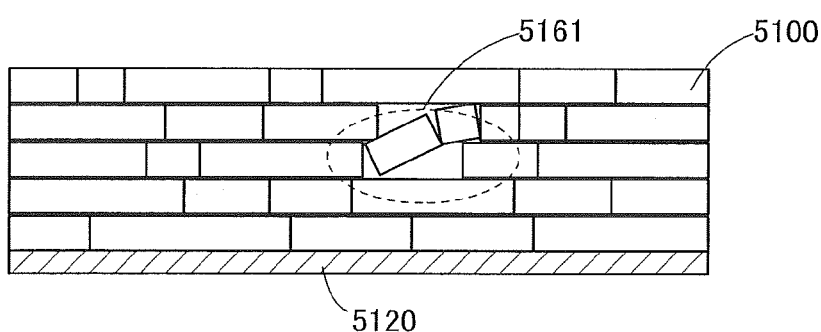

Here, according to the Cs-corrected high-resolution TEM images, the schematic arrangement of pellets 5100 of a CAAC-OS over a substrate 5120 is illustrated by such a structure in which bricks or blocks are stacked (see FIG. 17D). The part in which the pellets are tilted as observed in FIG. 17C corresponds to a region 5161 shown in FIG. 17D.

FIG. 18A shows a Cs-corrected high-resolution TEM image of a plane of the CAAC-OS observed from a direction substantially perpendicular to the sample surface. FIGS. 18B, 18C, and 18D are enlarged Cs-corrected high-resolution TEM images of regions (1), (2), and (3) in FIG. 18A, respectively. FIGS. 18B, 18C, and 18D indicate that metal atoms are arranged in a triangular, quadrangular, or hexagonal configuration in a pellet. However, there is no regularity of arrangement of metal atoms between different pellets.

Figure 19A:
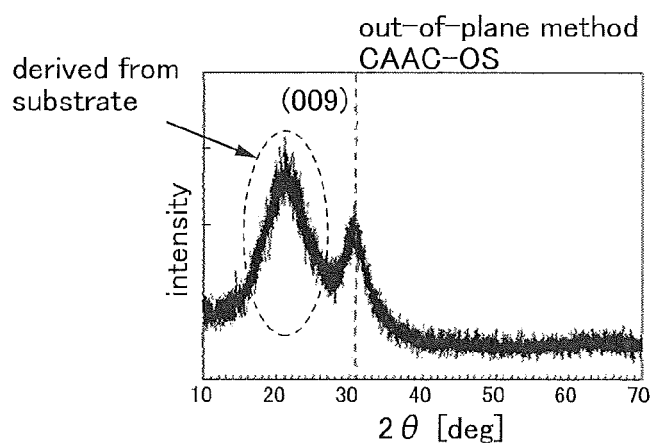
FIGS. 19A to 19C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 19A. This peak is assigned to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 19B:
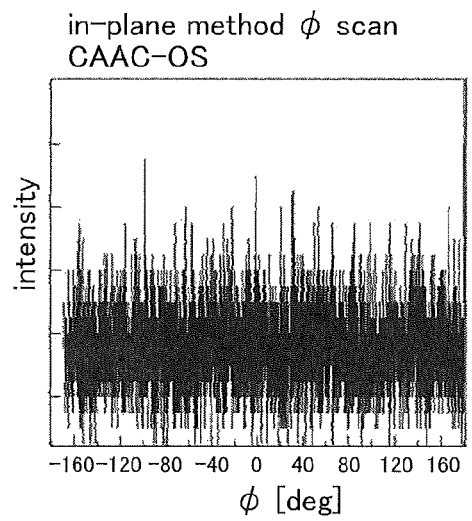
Figure 19C:
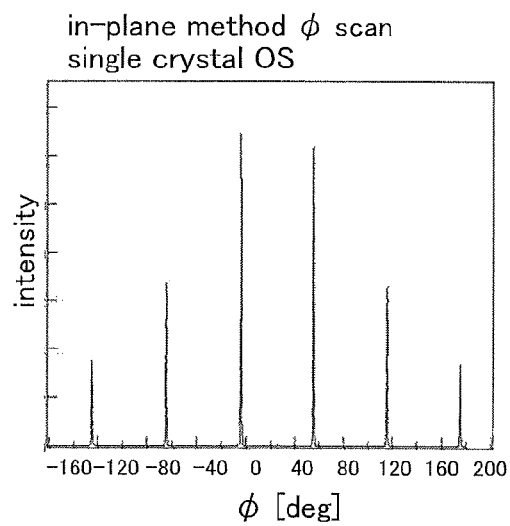

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 19B, a peak is not clearly observed. In contrast, in the case of a single crystal oxide semiconductor of $InGaZnO_4$, when $\phi$ scan is performed with $2\theta$ fixed at around 56°, as shown in FIG. 19C, six peaks which are assigned to crystal planes equivalent to the (110) plane are observed. Accordingly, the structural analysis using XRD shows that the directions of the a-axes and b-axes are irregularly oriented in the CAAC-OS.

Figure 20A:
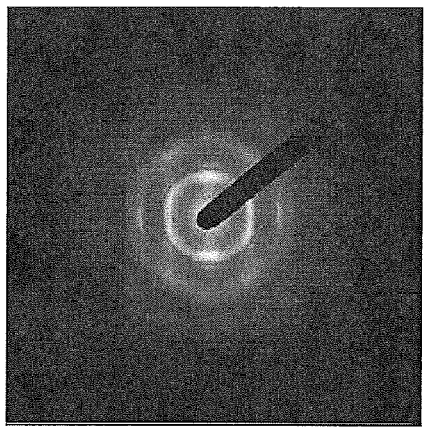
FIGS. 20A and 20B show electron diffraction patterns of a CAAC-OS.
Figure 20B:
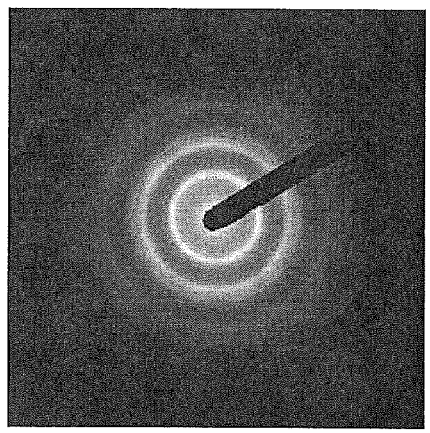

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 20A can be obtained. In this diffraction pattern, spots assigned to the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 20B shows a diffraction pattern obtained in such a manner that an electron beam with a probe diameter of 300 nm is incident on the same sample in a direction perpendicular to the sample surface. As shown in FIG. 20B, a ring-like diffraction pattern is observed. Thus, the electron diffraction also indicates that the a-axes and b-axes of the pellets included in the CAAC-OS do not have regular alignment. The first ring in FIG. 20B is considered to be assigned to the (010) plane, the (100) plane, and the like of the $InGaZnO_4$ crystal. The second ring in FIG. 20B is considered to be assigned to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 21:
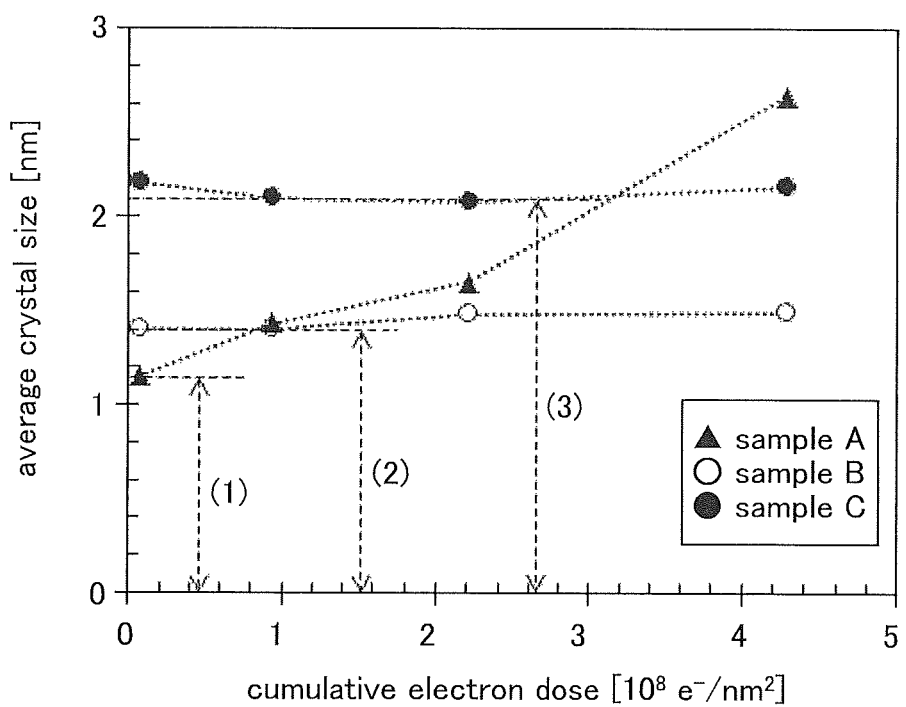
FIG. 21 shows a change of crystal parts of an In—Ga—Zn oxide owing to electron irradiation.

FIG. 21 shows change in the average size of crystal parts (at 22 points to 45 points) in each sample. Note that the crystal part size corresponds to the length of a lattice fringe. FIG. 21 indicates that the crystal part size in the a-like OS increases with an increase in the cumulative electron dose. Specifically, as shown by (1) in FIG. 21, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 21, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition.

Note that it is difficult to deposit an oxide semiconductor having a density of lower than 78% of the density of the single crystal oxide semiconductor.

For example, in the case of an oxide semiconductor having an atomic ratio of In:Ga:Zn =1:1:1, the density of single crystal InGaZnO$_4$ with a rhombohedral crystal structure is 6.357 g/cm$^3$. Accordingly, in the case of the oxide semiconductor having an atomic ratio of In:Ga:Zn =1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Deposition Method>

An example of a deposition model of a CAAC-OS using a sputtering method will be described below.

Figure 22A:
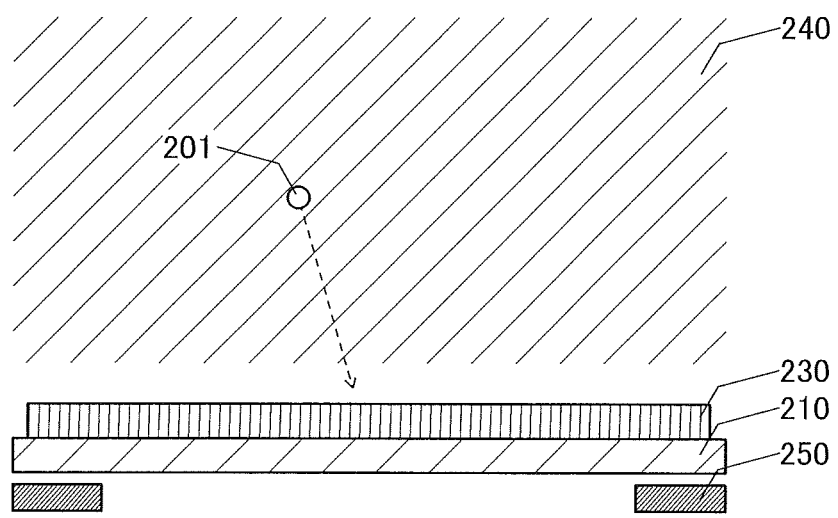
FIGS. 22A and 22B illustrate a deposition method of a CAAC-OS.
Figure 22B:
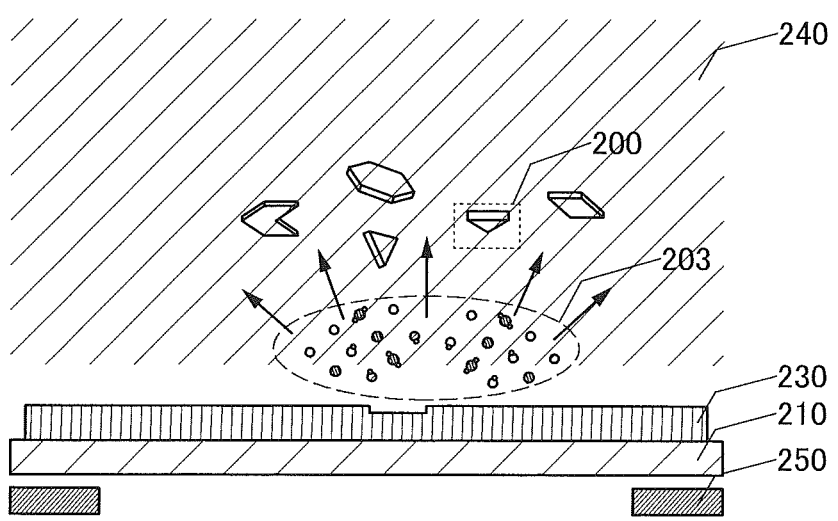

FIGS. 22A and 22B are each a schematic diagram illustrating one of a pair of targets in a deposition chamber.

A target 230 is attached to a backing plate 210. A magnet 250 is placed to face the target 230 with the backing plate 210 positioned therebetween. Although not illustrated, a target paired with the target 230 has a similar structure. Poles of the magnets that face each other are opposite to each other, so that a magnetic field is produced between the pair of targets.

The deposition chamber is mostly filled with a deposition gas (e.g., an oxygen gas, an argon gas, or a mixed gas containing oxygen at 5 volume % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 230, and the plasma 240 can be observed. The magnetic field forms a high-density plasma region over the target 230. In the high-density plasma region, the deposition gas is ionized, so that an ion 201 is generated. Examples of the ion 201 include an oxygen cation (O$^+$) and an argon cation (Ar$^+$).

Figure 23A:
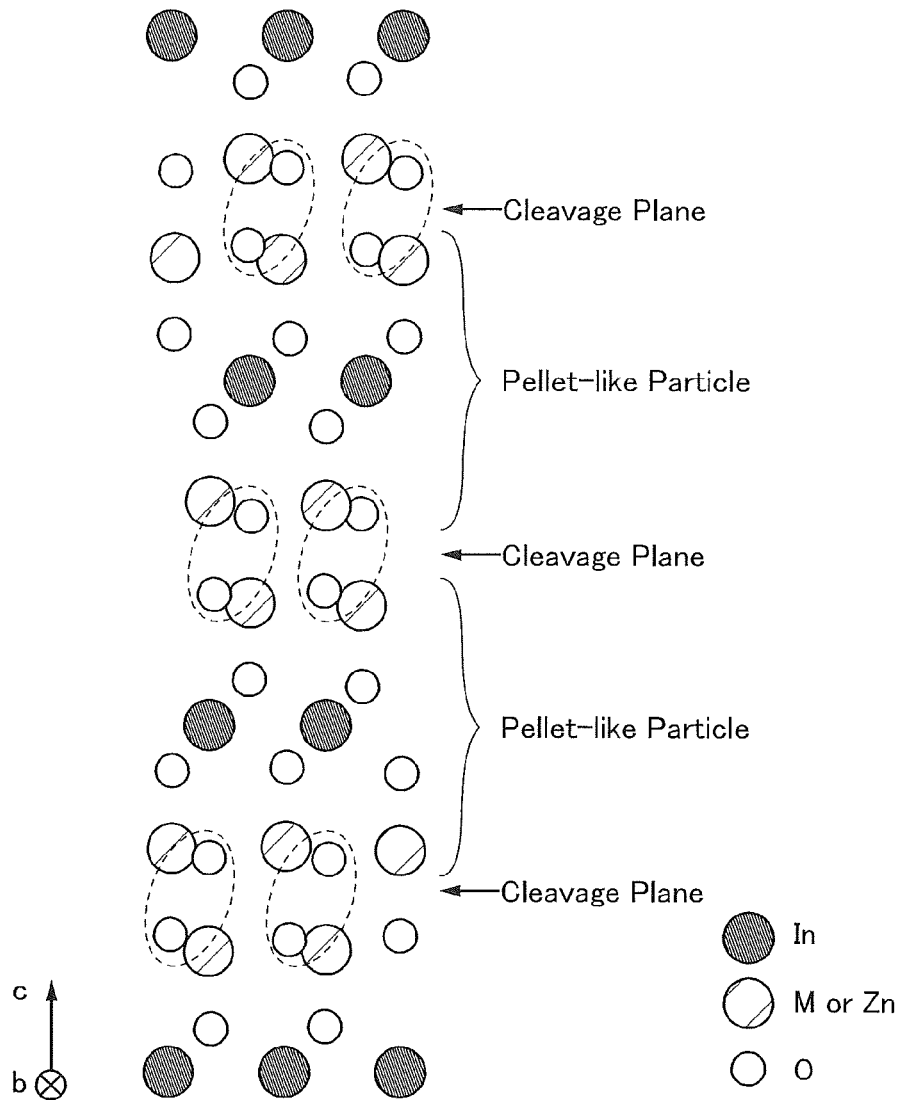
FIGS. 23A to 23C illustrate an $InMZnO_4$ crystal and a pellet.

Here, the target 230 has a polycrystalline structure which includes a plurality of crystal grains and in which a cleavage plane exists in any of the crystal grains. FIG. 23A shows a crystal structure of InMZnO$_4$ (M is an element such as aluminum, gallium, yttrium, or tin) included in the target 230 as an example. Note that FIG. 23A illustrates the crystal structure of InMZnO$_4$ observed from a direction parallel to the b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

The ion 201 generated in the high-density plasma region is accelerated toward the target 230 side by an electric field, and then collides with the target 230 (see FIG. 22A). At this time, the pellet 200, which is a flat-plate-like or pellet-like sputtered particle, is separated from the cleavage plane. Note that along with the separation of the pellet 200, particles 203 are also sputtered from the target 230. The particles 203 each have an atom or an aggregate of several atoms. Thus, the particles 203 can be referred to as atomic particles.

Figure 23B:
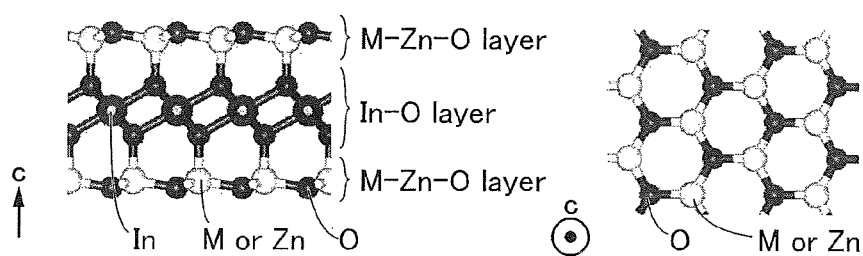
Figure 23C:
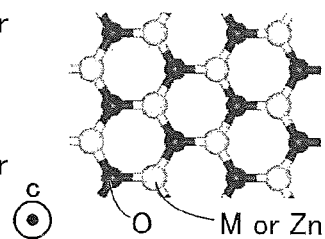
Figure 24A:
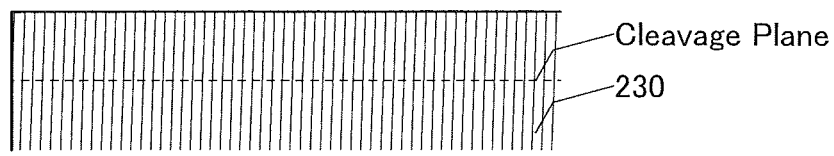
FIGS. 24A to 24D illustrate a deposition method of a CAAC-OS.
Figure 24B:
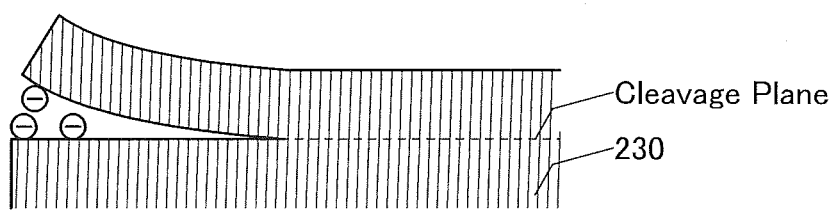
Figure 24C:
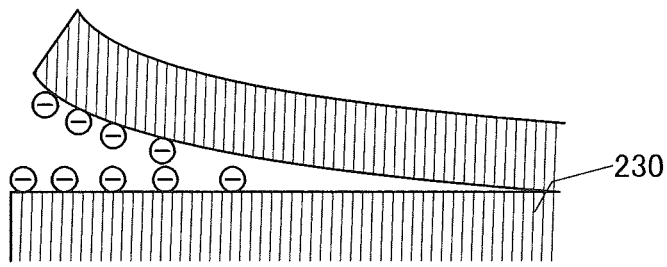
Figure 24D:
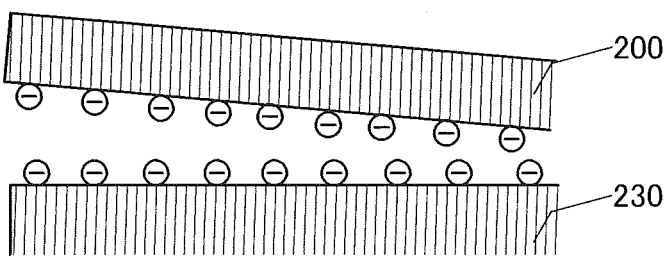

Cleavage at a surface of the target is described with reference to cross-sectional views in FIGS. 24A to 24D. FIG. 24A is a cross-sectional view of the target 230 having a cleavage plane (indicated by a dashed line). When the ion 201 collides with the target 230, bonds are sequentially cut from an end portion of the cleavage plane (see FIG. 24B). The cleaved surfaces repel each other because of the existence of charges with the same polarity. For this reason, rebinding does not occur once the bond is cut. As repellency due to charges proceeds, a region where bonds are cut gradually expands (see FIG. 24C). In the end, the pellet 200 is separated from the target 230 (see FIG. 24D). The pellet 200 corresponds to a portion between any two adjacent cleavage planes illustrated in FIG. 23A. Thus, when the pellet 200 is observed, the cross-section thereof is as illustrated in FIG. 23B, and the top surface thereof is as illustrated in FIG. 23C. Note that the structure of the pellet 200 may be distorted by an impact of collision with the ion 201.

The pellet 200 is a flat-plate-like (pellet-like) sputtered particle having a triangle plane, e.g., regular triangle plane. Alternatively, the pellet 200 is a flat-plate-like (pellet-like) sputtered particle having a hexagon plane, e.g., regular hexagon plane. However, the shape of a flat plane of the pellet 200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 200 is determined in accordance with the kind of the deposition gas and the like. For example, the thickness of the pellet 200 is greater than or equal to 0.4 nm and less than or equal to 1 nm, and preferably greater than or equal to 0.6 nm and less than or equal to 0.8 nm. In addition, for example, the width of the pellet 200 is greater than or equal to 1 nm and less than or equal to 10 nm, and preferably greater than or equal to 1.2 nm and less than or equal to 5 nm.

A surface of the pellet 200 might be negatively or positively charged when the pellet 200 receives a charge from the plasma 240. In the case where the pellet 200 receives a negative charge from O$^{2-}$ in the plasma 240, for example, an oxygen atom on the surface of the pellet 200 is negatively charged. A lateral growth might occur when the particles 203 are attached and bonded to a side surface of the pellet 200 in the plasma 240.

The pellet 200 and the particles 203 that have passed through the plasma 240 reach a surface of a substrate. Note that some of the particles 203 are discharged to the outside by a vacuum pump or the like because of their smallness in mass.

Figure 25A:
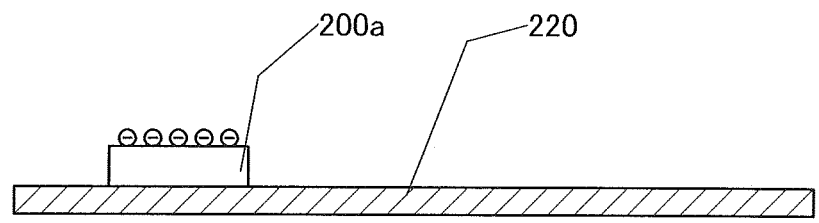
FIGS. 25A to 25C illustrate a deposition method of a CAAC-OS.
Figure 25B:
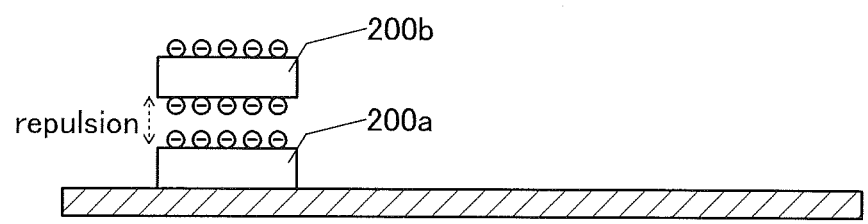

Here, deposition of pellets and particles on a surface of a substrate will be described with reference to FIGS. 25A to 25C.

First, a pellet 200a, which is the first of the pellets 200, is deposited on a substrate 220. Since the pellet 200a has a flat-plate-like shape, it is deposited so that the flat plane faces a surface of the substrate 220 (FIG. 25A). Here, a charge on a surface of the pellet 200a on the substrate 220 side is lost through the substrate 220.

Next, a pellet 200b, which is the second of the pellets 200, reaches the substrate 220. Here, since a surface of the pellet 200a and a surface of the pellet 200b are charged, they repel each other (FIG. 25B).

Figure 25C:
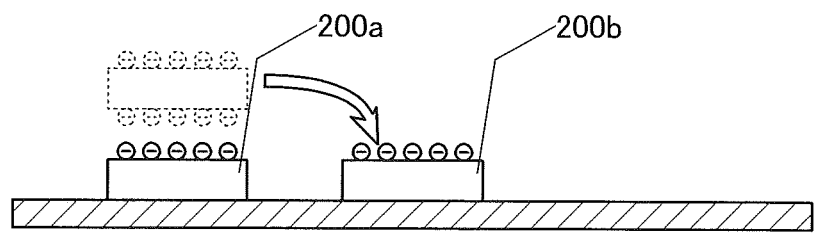

As a result, the pellet 200b avoids being deposited over the pellet 200a, and is deposited with its flat plane facing the surface of the substrate 220 so as to be a little distance away from the pellet 200a (FIG. 25C). With repetition of this, millions of the pellets 200 are deposited over the surface of the substrate 220 to have a thickness of one layer. A region where no pellet 200 is deposited is generated between adjacent pellets 200.

Figure 26A:
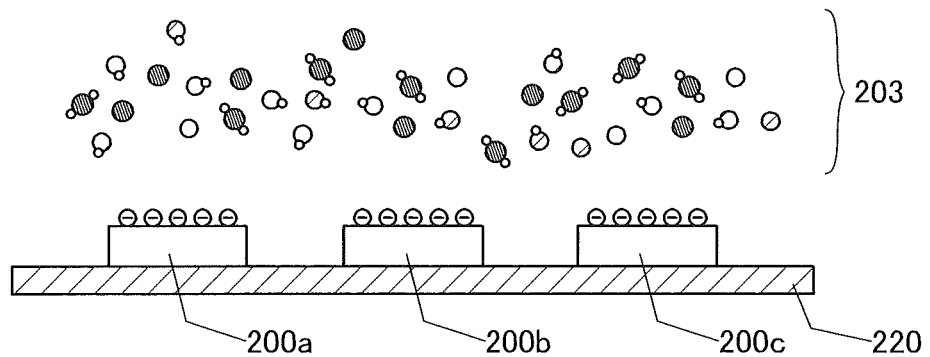
FIGS. 26A to 26C illustrate a deposition method of a CAAC-OS.

Similarly, a pellet 200c, which is the third of the pellets 200, is deposited with its flat plane facing the surface of the substrate 220. Then, the particles 203 that have received energy from the plasma 240 reach the surface of the substrate 220 (see FIG. 26A).

Figure 26B:
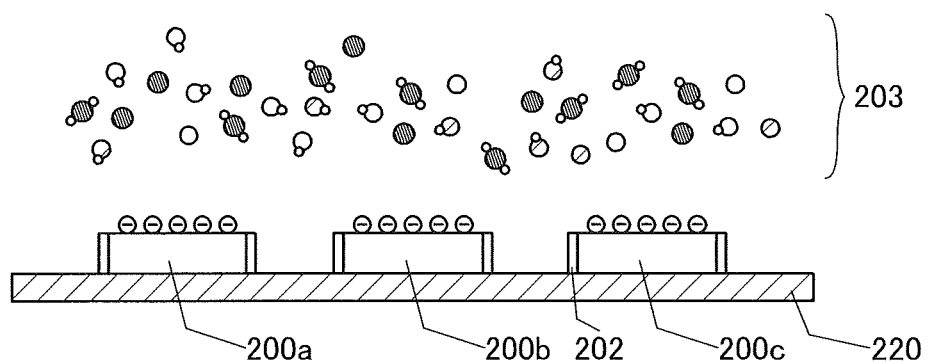
Figure 26C:
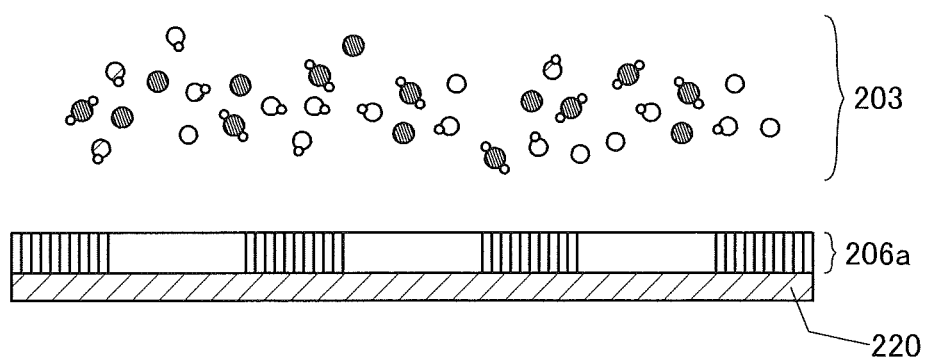

The particles 203 cannot be deposited on an active region such as the surface of the pellet 200. For this reason, the particles 203 are deposited so as to fill a region where no pellet 200 is deposited. That is, the particles 203 are attached between the pellets 200. Since an available bond of the particle 203 is activated by energy received from the plasma 240, the particle 203 is chemically bonded to the pellet 200 to form a lateral growth portion 202 (see FIG. 26B). The lateral growth portion 202 then further grow laterally so that the pellets 200 are anchored to each other, whereby a layer 206a is formed (see FIG. 26C). In this manner, the particles 203 are deposited until they fill regions where no pellet 200 is deposited. This mechanism is similar to a deposition mechanism for an atomic layer deposition method.

Even when the pellets 200 which are deposited with their flat planes facing the surface of the substrate 220 are oriented in different directions, the particles 203 cause a lateral growth to fill regions between the pellets 200; thus, no clear grain boundary is formed. In addition, as the particles 203 make a smooth connection between the pellets 200, a crystal structure different from single crystal and polycrystal structures is formed. In other words, a crystal structure including distortion between minute crystal regions (pellets 200) is formed. The regions filling the gaps between the crystal regions are distorted crystal regions, and thus, it will be not appropriate to say that the regions have an amorphous structure.

Figure 27A:
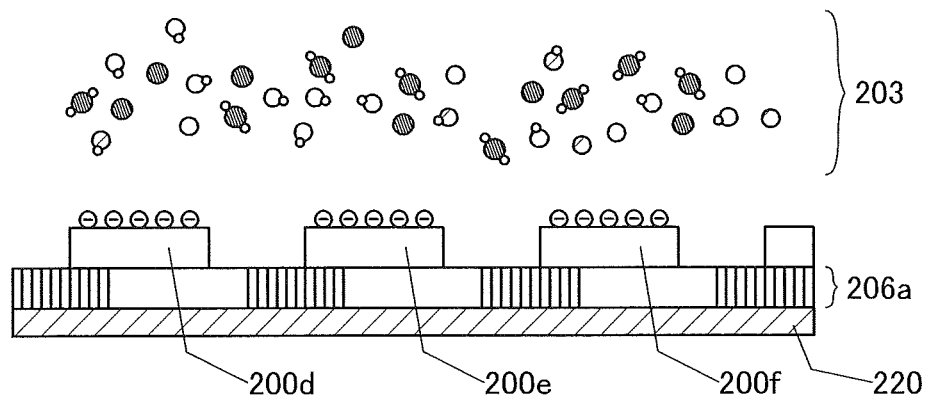
FIGS. 27A to 27C illustrate a deposition method of a CAAC-OS.
Figure 27B:
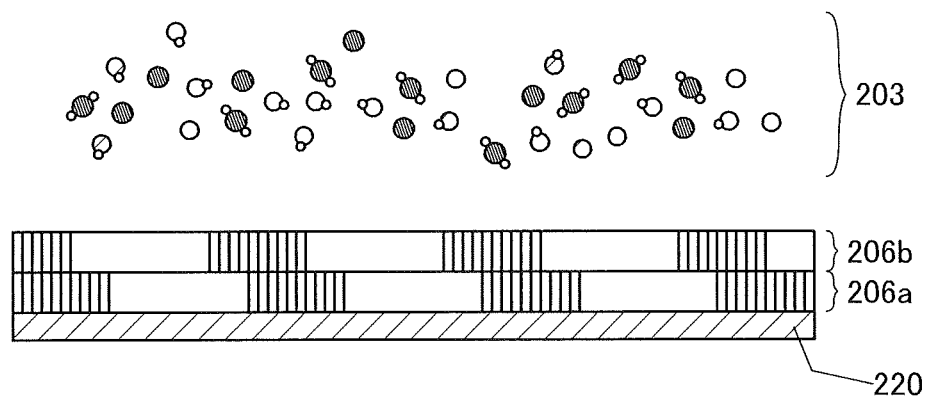
Figure 27C:
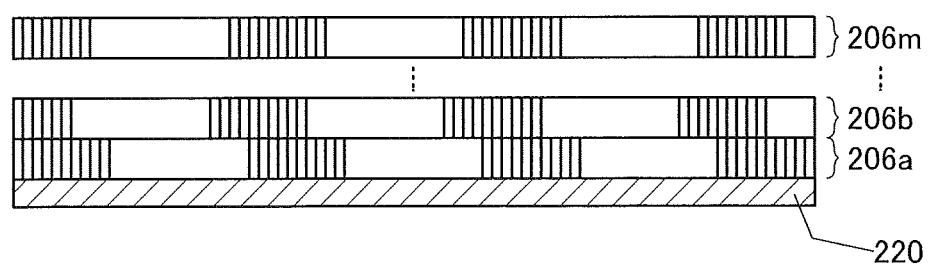

Then, pellets 206d, 206e, and 206f, which are the pellets 200, are newly deposited with their flat planes facing a surface of the layer 206a (see FIG. 27A). After that, the particles 203 are deposited so as to fill a region where no pellet 200 is deposited. In such a manner, the particles 203 are attached to side surfaces of the pellets 200 and the lateral growth portion 202 causes a lateral growth so that the pellets 200 are anchored to each other, whereby a layer 206b is formed (see FIG. 27B). Deposition continues until an m-th layer 206m (m is an integer of two or more) is formed; as a result, a stacked-layer thin film structure is formed (see FIG. 27C).

A deposition way of the pellets 200 changes according to the surface temperature of the substrate 220 or the like. For example, if the surface temperature of the substrate 220 is high, migration of the pellets 200 occurs over the surface of the substrate 220. As a result, a proportion of the pellets 200 that are directly connected with each other without the particles 203 increases, whereby a CAAC-OS with high orientation is made. The surface temperature of the substrate 220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 220, a warp or the like due to the deposition of the CAAC-OS hardly occurs.

In contrast, if the surface temperature of the substrate 220 is low, the migration of the pellets 200 over the substrate 220 does not easily occur. As a result, the pellets 200 are stacked to form an nc-OS or the like with low orientation. In the nanocrystalline oxide semiconductor (nc-OS), the pellets 200 are possibly deposited with certain gaps because the pellets 200 are negatively charged. Therefore, the nc-OS has low orientation but some regularity, and thus it has a denser structure than an amorphous oxide semiconductor.

When spaces between pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from above.

The pellets are considered to be deposited on the surface of the substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be formed.

In addition, even when the surface of the substrate (formation surface) has an uneven shape, the pellets are aligned along the shape.

The above-described deposition model suggests that a CAAC-OS with high crystallinity can be formed in the following manner, deposition is performed in high vacuum to have a long mean free path, plasma energy is weakened to reduce damage around a substrate, and thermal energy is applied to a formation surface to repair damage due to plasma during deposition.

The above is the description of the case of a flat plate pellet. In contrast, in the case of a cubic pellet or a columnar pellet that has a small width, for example, pellets that reached a surface of a substrate are oriented in various directions. Then, particles are attached to side surfaces of the deposited pellets while the orientations of the pellets are varied, and lateral growth portions cause a lateral growth. The crystal orientation in the resulting thin film might not be uniform.

The above-described deposition model can be used not only for the case where a target has a polycrystalline structure of a composite oxide with a plurality of crystal grains, such as an In-M-Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed between targets. Because of the high electric field region of plasma, atomic particles separated from the targets are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed between targets, only atomic particles separated from the targets are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

<Lateral Growth>

The following description explains that a lateral growth occurs when the particles 203 are attached to (bonded to or adsorbed on) the pellet 200 laterally.

FIGS. 28A to 28E illustrate a structure of the pellet 200 and positions to which metal ions can be attached. A model assumed as the pellet 200 is a cluster model with 84 atoms extracted from an InGaZnO$_4$ crystal structure with a constant stoichiometric composition. FIG. 28F illustrates a structure of the pellet 200 seen in the direction parallel to the c-axis. FIG. 28G illustrates a structure of the pellet 200 seen in the direction parallel to the a-axis.

The positions to which metal ions can be attached are represented as a position A, a position B, a position a, a position b, and a position c. The position A is an upper part of an interstitial site surrounded by one gallium atom and two zinc atoms on the top surface of the pellet 200. The position B is an upper part of an interstitial site surrounded by two gallium atoms and one zinc atom on the top surface of the pellet 200. The position a is in an indium site on a side surface of the pellet 200. The position b is in an interstitial site between an In—O layer and a Ga—Zn—O layer on a side surface of the pellet 200. The position c is in a gallium site on a side surface of the pellet 200.

The relative energy was estimated from first principles calculation in each case where a metal ion was located in the assumed position (the position A, the position B, the position a, the position b, or the position c). In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and Γ-only k-point sampling was used. The table below shows the relative energies in the case where an indium ion (In$^{3+}$), a gallium ion (Ga$^{3+}$), and a zinc ion (Zn$^{2+}$) are located at the position A, the position B, the position a, the position b, and the position c. Note that the relative energy is a relative value under the condition where the energy of the model with the lowest energy among the calculated models is set to 0 eV.

TABLE 1

| | Relative Energy [eV] | | | | |
| --- | --- | --- | --- | --- | --- |
| | Top surface of pellet | | Side surface of pellet | | |
| Ion | A | B | a | b | c |
| In$^{3+}$ | 2.1 | 1.5 | 0.0 | 1.8 | 1.9 |
| Ga$^{3+}$ | 3.7 | 3.0 | 0.6 | 0.0 | 3.5 |
| Zn$^{2+}$ | 2.3 | 1.8 | 0.0 | 0.6 | 2.9 |

It is found that any metal ion is more likely to be attached to the side surface of the pellet 200 than to the top surface thereof. It is also found that a zinc ion as well as an indium ion is most likely to be attached to the indium site at the position a.

Figure 29A:
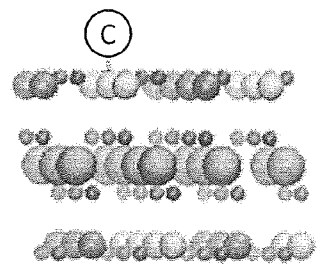
FIGS. 29A to 29G illustrate positions to which particles can be attached in a pellet.
Figure 29B:
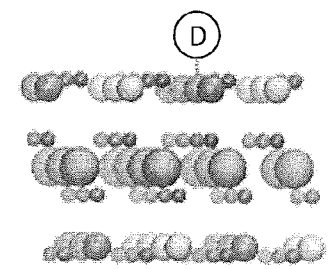
Figure 29C:
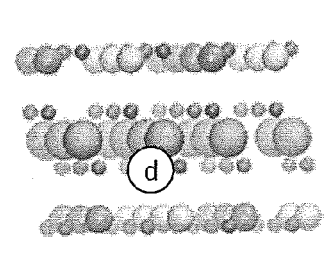
Figure 29D:
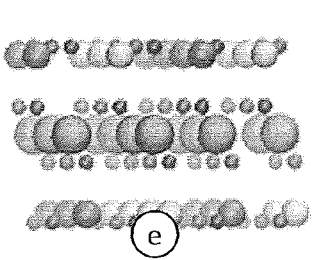
Figure 29E:
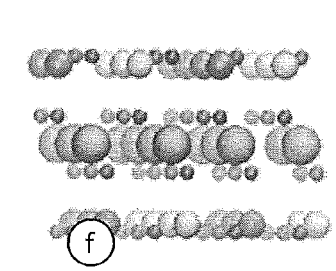
Figure 29F:
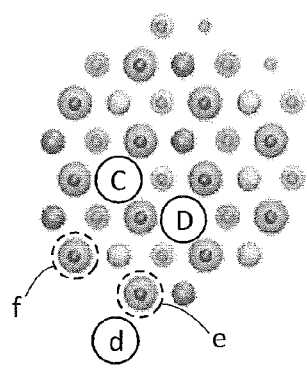
Figure 29G:
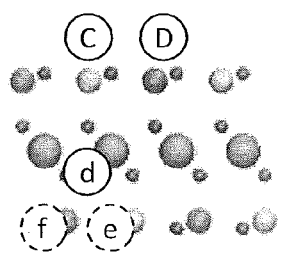

Ease of an oxygen ion (O$^{2-}$) attached to the pellet 200 was examined. FIGS. 29A to 29E illustrate a structure of the pellet 200 and positions to which oxygen ions can be attached. FIG. 29F illustrates a structure of the pellet 200 seen in the direction parallel to the c-axis. FIG. 29G illustrates a structure of the pellet 200 seen in the direction parallel to the b-axis.

The positions to which oxygen ions can be attached are represented as a position C, a position D, a position d, a position e, and a position f In the position C, an oxygen ion is bonded to gallium on the top surface of the pellet 200. In the position D, an oxygen ion is bonded to zinc on the top surface of the pellet 200. In the position d, an oxygen ion is bonded to indium on a side surface of the pellet 200. In the position e, an oxygen ion is bonded to gallium on a side surface of the pellet 200. In the position f, an oxygen ion is bonded to zinc on a side surface of the pellet 200.

The relative energy was estimated from first principles calculation in each case where an oxygen ion was located in the assumed position (the position C, the position D, the position d, the position e, or the position f). The table below shows the relative energies in the case where oxygen ions (O$^2$) are located at the position C, the position D, the position d, the position e, and the position f.

TABLE 2

| | Relative Energy [eV] | | | | |
| --- | --- | --- | --- | --- | --- |
| | Top surface of pellet | | Side surface of pellet | | |
| Ion | C | D | d | e | f |
| O$^{2-}$ | 3.9 | 3.6 | 0.0 | 0.5 | 1.5 |

It is found that the oxygen ion is also likely to be attached to the side surface of the pellet 200 than to the top surface thereof.

According to the above, the particle 203 that has approached the pellet 200 is preferentially attached to the side surface of the pellet 200. This suggests that the deposition model in which a lateral growth of the pellet 200 occurs when the particles 203 are attached to the side surface of the pellet 200 has high validity.

The structure described in this embodiment can be used in appropriate combination with any of the structures described in the other embodiments.

(Embodiment 4)

In this embodiment, a method for manufacturing a transistor that is partly different from the transistor in Embodiment 1 will be described.

<Transistor 2>

FIG. 30A, FIG. 31A, FIG. 32A, FIG. 33A, FIG. 34A, FIG. 35A, and FIG. 36A are top views each illustrating the method for manufacturing the transistor. FIG. 30B, FIG. 31B, FIG. 32B, FIG. 33B, FIG. 34B, FIG. 35B, and FIG. 36B are each a cross-sectional view taken along dashed-dotted lines F1-F2 and F3-F4 in the corresponding top view.

First, a substrate 500 is prepared. For the substrate 500, the description of the substrate 400 is referred to.

Next, a conductor is formed. The conductor may be formed by a sputtering method, a CVD method, an MBE method, a PLD method, an ALD method, or the like.

Next, a resist or the like is formed over the conductor and processing is performed using the resist, whereby a conductor 513 is formed.

Then, an insulator is formed. The insulator can be formed by a sputtering method, a CVD method, an MBE method, a PLD method, an ALD method, or the like.

Figure 30A:
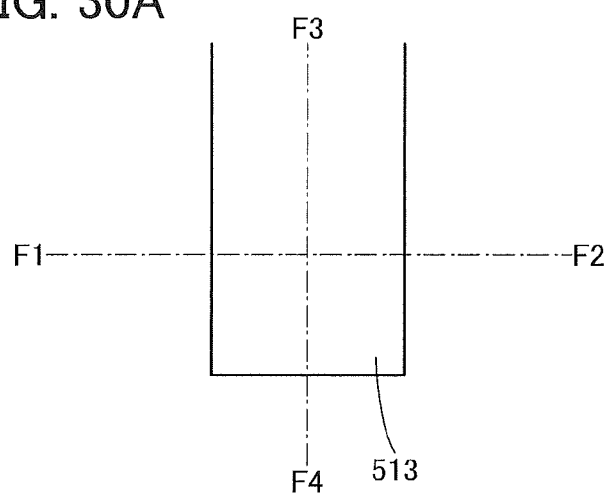
FIGS. 30A and 30B are a top view and a cross-sectional view illustrating a method for manufacturing a transistor of one embodiment of the present invention.
Figure 30B:
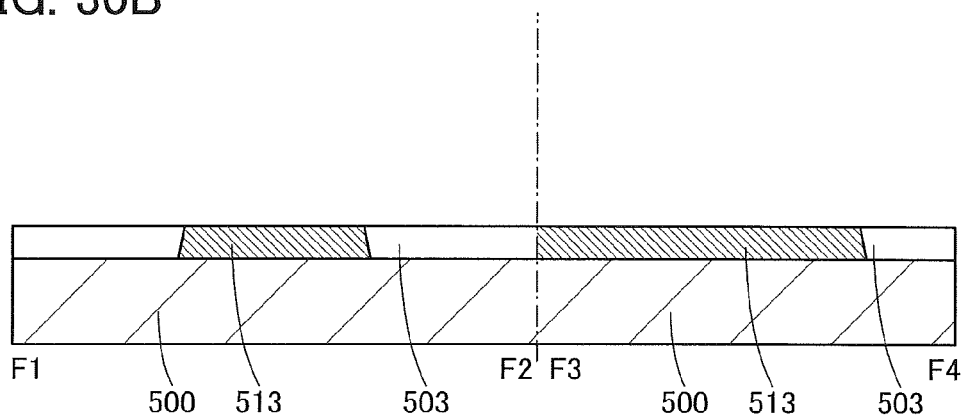

Next, etching is performed from the top surface of the insulator toward the bottom surface thereof such that the etched surface is parallel to the bottom surface of the substrate 500, whereby the conductor 513 is exposed and an insulator 503 is formed (see FIGS. 30A and 30B). When the insulator 503 is formed in this way, the top surface of the conductor 513 can be positioned at substantially the same level as the top surface of the insulator 503. Therefore, a defect in shape in a later step can be inhibited.

Figure 31A:
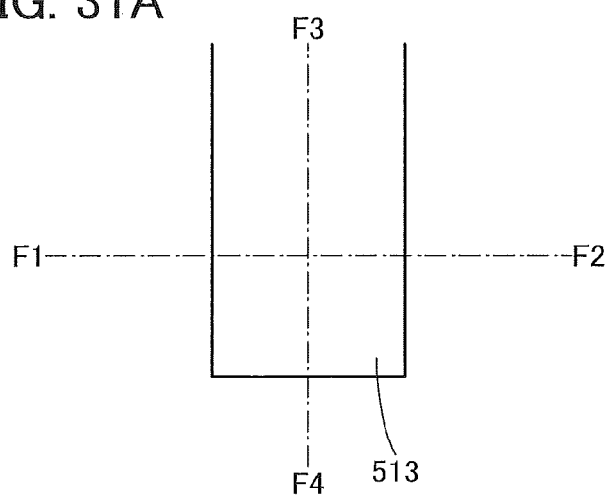
FIGS. 31A and 31B are a top view and a cross-sectional view illustrating a method for manufacturing a transistor of one embodiment of the present invention.
Figure 31B:
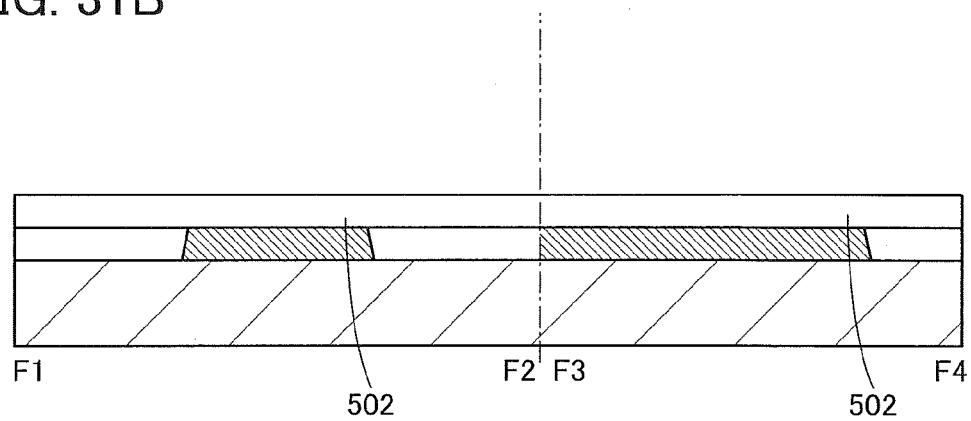

Then, an insulator 502 is formed (see FIGS. 31A and 31B). The insulator 502 can be formed by a sputtering method, a CVD method, an MBE method, a PLD method, an ALD method, or the like. For the insulator 502, the description of the insulator 402 is referred to.

Next, a semiconductor 536a is deposited. The semiconductor 536a can be deposited by a sputtering method, a CVD method, an MBE method, a PLD method, an ALD method, or the like. For the semiconductor 536a, the description of the semiconductor to be the semiconductor 406a is referred to.

Next, oxygen may be added so that the semiconductor 536a contains excess oxygen. The addition of oxygen may be performed by an ion implantation method at an acceleration voltage of greater than or equal to 2 kV and less than or equal to 10 kV at a dose of greater than or equal to $5\times10^{14}$ ions/cm$^2$ and less than or equal to $1\times10^{17}$ ions/cm$^2$, for example.

Next, a semiconductor 536b is deposited. The semiconductor 536b can be deposited by a sputtering method, a CVD method, an MBE method, a PLD method, an ALD method, or the like. For the semiconductor 536b, the description of the semiconductor to be the semiconductor 406b is referred to. Note that the semiconductor 536a and the semiconductor 536b are successively formed without being exposed to the air, in which case impurities can be prevented from entering the films and the interface therebetween.

Next, heat treatment is preferably performed. The heat treatment may be performed at higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the heat treatment, crystallinity of the semiconductor 536a and crystallinity of the semiconductor 536b can be increased and impurities such as hydrogen and water can be removed.

Next, a conductor is formed. The conductor can be formed by a sputtering method, a CVD method, an MBE method, a PLD method, an ALD method, or the like. The description of the conductor to be the conductor 416a and the conductor 416b is referred to for the conductor.

Figure 32A:
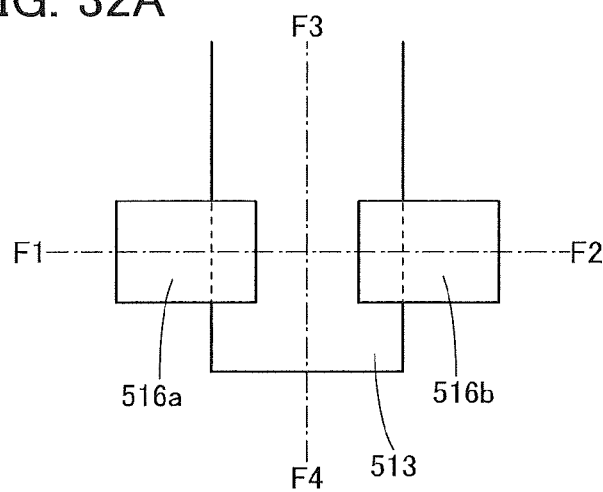
FIGS. 32A and 32B are a top view and a cross-sectional view illustrating a method for manufacturing a transistor of one embodiment of the present invention.
Figure 32B:
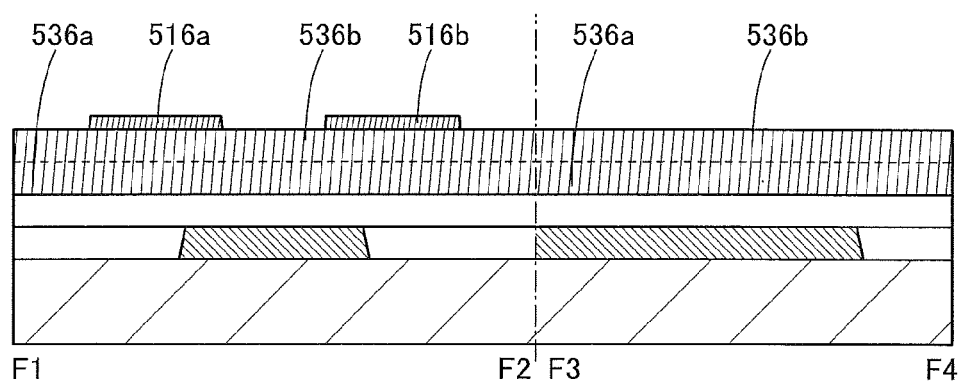

Then, a resist or the like is formed over the conductor and processing is performed using the resist, whereby a conductor 516a and a conductor 516b are formed (see FIGS. 32A and 32B).

Figure 33A:
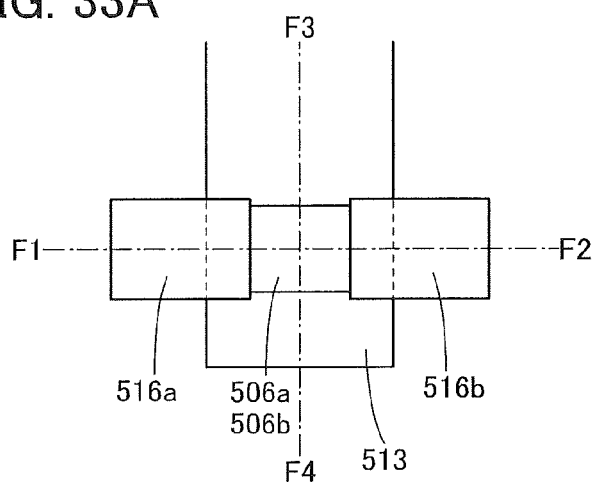
FIGS. 33A and 33B are a top view and a cross-sectional view illustrating a method for manufacturing a transistor of one embodiment of the present invention.
Figure 33B:
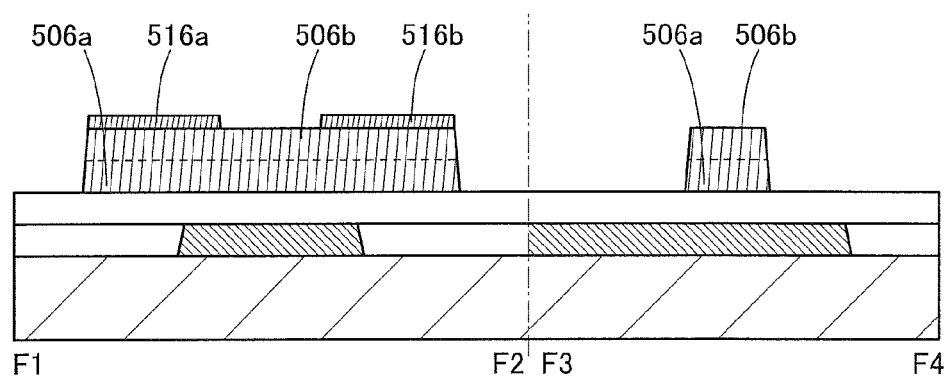

Then, a resist or the like is formed over the semiconductor 536b and processing is performed using the resist and the conductors 516a and 516b, whereby a semiconductor 506b and a semiconductor 506a are formed (see FIGS. 33A and 33B).

Note that the conductor 516a, the conductor 516b, the semiconductor 506a, and the semiconductor 506b may be formed in the following manner after the formation of the conductor.

Figure 36A:
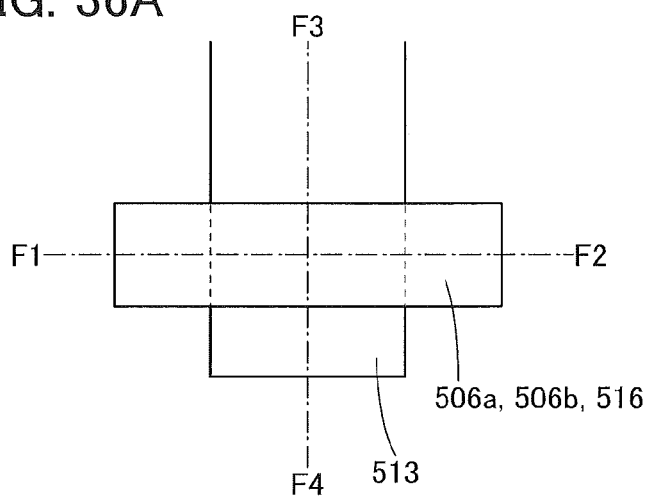
FIGS. 36A and 36B are a top view and a cross-sectional view illustrating a method for manufacturing a transistor of one embodiment of the present invention.
Figure 36B:
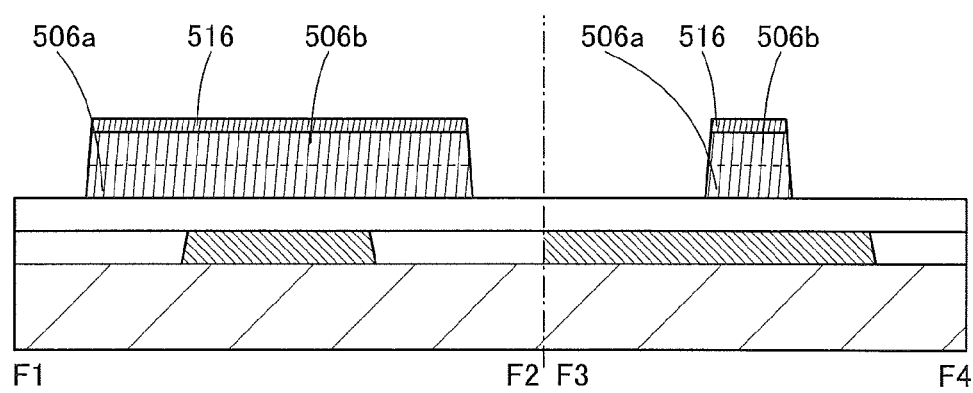

First, a resist or the like is formed over the conductor, and processing is performed using the resist, whereby the conductor 516, the semiconductor 506b, and the semiconductor 506a are formed (see FIGS. 36A and 36B). At this time, the semiconductor 506a and the semiconductor 506b may be formed using the conductor 516 after the resist is removed.

Next, a resist or the like is formed over the conductor 516, and the conductor is processed into the conductor 516a and the conductor 516b using the resist (see FIGS. 33A and 33B).

Next, a semiconductor 536c is formed. The semiconductor 536c can be formed by a sputtering method, a CVD method, an MBE method, a PLD method, an ALD method, or the like. For the semiconductor 536c, the description of the semiconductor 436c is referred to.

Next, an insulator 542 is formed. The insulator 542 can be formed by a sputtering method, a CVD method, an MBE method, a PLD method, an ALD method, or the like. For the insulator 542, the description of the insulator 442 is referred to.

Figure 34A:
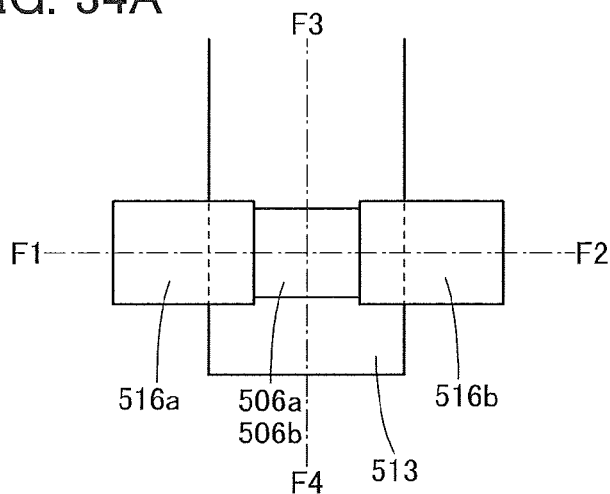
FIGS. 34A and 34B are a top view and a cross-sectional view illustrating a method for manufacturing a transistor of one embodiment of the present invention.
Figure 34B:
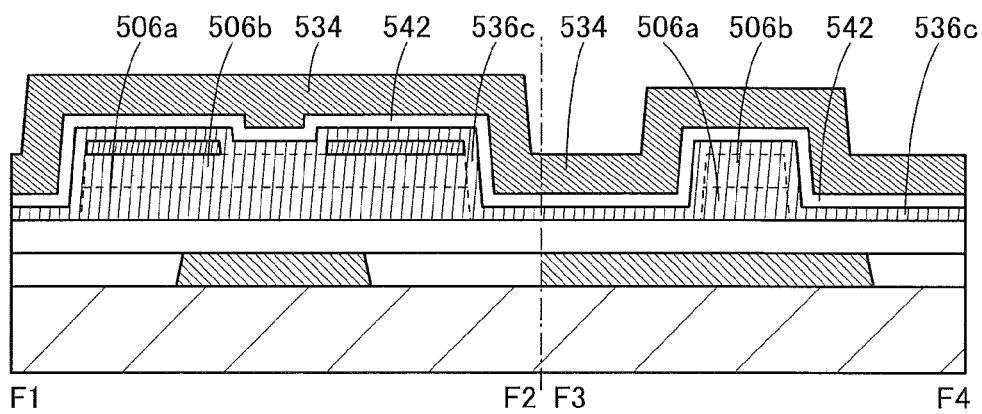

Next, a conductor 534 is formed (see FIGS. 34A and 34B). The conductor 534 can be formed by a sputtering method, a CVD method, an MBE method, a PLD method, an ALD method, or the like. For the conductor 534, the description of the conductor 434 is referred to.

Then, a resist or the like is formed over the conductor 534 and the conductor 534 is processed into a conductor 504 using the resist. The insulator 542 is processed into an insulator 512 using the resist or the conductor 504. The semiconductor 536c is processed into a semiconductor 506c using the resist, the conductor 504, or the insulator 542 (see FIGS. 35A and 35B). Note that here, the semiconductor 506c, the insulator 512, and the conductor 504 have the same shape when seen from above, but a transistor of one embodiment of the present invention is not limited to this shape. For example, the insulator 512 and the conductor 504 may be processed using different resists. For example, after the insulator 512 is formed, the conductor to be the conductor 504 may be formed; or after the conductor 504 is formed, a resist or the like may be formed over the insulator to be the insulator 512. For example, the semiconductor 506c may be shared between adjacent transistors or the like.

Next, an insulator may be formed. The insulator can be formed by a sputtering method, a CVD method, an MBE method, a PLD method, an ALD method, or the like.

The insulator may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator may be formed to have a single-layer structure or a stacked-layer structure including an insulator containing, for example, aluminum oxide, silicon nitride oxide, silicon nitride, gallium oxide, yttrium oxide, zirconium oxide, lanthanum oxide, neodymium oxide, hafnium oxide, or tantalum oxide.

The insulator preferably has a function of a barrier layer. The insulator has, for example, a function of blocking oxygen and/or hydrogen. Alternatively, the insulator preferably has a higher capability of blocking oxygen and/or hydrogen than the insulator 502 and the insulator 512, for example.

Through the above process, the transistor of one embodiment of the present invention can be manufactured.

Figure 35A:
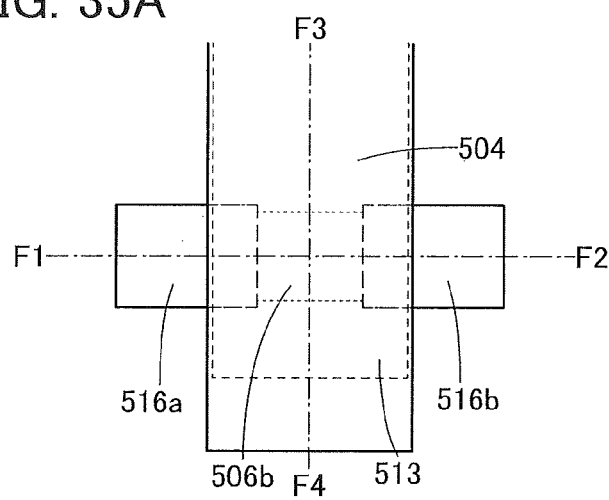
FIGS. 35A and 35B are a top view and a cross-sectional view illustrating a method for manufacturing a transistor of one embodiment of the present invention.
Figure 35B:
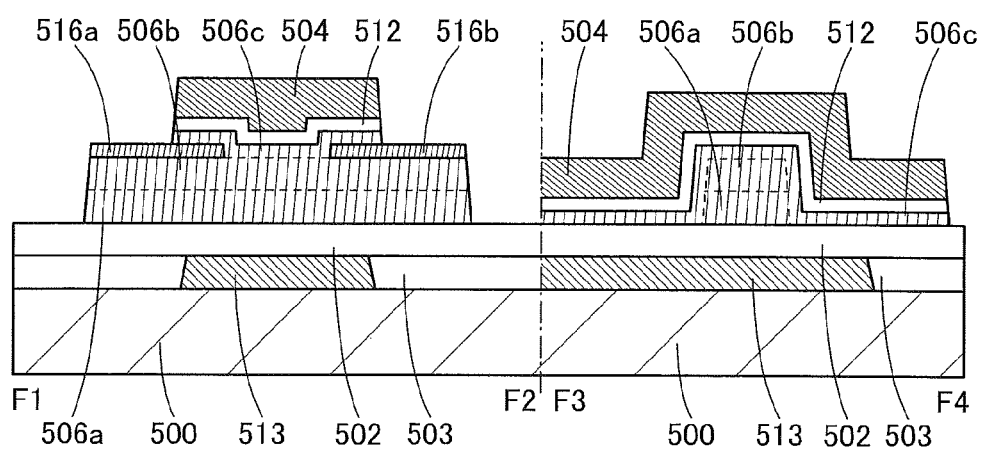

As illustrated in FIG. 35B, the transistor has an s-channel structure. The electric field from the conductor 504 and the conductor 513 is less likely to be inhibited by the conductor 516a, the conductor 516b, and the like at the side surface of the semiconductor 506b.

Figure 37A:
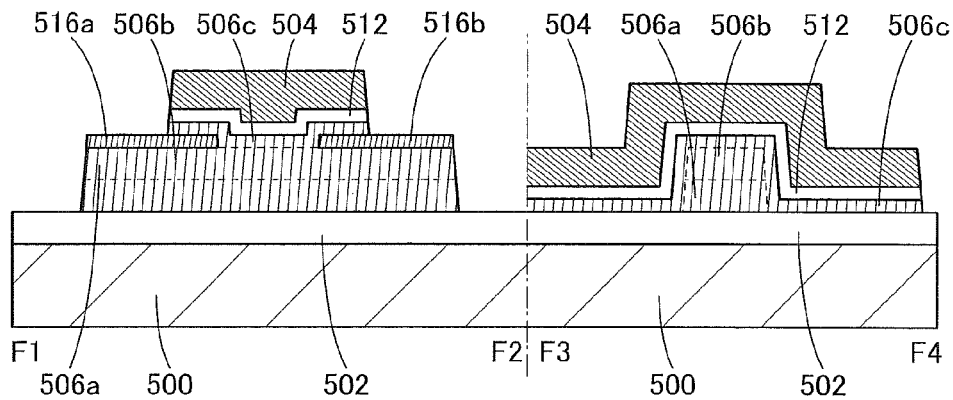
FIGS. 37A to 37C are cross-sectional views each illustrating a transistor of one embodiment of the present invention.
Figure 37B:
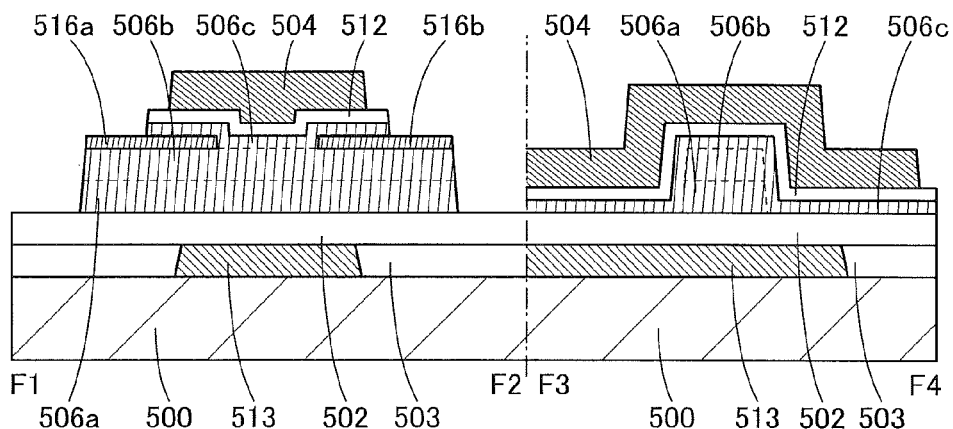
Figure 37C:
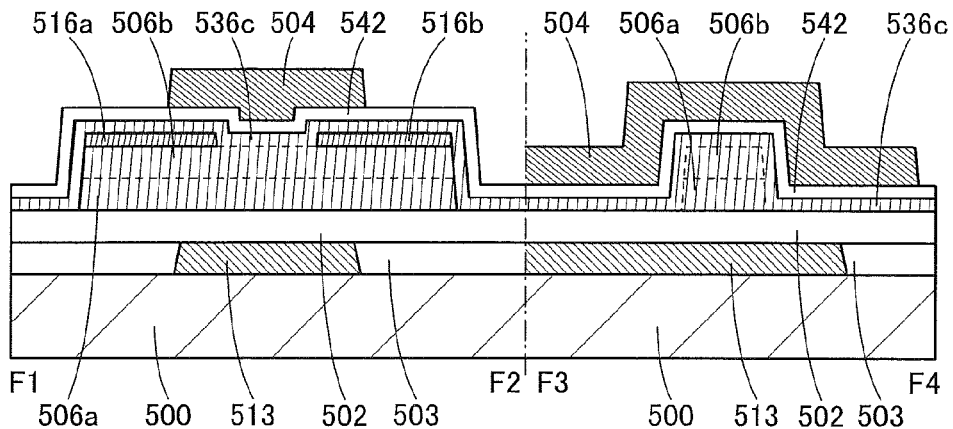
Figure 38A:
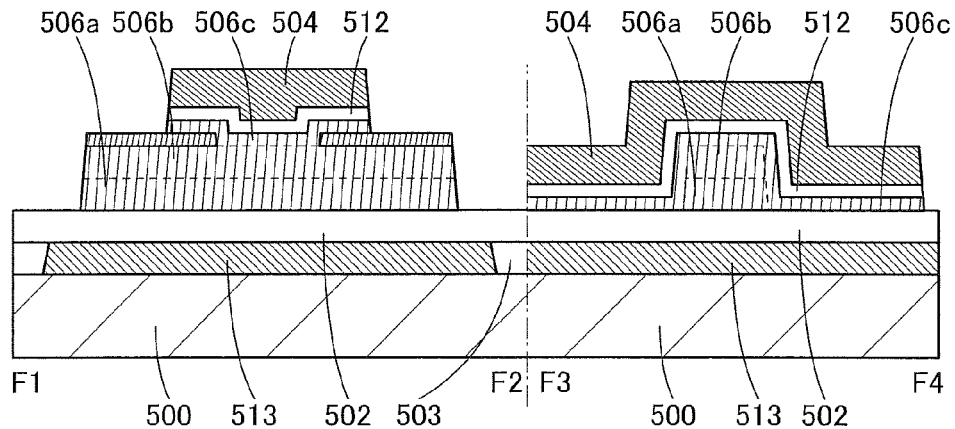
FIGS. 38A to 38C cross-sectional views each illustrating a transistor of one embodiment of the present invention.
Figure 38B:
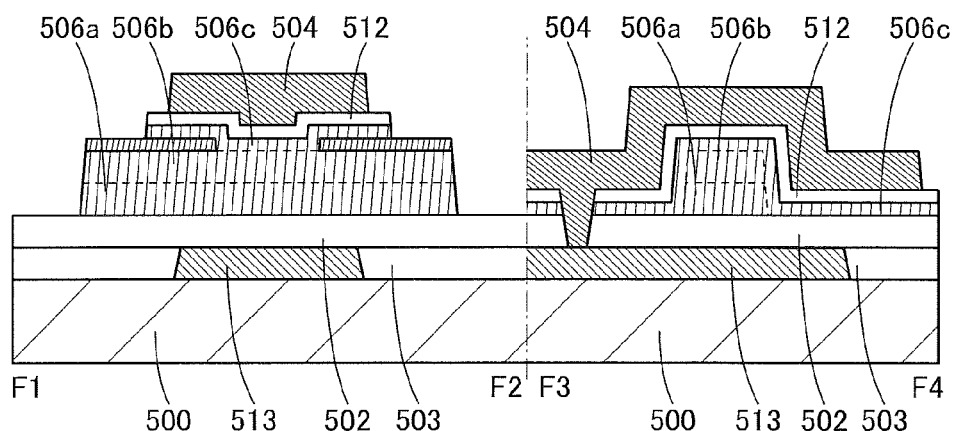
Figure 38C:
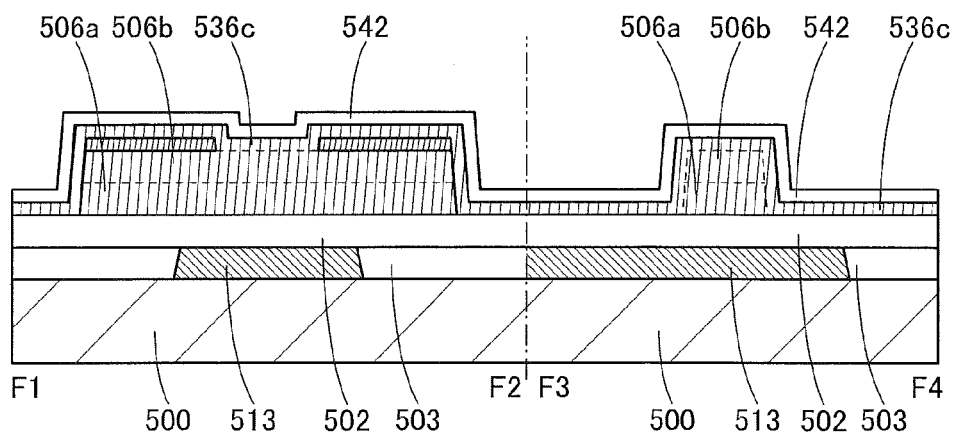

Note that the conductor 513 is not necessarily formed (see FIG. 37A). A shape in which the insulator 512 and the semiconductor 506c protrude from the conductor 504 may be employed (see FIG. 37B). The insulator 542 and the semiconductor 536c are not necessarily processed (see FIG. 37C). In the F1-F2 cross section, the width of the conductor 513 may be larger than that of the semiconductor 506b (see FIG. 38A). The conductor 513 may be in contact with the conductor 504 through an opening (see FIG. 38B). The conductor 504 is not necessarily formed (see FIG. 38C).

(Embodiment 5)

In this embodiment, semiconductor devices of one embodiment of the present invention will be described with reference to FIGS. 39A to 39D, FIGS. 40A to 40C, FIGS. 41A to 41C, FIGS. 42A to 42C, FIGS. 43A to 43C, FIGS. 44A to 44D, FIGS. 45A and 45B, FIGS. 46A to 46C, FIGS. 47A and 47B, FIGS. 48A to 48C, FIGS. 49A to 49C, FIGS. 50A and 50B, FIGS. 51A to 51D, and FIGS. 52A to 52D.

<Structural Example 1 of Semiconductor Device>

Figure 39A:
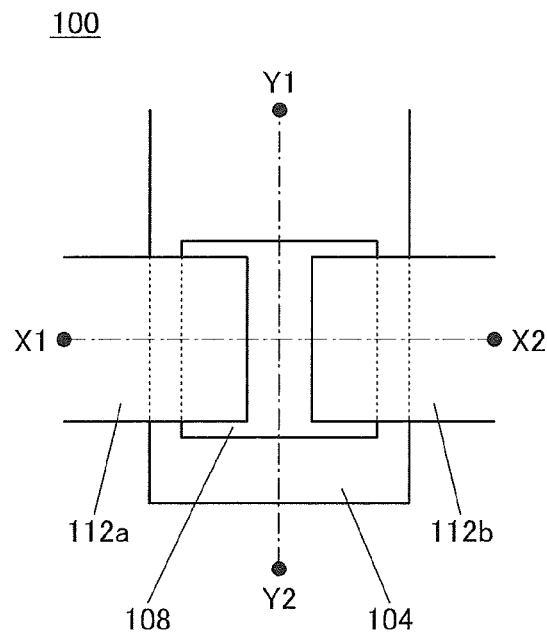
FIGS. 39A to 39D are a top view and cross-sectional views each illustrating one embodiment of a semiconductor device.
Figure 39B:
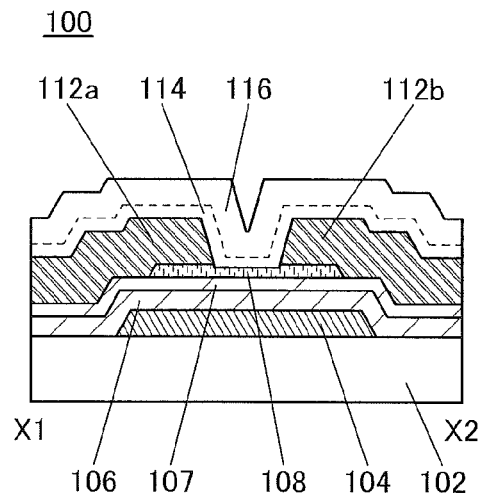
Figure 39C:
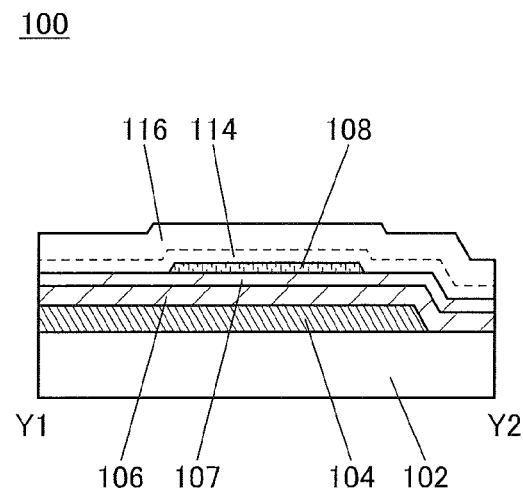
Figure 39D:
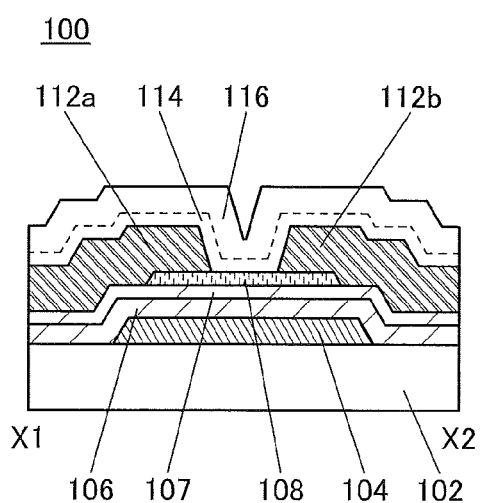

FIG. 39A is a top view of a transistor 100 that is a semiconductor device of one embodiment of the present invention. FIG. 39B is a cross-sectional view taken along dashed dotted line X1-X2 in FIG. 39A, and FIG. 39C is a cross-sectional view taken along dashed dotted line Y1-Y2 in FIG. 39A. Note that in FIG. 39A, some components of the transistor 100 (e.g., an insulator serving as a gate insulator) are not illustrated to avoid complexity. The direction of the dashed dotted line X1-X2 may be called a channel length direction of the transistor, and the direction of the dashed dotted line Y1-Y2 may be called a channel width direction of the transistor. As in FIG. 39A, some components might not be illustrated in some top views of transistors described below.

The transistor 100 includes, over a substrate 102, a conductor 104 serving as a gate electrode, an insulator 106 over the substrate 102 and the conductor 104, an insulator 107 over the insulator 106, an oxide semiconductor 108 over the insulator 107, a conductor 112a that serves as a source electrode and is electrically connected to the oxide semiconductor 108, a conductor 112b that serves as a drain electrode and is electrically connected to the oxide semiconductor 108, and insulators 114 and 116 over the oxide semiconductor 108 and the conductors 112a and 112b.

In the transistor 100 illustrated in FIG. 39B, the oxide semiconductor 108 has a depression in a region not overlapping with the conductor 112a or the conductor 112b. Alternatively, the oxide semiconductor 108 may have a shape with no depression in the region not overlapping with the conductor 112a or the conductor 112b, as in the transistor 100 illustrated in FIG. 39D, for example.

The insulators 106 and 107 can serve as a gate insulator of the transistor. Although the transistor 100 described in this embodiment has a gate insulator including two layers, the gate insulator is not limited thereto and may be a single layer or three or more layers. The gate insulator may have a function of supplying oxygen into the oxide semiconductor 108.

The insulators 114 and 116 can serve as a protective insulator of the transistor 100. Although the transistor 100 described in this embodiment has a protective insulator including two layers, the protective insulator is not limited thereto and may be a single layer or three or more layers. The protective insulator may have a function of supplying oxygen into the oxide semiconductor 108.

With excess oxygen, the insulators 114 and 116 each include a region containing oxygen in excess of that in the stoichiometric composition (oxygen excess region). In other words, the insulators 114 and 116 are insulators capable of releasing oxygen. The oxygen excess region is formed in the insulators 114 and 116 in such a manner that oxygen is added to the insulators 114 and 116 after the deposition, for example.

Oxygen can be added by a method in which acceleration energy is applied to a gas under reduced pressure, specifically, an ion implantation method, an ion doping method, plasma treatment, or the like. When oxygen is added, a substrate is preferably heated because a larger amount of oxygen can be added. The substrate temperature at the time of oxygen addition is preferably higher than room temperature and lower than 400° C., for example. For the above plasma treatment, an apparatus with which an oxygen gas is made to be plasma by high-frequency power (also referred to as a plasma etching apparatus or a plasma ashing apparatus) is preferably used.

The amount of released oxygen can be found by measuring an insulator by thermal desorption spectroscopy (TDS). For example, the amount of released oxygen molecules from the insulators 114 and 116 is more than or equal to $8.0 \times 10^{14}/cm^2$, preferably more than or equal to $1.0 \times 10^{15}/cm^2$, and further preferably more than or equal to $1.5 \times 10^{15}/cm^2$ by TDS. Note that the surface temperature of a measured object in TDS is higher than or equal to 100° C. and lower than or equal to 700° C., and preferably higher than or equal to 100° C. and lower than or equal to 500° C.

Other components of the semiconductor device of this embodiment will be described below in detail.

<Substrate>

There is no particular limitation on the property of a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. Further alternatively, any of these substrates provided with a semiconductor element may be used as the substrate 102. As the semiconductor element provided over the substrate, a capacitor, a resistor, a switching element, a light-emitting element, a memory element, or the like is used. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102. As a method for providing the transistor over a flexible substrate, a method in which the transistor is formed over a non-flexible substrate and then is separated and transferred to the substrate 102, which is a flexible substrate, can be given. In that case, a separation layer is preferably provided between the non-flexible substrate and the transistor. As the substrate 102, a sheet, a film, or a foil containing a fiber may be used. The substrate 102 may have elasticity. The substrate 102 may have a property of returning to its original shape when bending or pulling is stopped. Alternatively, the substrate 102 may have a property of not returning to its original shape. The thickness of the substrate 102 is, for example, greater than or equal to 5 μm and less than or equal to 1000 μm, preferably greater than or equal to 10 μm and less than or equal to 700 μm, and further preferably greater than or equal to 15 μm and less than or equal to 500 μm. When the substrate 102 has a small thickness, the weight of the semiconductor device can be reduced. When the substrate 102 has a small thickness, even in the case of using glass or the like, the substrate 102 may have elasticity or a property of returning to its original shape when bending or pulling is stopped. Therefore, an impact applied to the semiconductor device over the substrate 102, which is caused by dropping or the like, can be reduced. That is, a durable semiconductor device can be provided.

For the substrate 102, which is a flexible substrate, metal, an alloy, resin, glass, or fiber thereof can be used, for example. The flexible substrate 102 preferably has a lower coefficient of linear expansion because deformation due to an environment is suppressed. The flexible substrate 102 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 102 because of its low coefficient of linear expansion.

<Conductor>

The conductor 104 serving as a gate electrode and the conductors 112a and 112b serving as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy containing any of these metal element as its component; an alloy including a combination of any of these metal elements; or the like.

Furthermore, each of the conductors 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductors 104, 112a, and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductors 104, 112a, and 112b. The use of a Cu—X alloy film enables the manufacturing cost to be reduced because wet etching process can be used in the processing.

<Gate Insulator>

As each of the insulators 106 and 107 serving as a gate insulator of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked structure of the insulators 106 and 107, an insulating film of a single layer formed using a material selected from the above or an insulating film including three or more stacked layers may be used.

Note that the insulator 107 that is in contact with the oxide semiconductor 108 serving as a channel region of the transistor 100 is preferably an oxide insulator and preferably includes a region including oxygen in excess of the stoichiometric composition (oxygen-excess region). In other words, the insulator 107 is an insulator which is capable of releasing oxygen. In order to provide the oxygen excess region in the insulator 107, the insulator 107 is formed in an oxygen atmosphere, for example. Alternatively, the oxygen excess region may be formed by oxygen addition to the insulator 107 after the deposition.

In the case where hafnium oxide is used for the insulator 107, the following effect is attained. Hafnium oxide has a higher dielectric constant than silicon oxide and silicon oxynitride. Therefore, by using hafnium oxide, the thickness of the insulator 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to obtain a transistor with a low off-state current. Examples of the crystalline structure include a monoclinic crystal structure and a cubic crystal structure. Note that one embodiment of the present invention is not limited to the above examples.

Furthermore, the insulator including an oxygen-excess region may contain a peroxide radical. Specifically, the spin density of a signal attributed to the peroxide radical is greater than or equal to $5\times10^{17}$ spins/cm$^3$. Note that the insulator containing a peroxide radical may have an asymmetric signal with a g factor of approximately 2.01 in electron spin resonance (ESR).

The insulators 106 and 107 may have a function of preventing diffusion of impurities from the substrate 102.

In this embodiment, a silicon nitride film is formed as the insulator 106, and a silicon oxide film is formed as the insulator 107. A silicon nitride film has a higher dielectric constant than a silicon oxide film and needs a larger thickness for capacitance equivalent to that of a silicon oxide film. Thus, when a silicon nitride film is included in the gate insulator of the transistor 100, the physical thickness of the insulator can be increased. This makes it possible to suppress a decrease in withstand voltage of the transistor 100 and furthermore to increase the withstand voltage, thereby inhibiting electrostatic breakdown of the transistor 100.

<Oxide Semiconductor>

The oxide semiconductor 108 contains In, Zn, and M (M is Ti, Ga, Y, Zr, La, Ce, Nd, Sn, Mg, or Hf). Typical examples of a material that can be used for the oxide semiconductor 108 include In—Ga oxide, In—Zn oxide, and In-M-Zn oxide. It is particularly preferable to use In-M-Zn oxide for the semiconductor 108.

In the case where the oxide semiconductor 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. Note that the atomic ratio of metal elements in the formed oxide semiconductor 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor 108 may be 4:2:3 or in the vicinity of 4:2:3.

Note that in the case where the oxide semiconductor 108 is formed of In-M-Zn oxide, the proportion of In and the proportion of M, not taking Zn and O into consideration, are preferably greater than 25 atomic % and less than 75 atomic %, respectively, and further preferably greater than 34 atomic % and less than 66 atomic %, respectively.

The oxide semiconductor in this embodiment is preferably deposited using a facing-target sputtering apparatus.

In addition, the oxide semiconductor in this embodiment preferably has a crystallinity peak that corresponds to a (hkl) plane (h=0, k=0, l is a natural number) observed by X-ray diffraction using a Cu Kα radiation as a radiation source. The peak preferably appears at a diffraction angle 2θ greater than or equal to 31.3° and less than 33.5°. The peak may appear at a diffraction angle 2θ greater than or equal to 31.8° and less than 32.8°.

Furthermore, in the oxide semiconductor of this embodiment, lattice spacing is preferably longer than or equal to 0.27 nm and shorter than or equal to 0.28 nm in the normal direction of the substrate.

The use of the facing-target sputtering apparatus can reduce plasma damage induced during deposition of the oxide semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

The energy gap of the oxide semiconductor 108 is 2 eV or more, preferably 2.5 eV or more, further preferably 3 eV or more. With the use of an oxide semiconductor having such a wide energy gap, the off-state current of the transistor 100 can be reduced.

The thickness of the oxide semiconductor 108 is greater than or equal to 3 nm and less than or equal to 200 nm, preferably greater than or equal to 3 nm and less than or equal to 100 nm, and further preferably greater than or equal to 3 nm and less than or equal to 50 nm.

An oxide semiconductor with low carrier density is used as the oxide semiconductor 108. For example, the carrier density of the oxide semiconductor 108 is greater than or equal to $1\times10^{-9}$/cm$^3$ and less than $8\times10^{11}$/cm$^3$, preferably greater than or equal to $1\times10^{-9}$/cm$^3$ and less than $1\times10^{11}$/cm$^3$, further preferably greater than or equal to $1\times10^{-9}$/cm$^3$ and less than $1\times10^{10}$/cm$^3$.

Note that, without limitation to the compositions and materials described above, a material with an appropriate composition may be used in accordance with required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor 108 be set to be appropriate.

Note that it is preferable to use, as the oxide semiconductor 108, an oxide semiconductor in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor has few carrier generation sources, and thus can have a low carrier density. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Further, a highly purified intrinsic or substantially highly purified intrinsic oxide semiconductor has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor can have a small variation in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

As examples of the impurities, hydrogen, nitrogen, alkali metal, alkaline earth metal, and the like are given.

Hydrogen contained in the oxide semiconductor 108 reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. For this reason, it is preferable that hydrogen be reduced as much as possible in the oxide semiconductor 108. Specifically, the hydrogen concentration in the oxide semiconductor 108, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$, yet further preferably lower than or equal to $1 \times 10^{18}$ atoms/cm$^3$, even further preferably lower than or equal to $5 \times 10^{17}$ atoms/cm$^3$, or further preferably lower than or equal to $1 \times 10^{16}$ atoms/cm$^3$.

When silicon or carbon that is one of elements belonging to Group 14 is contained in the oxide semiconductor 108, oxygen vacancies are increased in the oxide semiconductor 108, and the oxide semiconductor 108 becomes an n-type film. Thus, the concentration of silicon or carbon (the concentration is measured by SIMS) in the oxide semiconductor 108 or the concentration of silicon or carbon (the concentration is measured by SIMS) in the vicinity of an interface with the oxide semiconductor 108 is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the oxide semiconductor 108, which is measured by SIMS, is set to be lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor 108.

Furthermore, when containing nitrogen, the oxide semiconductor 108 easily becomes n-type by generation of electrons serving as carriers and an increase of carrier density. Thus, a transistor including an oxide semiconductor that contains nitrogen is likely to have normally-on characteristics. For this reason, nitrogen in the oxide semiconductor is preferably reduced as much as possible; the concentration of nitrogen which is measured by SIMS is preferably set, for example, lower than or equal to $5 \times 10^{18}$ atoms/cm$^3$.

The oxide semiconductor 108 may have a non-single-crystal structure, for example. The non-single-crystal structure includes, for example, a CAAC-OS described later, a polycrystalline structure, an nc-OS, an a-like OS, and an amorphous structure. Among the non-single-crystal structure, the amorphous structure has the highest density of defect states, whereas CAAC-OS has the lowest density of defect states.

The oxide semiconductor 108 may have an amorphous structure, for example. The oxide semiconductors having an amorphous structure each have disordered atomic arrangement and no crystalline component, for example. Alternatively, the oxide semiconductors having an amorphous structure have, for example, an absolutely amorphous structure and no crystal part.

Note that the oxide semiconductor 108 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure including two or more of a region having an amorphous structure, a region having a microcrystalline structure, a region having a polycrystalline structure, a CAAC-OS region, and a region having a single-crystal structure.

<Protective Insulator>

The insulators 114 and 116 have a function of a protective insulator. The insulators 114 and 116 contain oxygen. Furthermore, the insulator 114 is an insulator that allows oxygen to pass through. Note that the insulator 114 also functions as a film that relieves damage to the oxide semiconductor 108 at the time of forming the insulator 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulator 114.

In addition, it is preferable that the number of defects in the insulator 114 be small; as a typical example, the spin density corresponding to a signal that appears at around g=2.001 due to a dangling bond of silicon be lower than or equal to $3 \times 10^{17}$ spins/cm$^3$ by electron spin resonance (ESR) measurement. This is because if the density of defects in the insulator 114 is high, oxygen is bonded to the defects and the amount of oxygen that passes through the insulator 114 is decreased.

Note that not all oxygen entering the insulator 114 from the outside move to the outside of the insulator 114 and some oxygen remains in the insulator 114. Furthermore, movement of oxygen occurs in the insulator 114 in some cases in such a manner that oxygen enters the insulator 114 and oxygen contained in the insulator 114 moves to the outside of the insulator 114. When an oxide insulator that allows oxygen to pass through is formed as the insulator 114, oxygen released from the insulator 116 provided over the insulator 114 can be moved to the oxide semiconductor 108 through the insulator 114.

The insulator 114 can be formed using an oxide insulating film having a low density of states due to nitrogen oxide. Note that the density of states due to nitrogen oxide can be formed between the valence band maximum ($E_{v\_os}$) and the conduction band minimum ($E_{c\_os}$) of the oxide semiconductor. A silicon oxynitride film that releases less nitrogen oxide, an aluminum oxynitride film that releases less nitrogen oxide, and the like can be used as the above insulator.

Note that a silicon oxynitride film that releases a small amount of nitrogen oxide is a film of which the amount of released ammonia is larger than the amount of released nitrogen oxide in thermal desorption spectroscopy analysis; as a typical example, the amount of released ammonia is greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of the film becomes a temperature higher than or equal to 50° C. and lower than or equal to 650° C., or preferably higher than or equal to 50° C. and lower than or equal to 550° C.

Nitrogen oxide ($NO_x$; x is greater than or equal to 0 and less than or equal to 2, preferably greater than or equal to 1 and less than or equal to 2), typified by $NO_2$ or NO, forms levels in the insulator 114, for example. The level is positioned in the energy gap of the oxide semiconductor 108. Therefore, when nitrogen oxide is diffused to the vicinity of the interface between the insulator 114 and the oxide semiconductor 108, an electron is in some cases trapped by the level on the insulator 114 side. As a result, the trapped electron remains in the vicinity of the interface between the insulator 114 and the oxide semiconductor 108; thus, the threshold voltage of the transistor is shifted in the positive direction.

Nitrogen oxide reacts with ammonia and oxygen in heat treatment. Since nitrogen oxide contained in the insulator 114 reacts with ammonia contained in the insulator 116 in heat treatment, nitrogen oxide contained in the insulator 114 is reduced. Therefore, an electron is hardly trapped at the vicinity of the interface between the insulator 114 and the oxide semiconductor 108.

With such an insulator, the insulator 114 can reduce the shift in the threshold voltage of the transistor, which leads to a smaller change in the electrical characteristics of the transistor.

Note that in an ESR spectrum at 100 K or lower of the insulator 114, by heat treatment of a manufacturing process of the transistor, typified by heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulator contains.

The concentration of nitrogen of the above insulator measured by SIMS is lower than or equal to $6\times10^{20}$ atoms/cm$^3$.

The above insulator is formed by a PECVD method at a substrate temperature higher than or equal to 220° C., higher than or equal to 280° C., or higher than or equal to 350° C. using silane and dinitrogen monoxide, whereby a dense and hard film can be formed.

The insulator 116 is preferably formed using an oxide insulator that contains oxygen at a higher proportion than oxygen in the stoichiometric composition. Part of oxygen is released by heating from the oxide insulator containing more oxygen than that in the stoichiometric composition. The oxide insulator containing oxygen in excess of that in the stoichiometric composition is an oxide insulator of which the amount of released oxygen converted into oxygen atoms is greater than or equal to $8.0\times10^{14}$ atoms/cm$^2$, preferably greater than or equal to $1.0\times10^{15}$ atoms/cm$^2$ in TDS. Note that the surface temperature of a measured object in the TDS is higher than or equal to 100° C. and lower than or equal to 700° C., and preferably higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulator 116.

It is preferable that the amount of defects in the insulator 116 be small; as a typical example, the spin density corresponding to a signal which appears at g=2.001 due to a dangling bond of silicon be lower than $1.5\times10^{18}$ spins/cm$^3$, and further preferably lower than or equal to $1\times10^{15}$ spins/cm$^3$ by ESR measurement. Note that the insulator 116 is provided more apart from the oxide semiconductor 108 than the insulator 114 is; thus, the insulator 116 may have higher defect density than the insulator 114.

Furthermore, the insulators 114 and 116 can be formed using insulators formed of the same kinds of materials; thus, a boundary between the insulators 114 and 116 cannot be clearly observed in some cases. Thus, in this embodiment, the boundary between the insulators 114 and 116 is shown by a dashed line. Although a two-layer structure of the insulators 114 and 116 is described in this embodiment, the present invention is not limited to this structure. For example, a single-layer structure of either one of the insulators 114 and 116 may be employed.

To make the insulator 114 or the insulator 116 an oxide insulator containing more oxygen than that in the stoichiometric composition, oxygen can be added by a method in which acceleration energy is applied to a gas under reduced pressure; specifically, an ion implantation method, an ion doping method, plasma treatment, or the like can be used. When oxygen is added, a substrate is preferably heated because a larger amount of oxygen can be added. The substrate temperature at the time when oxygen is added is preferably higher than room temperature and lower than 400° C., for example. For the above plasma treatment, an apparatus with which an oxygen gas is made to be plasma by high-frequency power (also referred to as a plasma etching apparatus or a plasma ashing apparatus) is preferably used.

Note that the above conductors, insulators, oxide semiconductor, and the like can be formed by a sputtering method, a chemical vapor deposition (CVD) method, a vacuum evaporation method, a pulsed laser deposition (PLD) method, or the like. Alternatively, the above conductors, insulators, oxide semiconductor, and the like can be formed by a plasma enhanced chemical vapor deposition (PECVD) method, a thermal CVD method, or an ALD method. As an example of a thermal CVD method, a metal organic chemical vapor deposition (MOCVD) method can be given. Further alternatively, the above conductors, insulators, oxide semiconductor, and the like can be formed by a coating method or a printing method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer, then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; thus, an ALD method makes it possible to accurately adjust the film thickness and thus is suitable for manufacturing a minute FET.

The above conductors, insulators, oxide semiconductor, and the like can be formed by an ALD method or a thermal CVD method such as an MOCVD. To form an In—Ga—Zn—O film, for example, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed with a deposition apparatus employing ALD, two kinds of gases, i.e., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on the surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed with a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed with a deposition apparatus employing ALD, an $In(CH_3)_3$ gas and an $O_3$ gas are sequentially introduced a plurality of times to form an In—O layer, then a $Ga(CH_3)_3$ gas and an $O_3$ gas are used to form a GaO layer, and then a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used.

<Structural Example 2 of Semiconductor Device>

A structural example which is different from the transistor 100 in FIGS. 39A to 39C will be described with reference to FIGS. 40A to 40C. Note that in the case where a portion has a function similar to that described above, the same hatch pattern is applied to the portion, and the portion is not denoted by a reference numeral in some cases.

Figure 40A:
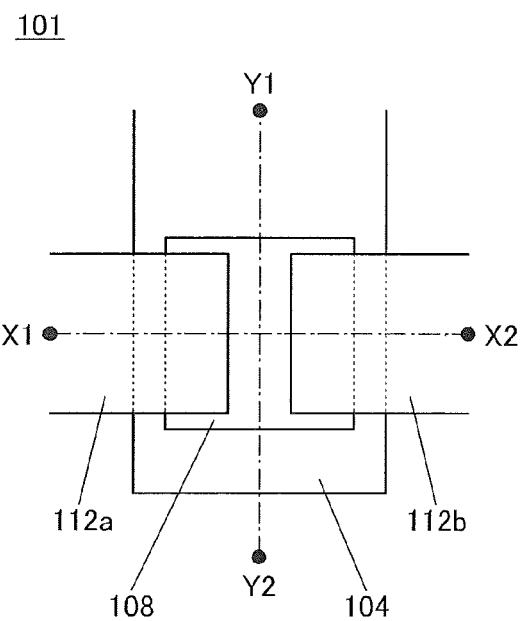
FIGS. 40A to 40C are a top view and cross-sectional views illustrating one embodiment of a semiconductor device.

FIG. 40A is a top view of a transistor 101 that is a semiconductor device of one embodiment of the present invention: FIG. 40B is a cross-sectional view taken along dashed dotted line X1-X2 in FIG. 40A, and FIG. 40C is a cross-sectional view taken along dashed dotted line Y1-Y2 in FIG. 40A.

The transistor 101 includes the conductor 104 serving as a gate electrode over the substrate 102, the insulator 106 over the substrate 102 and the conductor 104, the insulator 107 over the insulator 106, the oxide semiconductor 108 over the insulator 107, the conductor 112a serving as a source electrode that is electrically connected to the oxide semiconductor 108, the conductor 112b serving as a drain electrode that is electrically connected to the oxide semiconductor 108, the insulators 114 and 116 over the oxide semiconductor 108 and the conductors 112a and 112b, a metal oxide film 132 over the insulator 116, and a metal oxide film 134 over the metal oxide film 132. The metal oxide film 132 contains at least one metal element that is the same as a metal element contained in the oxide semiconductor 108. The metal oxide film 134 includes a region where the metal oxide film 134 is mixed with the metal oxide film 132.

Figure 40B:
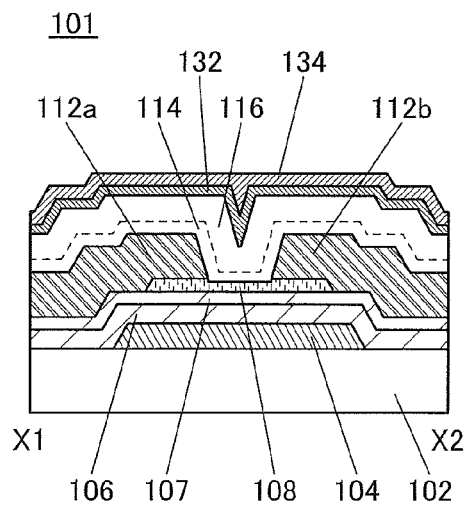
Figure 40C:
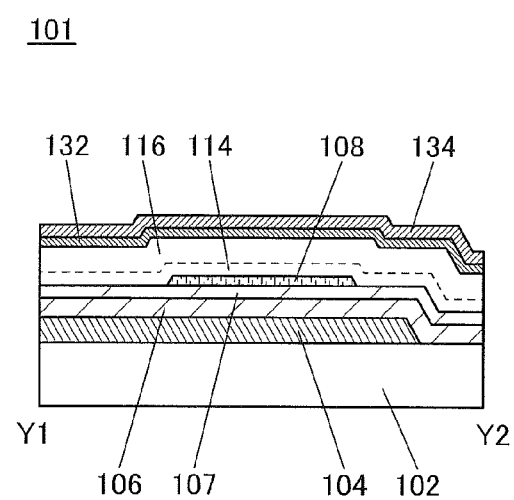

The transistor 101 illustrated in FIGS. 40A to 40C is different from the transistor 100 illustrated in FIGS. 39A to 39C in that the metal oxide film 132 over the insulator 116 and the metal oxide film 134 over the metal oxide film 132 are included.

The provision of the metal oxide films 132 and 134 as in the transistor 101 can inhibit outward diffusion of oxygen from the insulators 114 and 116. In addition, the provision of the metal oxide films 132 and 134 can inhibit entry of impurities (e.g., hydrogen and water) from the outside.

To form oxygen-excess regions in the insulators 114 and 116, oxygen may be added to the insulators 114 and 116 through the metal oxide film 132 formed over the insulator 116. The metal oxide film 132 preferably has a function of transmitting oxygen and a function of inhibiting release of oxygen so that oxygen can be added to the insulators 114 and 116 through the metal oxide film 132. The metal oxide film 132 may contain, for example, at least a metal element that is also contained in the oxide semiconductor 108.

<Metal Oxide Film>

When the metal oxide film 132 is formed using a material containing indium, oxygen can be favorably added to the insulators 114 and 116. Examples of a material containing indium that can be used for the metal oxide film 132 include indium oxide containing tungsten oxide, indium zinc oxide containing tungsten oxide, indium oxide containing titanium oxide, indium tin oxide containing titanium oxide, indium tin oxide (ITO), indium zinc oxide, and indium tin oxide containing silicon oxide (ITSO). Note that the above indium-containing materials are conductive materials with light-transmitting properties. Among the above materials, it is particularly preferable to use ITSO for the metal oxide film 132 because ITSO can be deposited over an insulator having roughness or the like with favorable coverage.

The metal oxide film 134 over the metal oxide film 132 can prevent outward diffusion of oxygen in the insulators 114 and 116.

The metal oxide film 134 is preferably formed using a material containing aluminum because outward diffusion of oxygen from the insulators 114 and 116 and/or entry of impurities (e.g., hydrogen and water) from the outside can be easily suppressed. Examples of a material containing aluminum that can be used for the metal oxide film 134 include aluminum oxide.

The metal oxide film 132 has a function of allowing oxygen to pass through and a function of inhibiting release of oxygen. The provision of the metal oxide film 132 makes it possible for oxygen to be favorably added to the insulators 114 and 116.

The metal oxide film 132 contains at least one metal element that is the same as one of those contained in the oxide semiconductor 108. In the case where the oxide semiconductor 108 contains In, Zn, and M (M is Ti, Ga, Y, Zr, La, Ce, Nd, Sn, Mg, or Hf), for example, the metal oxide film 132 contains In, Zn, or M. It is particularly preferable that the metal oxide film 132 be a conductor containing In or a semiconductor containing In.

The metal oxide film 134 has a function of inhibiting release of oxygen and a function of blocking impurities such as oxygen, hydrogen, water, alkali metal, and alkaline earth metal. The provision of the metal oxide film 134 makes it possible to inhibit outward diffusion of oxygen from the oxide semiconductor 108, outward diffusion of oxygen contained in the insulators 114 and 116, and entry of hydrogen, water, or the like into the oxide semiconductor 108 from the outside.

It is preferable that the metal oxide film 134 contain aluminum (Al), gallium (Ga), yttrium (Y), or hafnium (Hf). Examples of a material that can be used for the metal oxide film 134 include aluminum oxide, aluminum oxynitride, aluminum nitride oxide, gallium oxide, gallium oxynitride, gallium nitride oxide, yttrium oxide, yttrium oxynitride, yttrium nitride oxide, hafnium oxide, hafnium oxynitride, and hafnium nitride oxide. It is particularly preferable to use aluminum oxide for the metal oxide film 134, in which case outward diffusion of oxygen from the oxide semiconductor 108 and the insulators 114 and 116 and entry of hydrogen, water, or the like into the oxide semiconductor 108 from the outside can be inhibited.

It is preferable to form the metal oxide film 134 by a sputtering method or an ALD method.

<Structural Example 3 of Semiconductor Device>

A structural example different from the transistor 100 in FIGS. 39A to 39C will be described with reference to FIGS. 41A to 41C. Note that in the case where a portion has a function similar to that described above, the same hatch pattern is applied to the portion, and the portion is not denoted by a reference numeral in some cases.

Figure 41A:
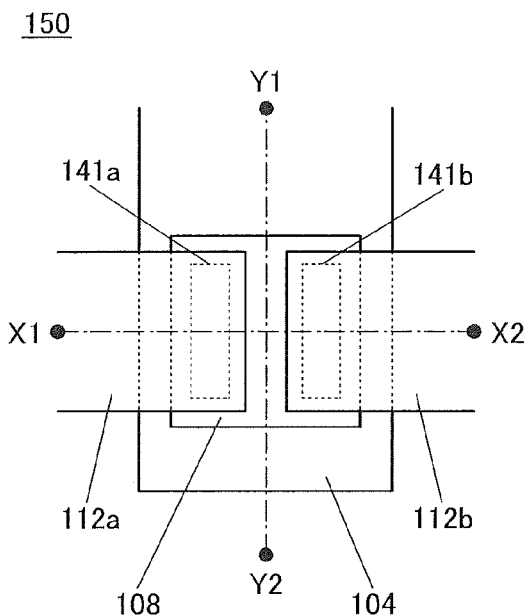
FIGS. 41A to 41C are a top view and cross-sectional views illustrating one embodiment of a semiconductor device.

FIG. 41A is a top view of a transistor 150 that is a semiconductor device of one embodiment of the present invention. FIG. 41B is a cross-sectional view taken along dashed dotted line X1-X2 in FIG. 41A, and FIG. 41C is a cross-sectional view taken along dashed dotted line Y1-Y2 in FIG. 41A.

The transistor 150 includes the conductor 104 serving as a gate electrode over the substrate 102, the insulator 106 over the substrate 102 and the conductor 104, the insulator 107 over the insulator 106, the oxide semiconductor 108 over the insulator 107, the insulator 114 over the oxide semiconductor 108, the insulator 116 over the insulator 114, the metal oxide film 132 over the insulator 116, the metal oxide film 134 over the metal oxide film 132, the conductor 112a serving as a source electrode electrically connected to the oxide semiconductor 108 through an opening 141a provided in the insulators 114 and 116 and the metal oxide films 132 and 134, and the conductor 112b serving as a drain electrode electrically connected to the oxide semiconductor 108 through an opening 141b provided in the insulators 114 and 116 and the metal oxide films 132 and 134. The metal oxide film 132 contains at least one metal element that is the same as a metal element contained in the oxide semiconductor 108. The metal oxide film 134 includes a region where the metal oxide film 134 is mixed with the metal oxide film 132.

Figure 41B:
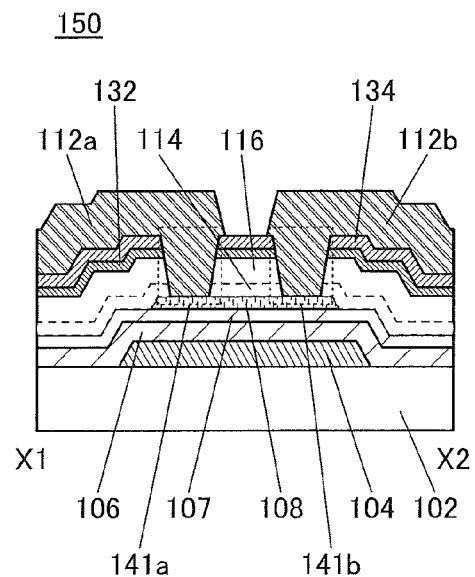
Figure 41C:
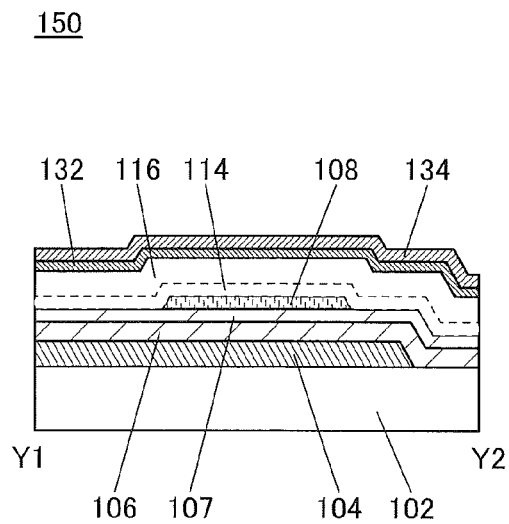

Although the transistor 100 described above has a channel-etched structure, the transistor 150 in FIGS. 41A to 41C has a channel-protective structure. Thus, the semiconductor device of one embodiment of the present invention can have either the channel-etched structure or the channel-protective structure.

As with the transistor 100 described above, the transistor 150 is provided with the insulators 114 and 116 over the oxide semiconductor 108; thus, oxygen contained in the insulators 114 and 116 can fill oxygen vacancies in the oxide semiconductor 108. Furthermore, the provision of the metal oxide films 132 and 134 over the insulator 116 makes it possible to inhibit entry of impurities into the oxide semiconductor 108 from the outside. The other components are similar to those of the transistor 100, and an effect similar to that of the transistor 100 can be obtained.

<Structural Example 4 of Semiconductor Device>

A structural example different from the transistor 150 in FIGS. 41A to 41C will be described with reference to FIGS. 42A to 42C. Note that in the case where a portion has a function similar to that described above, the same hatch pattern is applied to the portion, and the portion is not denoted by a reference numeral in some cases.

Figure 42A:
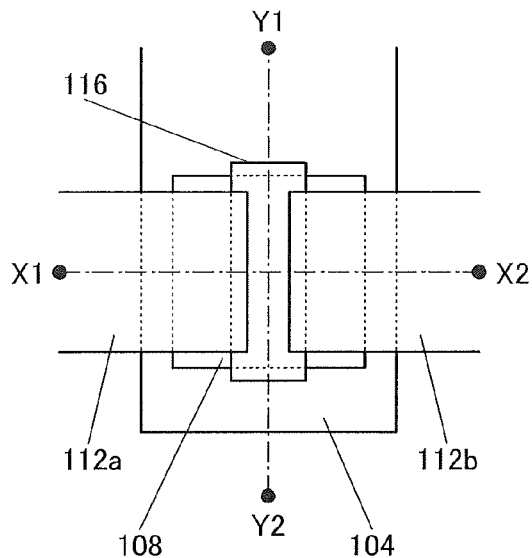
FIGS. 42A to 42C are a top view and cross-sectional views illustrating one embodiment of a semiconductor device.

FIG. 42A is a top view of a transistor 160 that is the semiconductor device of one embodiment of the present invention. FIG. 42B is a cross-sectional view taken along dashed dotted line X1-X2 in FIG. 42A, and FIG. 42C is a cross-sectional view taken along dashed dotted line Y1-Y2 in FIG. 42A.

The transistor 160 includes the conductor 104 serving as a gate electrode over the substrate 102, the insulator 106 over the substrate 102 and the conductor 104, the insulator 107 over the insulator 106, the oxide semiconductor 108 over the insulator 107, the insulator 114 over the oxide semiconductor 108, the insulator 116 over the insulator 114, the metal oxide film 132 over the insulator 116, the metal oxide film 134 over the metal oxide film 132, the conductor 112a serving as a source electrode electrically connected to the oxide semiconductor 108, and the conductor 112b serving as a drain electrode electrically connected to the oxide semiconductor 108. The metal oxide film 132 contains at least one metal element that is the same as a metal element contained in the oxide semiconductor 108. The metal oxide film 134 includes a region where the metal oxide film 134 is mixed with the metal oxide film 132.

Note that the transistor 160 is different from the transistor 150 in FIGS. 41A to 41C in the shapes of the insulators 114 and 116 and the metal oxide films 132 and 134. Specifically, the insulators 114 and 116 and the metal oxide films 132 and 134 of the transistor 160 have island shapes and are provided over a channel region of the oxide semiconductor 108. The other components are similar to those of the transistor 150, and an effect similar to that of the transistor 150 can be obtained.

As with the transistor 100, the transistor 160 is provided with the insulators 114 and 116 over the oxide semiconductor 108; thus, oxygen contained in the insulators 114 and 116 can fill oxygen vacancies in the oxide semiconductor 108. Furthermore, the provision of the metal oxide films 132 and 134 over the insulator 116 makes it possible to inhibit entry of impurities into the oxide semiconductor 108 from the outside.

<Structural Example 5 of Semiconductor Device>

A structural example which is different from the transistor 100 in FIGS. 39A to 39C will be described with reference to FIGS. 43A to 43C. Note that in the case where a portion has a function similar to that described above, the same hatch pattern is applied to the portion, and the portion is not denoted by a reference numeral in some cases.

Figure 43A:
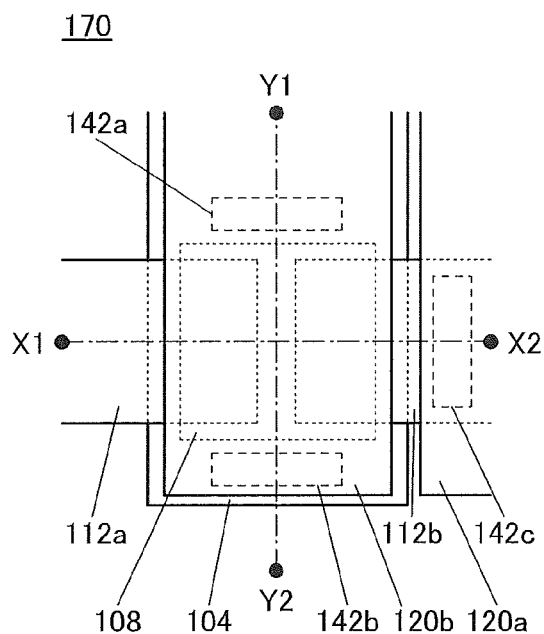
FIGS. 43A to 43C are a top view and cross-sectional views illustrating one embodiment of a semiconductor device.

FIG. 43A is a top view of a transistor 170 that is the semiconductor device of one embodiment of the present invention. FIG. 43B is a cross-sectional view taken along dashed dotted line X1-X2 in FIG. 43A, and FIG. 43C is a cross-sectional view taken along dashed dotted line Y1-Y2 in FIG. 43A.

The transistor 170 includes the conductor 104 serving as a first gate electrode over the substrate 102, the insulator 106 over the substrate 102 and the conductor 104, the insulator 107 over the insulator 106, the oxide semiconductor 108 over the insulator 107, the conductor 112a serving as a source electrode that is electrically connected to the oxide semiconductor 108, the conductor 112b serving as a drain electrode that is electrically connected to the oxide semiconductor 108, the insulator 114 over the oxide semiconductor 108 and the conductors 112a and 112b, the insulator 116 over the insulator 114, the metal oxide film 132 over the insulator 116, the metal oxide film 134 over the metal oxide film 132, and conductors 120a and 120b over the metal oxide film 134.

As with the transistor 100 described above, the transistor 170 is provided with the insulators 114 and 116 over the oxide semiconductor 108; thus, oxygen contained in the insulators 114 and 116 can fill oxygen vacancies in the oxide semiconductor 108. Furthermore, the provision of the metal oxide films 132 and 134 over the insulator 116 makes it possible to inhibit entry of impurities into the oxide semiconductor 108 from the outside.

In the transistor 170, the insulators 114 and 116 and the metal oxide films 132 and 134 have a function of a second gate insulator of the transistor 170. In the transistor 170, the conductor 120a has a function of, for example, a pixel electrode used for a display device. The conductor 120a is connected to the conductor 112b through an opening 142c provided in the insulators 114 and 116 and metal oxide films 132 and 134. In the transistor 170, the conductor 120b functions as a second gate electrode (also referred to as a back gate electrode).

Figure 43B:
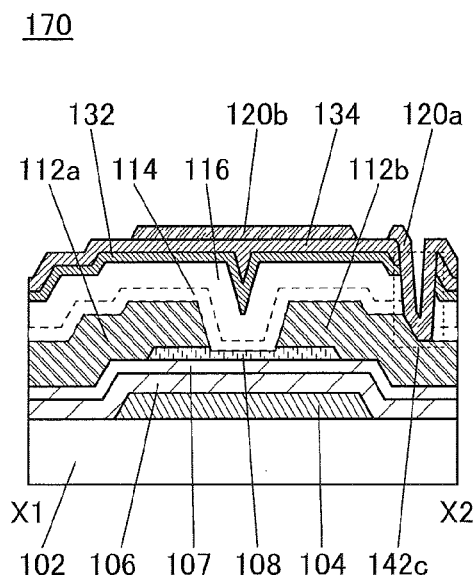
Figure 43C:
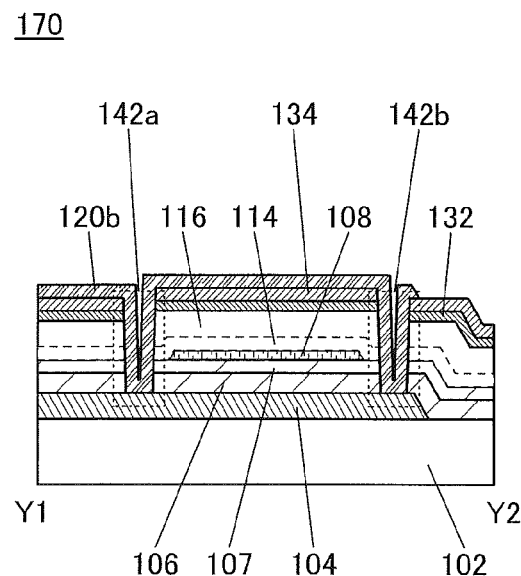

As illustrated in FIG. 43C, the conductor 120b is connected to the conductor 104 serving as the first gate electrode through openings 142a and 142b provided in the insulators 106, 107, 114, and 116 and the metal oxide films 132 and 134. Accordingly, the conductor 120b and the conductor 104 are supplied with the same potential.

Note that although the structure in which the openings 142a and 142b are provided so that the conductor 120b and the conductor 104 are connected to each other is described in this embodiment, one embodiment of the present invention is not limited thereto. For example, a structure in which only one of the openings 142a and 142b is provided so that the conductor 120b and the conductor 104 are connected to each other, or a structure in which the openings 142a and 142b are not provided and the conductor 120b and the conductor 104 are not connected to each other may be employed. Note that in the case where the conductor 120b and the conductor 104 are not connected to each other, it is possible to apply different potentials to the conductor 120b and the conductor 104.

As illustrated in FIG. 43B, the oxide semiconductor 108 is positioned to be opposite each of the conductor 104 serving as the first gate electrode and the conductor 120b serving as the second gate electrode, and is sandwiched between the two conductors serving as gate electrodes. The lengths in the channel length direction and the channel width direction of the conductor 120b serving as the second gate electrode are longer than those in the channel length direction and the channel width direction of the oxide semiconductor 108. The whole oxide semiconductor 108 is covered with the conductor 120b with the insulators 114 and 116 and the metal oxide films 132 and 134 positioned therebetween. In addition, since the conductor 120b serving as the second gate electrode is connected to the conductor 104 serving as the first gate electrode through the openings 142a and 142b provided in the insulators 106, 107, 114 and 116 and the metal oxide films 132 and 134; a side surface of the oxide semiconductor 108 in the channel width direction faces the conductor 120b serving as the second gate electrode with the insulators 114 and 116 and the metal oxide films 132 and 134 positioned therebetween.

In other words, the transistor 170 has the following structure in the channel width direction: the conductor 104 serving as the first gate electrode and the conductor 120b serving as the second gate electrode are connected to each other in the openings provided in the insulators 106 and 107 serving as a gate insulator and the insulators 114 and 116 and the metal oxide films 132 and 134 serving as the second gate insulator, and the conductor 104 serving as the first gate electrode and the conductor 120b serving as the second gate electrode surround the oxide semiconductor 108, with the insulators 106 and 107 serving as the gate insulator and the insulators 114 and 116 and the metal oxide films 132 and 134 serving as the second gate insulator positioned between the conductor 104 or 120b and the oxide semiconductor 108.

Such a structure makes it possible that the oxide semiconductor 108 included in the transistor 170 is electrically surrounded by electric fields of the conductor 104 serving as the first gate electrode and the conductor 120b serving as the second gate electrode. The device structure of a transistor, like that of the transistor 170, in which electric fields of a first gate electrode and a second gate electrode electrically surround an oxide semiconductor where a channel region is formed can be referred to as a surrounded channel (s-channel) structure.

Since the transistor 170 has the s-channel structure, an electric field for inducing a channel can be effectively applied to the oxide semiconductor 108 by the conductor 104 serving as the first gate electrode; therefore, the current drive capability of the transistor 170 can improve and high on-state current characteristics can be obtained. In addition, since the on-state current can be increased, it is possible to reduce the size of the transistor 170. In addition, since the transistor 170 has a structure in which the oxide semiconductor 108 is surrounded by the conductor 104 serving as the first gate electrode and the conductor 120b serving as the second gate electrode, the mechanical strength of the transistor 170 can be increased.

<Structural Example 6 of Semiconductor Device>

Structural examples different from the transistor 100 in FIGS. 39A to 39C will be described with reference to FIGS. 44A to 44D. Note that in the case where a portion has a function similar to that described above, the same hatch pattern is applied to the portion, and the portion is not denoted by a reference numeral in some cases.

FIGS. 44A to 44D are cross-sectional views illustrating variations of the transistor 100 in FIGS. 39B and 39C.

Figure 44A:
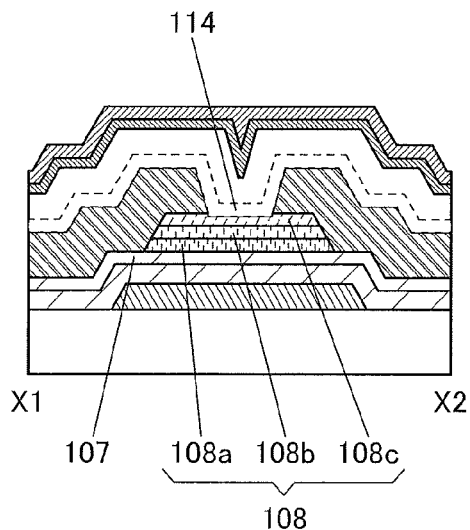
FIGS. 44A to 44D are cross-sectional views each illustrating one embodiment of a semiconductor device.
Figure 44B:
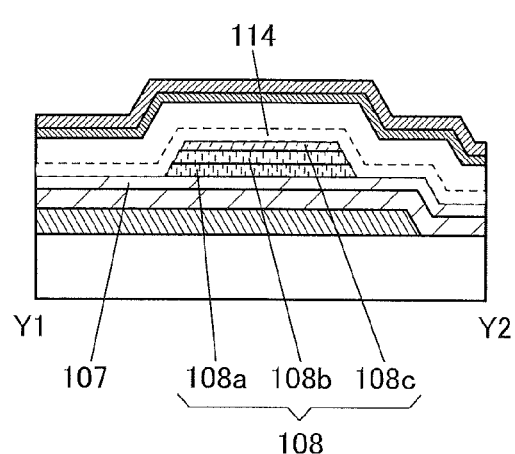

A transistor 100A in FIGS. 44A and 44B has the same structure as the transistor 100 in FIGS. 39B and 39C except that the oxide semiconductor 108 has a three-layer structure. Specifically, the oxide semiconductor 108 of the transistor 100A includes an oxide semiconductor 108a, an oxide semiconductor 108b, and an oxide semiconductor 108c.

Figure 44C:
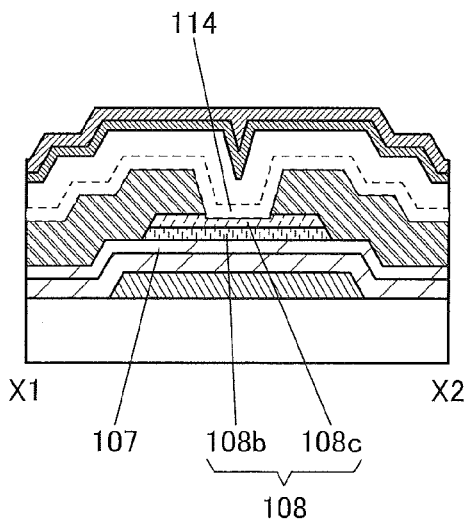
Figure 44D:
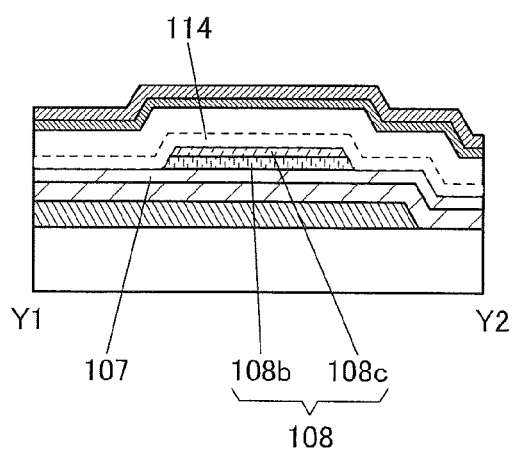

A transistor 100B in FIGS. 44C and 44D has the same structure as the transistor 100 in FIGS. 39B and 39C except that the oxide semiconductor 108 has a two-layer structure. Specifically, the oxide semiconductor 108 of the transistor 100B includes an oxide semiconductor 108b and an oxide semiconductor 108c.

Here, a band structure including the oxide semiconductors 108a, 108b, and 108c and the insulators in contact with the oxide semiconductors 108b and 108c is described with reference to FIGS. 45A and 45B.

Figure 45A:
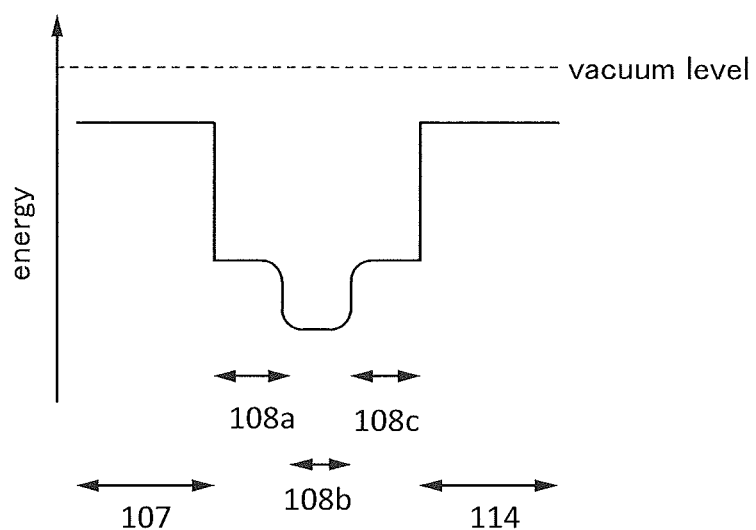
FIGS. 45A and 45B are band diagrams.

FIG. 45A shows an example of a band structure in the thickness direction of a stack including the insulator 107, the oxide semiconductors 108a, 108b, and 108c, and the insulator 114. FIG. 45B shows an example of a band structure in the thickness direction of a stack including the insulator 107, the oxide semiconductors 108b and 108c, and the insulator 114. For easy understanding, the conduction band minimum (Ec) of each of the insulator 107, the oxide semiconductors 108a, 108b, and 108c, and the insulator 114 is shown in the band diagrams.

In the band structure of FIG. 45A, a silicon oxide film is used as each of the insulators 107 and 114, an oxide semiconductor formed using a metal oxide target having an atomic ratio of metal elements of In:Ga:Zn=1:3:2 is used as the oxide semiconductor 108a, an oxide semiconductor formed using a metal oxide target having an atomic ratio of metal elements of In:Ga:Zn=1:1:1 is used as the oxide semiconductor 108b, and an oxide semiconductor formed using a metal oxide target having an atomic ratio of metal elements of In:Ga:Zn=1:3:2 is used as the oxide semiconductor 108c.

Figure 45B:
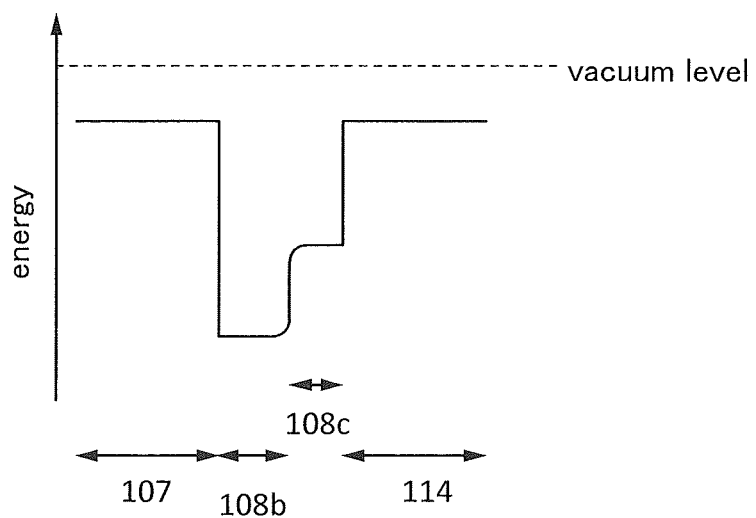

In the band structure of FIG. 45B, a silicon oxide film is used as each of the insulators 107 and 114, an oxide semiconductor formed using a metal oxide target having an atomic ratio of metal elements of In:Ga:Zn=1:1:1 is used as the oxide semiconductor 108b, and an oxide semiconductor formed using a metal oxide target having an atomic ratio of metal elements of In:Ga:Zn=1:3:2 is used as the oxide semiconductor 108c.

As illustrated in FIGS. 45A and 45B, the conduction band minimum gradually varies between the oxide semiconductor 108a and the oxide semiconductor 108b and between the oxide semiconductor 108b and the oxide semiconductor 108c. In other words, the conduction band minimum is continuously varied or continuously connected. To obtain such a band structure, there exists no impurity, which forms a defect state such as a trap center or a recombination center, at the interface between the oxide semiconductor 108a and the oxide semiconductor 108b or at the interface between the oxide semiconductor 108b and the oxide semiconductor 108c.

To form a continuous junction between the oxide semiconductor 108a and the oxide semiconductor 108b and between the oxide semiconductor 108b and the oxide semiconductor 108c, it is necessary to form the films successively without exposure to the air by using a multi-chamber deposition apparatus (sputtering apparatus) provided with a load lock chamber. It is particularly preferable to use a facing-target sputtering apparatus.

In addition, the oxide semiconductor in this embodiment preferably has a crystallinity peak that corresponds to a (hkl) plane (h=0, k=0, l is a natural number) observed by X-ray diffraction using a Cu Kα radiation as a radiation source. The peak preferably appears at a diffraction angle 2θ greater than or equal to 31.3° and less than 33.5°. The peak may appear at a diffraction angle 2θ greater than or equal to 31.8° and less than 32.8°.

Furthermore, in the oxide semiconductor of this embodiment, lattice spacing is preferably longer than or equal to 0.27 nm and shorter than or equal to 0.28 nm in the normal direction of the substrate.

The use of the facing-target sputtering apparatus can reduce plasma damage induced during deposition of the oxide semiconductor. Accordingly, oxygen vacancies in the oxide semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

With the band structure of FIG. 45A or FIG. 45B, the oxide semiconductor 108b serves as a well, and a channel region is formed in the oxide semiconductor 108b in the transistor with the stacked-layer structure.

In FIGS. 45A and 45B, the conduction band minimum of each of the oxide semiconductors 108a and 108c is closer to the vacuum level than that of the oxide semiconductor 108b is. A typical difference between the conduction band minimum of the oxide semiconductor 108b and the conduction band minimum of each of the oxide semiconductors 108a and 108c is greater than or equal to 0.15 eV or 0.5 eV and less than or equal to 2 eV or 1 eV. This means that the difference between the electron affinity (the electron affinity is the difference between the vacuum level and the conduction band minimum) of the oxide semiconductor 108b and the electron affinity of each of the oxide semiconductors 108a and 108c is greater than or equal to 0.15 eV or 0.5 eV, and less than or equal to 2 eV or 1 eV.

In such a structure, the oxide semiconductor 108b serves as a main path of current and functions as a channel region. In addition, since the oxide semiconductors 108a and 108c each contain one or more metal elements that are the same as those contained in the oxide semiconductor 108b in which a channel region is formed, interface scattering of carriers is less likely to occur at the interface between the oxide semiconductor 108a and the oxide semiconductor 108b or at the interface between the oxide semiconductor 108b and the oxide semiconductor 108c. Thus, a decrease in the field-effect mobility of the transistor is suppressed because the movement of carriers is not hindered at the interface.

To prevent each of the oxide semiconductors 108a and 108c from functioning as part of a channel region, a material having sufficiently low conductivity is preferably used for the oxide semiconductors 108a and 108c. Alternatively, a material which has a smaller electron affinity than the oxide semiconductor 108b and has a difference in energy level in the conduction band minimum from the oxide semiconductor 108b (band offset) is preferably used for the oxide semiconductors 108a and 108c. Furthermore, to inhibit generation of a difference between threshold voltages due to the value of the drain voltage, it is preferable to form the oxide semiconductors 108a and 108c using a material whose conduction band minimum is closer to the vacuum level than that of the oxide semiconductor 108b by 0.2 eV or more, preferably 0.5 eV or more.

It is preferable that the oxide semiconductors 108a and 108c not have a spinel crystal structure. This is because if the oxide semiconductors 108a and 108c have a spinel crystal structure, constituent elements of the conductors 112a and 112b might be diffused to the oxide semiconductor 108b at the interface between the spinel crystal structure and another region. Note that each of the oxide semiconductors 108a and 108c is preferably a CAAC-OS, which will be described later, in which case a higher blocking property against constituent elements of the conductors 112a and 112b, for example, copper elements, is obtained.

The thickness of each of the oxide semiconductors 108a and 108c is greater than or equal to a thickness that is capable of inhibiting diffusion of the constituent elements of the conductors 112a and 112b to the oxide semiconductor 108b, and less than a thickness that inhibits supply of oxygen from the insulator 114 to the oxide semiconductor 108b. For example, when the thickness of each of the oxide semiconductors 108a and 108c is greater than or equal to 10 nm, diffusion of the constituent elements of the conductors 112a and 112b to the oxide semiconductor 108b can be inhibited. When the thickness of each of the oxide semiconductors 108a and 108c is less than or equal to 100 nm, oxygen can be effectively supplied from the insulators 114 and 116 to the oxide semiconductor 108b.

When the oxide semiconductors 108a and 108c are each an In-M-Zn oxide in which the atomic ratio of the element M (M is Ti, Ga, Y, Zr, La, Ce, Nd, Mg, or Hf) is higher than that of In, the energy gap of each of the oxide semiconductors 108a and 108c can be large and the electron affinity thereof can be small. Therefore, a difference in electron affinity between the oxide semiconductor 108b and each of the oxide semiconductors 108a and 108c may be controlled by the proportion of the element M. Furthermore, an oxygen vacancy is less likely to be generated in the oxide semiconductor layer in which the atomic ratio of Ti, Ga, Y, Zr, La, Ce, Nd, or Hf is higher than that of In because Ti, Ga, Y, Zr, La, Ce, Nd, Mg, and Hf are each a metal element that is strongly bonded to oxygen.

When an In-M-Zn oxide is used for the oxide semiconductors 108a and 108c, the proportions of In and M, not taking Zn and O into consideration, are as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, gallium oxide may be used for each of the oxide semiconductors 108a and 108c.

Furthermore, in the case where each of the oxide semiconductors 108a, 108b, and 108c is an In-M-Zn oxide, the proportion of M atoms in each of the oxide semiconductors 108a and 108c is higher than that in the oxide semiconductor 108b. As a typical example, the proportion of M atoms in each of the oxide semiconductors 108a and 108c is 1.5 or more times, preferably twice or more times, or further preferably three or more times as high as that in the oxide semiconductor 108b.

Furthermore, in the case where the oxide semiconductors 108a, 108b, and 108c are each an In-M-Zn oxide, when the oxide semiconductor 108b has an atomic ratio of In:M:Zn=$x_1$:$y_1$:$z_1$ and the oxide semiconductors 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. In this case, it is preferable that in the oxide semiconductor 108b, $y_1$ be higher than or equal to $x_1$ because a transistor including the oxide semiconductor 108b can have stable electric characteristics. However, when $y_1$ is three or more times as large as $x_1$, the field-effect mobility of the transistor including the oxide semiconductor 108b is reduced. Accordingly, $y_1$ is preferably smaller than three times $x_1$.

In the case where the oxide semiconductor 108b is an In-M-Zn oxide and a target having the atomic ratio of metal elements of In:M:Zn=$x_1$:$y_1$:$z_1$ is used for depositing the oxide semiconductor 108b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS to be described later is easily formed as the oxide semiconductor 108b. Typical examples of the atomic ratio of the metal elements of the target include In:M:Zn=1:1:1, In:M:Zn=1:1:1.2, and In:M:Zn=3:1:2.

In the case where the oxide semiconductors 108a and 108c are each an In-M-Zn oxide and a target having an atomic ratio of metal elements of In:M:Zn=$x_2$:$y_2$:$z_2$ is used for depositing the oxide semiconductors 108a and 108c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. When the atomic ratio of M with respect to indium is high, the energy gap of the oxide semiconductors 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductors 108a and 108c are each an In-M oxide, when a divalent metal element (e.g., zinc) is not included as M, the oxide semiconductors 108a and 108c which do not include a spinel crystal structure can be formed. As each of the oxide semiconductors 108a and 108c, for example, an In—Ga oxide film can be used. The In—Ga oxide can be formed by a sputtering method using an In—Ga metal oxide target (In:Ga=7:93), for example. To deposit the oxide semiconductors 108a and 108c by a sputtering method using DC discharge, on the assumption that an atomic ratio of In:M is x:y, it is preferable that y/(x+y) be less than or equal to 0.96, or further preferably less than or equal to 0.95, for example, 0.93.

In each of the oxide semiconductors 108a, 108b, and 108c, the proportions of the atoms in the above atomic ratio vary within a range of ±40% as an error.

The structures of the transistors of this embodiment can be freely combined with each other.

<Method 1 for Manufacturing Semiconductor Device>

Next, a method for manufacturing the transistor 100 that is the semiconductor device of one embodiment of the present invention will be described with reference to FIGS. 46A to 46C and FIGS. 47A and 47B. Note that FIGS. 46A to 46C and FIGS. 47A and 47B are cross-sectional views illustrating the method for manufacturing the semiconductor device.

Figure 46A:
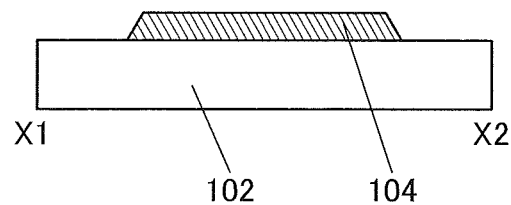
FIGS. 46A to 46C are cross-sectional views illustrating an example of a manufacturing process of a semiconductor device.

First, a conductor is formed over the substrate 102 and processed through a lithography process and an etching process, whereby the conductor 104 serving as a gate electrode is formed (see FIG. 46A).

In this embodiment, a glass substrate is used as the substrate 102, and as the conductor 104 serving as a gate electrode, a 100-nm-thick tungsten film is formed by a sputtering method.

Figure 46B:
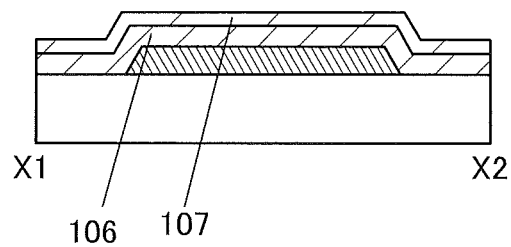

Then, the insulators 106 and 107 serving as gate insulators are formed over the conductor 104 (see FIG. 46B).

In this embodiment, a 400-nm-thick silicon nitride film as the insulator 106 and a 50-nm-thick silicon oxynitride film as the insulator 107 are formed by a PECVD method.

The insulator 106 has a stacked-layer structure of silicon nitride films. Specifically, the insulator 106 can have a three-layer stacked-layer structure of a first silicon nitride film, a second silicon nitride film, and a third silicon nitride film. An example of the three-layer stacked-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the condition where silane at a flow rate of 200 sccm, nitrogen at a flow rate of 2000 sccm, and an ammonia gas at a flow rate of 2000 sccm are supplied as a source gas to the reaction chamber of the PECVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane at a flow rate of 200 sccm and nitrogen at a flow rate of 5000 sccm are supplied as a source gas to the reaction chamber of the PECVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C.

When the insulator 106 has the three-layer stacked-layer structure of silicon nitride films, for example, in the case where a conductor containing copper (Cu) is used as the conductor 104, the following effect can be obtained.

The first silicon nitride film can inhibit diffusion of a copper (Cu) element from the conductor 104. The second silicon nitride film has a function of releasing hydrogen and can improve withstand voltage of the insulating film serving as a gate insulating film. The third silicon nitride film releases a small amount of hydrogen and can inhibit diffusion of hydrogen released from the second silicon nitride film.

The insulator 107 is preferably an insulator containing oxygen to improve characteristics of an interface with the oxide semiconductor 108 formed later.

Figure 46C:
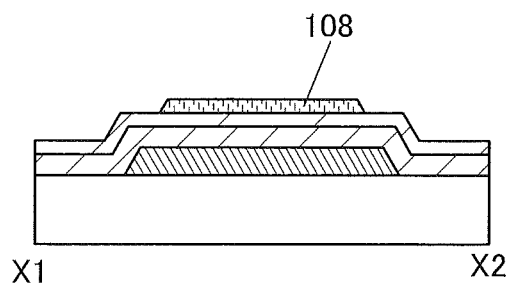

Next, the oxide semiconductor 108 is formed over the insulator 107 (see FIG. 46C).

In this embodiment, an oxide semiconductor is formed by a sputtering method using an In—Ga—Zn oxide target (having an atomic ratio of In:Ga:Zn=1:1:1.2), a mask is formed over the oxide semiconductor through a lithography process, and the oxide semiconductor is processed into a desired shape, whereby the oxide semiconductor 108 having an island shape is formed. It is particularly preferable to use a facing-target sputtering apparatus.

After the oxide semiconductor 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor and can reduce hydrogen, water, and the like contained in the oxide semiconductor 108. Note that the heat treatment for the purpose of reducing hydrogen, water, and the like may be performed before the oxide semiconductor 108 is processed into an island shape.

A gas baking furnace, an electric furnace, an RTA apparatus, or the like can be used for the heat treatment to which the oxide semiconductor 108 is subjected. With the use of an RTA apparatus, the heat treatment can be performed at a temperature higher than or equal to the strain point of the substrate if the heating time is short. Therefore, the heat treatment time can be shortened.

The heat treatment to which the oxide semiconductor 108 is subjected may be performed in an atmosphere of nitrogen gas, oxygen gas, clean dry air (also referred to as CDA, which is an air with a water content of 20 ppm or less, preferably 1 ppm or less, further preferably 10 ppb or less), or rare gas (e.g., argon or helium). The atmosphere of nitrogen gas, oxygen gas, CDA, or rare gas preferably does not contain hydrogen, water, and the like.

The purity of the nitrogen gas, the oxygen gas, or CDA is preferably increased, for example. Specifically, the purity of the nitrogen gas, the oxygen gas, or CDA is preferably 6N (99.9999%) or 7N (99.99999%). When a gas which is highly purified to have a dew point of −60° C. or lower, preferably −100° C. or lower, is used as the nitrogen gas, the oxygen gas, or CDA, entry of moisture and the like into the oxide semiconductor 108 can be minimized.

Furthermore, the oxide semiconductor 108 may be subjected to another heat treatment in an oxygen atmosphere or a CDA atmosphere after the heat treatment in a nitrogen atmosphere or a rare gas atmosphere. As a result, hydrogen, water, and the like can be released from the oxide semiconductor 108 and oxygen can be supplied to the oxide semiconductor 108 at the same time. Consequently, the amount of oxygen vacancies in the oxide semiconductor 108 can be reduced.

In addition, time for baking with the use of either a mixed gas of nitrogen and oxygen or CDA may be set longer (e.g., 1 to 10 hours inclusive) as necessary. Increasing the heating time in an oxygen-containing atmosphere makes it possible to favorably fill the oxygen vacancies formed in the oxide semiconductor 108.

In the case where the oxide semiconductor is formed by a sputtering method, a rare gas (typically argon), oxygen, or a mixed gas of a rare gas and oxygen is used as a sputtering gas, as appropriate. In the case where the mixed gas of a rare gas and oxygen is used, the proportion of oxygen to a rare gas is preferably increased. In addition, increasing the purity of a sputtering gas is necessary. For example, as an oxygen gas or an argon gas used for a sputtering gas, a gas that is highly purified to have a dew point of −60° C. or lower, further preferably −100° C. or lower is used, whereby entry of moisture or the like into the oxide semiconductor 108 can be minimized.

In the case where the oxide semiconductor 108 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor 108, as much as possible. Alternatively, a turbo molecular pump and a cold trap are preferably combined so as to prevent a backflow of a gas, especially a gas containing carbon or hydrogen from an exhaust system to the inside of the chamber.

Figure 47A:
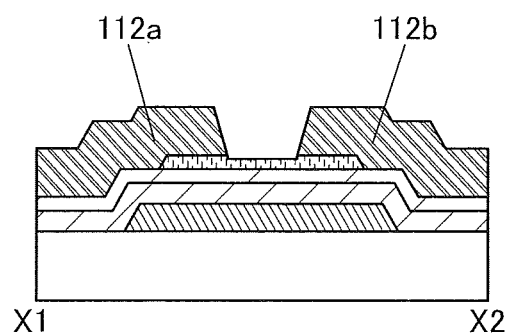
FIGS. 47A and 47B are cross-sectional views illustrating an example of a manufacturing process of a semiconductor device.

Next, the conductors 112a and 112b serving as source and drain electrodes are formed over the insulator 107 and the oxide semiconductor 108 (see FIG. 47A).

In this embodiment, the conductors 112a and 112b are formed in the following manner: a stack including a 50-nm-thick tungsten film and a 400-nm-thick aluminum film is formed by a sputtering method, a mask is formed over the stack through a lithography process, and the stack is processed into desired shapes. Although the conductors 112a and 112b each have a two-layer stacked-layer structure in this embodiment, one embodiment of the present invention is not limited thereto. For example, the conductors 112a and 112b each may have a three-layer stacked-layer structure including a 50-nm-thick titanium film, a 400-nm-thick aluminum film, and a 100-nm-thick titanium film.

After the conductors 112a and 112b are formed, a surface of the oxide semiconductor 108 (on a back channel side) may be cleaned. The cleaning may be performed, for example, using a chemical solution such as phosphoric acid. The cleaning using a chemical solution such as a phosphoric acid can remove impurities (e.g., an element contained in the conductors 112a and 112b) attached to the surface of the oxide semiconductor 108.

Note that a recessed portion might be formed in part of the oxide semiconductor 108 in the step of forming the conductors 112a and 112b and/or the cleaning step.

Figure 47B:
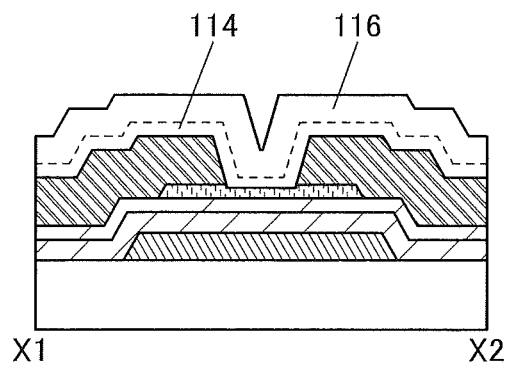

Next, the insulators 114 and 116 serving as a protective insulator are formed over the oxide semiconductor 108 and the conductors 112a and 112b (see FIG. 47B).

Note that after the insulator 114 is formed, the insulator 116 is preferably formed in succession without exposure to the air. After the insulator 114 is formed, the insulator 116 is formed in succession without exposure to the air while at least one of the flow rate of a source gas, pressure, a high-frequency power, and a substrate temperature is adjusted, whereby the concentration of impurities attributed to the atmospheric component at the interface between the insulator 114 and the insulator 116 can be reduced and oxygen in the insulators 114 and 116 can be moved to the oxide semiconductor 108; accordingly, the amount of oxygen vacancies in the oxide semiconductor 108 can be reduced.

As the insulator 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulator containing nitrogen and having a small number of defects can be formed as the insulator 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulator 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulator 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C.; the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulator 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulator 116 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulator which contains oxygen at a higher proportion than the stoichiometric composition and from which part of oxygen is released by heating.

Note that the insulator 114 functions as a protective film for the oxide semiconductor 108 in the step of forming the insulator 116. Therefore, the insulator 116 can be formed using the high-frequency power having a high power density while damage to the oxide semiconductor 108 is reduced.

Note that in the deposition conditions of the insulator 116, when the flow rate of the deposition gas containing silicon with respect to the oxidizing gas is increased, the amount of defects in the insulator 116 can be reduced. As a typical example, it is possible to form an oxide insulating layer in which the amount of defects is small, i.e., the spin density of a signal which appears at around g=2.001 originating from a dangling bond of silicon is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor can be improved.

Heat treatment may be performed after the insulators 114 and 116 are formed. The heat treatment can reduce nitrogen oxide contained in the insulators 114 and 116. By the heat treatment, part of oxygen contained in the insulators 114 and 116 can be moved to the oxide semiconductor 108, so that the amount of oxygen vacancies included in the oxide semiconductor 108 can be reduced.

The temperature of the heat treatment performed on the insulators 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, CDA, or a rare gas (argon, helium, and the like). Note that a gas baking furnace, an electric furnace, an RTA apparatus, or the like can be used for the heat treatment, in which it is preferable that hydrogen, water, and the like not be contained in the nitrogen, oxygen, ultra-dry air, or a rare gas.

In this embodiment, the heat treatment is performed at 350° C. for one hour in an atmosphere of nitrogen and oxygen.

Through the above-described process, the transistor 100 illustrated in FIGS. 39A to 39C can be fabricated.

<Method 2 for Manufacturing Semiconductor Device>

Figure 48A:
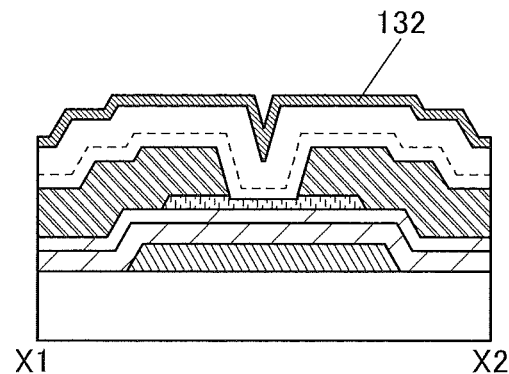
FIGS. 48A to 48C are cross-sectional views illustrating an example of a manufacturing process of a semiconductor device.
Figure 48B:
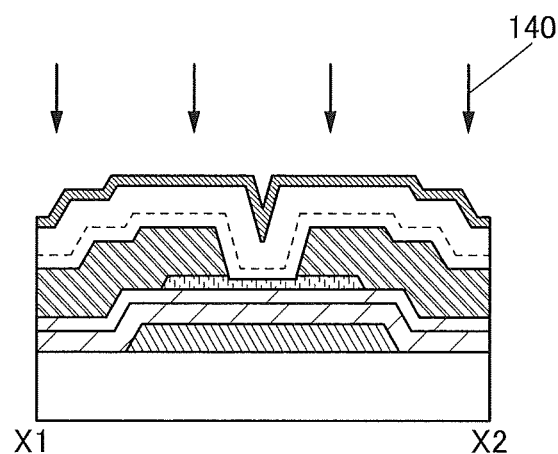
Figure 48C:
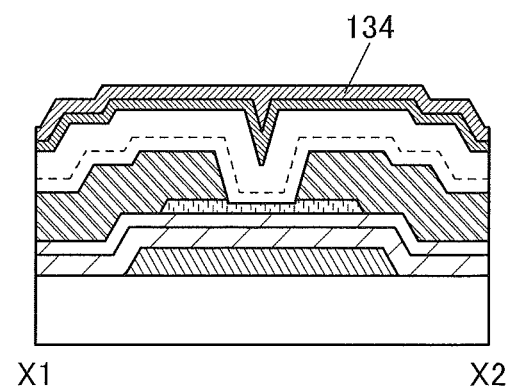

Next, an example of a method for manufacturing the transistor 101 in FIGS. 40A to 40C that is the semiconductor device of one embodiment of the present invention will be described with reference to FIGS. 48A to 48C. FIGS. 48A to 48C are cross-sectional views illustrating a method for manufacturing a semiconductor device.

First, the steps up to the step shown in FIG. 47B are performed. Then, the metal oxide film 132 is formed over the insulator 116 (see FIG. 48A).

The metal oxide film 132 can be formed using a conductor containing indium or a semiconductor containing indium. In this embodiment, a 5-nm-thick ITSO film is formed, as the metal oxide film 132, with the use of a sputtering apparatus.

Note that the thickness of the metal oxide film 132 is preferably greater than or equal to 1 nm and less than or equal to 20 nm, or greater than or equal to 2 nm and less than or equal to 10 nm, in which case oxygen is favorably transmitted and release of oxygen can be inhibited.

Next, oxygen 140 is introduced into the insulators 114 and 116 through the metal oxide film 132 (see FIG. 48B).

Examples of the method for introducing the oxygen 140 into the insulators 114 and 116 through the metal oxide film 132 include an ion doping method, an ion implantation method, and a plasma treatment method. For the plasma treatment method, high-density plasma may be generated by exciting oxygen with a microwave.

By application of a bias voltage to the substrate side when the oxygen 140 is introduced, the oxygen 140 can be effectively introduced into the insulators 114 and 116. As the bias voltage, for example, an ashing apparatus is used, and power density applied to a substrate side of the ashing apparatus can be greater than or equal to 1 W/cm$^2$ and less than or equal to 5 W/cm$^2$. The substrate temperature during introduction of the oxygen 140 is higher than room temperature and lower than 400° C., preferably higher than or equal to 100° C. and lower than or equal to 350° C., whereby the oxygen can be introduced efficiently into the insulators 114 and 116.

In this embodiment, an ashing apparatus is used. An O$_2$ gas is introduced into the ashing apparatus and a bias is applied to the substrate side, so that the oxygen 140 is introduced into the insulators 114 and 116.

Oxygen is introduced into the insulators 114 and 116 with the metal oxide film 132 provided thereover, thus, the metal oxide film 132 functions as a protective film that inhibits oxygen from being released from the insulators 114 and 116. Accordingly, a larger amount of oxygen can be introduced into the insulators 114 and 116.

Next, the metal oxide film 134 is formed over the metal oxide film 132, whereby the transistor 101 in FIGS. 40A to 40C is formed (see FIG. 48C).

A conductive film containing aluminum, an insulating film containing aluminum, or the like can be used as the metal oxide film 134. For example, aluminum is deposited by a sputtering method as a conductive film over the metal oxide film 132, and the deposited aluminum is subjected to oxygen plasma treatment or heat treatment in an oxygen atmosphere, whereby an aluminum oxide film can be formed as the metal oxide film 134 over the metal oxide film 132. Alternatively, an aluminum oxide film is formed by an ALD method as an insulating film over the metal oxide film 132, whereby an aluminum oxide film as the metal oxide film 134 can be formed over the metal oxide film 132.

Furthermore, heat treatment may be performed after the formation of the metal oxide films 132 and 134, so that excess oxygen contained in the insulators 114 and 116 can be diffused into the oxide semiconductor 108 to fill oxygen vacancies in the oxide semiconductor 108. Alternatively, either one of or each of the metal oxide films 132 and 134 is formed by thermal deposition, so that excess oxygen contained in the insulators 114 and 116 can be diffused into the oxide semiconductor 108 to fill oxygen vacancies in the oxide semiconductor 108. The temperature of the heat treatment that can be performed after the formation of the metal oxide films 132 and 134 is typically higher than or equal to 150° C. and lower than or equal to 400° C., preferably higher than or equal to 300° C. and lower than or equal to 400° C., and further preferably higher than or equal to 320° C. and lower than or equal to 370° C.

Through the above-described process, the transistor 101 illustrated in FIGS. 40A to 40C can be fabricated.

<Method 3 for Manufacturing Semiconductor Device>

Next, a method for manufacturing the transistor 150 in FIGS. 41A to 41C that is the semiconductor device of one embodiment of the present invention will be described with reference to FIGS. 49A to 49C and FIGS. 50A and 50B. FIGS. 49A to 49C and FIGS. 50A and 50B are cross-sectional views illustrating a method for manufacturing the semiconductor device.

Figure 49A:
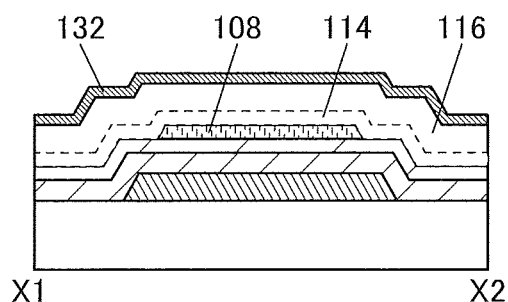
FIGS. 49A to 49C are cross-sectional views illustrating an example of a manufacturing process of a semiconductor device.

First, the steps up to the step shown in FIG. 46C are performed, and then the insulators 114 and 116 and the metal oxide film 132 are formed over the insulator 107 and the oxide semiconductor 108 (see FIG. 49A).

Figure 49B:
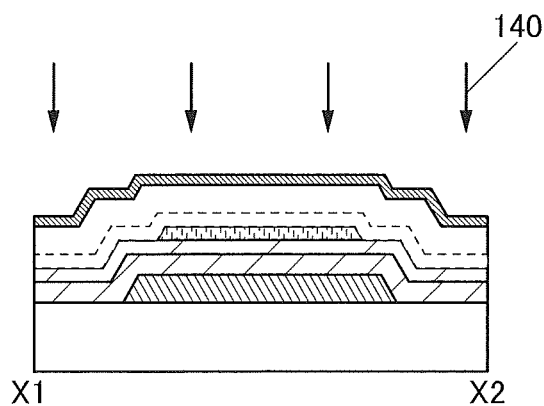

Then, oxygen 140 is added to the insulators 114 and 116 through the metal oxide film 132 (see FIG. 49B).

Figure 49C:
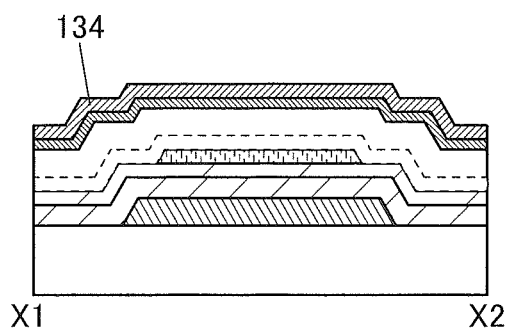

Then, the metal oxide film 134 is formed over the metal oxide film 132 (see FIG. 49C).

Next, a mask is formed over the metal oxide film 134 by a lithography process, and the openings 141*a* and 141*b* are formed in desired regions in the insulators 114 and 116 and the metal oxide films 132 and 134. Note that the openings 141*a* and 141*b* reach the oxide semiconductor 108 (see FIG. 50A).

Figure 50A:
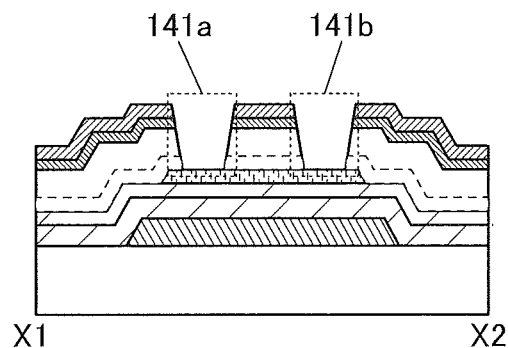
FIGS. 50A and 50B are cross-sectional views illustrating an example of a manufacturing process of a semiconductor device.
Figure 50B:
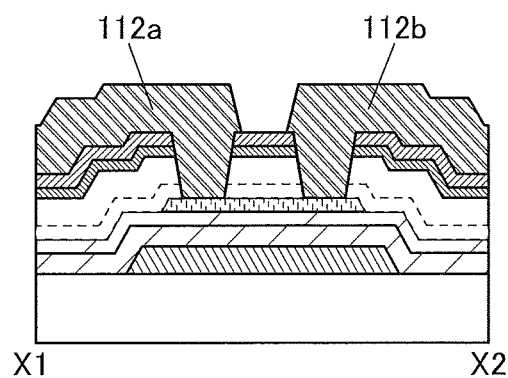

Then, a conductor is formed over the oxide semiconductor 108 and the metal oxide film 134 to cover the openings 141*a* and 141*b*, a mask is formed over the conductor through a lithography process, and the conductor is processed into desired shapes, whereby the conductors 112*a* and 112*b* are formed (see FIG. 50B).

Through the above process, the transistor 150 illustrated in FIGS. 41A to 41C can be manufactured.

Figure 42B:
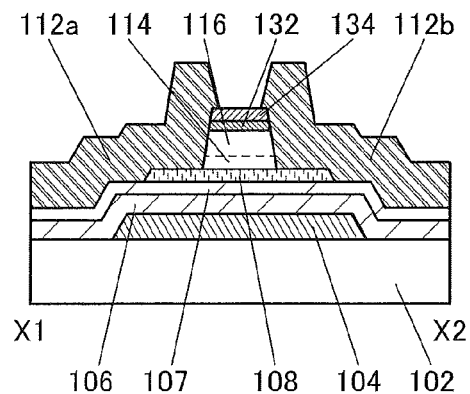
Figure 42C:
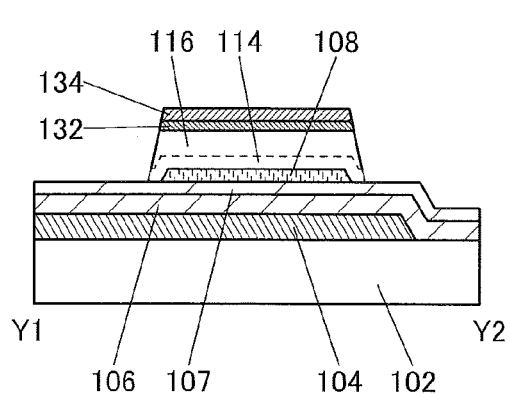

Note that the transistor 160 in FIGS. 42A to 42C can be manufactured in such a manner that the insulators 114 and 116 are left over a channel region of the oxide semiconductor 108 at the formation of the openings 141*a* and 141*b*.

<Method 4 for Manufacturing Semiconductor Device>

Next, a method for manufacturing the transistor 170 in FIGS. 43A to 43C that is the semiconductor device of one embodiment of the present invention will be described with reference to FIGS. 51A to 51D and FIGS. 52A to 52D. FIGS. 51A and 51C and FIGS. 52A and 52C are each a cross-sectional view in the channel length direction of the transistor 170 in the manufacturing process, and FIGS. 51B and 51D and FIGS. 52B and 52D are each a cross-sectional view in the channel width direction of the transistor 170 in the manufacturing process.

Figure 51A:
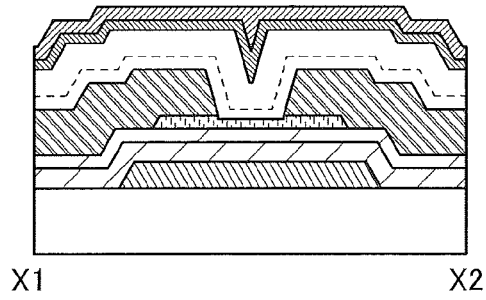
FIGS. 51A to 51D are cross-sectional views illustrating an example of a manufacturing process of a semiconductor device.
Figure 51B:
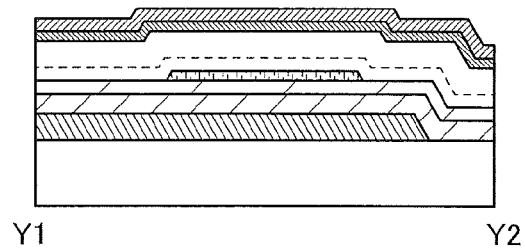
Figure 51C:
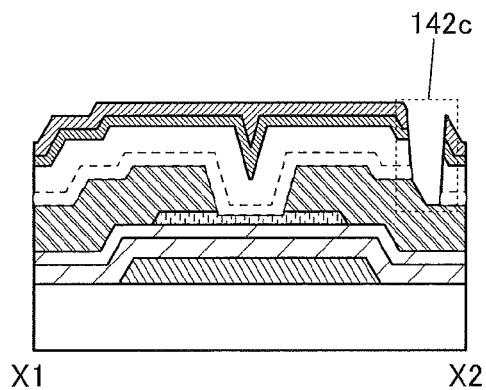
Figure 51D:
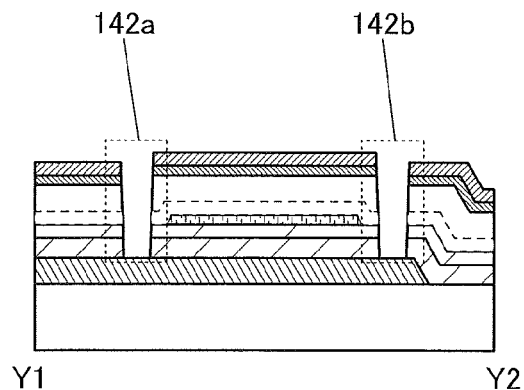

First, the steps up to the step in FIG. 48B are performed (see FIGS. 51A and 51B).

Next, a mask is formed over the metal oxide film 134 through a lithography process, and the opening 142*c* is formed in a desired region in the insulators 114 and 116 and the metal oxide films 132 and 134. In addition, a mask is formed over the metal oxide film 134 through a lithography process, and the openings 142*a* and 142*b* are formed in desired regions in the insulators 106, 107, 114, and 116, and the metal oxide films 132 and 134. Note that the opening 142*c* reaches the conductor 112*b*. The openings 142*a* and 142*b* reach the conductor 104 (see FIGS. 51C and 51D).

Note that the openings 142*a* and 142*b* and the opening 142*c* may be formed in the same step or may be formed by different steps. In the case where the openings 142*a* and 142*b* and the opening 142*c* are formed in the same step, for example, a gray-tone mask or a half-tone mask may be used.

Figure 52A:
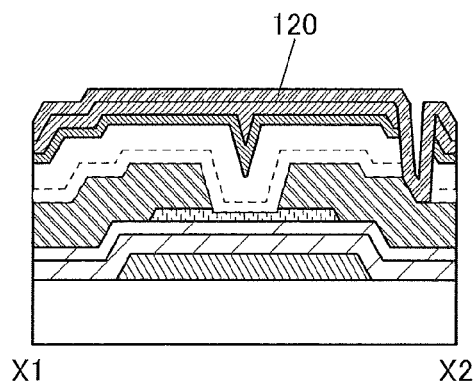
FIGS. 52A to 52D are cross-sectional views illustrating an example of a manufacturing process of a semiconductor device.
Figure 52B:
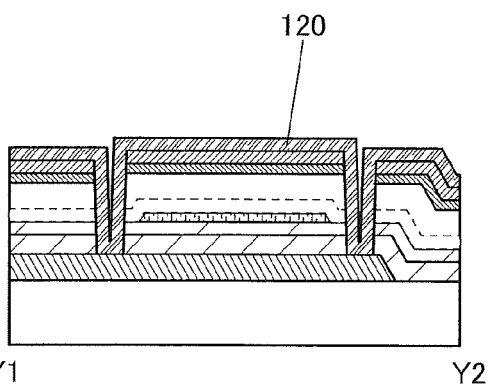

Next, a conductor 120 is formed over the metal oxide film 134 to cover the openings 142*a*, 142*b*, and 142*c* (see FIGS. 52A and 52B).

For the conductor 120, for example, a material containing one of indium (In), zinc (Zn), and tin (Sn) can be used. In particular, for the conductor 120, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide containing silicon oxide can be used. Moreover, the conductor 120 is favorably formed using the same kind of material as the metal oxide film 132, in which case the manufacturing cost can be reduced.

The conductor 120 can be formed by a sputtering method, for example. In this embodiment, a 110-nm-thick ITSO film is formed by a sputtering method.

Figure 52C:
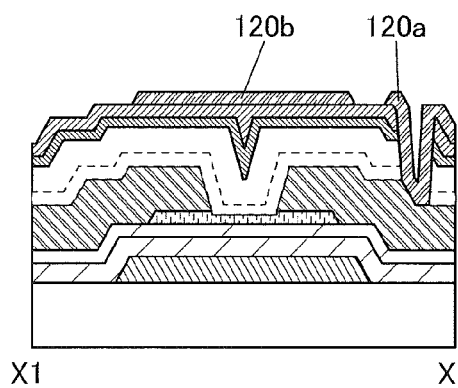
Figure 52D:
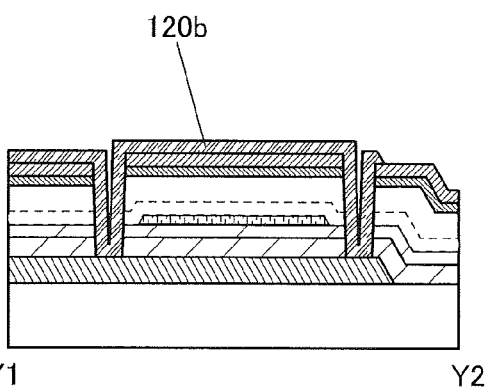

Next, a mask is formed over the conductor 120 through a lithography process, and the conductor 120 is processed into desired shapes to form the conductors 120*a* and 120*b* (see FIGS. 52C and 52D).

Through the above process, the transistor 170 illustrated in FIGS. 43A to 43C can be manufactured.

In this embodiment, one embodiment of the present invention has been described. Note that one embodiment of the present invention is not limited to the above examples. In other words, various embodiments of the invention are described in this embodiment and the other embodiments, and one embodiment of the present invention is not limited to a particular embodiment. For example, an example in which an oxide semiconductor is included in a channel region is described in this embodiment; however, one embodiment of the present invention is not limited to this example. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

Note that the transistor in this embodiment has, although not limited to, a structure (top-contact structure) in which the top surface of an oxide semiconductor is in contact with a source electrode and a drain electrode. The transistor may have, for example, a structure (bottom-contact structure) in which the bottom surface of an oxide semiconductor is in contact with a source electrode and a drain electrode.

Furthermore, the transistor in this embodiment has, although not limited to, a structure in which a gate electrode partly overlaps with a source electrode and a drain electrode. Alternatively, the transistor may have, for example, a structure in which a gate electrode does not overlap with a source electrode and a drain electrode.

The structure and method described in this embodiment can be implemented by being combined as appropriate with any of the other structures and methods described in the other embodiments.

(Embodiment 6)

An example of a circuit of a semiconductor device including the transistor or the like of one embodiment of the present invention will be described in this embodiment.

<CMOS Inverter>

Figure 53A:
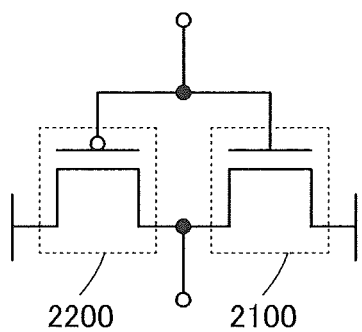
FIGS. 53A and 53B are circuit diagrams each illustrating a semiconductor device of one embodiment of the present invention.

A circuit diagram in FIG. 53A shows a configuration of what is called a CMOS inverter in which a p-channel transistor 2200 and an n-channel transistor 2100 are connected to each other in series and in which gates of them are connected to each other. It is preferable to use a transistor including an oxide semiconductor as the n-channel transistor 2100, in which case power consumption of the CMOS inverter circuit can be reduced.

<CMOS Analog Switch>

Figure 53B:
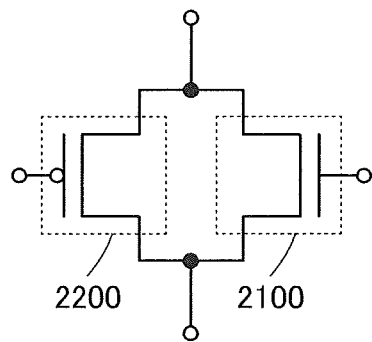

A circuit diagram in FIG. 53B shows a configuration in which sources of the transistors 2100 and 2200 are connected to each other and drains of the transistors 2100 and 2200 are connected to each other. With such a configuration, the transistors can function as what is called a CMOS analog switch. It is preferable to use a transistor including an oxide semiconductor as the n-channel transistor 2100.

<Structure 1 of Semiconductor Device>

Figure 54:
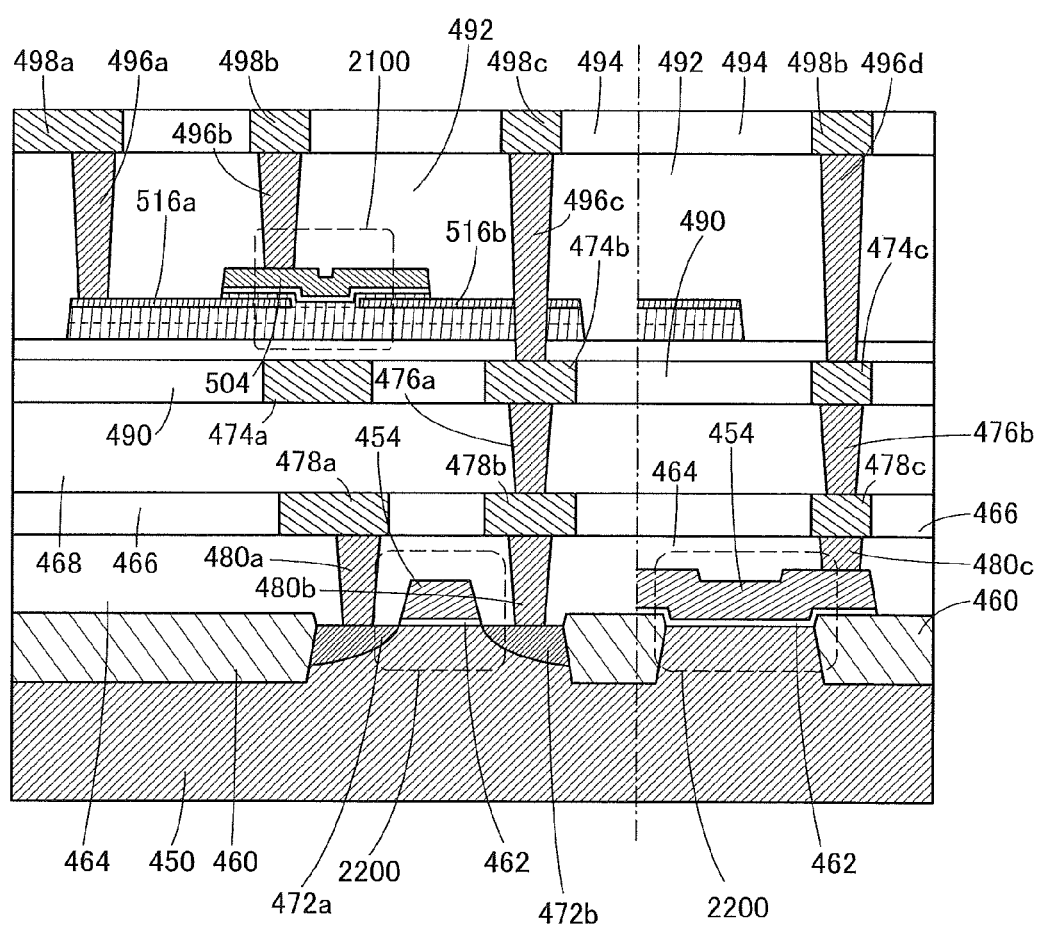
FIG. 54 is a cross-sectional view illustrating a semiconductor device of one embodiment of the present invention.

FIG. 54 is a cross-sectional view of the semiconductor device of FIG. 53A. The semiconductor device shown in FIG. 54 includes the transistor 2200 and the transistor 2100. The transistor 2100 is placed above the transistor 2200. Although an example where the transistor shown in FIGS. 34A and 34B is used as the transistor 2100 is shown, the semiconductor device of one embodiment of the present invention is not limited thereto. For example, any of the transistors illustrated in FIGS. 6A and 6B, FIGS. 7A to 7C, FIGS. 8A to 8C, FIGS. 37A to 37C, FIGS. 38A to 38C, and the like can be used as the transistor 2100. Therefore, the description regarding the above-mentioned transistors is referred to for the transistor 2100 as appropriate.

The transistor 2200 shown in FIG. 54 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 54 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, an insulator 492, and an insulator 494.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 490 includes an opening overlapping a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 492 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, the openings are provided through any of components of the transistor 2100 or the like.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 490, 492, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480*a*, the conductor 480*b*, the conductor 480*c*, the conductor 478*a*, the conductor 478*b*, the conductor 478*c*, the conductor 476*a*, the conductor 476*b*, the conductor 474*a*, the conductor 474*b*, the conductor 474*c*, the conductor 496*a*, the conductor 496*b*, the conductor 496*c*, the conductor 496*d*, the conductor 498*a*, the conductor 498*b*, and the conductor 498*c* may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 55:
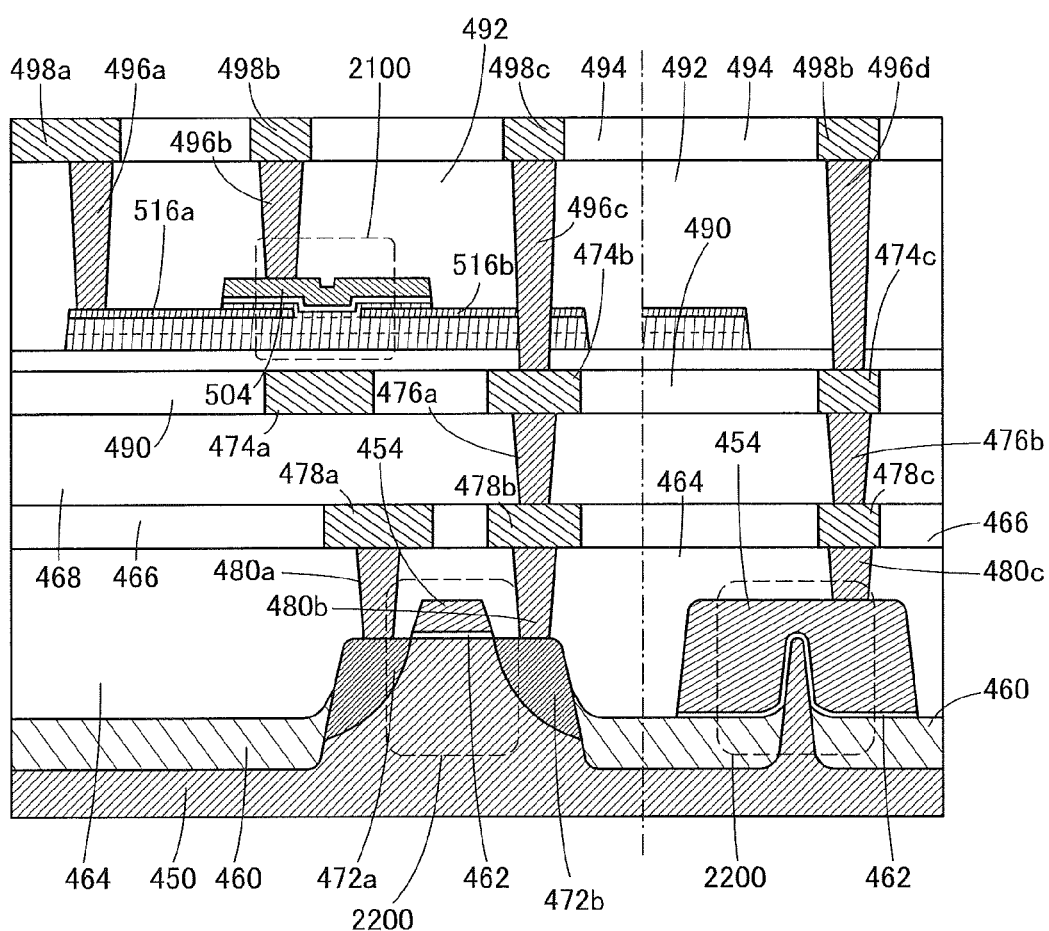
FIG. 55 is a cross-sectional view illustrating a semiconductor device of one embodiment of the present invention.

Note that a semiconductor device in FIG. 55 is the same as the semiconductor device in FIG. 54 except for the structure of the transistor 2200. Therefore, the description of the semiconductor device in FIG. 54 is referred to for the semiconductor device in FIG. 55. In the semiconductor device in FIG. 55, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 56:
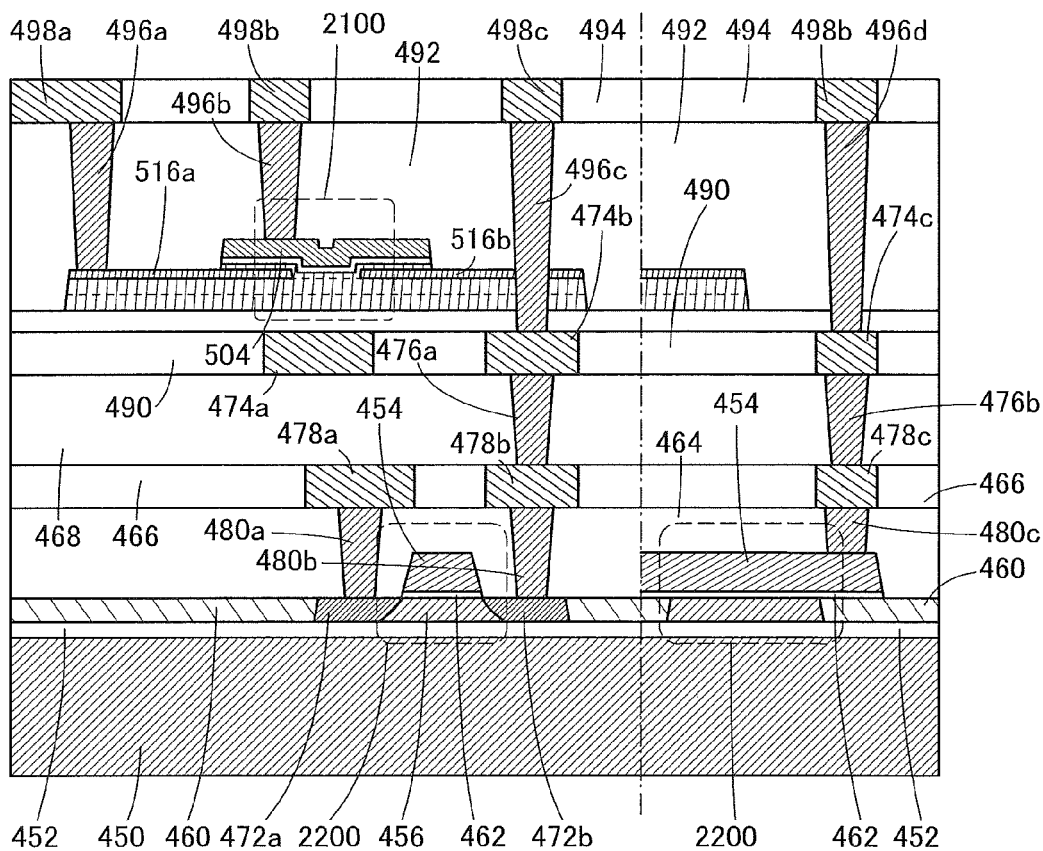
FIG. 56 is a cross-sectional view illustrating a semiconductor device of one embodiment of the present invention.

Note that a semiconductor device in FIG. 56 is the same as the semiconductor device in FIG. 54 except for the structure of the transistor 2200. Therefore, the description of the semiconductor device in FIG. 54 is referred to for the semiconductor device in FIG. 56. Specifically, in the semiconductor device in FIG. 56, the transistor 2200 is formed using the semiconductor substrate 450, which is an SOI substrate. In the structure in FIG. 56, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 54, FIG. 55, and FIG. 56, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<Memory Device 1>

Figure 57A:
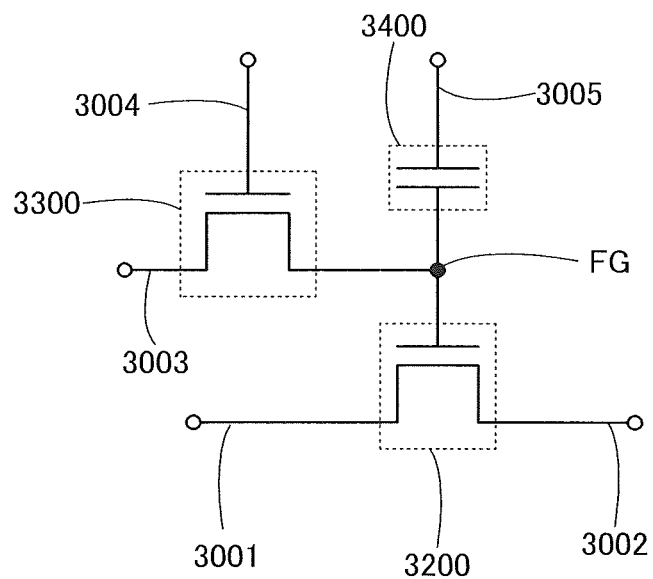
FIGS. 57A and 57B are circuit diagrams each illustrating a memory device of one embodiment of the present invention.
Figure 57B:
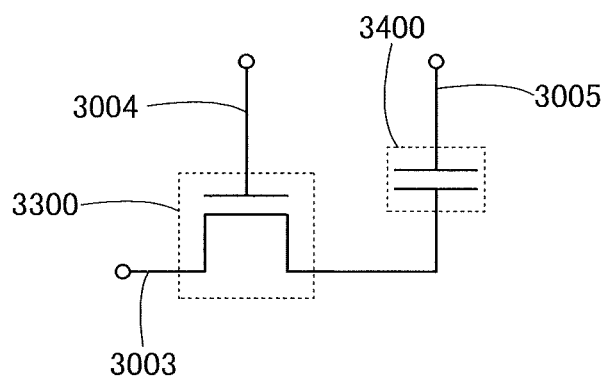

An example of a semiconductor device (memory device) which includes the transistor of one embodiment of the present invention, which can retain stored data even when not powered, and which has an unlimited number of write cycles is shown in FIGS. 57A and 57B.

The semiconductor device illustrated in FIG. 57A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 57A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 57A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into "on state." In the case where the low-level charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is brought into "on state" regardless of the charge supplied to the node FG, that is, a potential higher than $V_{th\_L}$.

<Memory Device 2>

The semiconductor device in FIG. 57B is different from the semiconductor device in FIG. 57A in that the transistor 3200 is not provided. Also in this case, data can be written and retained in a manner similar to that of the semiconductor device in FIG. 57A.

Reading of data in the semiconductor device in FIG. 57B is described. When the transistor 3300 is brought into on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Structure 2 of Semiconductor Device>

Figure 58:
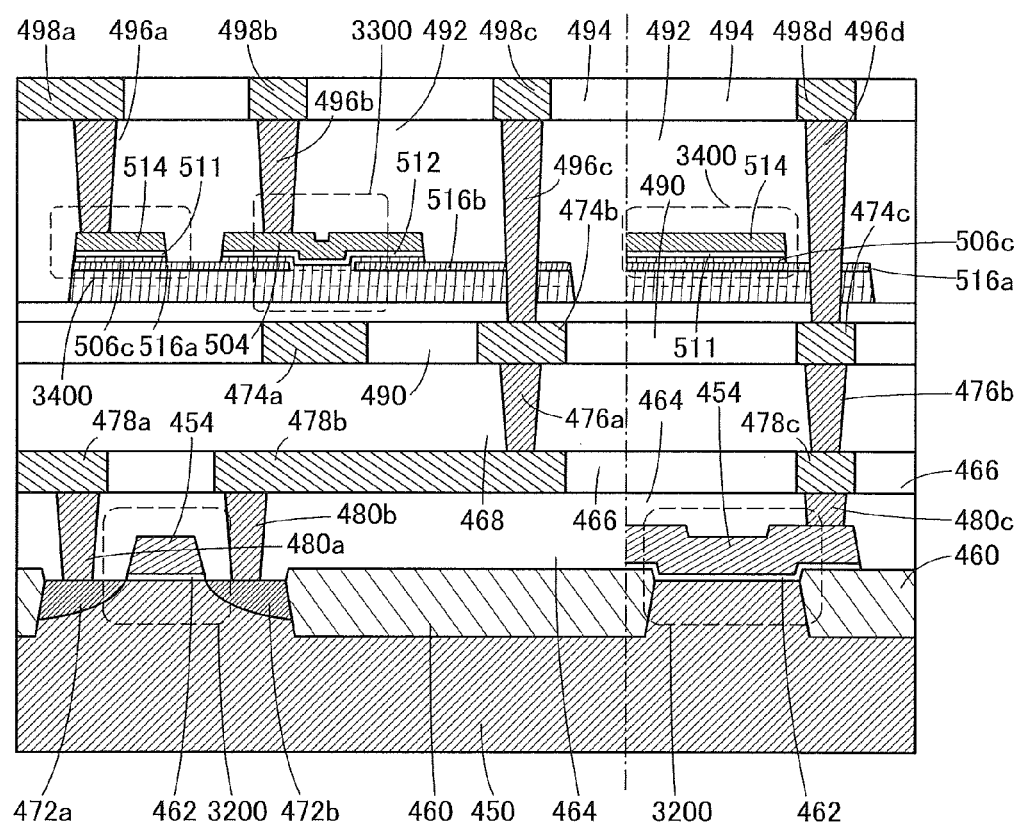
FIG. 58 is a cross-sectional view illustrating a semiconductor device of one embodiment of the present invention.

FIG. 58 is a cross-sectional view of the semiconductor device of FIG. 57A. The semiconductor device shown in FIG. 58 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 54 is referred to. Note that although the transistor 2200 is illustrated as a p-channel transistor in FIG. 54, the transistor 3200 may be an n-channel transistor.

The transistor 3200 illustrated in FIG. 58 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 58 includes insulators 464, 466, and 468, conductors 480a, 480b, 480c, 478a, 478b, 478c, 476a, 476b, 474a, 474b, 474c, 496a, 496b, 496c, 496d, 498a, 498b, 498c, and 498d, and insulators 490, 492, and 494.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 490 includes an opening overlapping the channel formation region of the transistor 3300, an opening reaching the conductor 476a, and an opening reaching the conductor 476b. In the openings, the conductors 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a predetermined potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 492 includes an opening reaching the conductor 474b through the conductor 516b that is one of a source electrode and a drain electrode of the transistor 3300, an opening reaching a conductor 514 that overlaps with the conductor 516a that is the other of the source electrode and the drain electrode of the transistor 3300, with the insulator 512 positioned therebetween, an opening reaching the conductor 504 that is the gate electrode of the transistor 3300, and an opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, a component of the transistor 3300 or the like is through other components.

The insulator 494 includes an opening reaching the conductor 496a, an opening reaching the conductors 496b, an opening reaching the conductor 496c, and an opening reaching the conductor 496d. In the openings, the conductors 498a, 498b, 498c, and 498d are embedded.

At least one of the insulators 464, 466, 468, 490, 492, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The conductors 498a, 498b, 498c, and 498d may each be formed to have a single-layer structure or a stacked-layer structure including a conductor containing, for example, one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The source or drain of the transistor 3200 is electrically connected to the conductor 516b that is one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 514, and an insulator 511. Because the insulator 511 can be formed by the same step as the insulator 512 serving as a gate insulator of the transistor 3300, productivity can be preferably increased in some cases. When a layer formed by the same step as the conductor 504 serving as a gate electrode of the transistor 3300 is used as the conductor 514, productivity can be preferably increased in some cases.

For the structures of other components, the description of FIG. 54 and the like can be referred to as appropriate.

Figure 59:
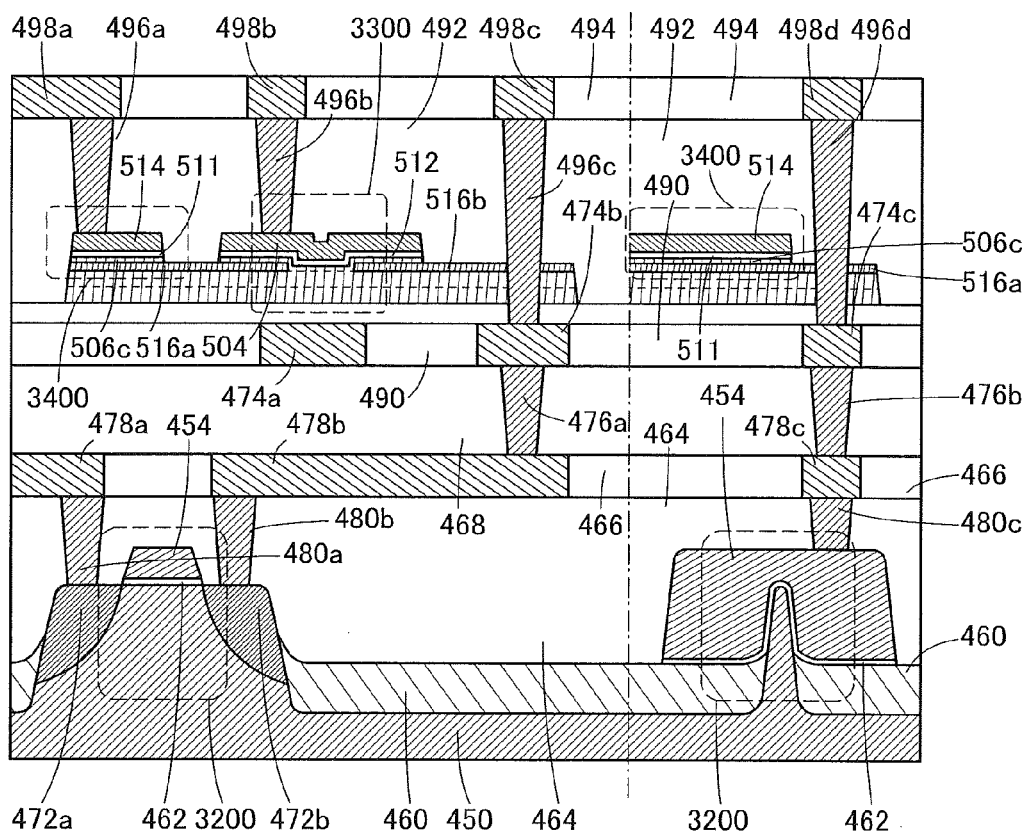
FIG. 59 is a cross-sectional view illustrating a semiconductor device of one embodiment of the present invention.

A semiconductor device in FIG. 59 is the same as the semiconductor device in FIG. 58 except for the structure of the transistor 3200. Therefore, the description of the semiconductor device in FIG. 58 is referred to for the semiconductor device in FIG. 59. Specifically, in the semiconductor device in FIG. 59, the transistor 3200 is a FIN-type transistor. For the FIN-type transistor 3200, the description of the transistor 2200 in FIG. 55 is referred to. Note that although the transistor 2200 is illustrated as a p-channel transistor in FIG. 55, the transistor 3200 may be an n-channel transistor.

Figure 60:
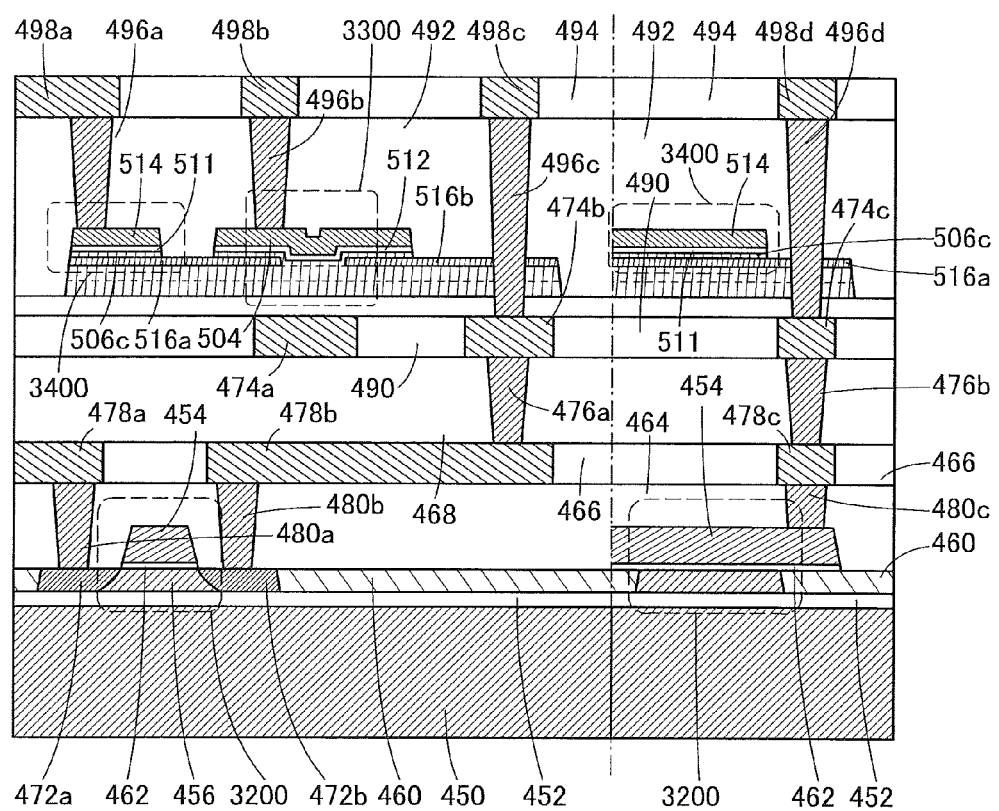
FIG. 60 is a cross-sectional view illustrating a semiconductor device of one embodiment of the present invention.

A semiconductor device in FIG. 60 is the same as the semiconductor device in FIG. 58 except for the structure of the transistor 3200. Therefore, the description of the semiconductor device in FIG. 58 is referred to for the semiconductor device in FIG. 60. Specifically, in the semiconductor device in FIG. 60, the transistor 3200 is provided in the semiconductor substrate 450 that is an SOI substrate. For the transistor 3200, which is provided in the semiconductor substrate 450 that is an SOI substrate, the description of the transistor 2200 in FIG. 56 is referred to. Note that although the transistor 2200 is illustrated as a p-channel transistor in FIG. 56, the transistor 3200 may be an n-channel transistor.

<Imaging Device>

An imaging device of one embodiment of the present invention will be described below.

Figure 61A:
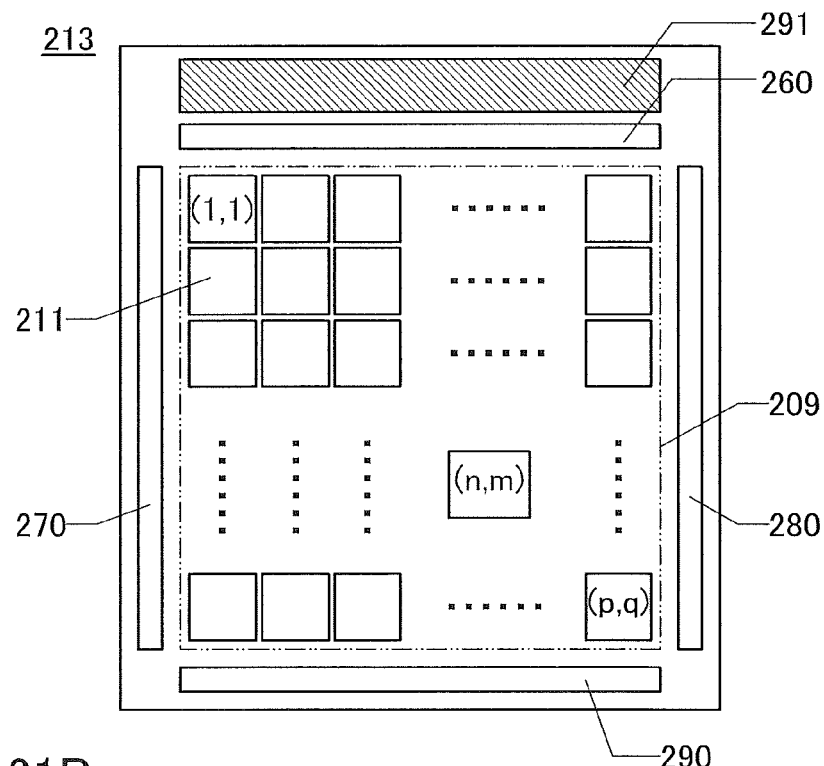
FIGS. 61A and 61B are plan views each illustrating a semiconductor device of one embodiment of the present invention.

FIG. 61A is a plan view illustrating an example of an imaging device 213 of one embodiment of the present invention. The imaging device 213 includes a pixel portion 209 and peripheral circuits for driving the pixel portion 209 (a peripheral circuit 260, a peripheral circuit 270, a peripheral circuit 280, and a peripheral circuit 290). The pixel portion 209 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to the plurality of pixels 211 and each have a function of supplying a signal for driving the plurality of pixels 211. In this specification and the like, in some cases, a "peripheral circuit" or a "driver circuit" indicates all of the peripheral circuits 260, 270, 280, and 290. For example, the peripheral circuit 260 can be regarded as part of the peripheral circuit.

The imaging device 213 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 209 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 61B:
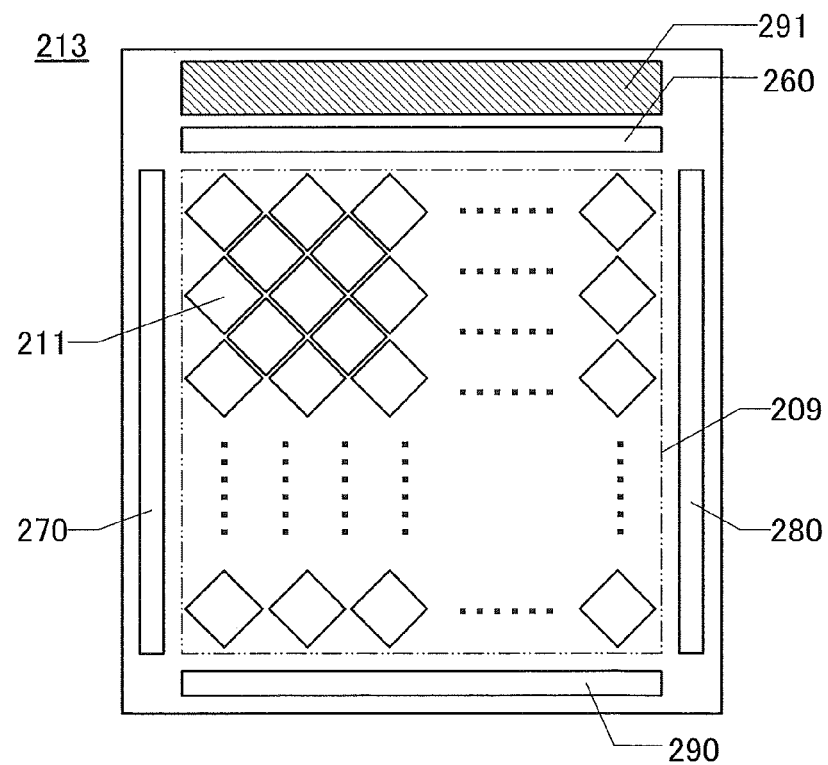

As illustrated in FIG. 61B, the pixels 211 may be obliquely arranged in the pixel portion 209 in the imaging device 213. When the pixels 211 are obliquely arranged, the distance between pixels (pitch) can be shortened in the row direction and the column direction. Accordingly, the quality of an image taken by the imaging device 213 can be improved.

<Configuration Example 1 of Pixel>

Each of the pixels 211 included in the imaging device 213 is formed with a plurality of subpixels 212, and each subpixel 212 is combined with a filter (color filter) which transmits light with a specific wavelength band, whereby data for achieving color image display can be obtained.

Figure 62A:
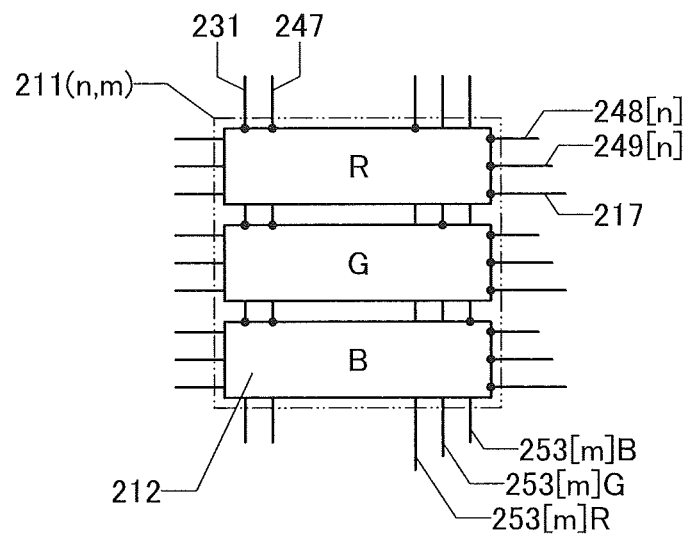
FIGS. 62A and 62B are block diagrams each illustrating a semiconductor device of one embodiment of the present invention.

FIG. 62A is a plan view illustrating an example of the pixel 211 with which a color image is obtained. The pixel 211 illustrated in FIG. 62A includes the subpixel 212 provided with a color filter transmitting light with a red (R) wavelength band (also referred to as a "subpixel 212R"), the subpixel 212 provided with a color filter transmitting light with a green (G) wavelength band (also referred to as a "subpixel 212G"), and the subpixel 212 provided with a color filter transmitting light with a blue (B) wavelength band (also referred to as a "subpixel 212B"). The subpixels 212 can function as photosensors.

Each of the subpixels 212 (the subpixel 212R, the subpixel 212G, and the subpixel 212B) is electrically connected to a wiring 231, a wiring 247, a wiring 248, a wiring 249, and a wiring 217. In addition, the subpixel 212R, the subpixel 212G, and the subpixel 212B are connected to respective wirings 253 which are independent from one another. In this specification and the like, for example, the wiring 248 and the wiring 249 that are connected to the pixels 211 in an n-th row are referred to as a wiring 248[n] and a wiring 249[n], respectively. Furthermore, for example, the wiring 253 connected to the pixels 211 in an m-th column is referred to as a wiring 253[m]. Note that in FIG. 62A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B, respectively. The subpixels 212 are electrically connected to the peripheral circuits through the above wirings.

Figure 62B:
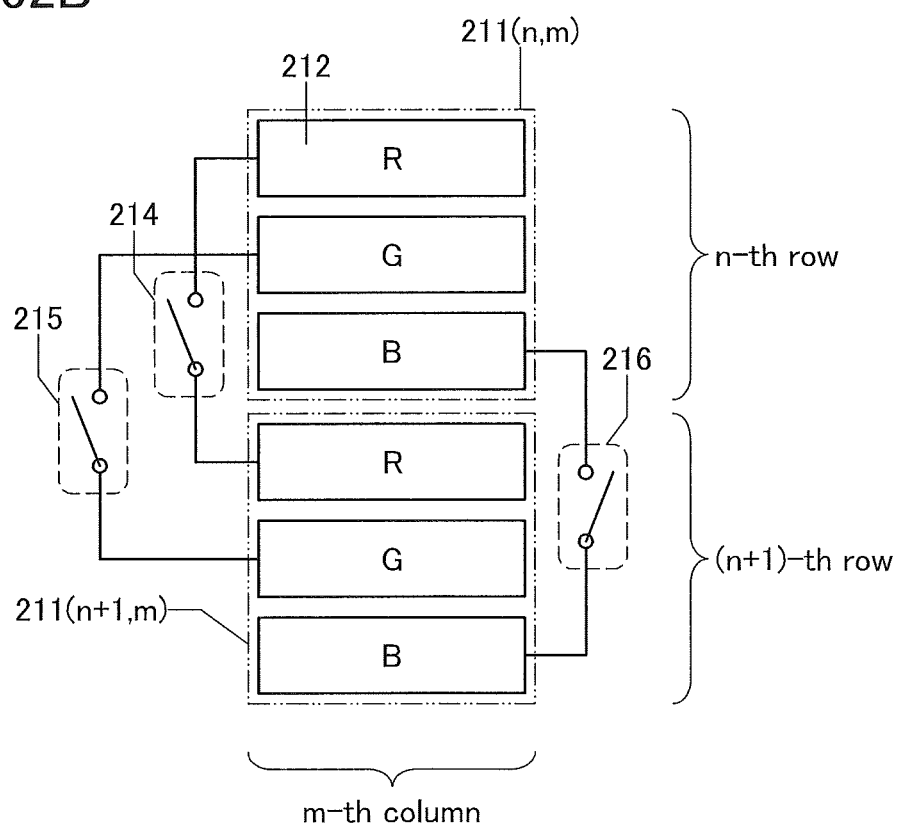

In the imaging device 213, the subpixel 212 is electrically connected to the subpixel 212, which is in an adjacent pixel 211 and is provided with a color filter transmitting light with the same wavelength band, via a switch. FIG. 62B illustrates a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 62B, the subpixel 212R arranged in the n-th row and the m-th column and the subpixel 212R arranged in the (n+1)-th row and the m-th column are connected to each other via a switch 214. The subpixel 212G arranged in the n-th row and the m-th column and the subpixel 212G arranged in the (n+1)-th row and the m-th column are connected to each other via a switch 215. The subpixel 212B arranged in the n-th row and the m-th column and the subpixel 212B arranged in the (n+1)-th row and the m-th column are connected to each other via a switch 216.

The color filters used in the subpixels 212 are not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 21-1 including the subpixel 212 provided with a color filter transmitting blue (B) light may be provided, in addition to the subpixels 212 provided with color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 62A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) of red and green to blue is 1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 213 can be increased.

When an infrared (IR) filter that transmits infrared light and absorbs or reflects visible light is used as the filter, the imaging device 213 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. Arrangement examples of the pixel 211, filters 254, and a lens 255 are described with cross-sectional views in FIGS. 63A and 63B. With the lens 255, the photoelectric conversion element can efficiently receive incident light. Specifically, as illustrated in FIG. 63A, light 256 enters a photoelectric conversion element 219 through the lens 255, the filters 254 (a filter 254R, a filter 254G, and a filter 254B), a pixel circuit 218, and the like which are provided in the pixel 211.

However, as illustrated in a region surrounded by a two-dot chain line, part of the light 256 indicated by arrows might be blocked by part of a wiring 257. Thus, a preferred structure is such that the lens 255 and the filters 254 are provided on the photoelectric conversion element 219 side, so that the photoelectric conversion element 219 can efficiently receive the light 256 as illustrated in FIG. 63B. When the light 256 is incident on the photoelectric conversion element 219 through the photoelectric conversion element 219, the imaging device 213 with high sensitivity can be provided.

Figure 63A:
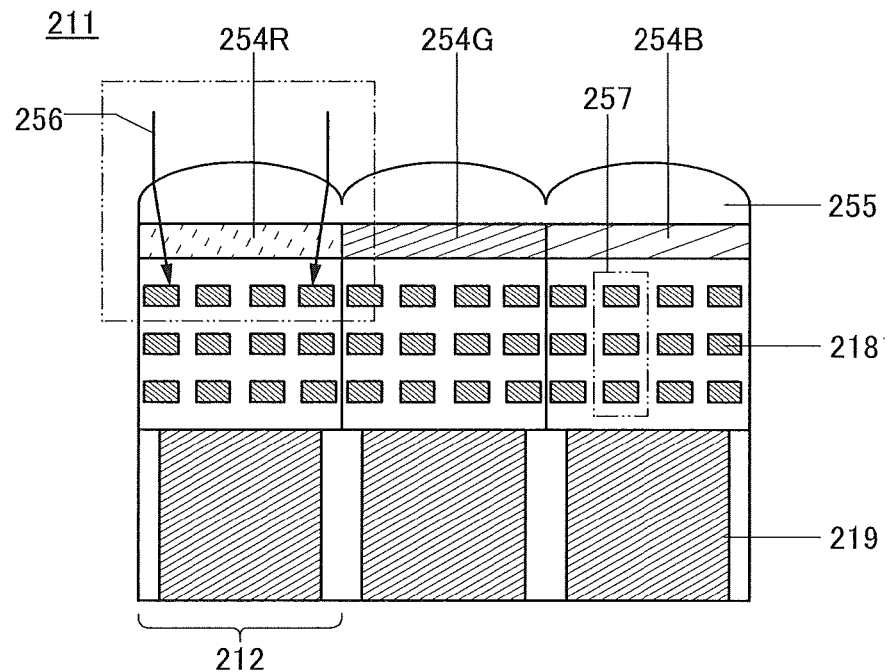
FIGS. 63A and 63B are cross-sectional views each illustrating a semiconductor device of one embodiment of the present invention.
Figure 63B:
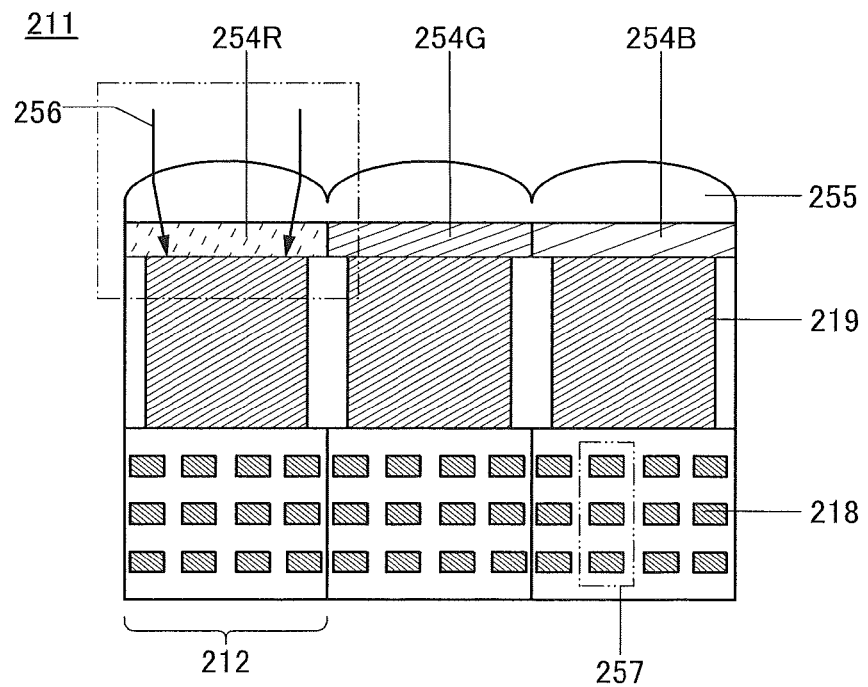

As each of the photoelectric conversion elements 219 illustrated in FIGS. 63A and 63B, a photoelectric conversion element in which a p-n junction or a p-i-n junction is formed may be used.

The photoelectric conversion element 219 may be formed using a substance that has a function of absorbing a radiation and generating electric charges. Examples of the substance that has a function of absorbing radiation and generating electric charges include selenium, lead iodide, mercury iodide, gallium arsenide, cadmium telluride, and a cadmium zinc alloy.

The use of selenium for the photoelectric conversion element 219 enables the photoelectric conversion element 219 to have a light absorption coefficient over a wide wavelength range including X-rays and gamma rays in addition to visible light, ultraviolet light, and infrared rays, for example.

One pixel 211 included in the imaging device 213 may include the subpixel 212 with a first filter, in addition to the subpixels 212 illustrated in FIGS. 62A and 62B.

<Configuration Example 2 of Pixel>

An example of a pixel including a transistor using silicon and a transistor using an oxide semiconductor is described below.

Figure 64A:
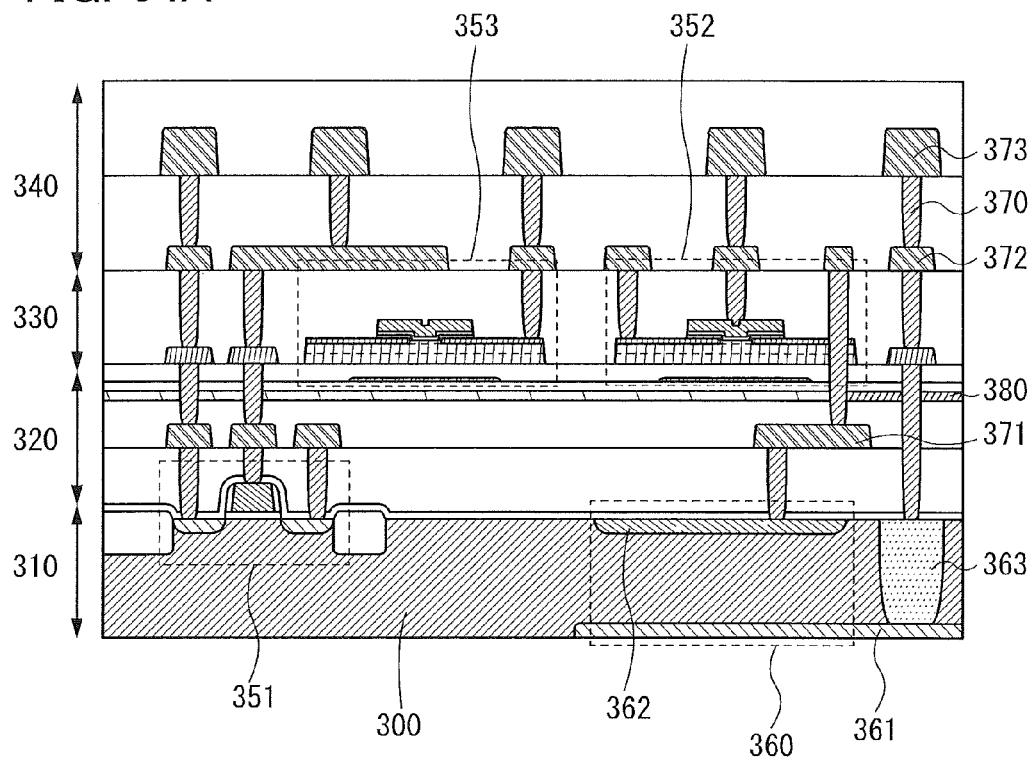
FIGS. 64A and 64B are cross-sectional views each illustrating a semiconductor device of one embodiment of the present invention.
Figure 64B:
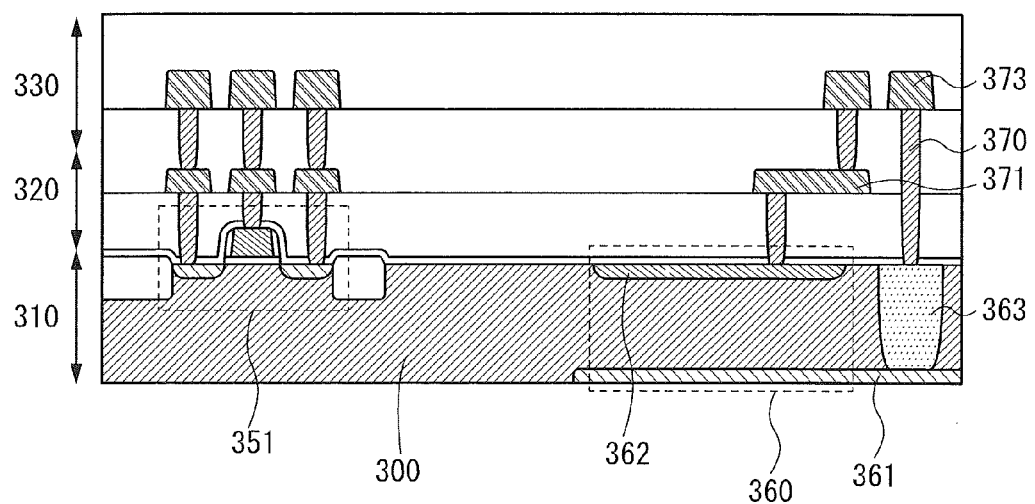

FIGS. 64A and 64B are each a cross-sectional view of an element included in an imaging device. The imaging device illustrated in FIG. 64A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 64A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 64B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Thus, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 64A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 65A1 and FIG. 65B1, part or the whole of the imaging device can be bent. FIG. 65A1 illustrates a state in which the imaging device is bent in the direction of a dashed-dotted line X1-X2. FIG. 65A2 is a cross-sectional view illustrating a portion indicated by the dashed-dotted line X1-X2 in FIG. 65A1. FIG. 65A3 is a cross-sectional view illustrating a portion indicated by a dashed-dotted line Y1-Y2 in FIG. 65A1.

FIG. 65B1 illustrates a state where the imaging device is bent in the direction of a dashed-dotted line X3-X4 and the direction of a dashed-dotted line Y3-Y4. FIG. 65B2 is a cross-sectional view illustrating a portion indicated by the dashed-dotted line X3-X4 in FIG. 65B 1. FIG. 65B3 is a cross-sectional view illustrating a portion indicated by the dashed-dotted line Y3-Y4 in FIG. 65B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 66:
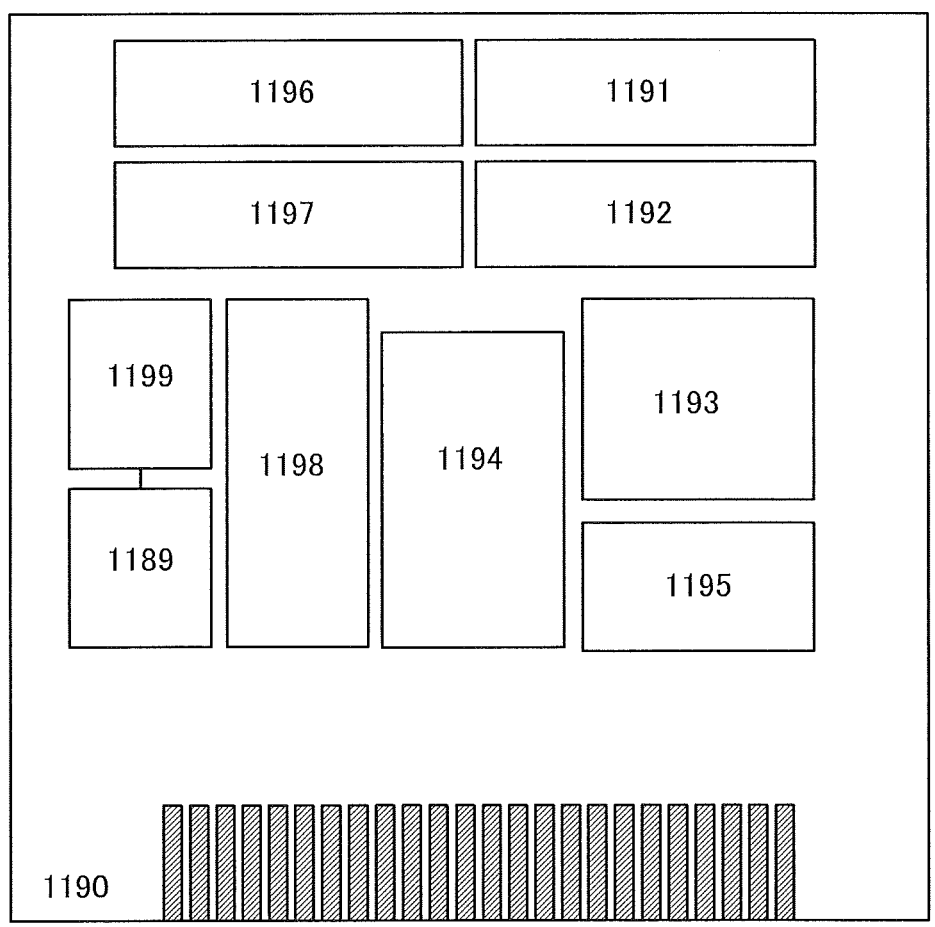
FIG. 66 is a block diagram illustrating a semiconductor device of one embodiment of the present invention.

FIG. 66 is a block diagram illustrating a configuration example of a CPU including any of the above-described transistors as a component.

The CPU illustrated in FIG. 66 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 66 is just an example in which the configuration has been simplified, and an actual CPU may have a variety of configurations depending on the application. For example, the CPU may have the following configuration: a structure including the CPU illustrated in FIG. 66 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 66, a memory cell is provided in the register 1196. For the memory cell of the register 1196, any of the above-described transistors, the above-described memory device, or the like can be used.

In the CPU illustrated in FIG. 66, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 67:
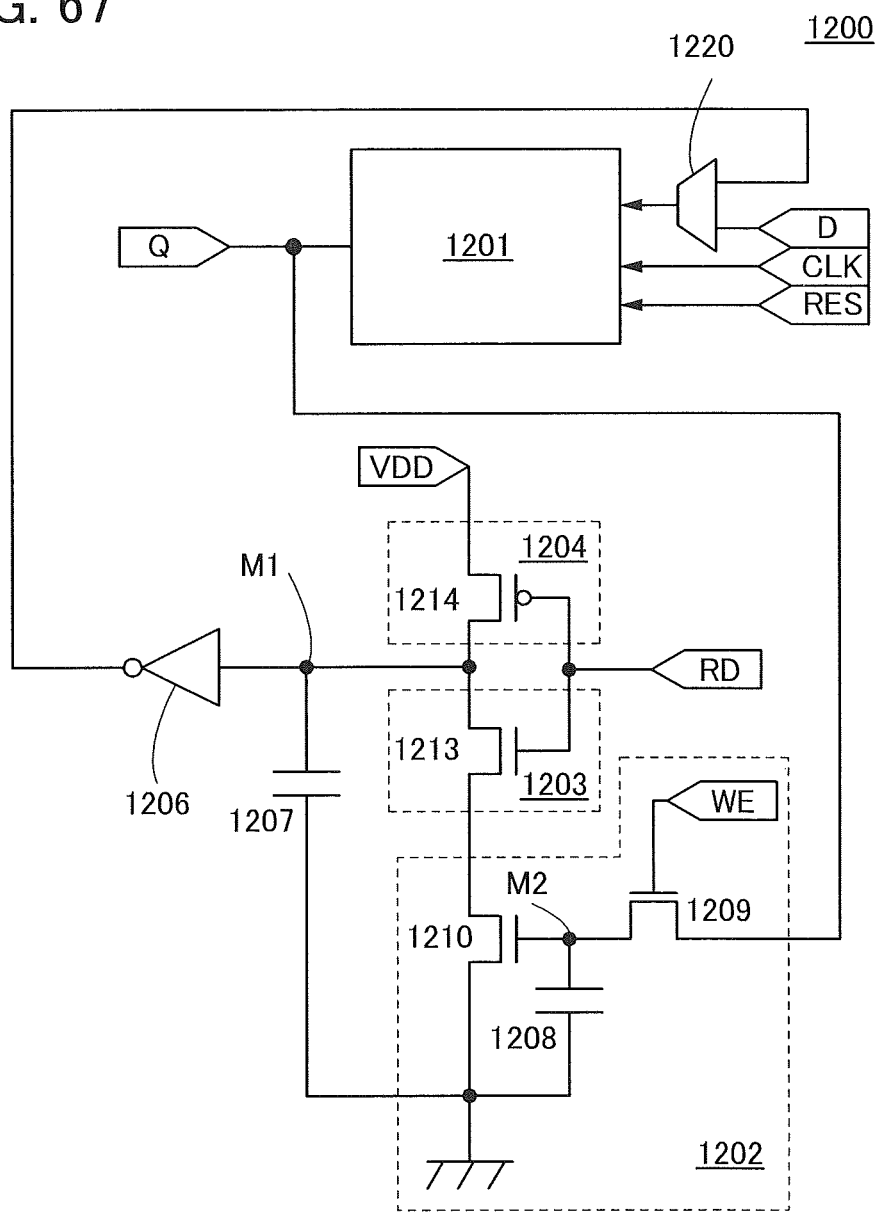
FIG. 67 is a circuit diagram illustrating a semiconductor device of one embodiment of the present invention.

FIG. 67 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 67 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 67, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 67, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 67, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

(Embodiment 7)

In this embodiment, a display device that includes the semiconductor device of one embodiment of the present invention is described with reference to FIGS. 68A to 68C.

<Display Device>

The display device illustrated in FIG. 68A includes a region including pixels of display elements (hereinafter the region is referred to as a pixel portion 1502), a circuit portion provided outside the pixel portion 1502 and including a circuit for driving the pixels (hereinafter the portion is referred to as a driver circuit portion 1504), circuits each having a function of protecting an element (hereinafter the circuits are referred to as protection circuits 506), and a terminal portion 507. Note that the protection circuits 506 are not necessarily provided.

A part or the whole of the driver circuit portion 1504 is preferably formed over a substrate over which the pixel portion 1502 is formed, in which case the number of components and the number of terminals can be reduced. When a part or the whole of the driver circuit portion 1504 is not formed over the substrate over which the pixel portion 1502 is formed, the part or the whole of the driver circuit portion 1504 can be mounted by COG or tape automated bonding (TAB).

The pixel portion 1502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 1504 includes driver circuits such as a circuit for supplying a signal (scan signal) to select a pixel (hereinafter, the circuit is referred to as a gate driver 1504a) and a circuit for supplying a signal (data signal) to drive a display element in a pixel (hereinafter, the circuit is referred to as a source driver 1504b).

The gate driver 1504a includes a shift register or the like. The gate driver 1504a receives a signal for driving the shift register through the terminal portion 507 and outputs a signal. For example, the gate driver 1504a receives a start pulse signal, a clock signal, or the like and outputs a pulse signal. The gate driver 1504a has a function of controlling the potentials of wirings supplied with scan signals (hereinafter, such wirings are referred to as scan lines GL_1 to GL_X). Note that a plurality of gate drivers 1504a may be provided to control the scan lines GL_1 to GL_X separately.

Alternatively, the gate driver 1504a has a function of supplying an initialization signal. Without being limited thereto, the gate driver 1504a can supply another signal.

The source driver 1504b includes a shift register or the like. The source driver 1504b receives a signal (image signal) from which a data signal is derived, as well as a signal for driving the shift register, through the terminal portion 507. The source driver 1504b has a function of generating a data signal to be written to the pixel circuit 501 which is based on the image signal. In addition, the source driver 1504b has a function of controlling output of a data signal in response to a pulse signal produced by input of a start pulse signal, a clock signal, or the like. Furthermore, the source driver 1504b has a function of controlling the potentials of wirings supplied with data signals (hereinafter such wirings are referred to as data lines DL_1 to DL_Y). Alternatively, the source driver 1504b has a function of supplying an initialization signal. Without being limited thereto, the source driver 1504b can supply another signal.

The source driver 1504b includes a plurality of analog switches or the like, for example. The source driver 1504b can output, as the data signals, signals obtained by time-dividing the image signal by sequentially turning on the plurality of analog switches. The source driver 1504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 1504a. For example, to the pixel circuit 501 in the m-th row and the n-th column (m is a natural number of less than or equal to X, and n is a natural number of less than or equal to Y), a pulse signal is input from the gate driver 1504a through the scan line GL_m, and a data signal is input from the source driver 1504b through the data line DL_n in accordance with the potential of the scan line GL_m.

Figure 68A:
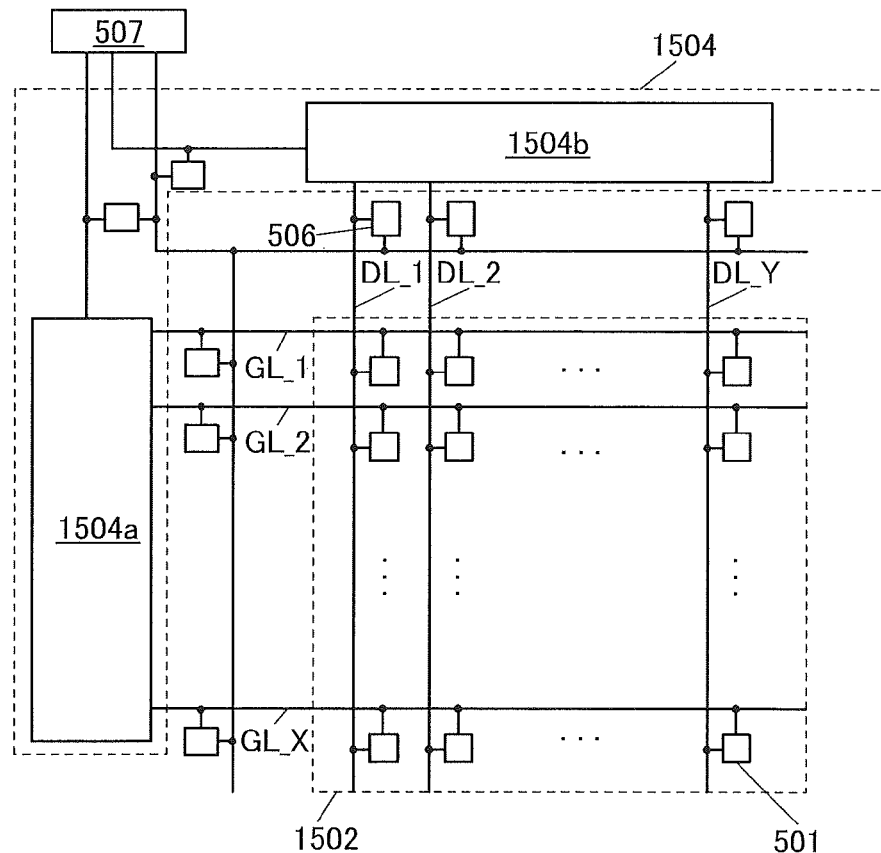
FIGS. 68A to 68C are a block diagram and circuit diagrams each illustrating a display device.

The protection circuit 506 shown in FIG. 68A is connected to, for example, the scan line GL between the gate driver 1504a and the pixel circuit 501. Alternatively, the protection circuit 506 is connected to the data line DL between the source driver 1504b and the pixel circuit 501. Alternatively, the protection circuit 506 can be connected to a wiring between the gate driver 1504a and the terminal portion 507. Alternatively, the protection circuit 506 can be connected to a wiring between the source driver 1504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 68A, the protection circuits 506 are provided for the pixel portion 1502 and the driver circuit portion 1504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 1504a or the protection circuit 506 may be configured to be connected to the source driver 1504b. Alternatively, the protection circuit 506 may be configured to be connected to the terminal portion 507.

In FIG. 68A, an example in which the driver circuit portion 1504 includes the gate driver 1504a and the source driver 1504b is shown; however, the structure is not limited thereto. For example, only the gate driver 1504a may be formed and a separately prepared substrate where a source driver circuit is formed (e.g., a driver circuit substrate formed with a single crystal semiconductor film or a polycrystalline semiconductor film) may be mounted.

Figure 68B:
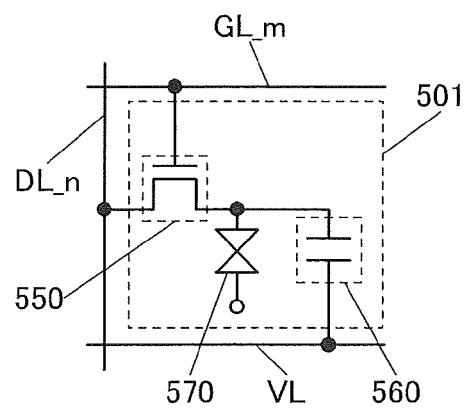

Each of the plurality of pixel circuits 501 in FIG. 68A can have the structure illustrated in FIG. 68B, for example.

The pixel circuit 501 illustrated in FIG. 68B includes a liquid crystal element 570, a transistor 550, and a capacitor 560. As the transistor 550, any of the transistors described in the above embodiments can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a twisted nematic (TN) mode, a super-twisted nematic (STN) mode, a vertical alignment (VA) mode, a multi-domain vertical alignment (MVA) mode, a patterned vertical alignment (PVA) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an FFS mode, a transverse bend alignment (TBA) mode, and the like.

Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 68B, the pixel circuits 501 are sequentially selected row by row by the gate driver 1504a illustrated in FIG. 68A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 68C:
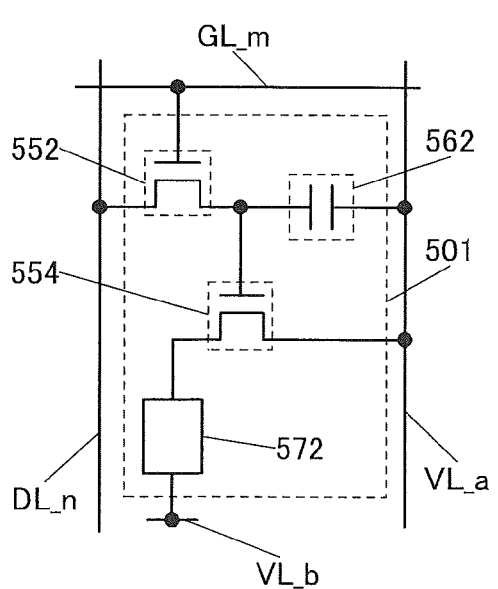

Alternatively, each of the plurality of pixel circuits 501 in FIG. 68A can have the structure illustrated in FIG. 68C, for example.

The pixel circuit 501 illustrated in FIG. 68C includes transistors 552 and 554, a capacitor 562, and a light-emitting element 572. Any of the transistors described in the above embodiments can be used as one or both of the transistors 552 and 554.

One of a source electrode and a drain electrode of the transistor 552 is electrically connected to a wiring to which a data signal is supplied (hereinafter referred to as a data line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 68C, the pixel circuits 501 are sequentially selected row by row by the gate driver 1504a illustrated in FIG. 68A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structures including the liquid crystal element 570 or the light-emitting element 572 as a display element of the display device are described in this embodiment, one embodiment of the present invention is not limited to these structures and a variety of elements may be included in the display device.

Examples of the display element include a display medium whose contrast, luminance, reflectivity, transmittance, or the like is changed by electrical or magnetic effect, such as a liquid crystal element, an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, or a display element using a carbon nanotube. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device of this embodiment. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

The structures described in this embodiment can be used in appropriate combination with any of the structures described in the other embodiments.

(Embodiment 8)

In this embodiment, a display device including the semiconductor device of one embodiment of the present invention and an electronic device in which the display device is provided with an input device will be described with reference to FIGS. 69A and 69B, FIGS. 70A and 70B, FIG. 71, FIGS. 72A and 72B, FIGS. 73A and 73B, and FIG. 74.

<Touch Panel>

In this embodiment, a touch panel 2000 including a display device and an input device will be described as an example of an electronic device. In addition, an example in which a touch sensor is used as an input device will be described.

Figure 69A:
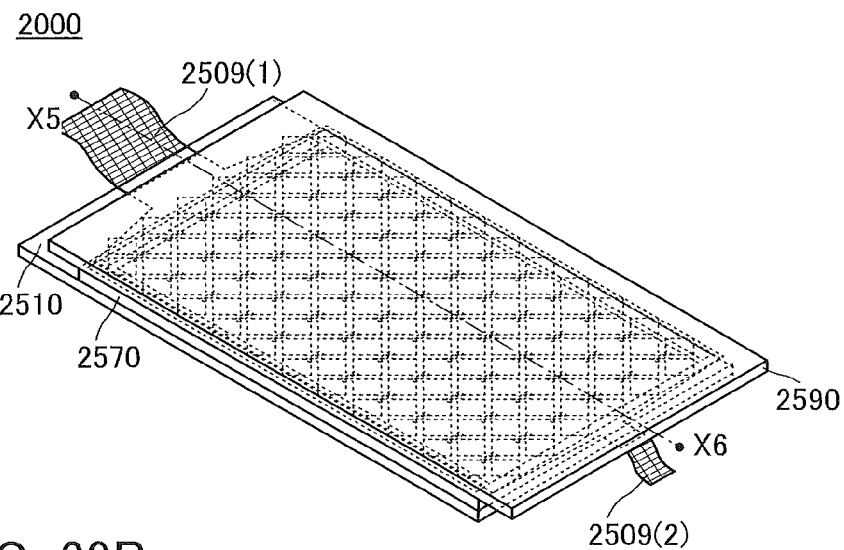
FIGS. 69A and 69B are perspective views illustrating an example of a touch panel.
Figure 69B:
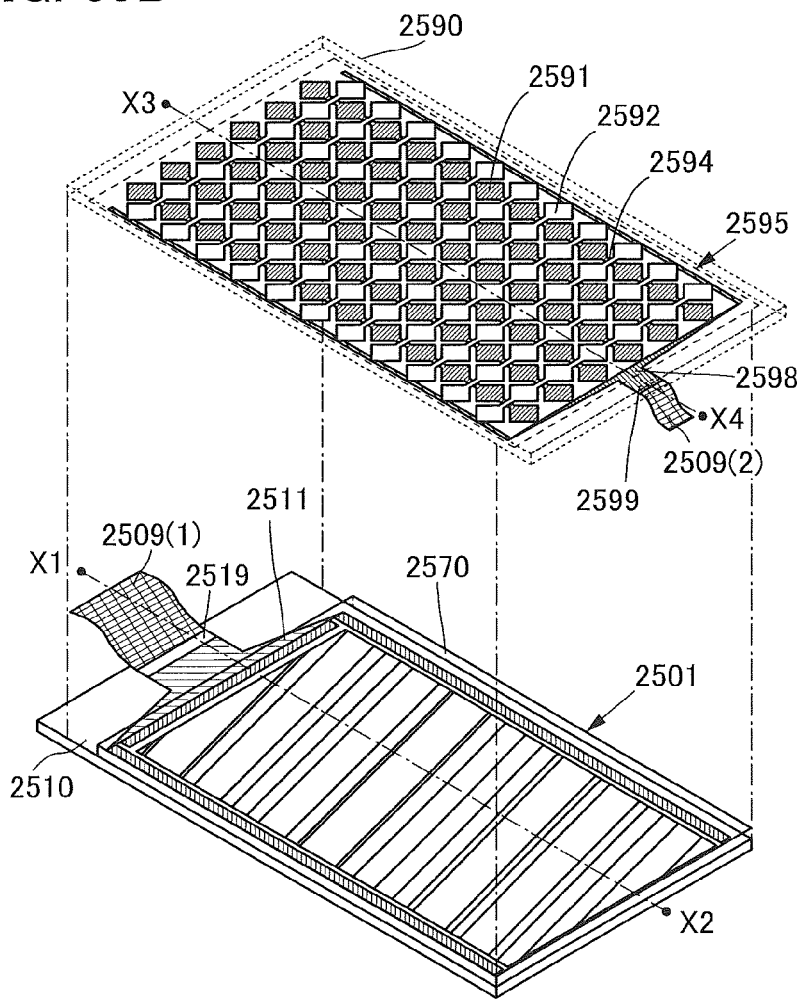

FIGS. 69A and 69B are perspective views of the touch panel 2000. Note that FIGS. 69A and 69B illustrate only main components of the touch panel 2000 for simplicity.

The touch panel 2000 includes a display device 2501 and a touch sensor 2595 (see FIG. 69B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 69B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 69B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 69A and 69B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<Display Device>

Figure 70A:
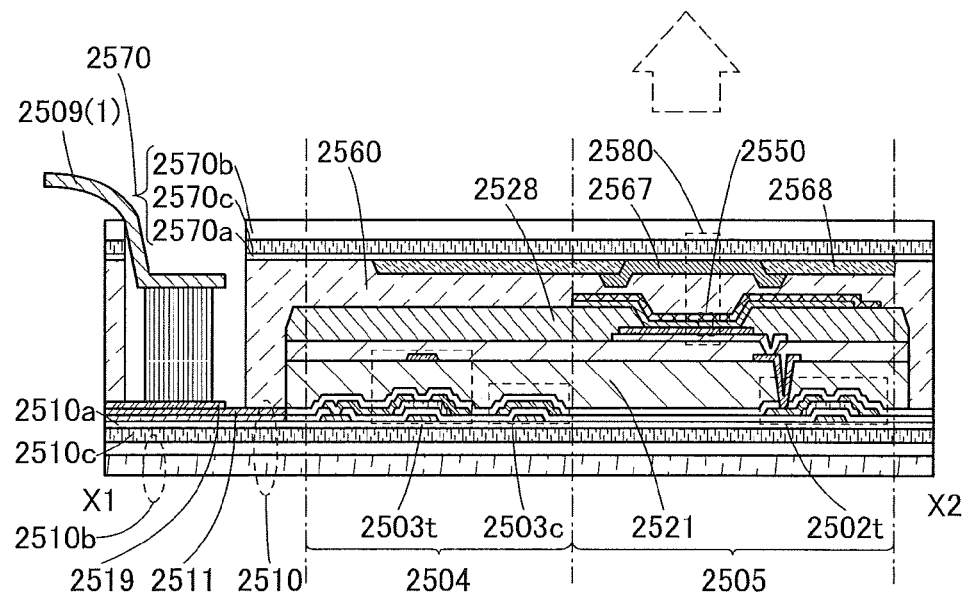
FIGS. 70A and 70B are cross-sectional views each illustrating an example of a display device.
Figure 70B:
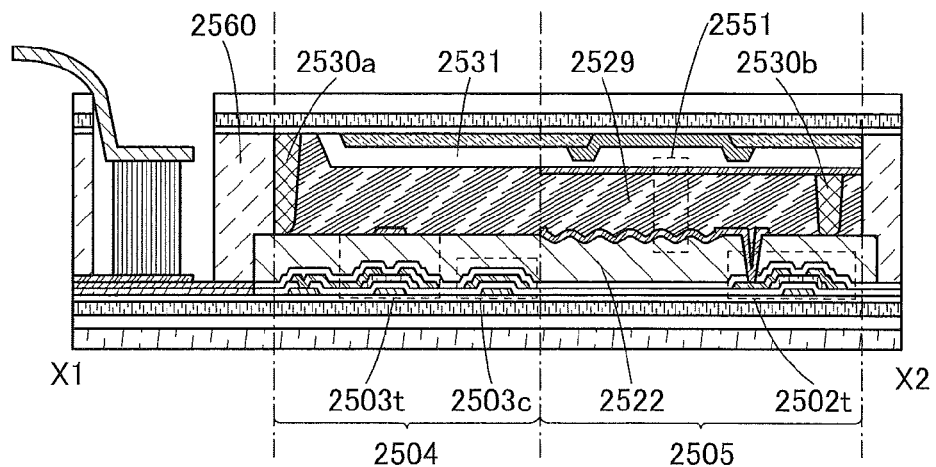

Next, the display device 2501 will be described in detail with reference to FIGS. 70A and 70B. FIGS. 70A and 70B correspond to cross-sectional views taken along dashed-dotted line X1-X2 in FIG. 69B.

The display device 2501 includes a plurality of pixels arranged in a matrix. Each of the pixels includes a display element and a pixel circuit for driving the display element.

<Structure with EL Element as Display Element>

First, a structure that uses an EL element as a display element will be described below with reference to FIG. 70A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m$^2$·day), preferably lower than or equal to $10^{-6}$ g/(m$^2$·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 70A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass flit is preferably used as the sealant. As a material used for the sealant, a material which is impermeable to moisture or oxygen is preferably used.

The display device 2501 illustrated in FIG. 70A includes a pixel 2505. The pixel 2505 includes a light-emitting module 2580, the EL element 2550 and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 70A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor which is highly purified and in which formation of oxygen vacancies is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<Structure with Liquid Crystal Element as Display Element>

Next, a structure including a liquid crystal element as a display element is described below with reference to FIG. 70B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 70B has the same structure as the display device 2501 illustrated in FIG. 70A except for the following points.

The pixel 2505 in the display device 2501 illustrated in FIG. 70B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 70B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 70B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 has a function of a reflective electrode. The display device 2501 illustrated in FIG. 70B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 70B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<Touch Sensor>

Figure 71:
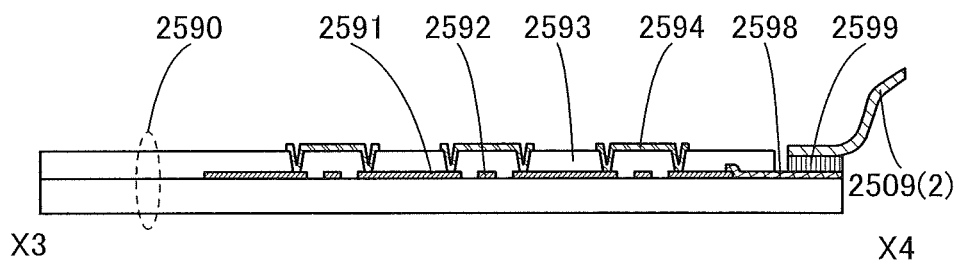
FIG. 71 is a cross-sectional view illustrating an example of a touch sensor.

Next, the touch sensor 2595 will be described in detail with reference to FIG. 71. FIG. 71 corresponds to a cross-sectional view taken along dashed-dotted line X3-X4 in FIG. 69B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 include a resin such as an acrylic resin or an epoxy resin, a resin having a siloxane bond such as silicone, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Touch Panel>

Figure 72A:
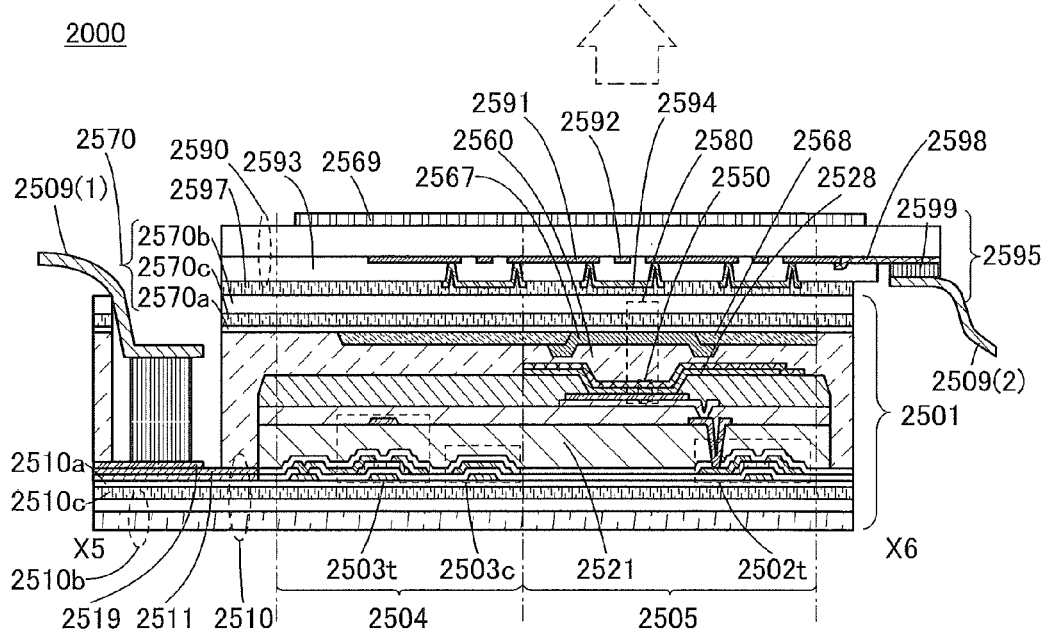
FIGS. 72A and 72B are cross-sectional views each illustrating examples of a touch panel and a display device.

Next, the touch panel 2000 will be described in detail with reference to FIG. 72A. FIG. 72A corresponds to a cross-sectional view taken along dashed-dotted line X5-X6 in FIG. 69A.

In the touch panel 2000 illustrated in FIG. 72A, the display device 2501 described with reference to FIG. 70A and the touch sensor 2595 described with reference to FIG. 71 are attached to each other.

The touch panel 2000 illustrated in FIG. 72A includes an adhesive layer 2597 and an anti-reflective layer 2569 in addition to the components described with reference to FIG. 70A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 72A will be described with reference to FIG. 72B.

Figure 72B:
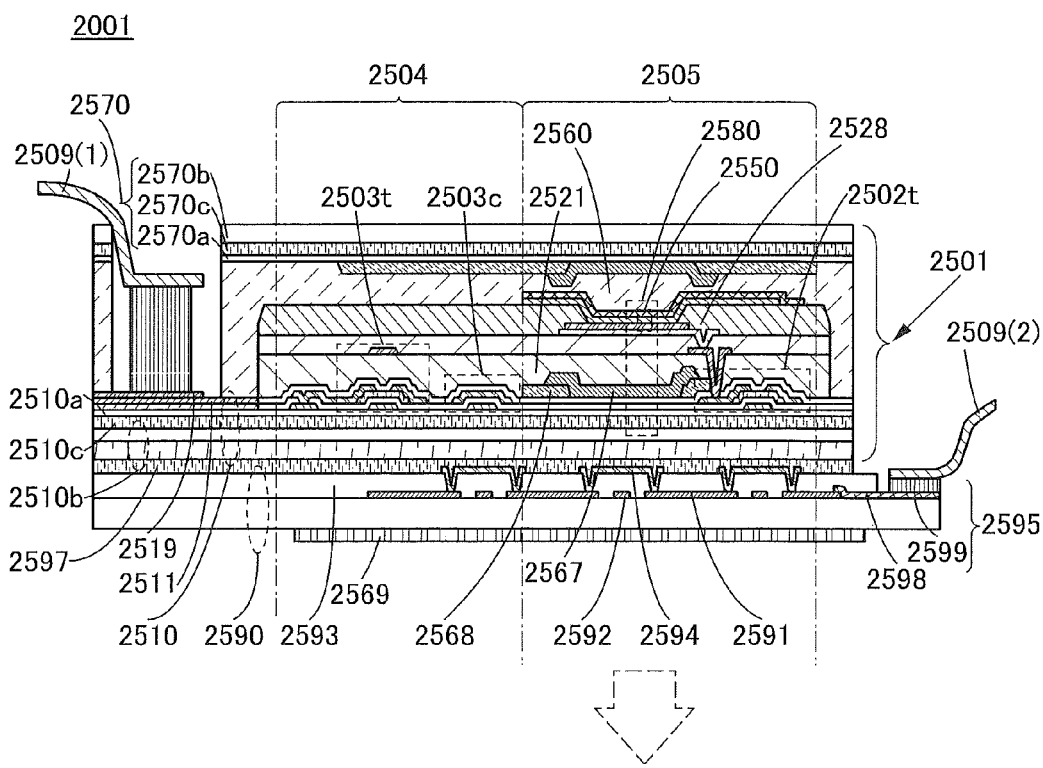

FIG. 72B is a cross-sectional view of a touch panel 2001. The touch panel 2001 illustrated in FIG. 72B differs from the touch panel 2000 illustrated in FIG. 72A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 72B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 72B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 72A or FIG. 72B, light may be emitted from the light-emitting element to one or both of upper and lower sides of the substrate.

<Driving Method of Touch Panel>

Next, an example of a method for driving a touch panel will be described with reference to FIGS. 73A and 73B.

Figure 73A:
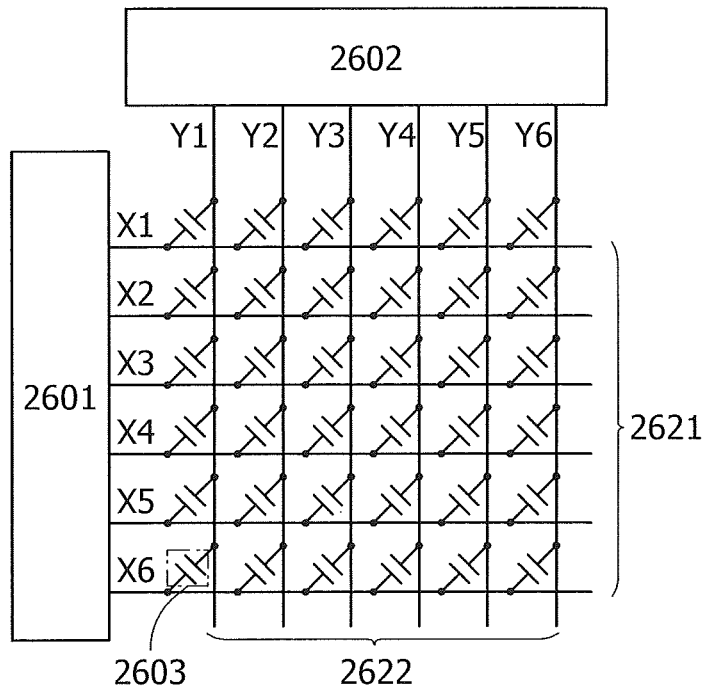
FIGS. 73A and 73B are a block diagram and a timing chart of a touch sensor.

FIG. 73A is a block diagram illustrating the structure of a mutual capacitive touch sensor. FIG. 73A illustrates a pulse voltage output circuit 2601 and a current sensing circuit 2602. Note that in FIG. 73A, six wirings X1 to X6 represent the electrodes 2621 to which a pulse voltage is applied, and six wirings Y1 to Y6 represent the electrodes 2622 that detect changes in current. FIG. 73A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 73B:
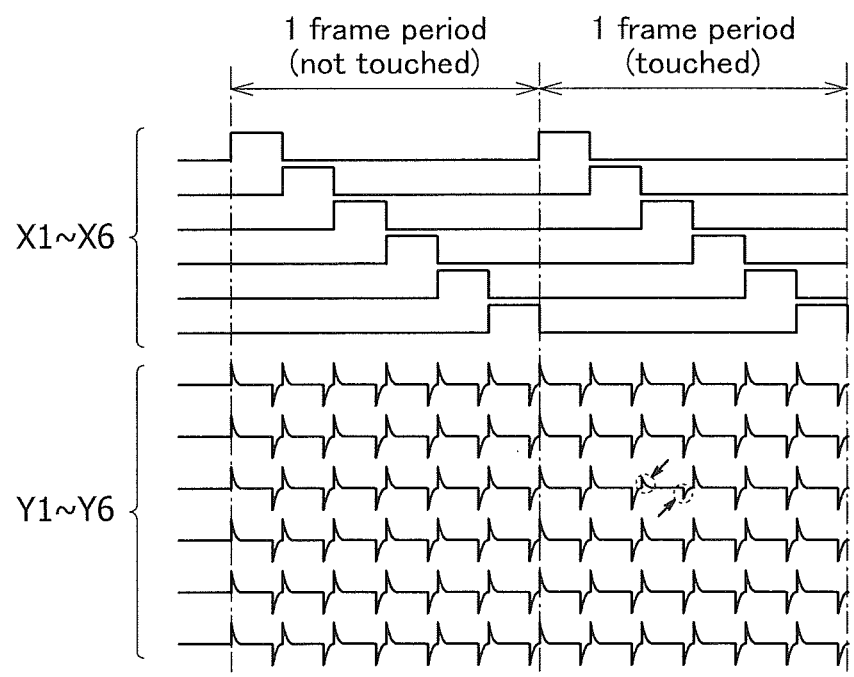

FIG. 73B is a timing chart showing input and output waveforms in the mutual capacitive touch sensor illustrated in FIG. 73A. In FIG. 73B, sensing of a sensing target is performed in all the rows and columns in one frame period. FIG. 73B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6 , and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Sensor Circuit>

Figure 74:
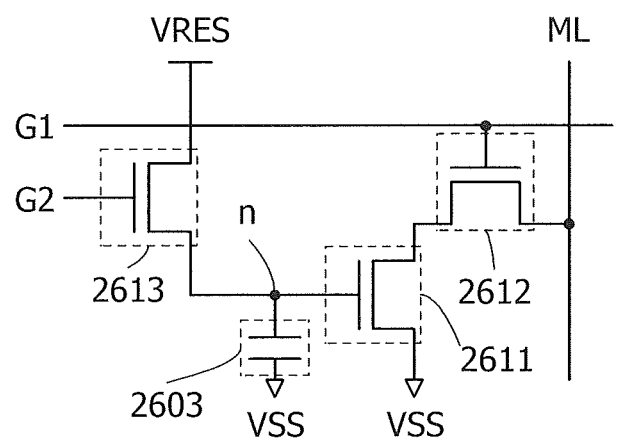
FIG. 74 is a circuit diagram of a touch sensor.

Although FIG. 73A illustrates a passive type touch sensor in which only the capacitor 2603 is provided at the intersection of wirings as a touch sensor, an active type touch sensor including a transistor and a capacitor may be used. FIG. 74 illustrates an example of a sensor circuit included in an active type touch sensor.

The sensor circuit in FIG. 74 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 74 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structures described in this embodiment can be used in appropriate combination with any of the structures described in the other embodiments.

(Embodiment 9)

In this embodiment, a display module and electronic devices that include the semiconductor device of one embodiment of the present invention are described with reference to FIG. 75 and FIGS. 76A to 76G.

<Display Module>

Figure 75:
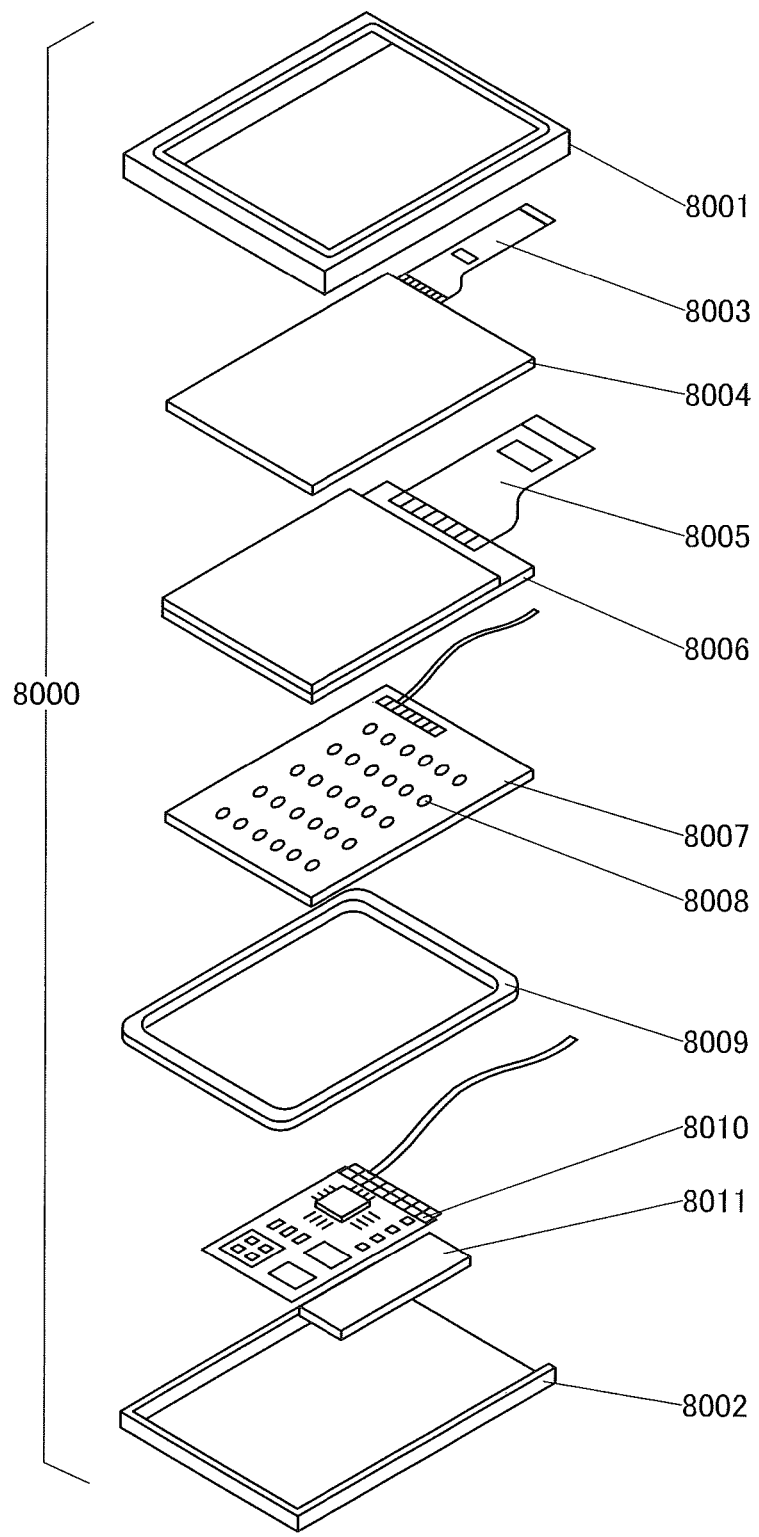
FIG. 75 illustrates a display module.

In a display module 8000 illustrated in FIG. 75, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 75, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 76A to 76G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 76A to 76G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 76A to 76G are not limited thereto, and the electronic devices can have a variety of functions. Although not illustrated in FIGS. 76A to 76G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 76A to 76G will be described in detail below.

Figure 76A:
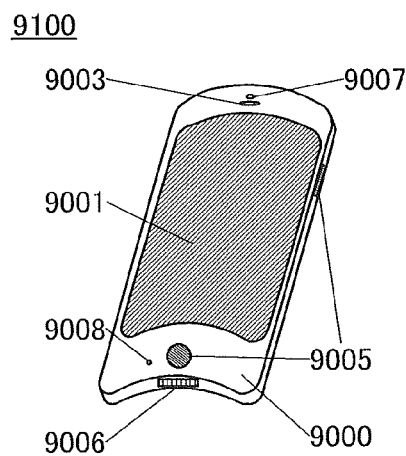
FIGS. 76A to 76G illustrate electronic devices.

FIG. 76A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 76B:
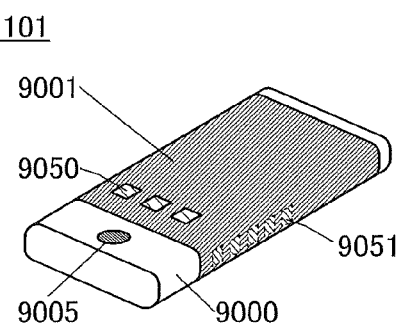

FIG. 76B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 76B, can be positioned in the portable information terminal 9101 as in the portable information terminal 9100 illustrated in FIG. 76A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the reception strength of an antenna. Instead of the information 9051, the operation buttons 9050 or the like may be displayed in the position where the information 9051 is displayed.

Figure 76C:
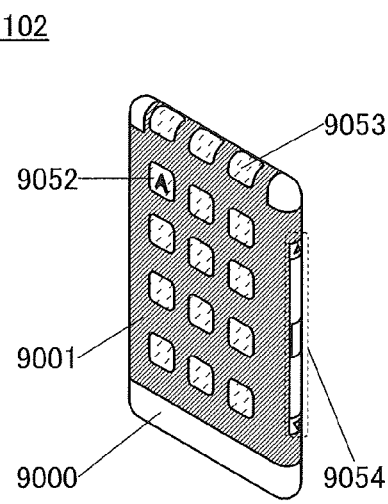

FIG. 76C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

Figure 76D:
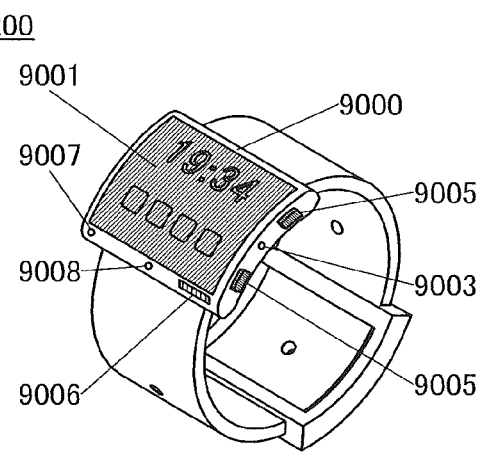

FIG. 76D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 76E:
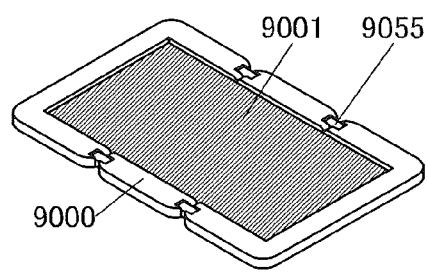
Figure 76F:
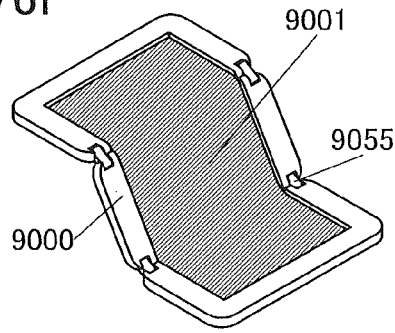
Figure 76G:
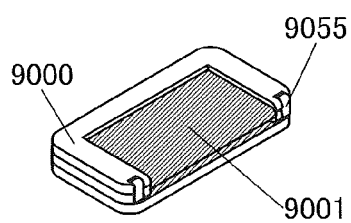

FIGS. 76E, 76F, and 76G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some kinds of information. However, a semiconductor device according to one embodiment of the present invention can also be used for an electronic device that does not include a display portion. Furthermore, the display portions of the electronic devices described in this embodiment may also be non-flexible and can display images on a flat surface without limitation to a flexible mode capable of displaying images on a curved display surface or a foldable mode.

EXAMPLE 1

In this example, investigation results of the quality of In—Ga—Zn oxide films which were oxide semiconductors deposited with a facing-target sputtering apparatus will be described.

To fabricate Sample 1, a 100-nm-thick In—Ga—Zn oxide film was deposited on a quartz substrate with a facing-target sputtering apparatus using an In—Ga—Zn oxide (In:Ga:Zn=1:4:5 in atomic ratio) target The In—Ga—Zn oxide film was deposited under the following conditions: an atmosphere containing an argon gas at 50 sccm and an oxygen gas at 16 sccm was used, pressure was adjusted to 0.05 Pa, substrate temperature was set at room temperature (R.T.), and a power of 1200 W from a DC power source was applied to the target. Deposition at such a low pressure can provide a film containing few impurities.

To fabricate Sample 2, a 100-nm-thick In—Ga—Zn oxide film was deposited on a quartz substrate with a facing-target sputtering apparatus using an In—Ga—Zn oxide (In:Ga:Zn=1:4:5 in atomic ratio) target. The In—Ga—Zn oxide film was deposited under the following conditions: an atmosphere containing an argon gas at 50 sccm and an oxygen gas at 16 sccm was used, pressure was adjusted to 0.3 Pa, substrate temperature was set at room temperature (R.T.), and a power of 1200 W from a DC power source was applied to the target.

To fabricate Sample 3, a 100-nm-thick In—Ga—Zn oxide film was deposited on a quartz substrate with a parallel-plate-type sputtering apparatus using an In—Ga—Zn oxide (In:Ga:Zn=1:4:5 in atomic ratio) target. The In—Ga—Zn oxide film was deposited under the following conditions: an atmosphere containing an argon gas at 30 sccm and an oxygen gas at 10 sccm was used, pressure was adjusted to 0.4 Pa, substrate temperature was set at room temperature (R.T.), and a power of 200 W from a DC power source was applied to the target.

Figure 77:
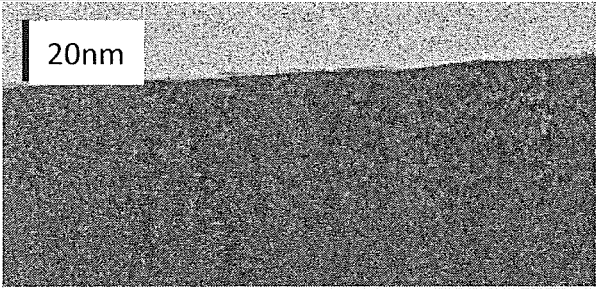
FIG. 77 shows cross-sectional TEM images of Sample 1.

Cross-sectional TEM images of the In—Ga—Zn oxide films in Samples 1 to 3 were observed. FIG. 77 shows the cross-sectional TEM images of Sample 1, FIG. 78 shows the cross-sectional TEM images of Sample 2, and FIG. 79 shows the cross-sectional TEM images of Sample 3.

Figure 78:
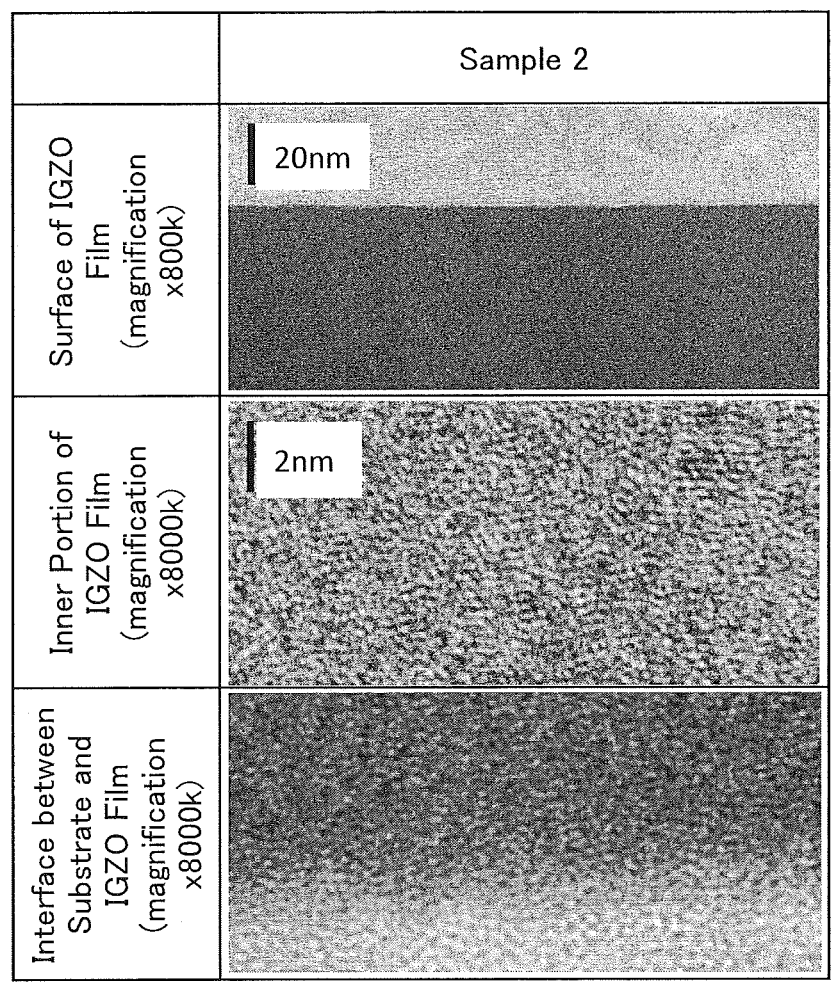
FIG. 78 shows cross-sectional TEM images of Sample 2.
Figure 79:
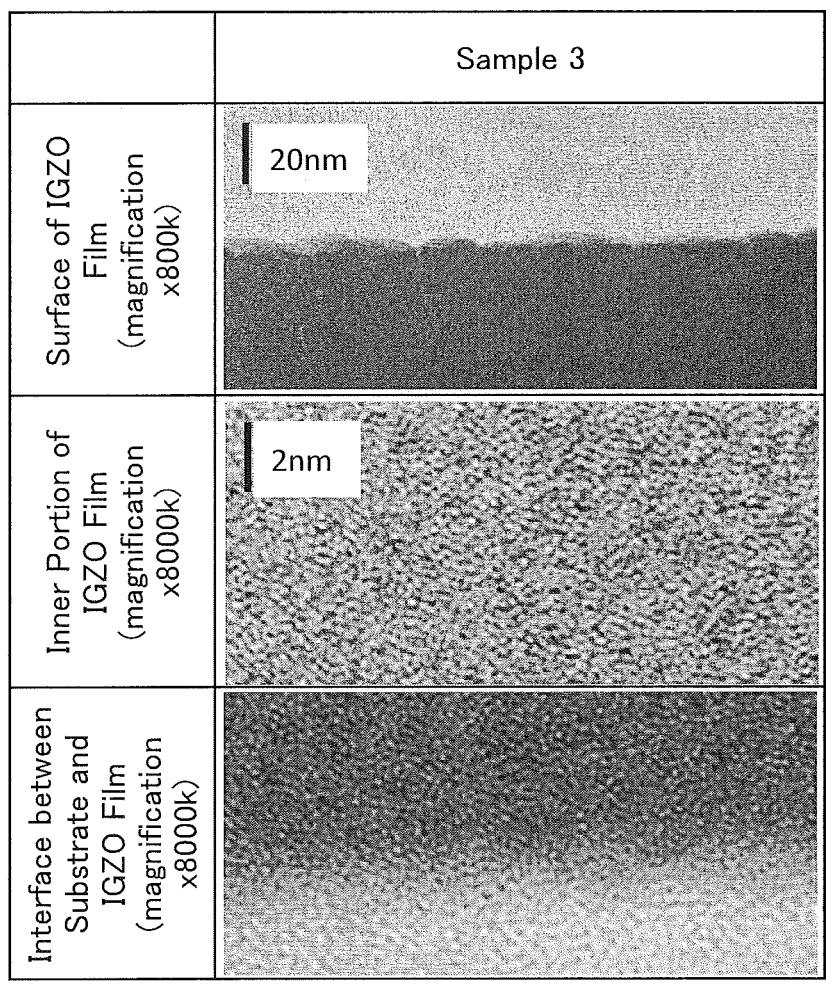
FIG. 79 shows cross-sectional TEM images of Sample 3.

FIG. 77 to FIG. 79 show that a film surface is flatter in Sample 1 and Sample 2 than in Sample 3. As in the TEM image showing the inside of the film in Sample 1, a layered crystal region was observed, indicating that the above-described CAAC-OS was formed. It is preferable to use a facing-target sputtering apparatus to form a CAAC-OS because plasma damage during deposition can be reduced.

Figure 80:
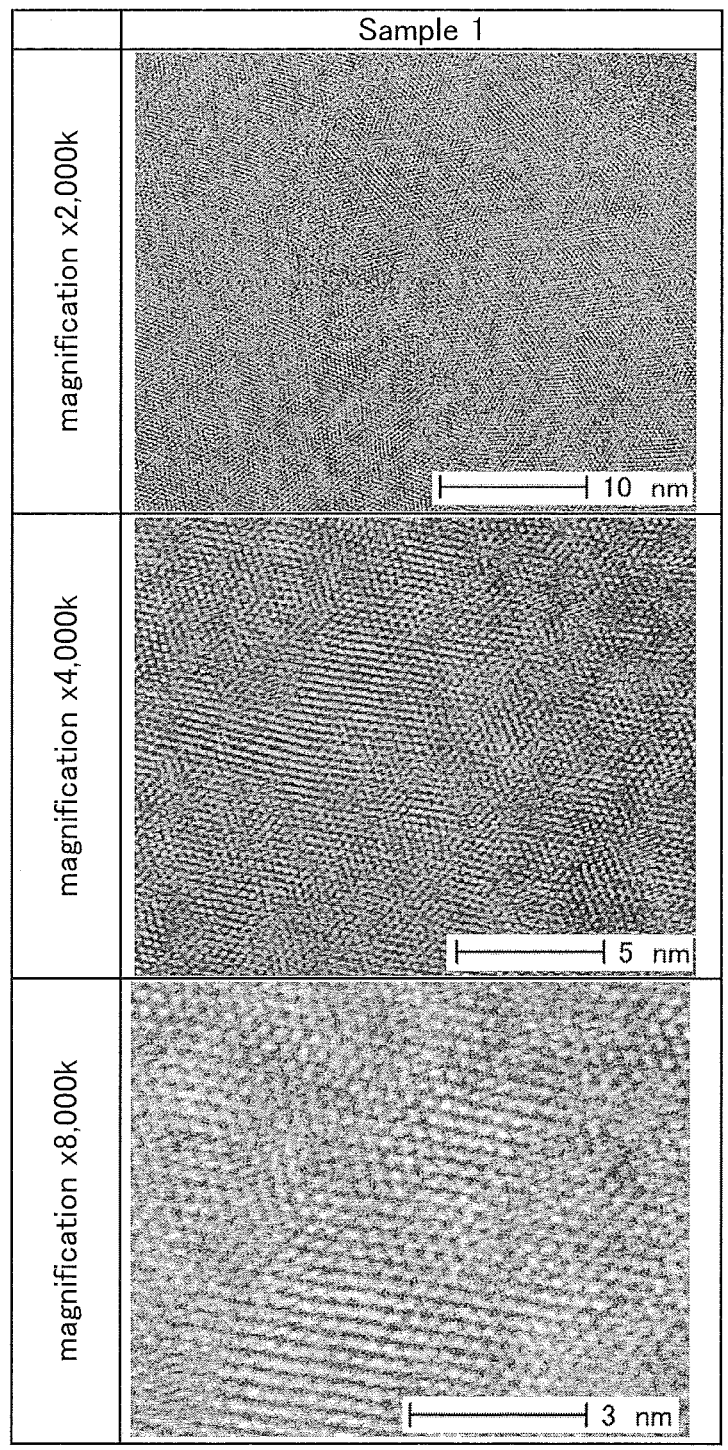
FIG. 80 shows plan-view TEM images of Sample 1.

Plan-view TEM images of the In—Ga—Zn oxide films in Samples 1 to 3 were observed. FIG. 80 shows the plan-view TEM images of Sample 1, FIG. 81 shows the plan-view TEM images of Sample 2, and FIG. 82 shows the plan-view TEM images of Sample 3.

Figure 81:
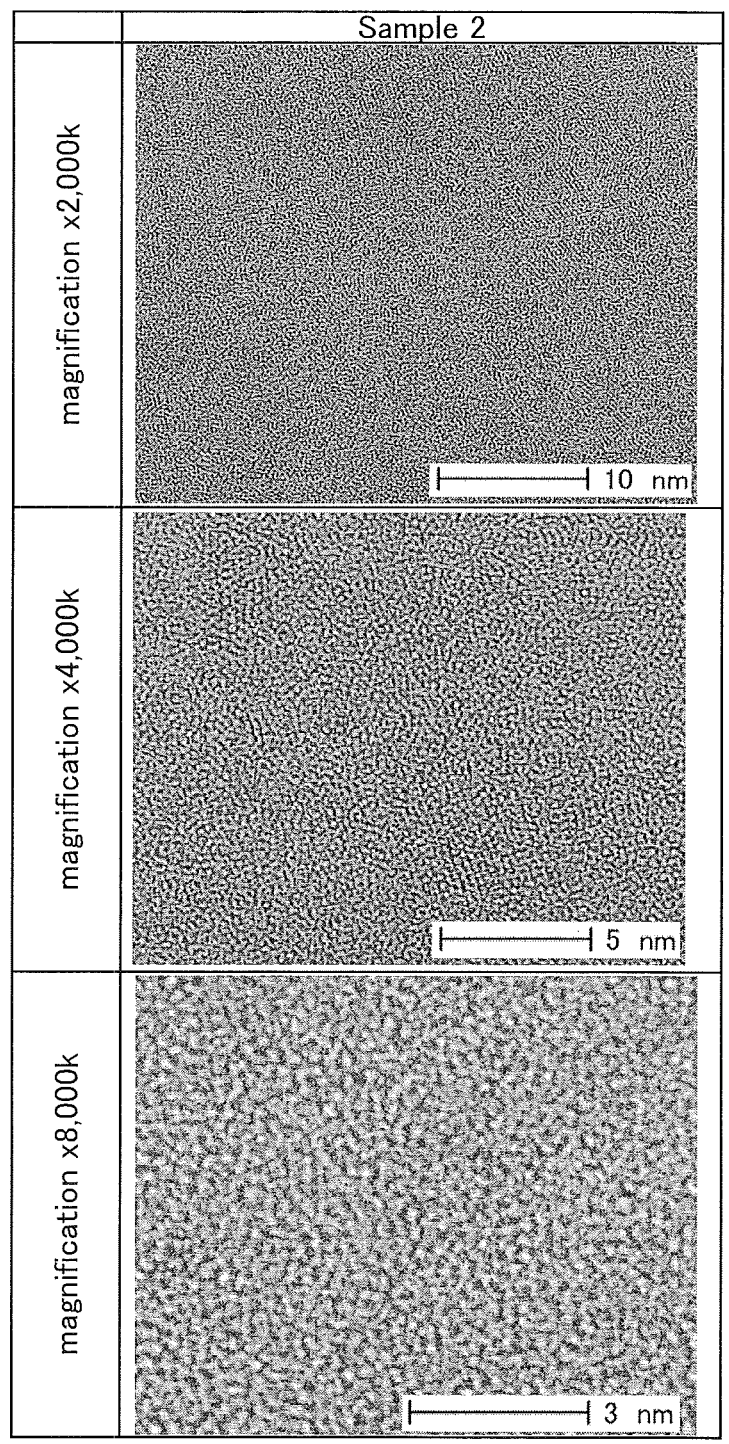
FIG. 81 shows plan-view TEM images of Sample 2.
Figure 82:
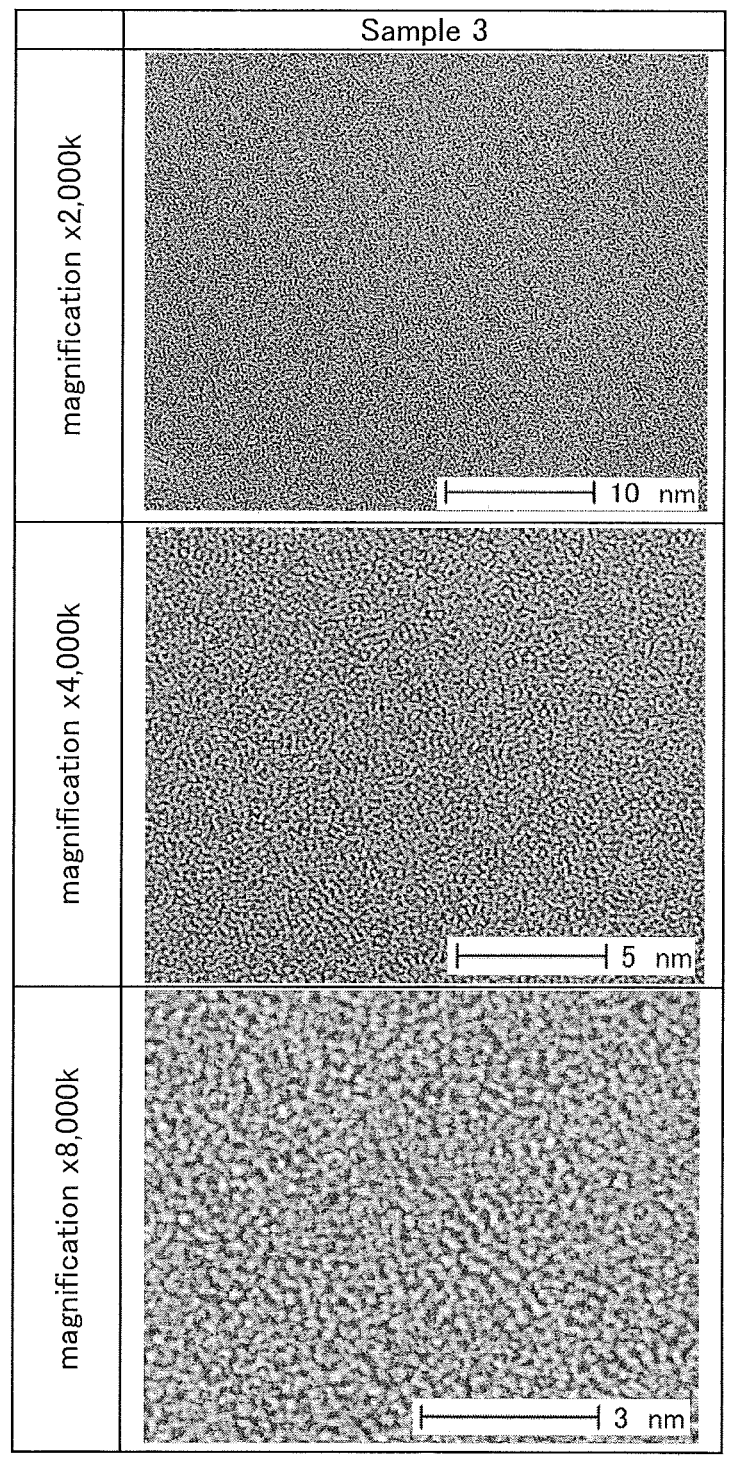
FIG. 82 shows plan-view TEM images of Sample 3.

The plan-view TEM images in FIG. 80 to FIG. 82 also show that Sample 1 has higher crystallinity than Sample 2 and Sample 3.

Figure 83:
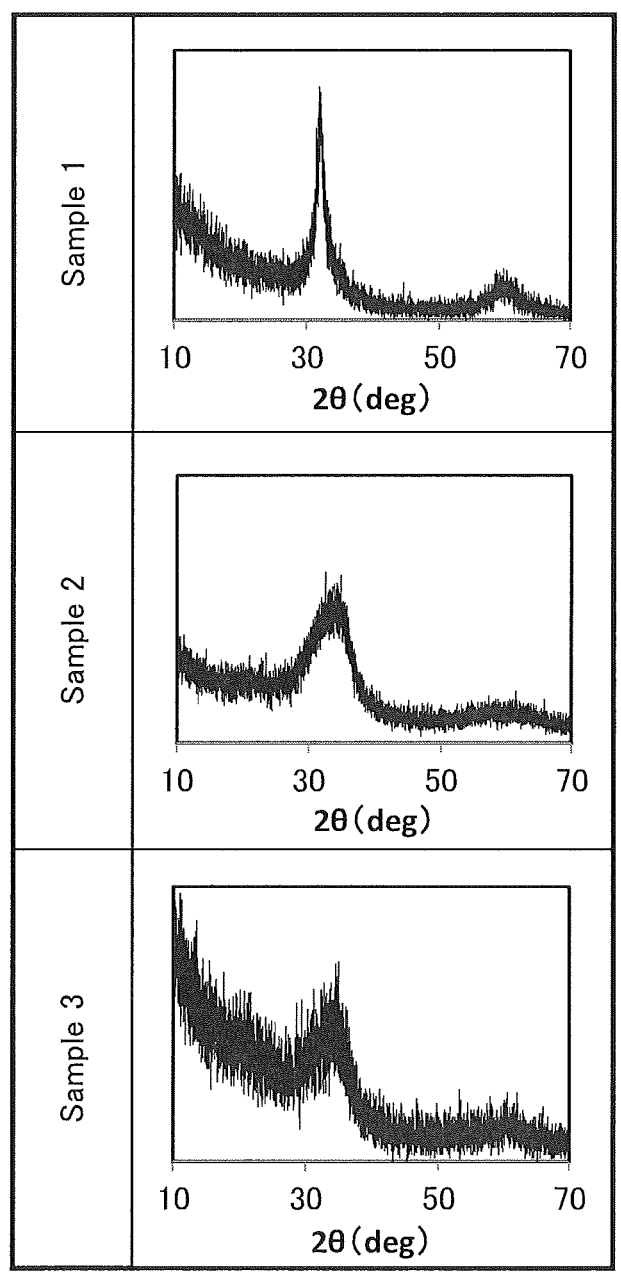
FIG. 83 shows XRD results of Samples 1 to 3.

FIG. 83 shows XRD results of the In—Ga—Zn oxide films in Samples 1 to 3. Note that the XRD analysis was performed using a Cu Kα radiation as a radiation source by an out-of-plane method.

The results in FIG. 83 demonstrate that Sample 1 has a crystallinity peak that corresponds to a (hkl) plane (h=0, k=0, l is a natural number) at 2θ of around 32°. This indicates that Sample 1 has higher crystallinity than Sample 2 and Sample 3.

Table 3 shows the compositions of the In—Ga—Zn oxide films in Samples 1 to 3 and the target analyzed by ICP-MS.

TABLE 3

|  | In | Ga | Zn | O |
|---|---|---|---|---|
| Sample 1 | 1.0 | 3.9 | 5.2 | 12.6 |
| Sample 2 | 1.0 | 3.8 | 4.5 | 11.6 |
| Sample 3 | 1.0 | 3.6 | 3.6 | 10.6 |
| Target | 1 | 4 | 5 | 12.5 |

The results in Table 3 indicate that the composition in Sample 1 is substantially the same as that of the deposition target. The results also indicate that the proportion of Zn is slightly decreased in Sample 2, and further decreased in Sample 3. It is suggested that, as in Sample 1 and Sample 2, the use of a facing-target sputtering apparatus can provide a film whose composition is close to that of a target.

Figure 84:
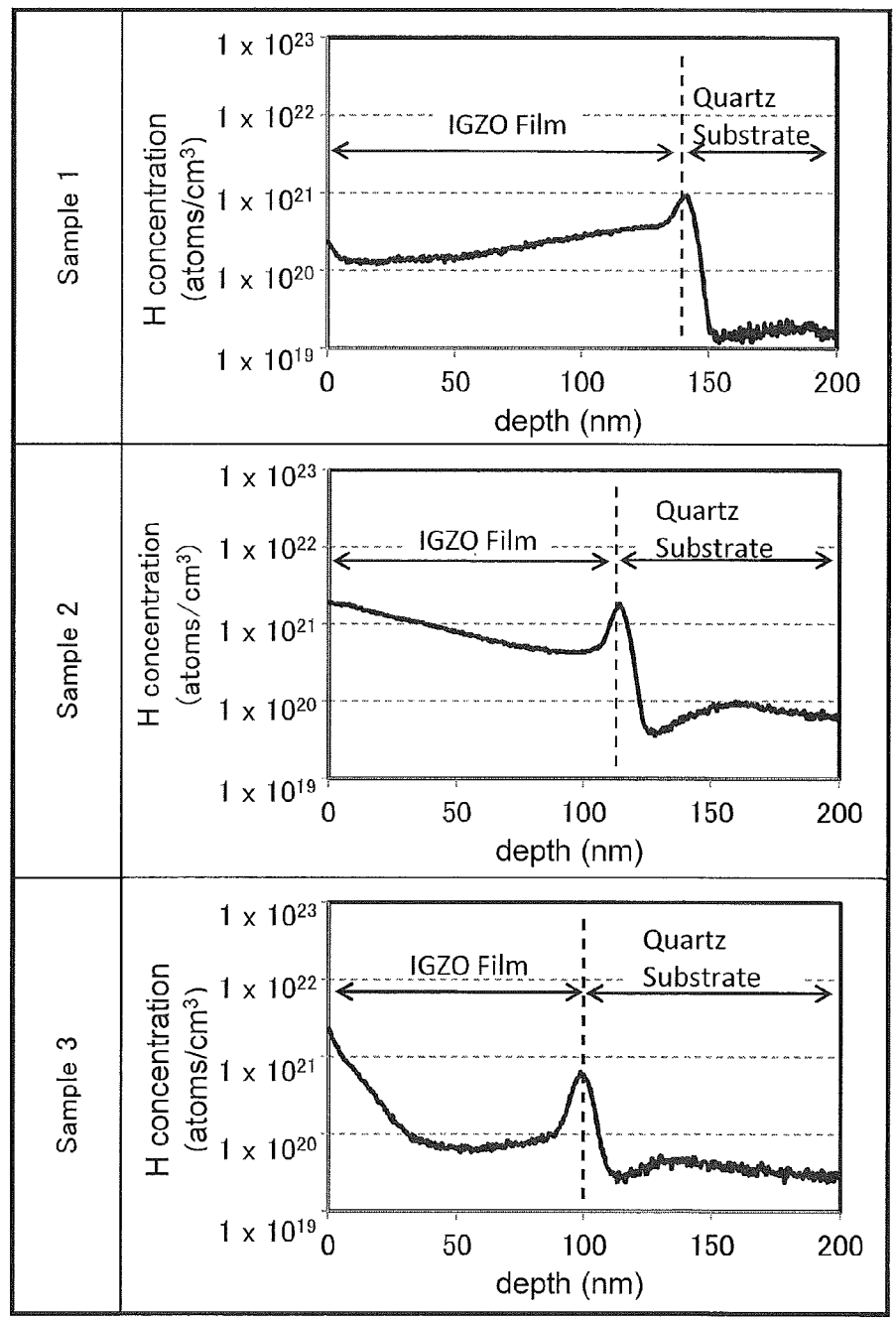
FIG. 84 shows hydrogen concentration of Samples 1 to 3 in the depth direction.

FIG. 84 shows the hydrogen concentration in the depth direction of the In—Ga—Zn oxide films in Samples 1 to 3, which were analyzed by SIMS. Note that the results in FIG. 84 were obtained by the SIMS analysis from the substrate side.

The results in FIG. 84 show a tendency of the hydrogen concentration of Sample 3 to be low at the interface between the substrate and the In—Ga—Zn oxide film and to be increased toward a surface of the In—Ga—Zn oxide film. The results also show that a tendency of the hydrogen concentration of Sample 1 to be high at the interface between the substrate and the In—Ga—Zn oxide film and to be decreased toward a surface of the In—Ga—Zn oxide film.

EXAMPLE 2

In this example, TEM observation results of In—Ga—Zn oxide films which were oxide semiconductors deposited with a facing-target sputtering apparatus will be described.

To fabricate Sample 4, an In—Ga—Zn oxide film was deposited on a silicon substrate with a facing-target sputtering apparatus using an In—Ga—Zn oxide (In:Ga:Zn=1:1:1 in atomic ratio) target. Note that an amorphous silicon oxide film was on a surface of the silicon substrate, and the In—Ga—Zn oxide film was formed thereon. The In—Ga—Zn oxide film was deposited under the following conditions: an atmosphere containing an argon gas at 20 sccm and an oxygen gas at 10 sccm was used, pressure was adjusted to 0.4 Pa, substrate temperature was set at 300° C., and a power of 1000 W from a DC power source was applied to the target.

To fabricate Sample 5, an In—Ga—Zn oxide film was deposited on an yttria-stabilized zirconia (YSZ) substrate with a facing-target sputtering apparatus using an In—Ga—Zn oxide (In:Ga:Zn=1:1:1 in atomic ratio) target. Note that the YSZ substrate used for Sample 5 had a (111) surface orientation. The In—Ga—Zn oxide film was deposited under the following conditions: an atmosphere containing an oxygen gas at 30 sccm was used, pressure was adjusted to 0.4 Pa, substrate temperature was set at 300° C., and a power of 1000 W from a DC power source was applied to the target.

Figure 85A:
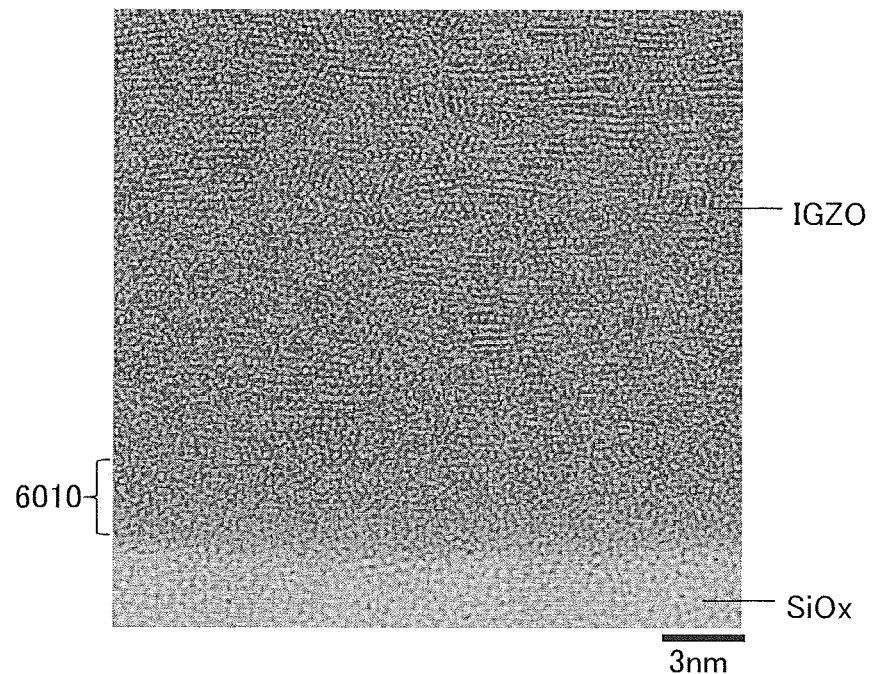
FIGS. 85A and 85B show cross-sectional TEM images of Sample 4.
Figure 86A:
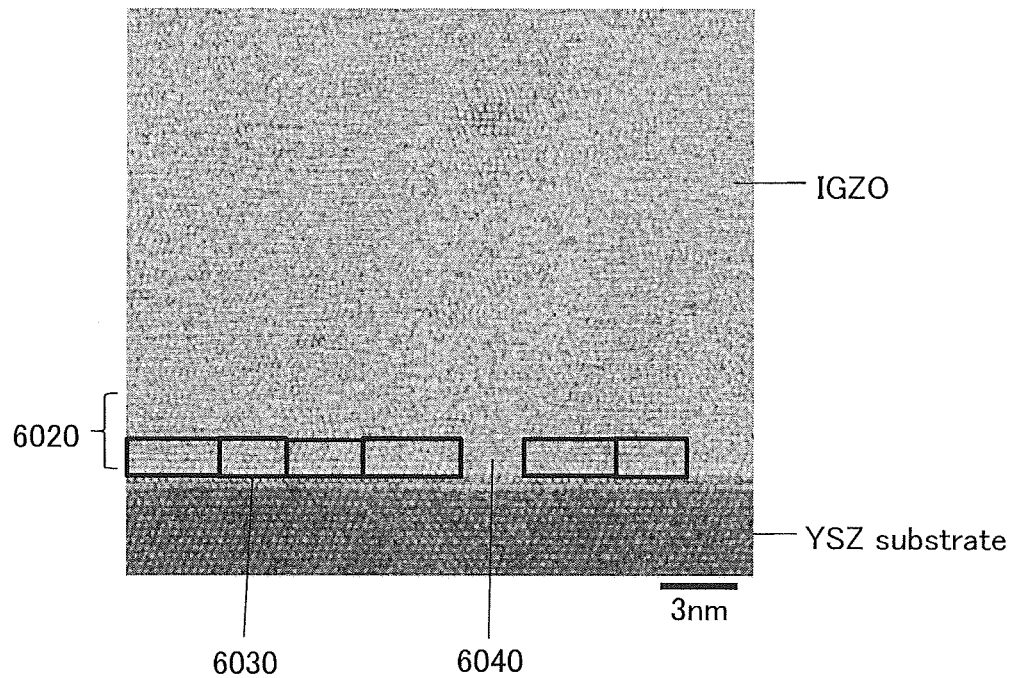
FIGS. 86A and 86B show cross-sectional TEM images of Sample 5.
Figure 86B:
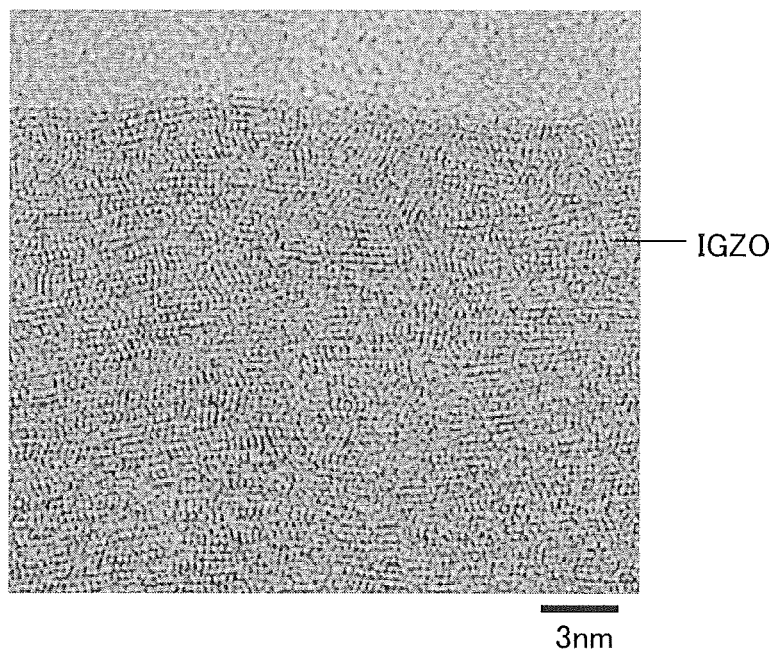

Cross-sectional TEM images of the In—Ga—Zn oxide films in the fabricated Samples 4 and 5 were observed. FIG. 85A is the cross-sectional TEM image of Sample 4. FIG. 86A is the cross-sectional TEM image of Sample 5 showing a region around the top surface of the YSZ substrate. FIG. 86B is the cross-sectional TEM image of Sample 5 showing a region around a surface of the In—Ga—Zn oxide film.

As shown in FIG. 85A, a layered crystal region was observed in the In—Ga—Zn oxide film in Sample 4, indicating that the above-described CAAC-OS was formed. Note that a layered crystal region was not observed at around the interface between the amorphous silicon oxide film and the In—Ga—Zn oxide film (or at a region 6010).

Figure 85B:
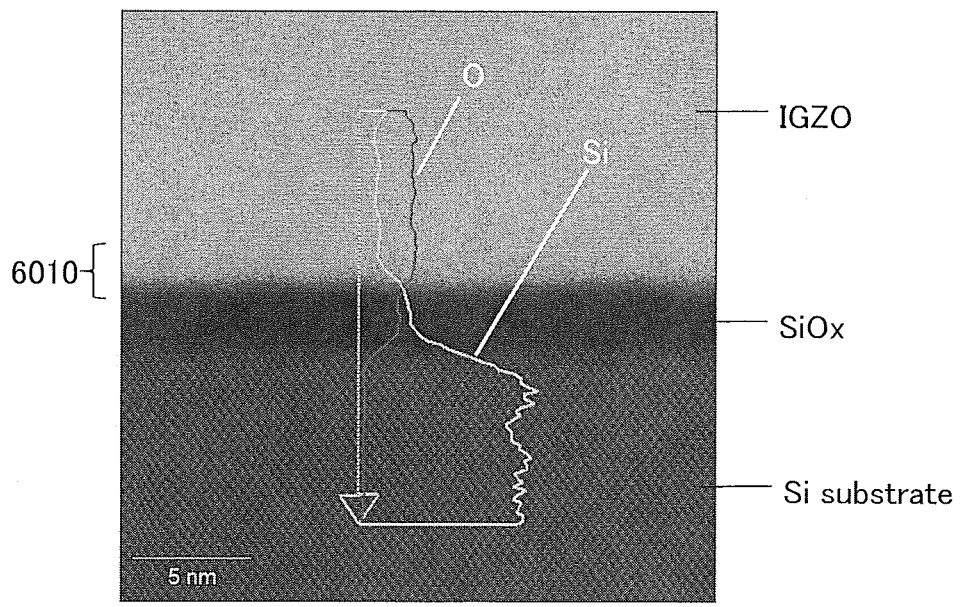

FIG. 85B shows a Si profile and an O profile obtained by energy dispersive X-ray spectroscopy (EDX), which are superimposed on a high-angle annular dark field scanning TEM (HAADF-STEM) image of Sample 4 showing a region around the interface between the silicon substrate and the In—Ga—Zn oxide film. An arrow in FIG. 85B indicates the scanning direction in the measurement. As shown in FIG. 85B, in the region 6010, Si was increased while O was decreased toward the silicon substrate. This means that a mixture layer of silicon oxide and an In—Ga—Zn oxide was formed in the region 6010. This suggests that a layered crystal region was not observed in the region 6010 because a mixture layer of an In—Ga—Zn oxide and amorphous silicon was formed at the initial stage of deposition of the In—Ga—Zn oxide film.

As shown in FIGS. 86A and 86B, a layered crystal region was observed also in the In—Ga—Zn oxide film in Sample 5, indicating that the above-described CAAC-OS was formed. In addition, in Sample 5, a layered crystal region (hereinafter, also referred to as a pellet 6030) can be observed also at around the interface between the YSZ substrate and the In—Ga—Zn oxide film (or at a region 6020). Note that a region where a crystal structure is slightly disordered as compared to the pellet 6030 (hereinafter, such a region is also referred to as a region 6040) was observed in the region 6020. As described above, the use of a facing-target sputtering apparatus with which plasma damage during deposition can be reduced allowed formation of the CAAC-OS even in the vicinity of the YSZ substrate.

Figure 87:
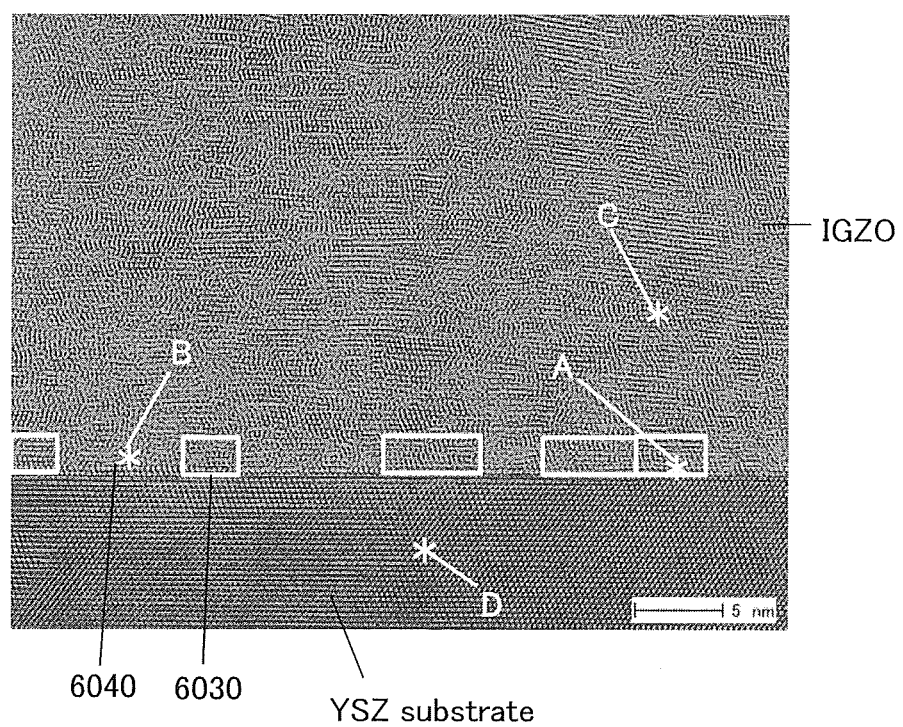
FIG. 87 shows a cross-sectional TEM image of Sample 5.
Figure 88A:
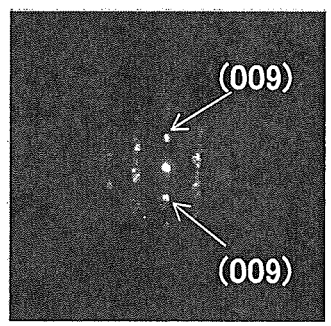
FIGS. 88A to 88D show electron diffraction patterns of Sample 5.

Furthermore, electron diffraction patterns at a point A in the pellet 6030, a point B in the region 6040, a point C in the In—Ga—Zn oxide film, and a point D in the YSZ substrate shown in FIG. 87 were observed. FIG. 88A shows the electron diffraction pattern of the point A, FIG. 88B shows the electron diffraction pattern of the point B, FIG. 88C shows the electron diffraction pattern of the point C, and FIG. 88D shows the electron diffraction pattern of the point D.

Figure 88B:
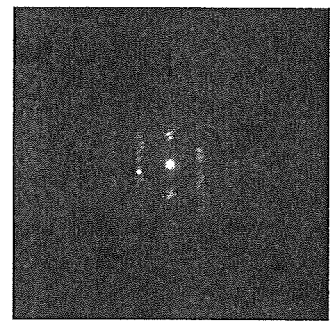
Figure 88C:
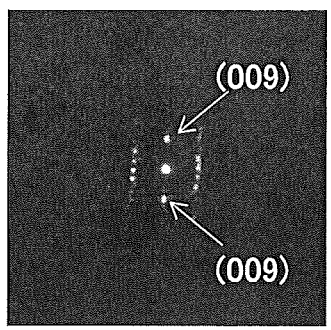

As shown in FIGS. 88A and 88C, clear spot-like patterns were observed at the point A and the point C and spots assigned to the (009) plane were also observed as indicated in FIGS. 88A and 88C. This indicates that the In—Ga—Zn oxide film has high crystallinity and (009) plane alignment at the point A and the point C.

A spot-like pattern was also observed at the point B as shown in FIG. 88B; however, the electron diffraction pattern was less clear than those at the point A and the point C. This means that crystallinity was lower at the point B than at the point A and the point C.

Figure 88D:
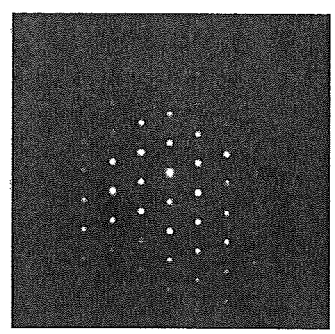

At the point D, although a clear spot-like pattern was observed as shown in FIG. 88D, the pattern was different from the patterns at the point A and the point C. The pattern at the point D probably corresponds to the (111) surface orientation of the YSZ substrate.

As described above, crystals were observed in the entire In—Ga—Zn oxide film in Sample 5 from the interface with the YSZ substrate to the film surface. This suggests that crystals were formed from the initial stage of deposition of the In—Ga—Zn oxide film.

Note that the pellet 6030 with high crystallinity and the region 6040 with lower crystallinity than the pellet were observed in the vicinity of the interface with the YSZ substrate in Sample 5. Furthermore, the In—Ga—Zn oxide had a (009) surface orientation, which was different from the (111) surface orientation of the YSZ substrate serving as a base.

These suggest that the deposition of the CAAC-OS in the In—Ga—Zn oxide film can be mainly based on the growth model using pellets, which is described in the above embodiment and is different from an epitaxial growth model affected by a crystal axis of a base.

EXPLANATION OF REFERENCE

10: target, 11: target, 12: backing plate, 13: backing plate, 14: magnet, 15: magnet, 16: substrate, 17: substrate holder, 18: magnetic force line, 20: power source, 21: power source, 22: target shield, 23: target shield, 30: plasma, 100: transistor, 100A: transistor, 100B: transistor, 101: transistor, 102: substrate, 103: transistor, 104: conductor, 106: insulator, 107: insulator, 108: oxide semiconductor, 108a: oxide semiconductor, 108b: oxide semiconductor, 108c: oxide semiconductor, 112a: conductor, 112b: conductor, 114: insulator, 116: insulator, 120: conductor, 120a: conductor, 120b: conductor, 132: metal oxide film, 134: metal oxide film, 140: oxygen, 141a: opening, 141b: opening, 142a: opening, 142b: opening, 142c: opening, 150: transistor, 160: transistor, 170: transistor, 200: pellet, 200a: pellet, 200b: pellet, 200c: pellet, 201: ion, 202: lateral growth portion, 203: particle, 206a: layer, 206b: layer, 206d: pellet, 206e: pellet, 206f: pellet, 206m: layer, 209: pixel portion, 210: backing plate, 211: pixel, 212: sub-pixel, 212B: sub-pixel, 212G: sub-pixel, 212R: sub-pixel, 213: imaging device, 214: switch, 215: switch, 216: switch, 217: wiring, 218: pixel circuit, 219: photoelectric conversion element, 220: substrate, 230: target, 231: wiring, 240: plasma, 247: wiring, 248: wiring, 249: wiring, 250: magnet, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 310: layer, 320: layer, 330: layer, 340: layer, 351: transistor, 352: transistor, 353: transistor, 360: photodiode, 361: anode, 363: low-resistance region, 370: plug, 371: wiring, 372: wiring, 373: wiring, 380: insulator, 400: substrate, 401: insulator, 402: insulator, 404: conductor, 406a: semiconductor, 406b: semiconductor, 406c: semiconductor, 412: insulator, 413: conductor, 416a: conductor, 416b: conductor, 434: conductor, 436c: semiconductor, 442: insulator, 450: semiconductor, 452: semiconductor substrate, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 490: insulator, 492: insulator, 494: insulator, 496a: conductor, 496b: conductor, 496c: conductor, 496d: conductor, 498a: conductor, 498b: conductor, 498c: conductor, 498d: conductor, 500: substrate, 501: pixel circuit, 502: insulator, 503: insulator, 504: conductor, 506: protection circuit, 506a: semiconductor, 506b: semiconductor, 506c: semiconductor, 507: terminal portion, 511: insulator, 512: insulator, 513: conductor, 514: conductor, 516: conductor, 516a: conductor, 516b: conductor, 534: conductor, 536a: semiconductor, 536b: semiconductor, 536c: semiconductor, 542: insulator, 550: transistor, 552: transistor, 554: transistor, 560: capacitor, 562: capacitor, 570: liquid crystal element, 572: light-emitting element, 700: deposition apparatus, 701: atmosphere-side substrate supply chamber, 702: atmosphere-side substrate transfer chamber, 703a: load lock chamber, 703b: unload lock chamber, 704: transfer chamber, 705: substrate heating chamber, 706a: deposition chamber, 706b: deposition chamber, 706c: deposition chamber, 751: cryotrap, 752: stage, 761: cassette port, 762: alignment port, 763: transfer robot, 764: gate valve, 765: heating holder, 766: target, 767: target shield, 768: substrate holder, 769: substrate, 770: vacuum pump, 771: cryopump, 772: turbo molecular pump, 780: mass flow controller, 781: refiner, 782: gas heating system, 784: adjustment member, 790: magnet, 791: power source, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1502: pixel portion, 1504: driver circuit portion, 1504a: gate driver, 1504b: source driver, 2000: touch panel, 2001: touch panel, 2100: transistor, 2200: transistor, 2501: display device, 2502t: transistor, 2503c: capacitor, 2503t: transistor, 2504: scan line driver circuit, 2505: pixel, 2509: FPC, 2510: substrate, 2510a: insulating layer, 2510b: flexible substrate, 2510c: adhesive layer, 2511: wiring, 2519: terminal, 2521: insulating layer, 2522: insulating layer, 2528: partition, 2529: liquid crystal: layer, 2530a: spacer, 2530b: spacer, 2531: insulating layer, 2550: EL element, 2551: liquid crystal element, 2560: sealing layer, 2567: coloring layer, 2568: light-blocking layer, 2569: anti-reflective layer, 2570: substrate, 2570a: insulating layer, 2570b: flexible substrate, 2570c: adhesive layer, 2580: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 3001: wiring, 3002: wiring, 3003: wiring, 3004: wiring, 3005: wiring, 3200: transistor, 3300: transistor, 3400: capacitor, 5100: pellet, 5120: substrate, 5161: region, 6010: region, 6020: region, 6030: pellet, 6040: region, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, and 9201: portable information terminal.

This application is based on Japanese Patent Application serial no. 2014-265862 filed with Japan Patent Office on Dec. 26, 2014, Japanese Patent Application serial no. 2014-266094 filed with Japan Patent Office on Dec. 26, 2014, Japanese Patent Application serial no. 2015-004895 filed with Japan Patent Office on Jan. 14, 2015, Japanese Patent Application serial no. 2015-004898 filed with Japan Patent Office on Jan. 14, 2015, and Japanese Patent Application serial no. 2015-206123 filed with Japan Patent Office on Oct. 20, 2015, the entire contents of which are hereby incorporated by reference.

The invention claimed is:

1. A manufacturing method of an oxide,
wherein the manufacturing method is a sputtering method using a deposition chamber, a pair of targets positioned in the deposition chamber, and magnets for making a space between the pair of targets a magnetic field space,
wherein the pair of targets comprises indium, zinc, an element M, and oxygen,
wherein the element M is at least any one of aluminum, gallium, yttrium, and tin, and
wherein the manufacturing method comprising the steps of:
placing a substrate between the pair of targets;
supplying a sputtering gas comprising oxygen or a rare gas to the deposition chamber;
adjusting pressure in the deposition chamber to higher than or equal to 0.005 Pa and lower than or equal to 0.09 Pa;
supplying a sputtering power to the pair of targets to generate plasma;
sputtering the pair of targets using ions in the plasma; and
depositing particles sputtered from the pair of targets on the substrate.

2. The manufacturing method of an oxide, according to claim 1, wherein the substrate is placed in a positive column of the plasma.

3. The manufacturing method of an oxide, according to claim 1, wherein L1 and L2 are each longer than or equal to 10 mm and shorter than or equal to 200 mm, where L1 is a horizontal distance from one of the pair of targets to the substrate and L2 is a horizontal distance from the other of the pair of targets to the substrate.

4. The manufacturing method of an oxide, according to claim 1, wherein temperature of the substrate during deposition is higher than or equal to 10° C. and lower than 100° C.

5. The manufacturing method of an oxide, according to claim 1, wherein temperature of the substrate during deposition is higher than or equal to 100° C. and lower than or equal to 500° C.

6. The manufacturing method of an oxide, according to claim 1, wherein the oxide is formed over a surface of an amorphous structure.

7. The manufacturing method of an oxide, according to claim 1, wherein lattice spacing in the oxide is longer than or equal to 0.27 nm and shorter than or equal to 0.28 nm in a normal direction of the substrate.

8. A manufacturing method of an oxide,
wherein the manufacturing method is a sputtering method using a deposition chamber, a pair of targets positioned in the deposition chamber, and magnets for making a space between the pair of targets a magnetic field space,
wherein the pair of targets comprises indium, zinc, an element M, and oxygen,
wherein the element M is at least any one of aluminum, gallium, yttrium, and tin, and
wherein the manufacturing method comprising the steps of:
placing a substrate beside the space between the pair of targets;
supplying a sputtering gas comprising oxygen or a rare gas to the deposition chamber;
adjusting pressure in the deposition chamber to higher than or equal to 0.005 Pa and lower than or equal to 0.09 Pa;
supplying a sputtering power to the pair of targets to generate plasma;
sputtering the pair of targets using ions in the plasma; and
depositing particles sputtered from the pair of targets on the substrate.

9. The manufacturing method of an oxide, according to claim 8, wherein the substrate is placed in a positive column of the plasma.

10. The manufacturing method of an oxide, according to claim 8, wherein L1 and L2 are each longer than or equal to 10 mm and shorter than or equal to 200 mm, where L1 is a horizontal distance from one of the pair of targets to the substrate and L2 is a horizontal distance from the other of the pair of targets to the substrate.

11. The manufacturing method of an oxide, according to claim 8, wherein temperature of the substrate during deposition is higher than or equal to 10° C. and lower than 100° C.

12. The manufacturing method of an oxide, according to claim 8, wherein temperature of the substrate during deposition is higher than or equal to 100° C. and lower than or equal to 500° C.

13. The manufacturing method of an oxide, according to claim 8, wherein the oxide is formed over a surface of an amorphous structure.

14. The manufacturing method of an oxide, according to claim 8, wherein lattice spacing in the oxide is longer than or equal to 0.27 nm and shorter than or equal to 0.28 nm in a normal direction of the substrate.

* * * * *